United States Patent
Li et al.

(10) Patent No.: US 11,368,249 B2
(45) Date of Patent: *Jun. 21, 2022

(54) POLAR CODING METHOD, APPARATUS, AND DEVICE

(71) Applicant: HUAWEI TECHNOLOGIES CO., LTD., Guangdong (CN)

(72) Inventors: Rong Li, Hangzhou (CN); Gongzheng Zhang, Hangzhou (CN); Ying Chen, Hangzhou (CN); Xiaocheng Liu, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/132,566

(22) Filed: Dec. 23, 2020

(65) Prior Publication Data

US 2021/0176007 A1 Jun. 10, 2021

Related U.S. Application Data

(63) Continuation of application No. 16/295,151, filed on Mar. 7, 2019, now Pat. No. 10,892,851, which is a (Continued)

(30) Foreign Application Priority Data

Aug. 11, 2016 (CN) .......................... 201610664987.6

(51) Int. Cl.
*H03M 13/00* (2006.01)
*H04L 1/00* (2006.01)
*H03M 13/13* (2006.01)

(52) U.S. Cl.
CPC .......... *H04L 1/0058* (2013.01); *H03M 13/13* (2013.01); *H03M 13/618* (2013.01);
(Continued)

(58) Field of Classification Search
None
See application file for complete search history.

(56) References Cited

U.S. PATENT DOCUMENTS 6,105,158 A * 8/2000 Chen ...................... H03M 13/09
714/755
6,507,927 B1 * 1/2003 Kalliojarvi ........ H03M 13/4138
714/795
(Continued)

FOREIGN PATENT DOCUMENTS

CN 101447851 6/2009
CN 102118231 7/2011
(Continued)

OTHER PUBLICATIONS

Hauwei, HiSilicon, "Polar codes—encoding and decoding [online]," 3GPP TSG-RAN WG1 #85 R1-164039, May 2016, total 7 pages.
(Continued)

*Primary Examiner* — Mujtaba M Chaudry
(74) *Attorney, Agent, or Firm* — Fish & Richardson P.C.

(57) ABSTRACT

Embodiments of this application disclose a polar coding method, apparatus, and device, so as to reduce storage overheads of a system. A sequence for polar coding is obtained based on a length M of a target polar code, wherein the sequence comprises L sequence numbers, ordering of the L sequence numbers in the sequence is the same as ordering of the L sequence numbers in a maximum mother code sequence, wherein the maximum mother code sequence is obtained by sorting N sequence numbers of N polarized channels in ascending order or descending order of reliabil-
(Continued)

ity metrics, wherein L and N are integer power of 2, M is smaller than or equal to L, L is smaller than or equal to N.

20 Claims, 3 Drawing Sheets

Related U.S. Application Data continuation of application No. 16/110,873, filed on Aug. 23, 2018, now Pat. No. 10,326,555, which is a continuation of application No. PCT/CN2017/091675, filed on Jul. 4, 2017.

(52) U.S. Cl.
 CPC ..... *H03M 13/635* (2013.01); *H03M 13/6588* (2013.01); *H04L 1/00* (2013.01)

(56) References Cited

U.S. PATENT DOCUMENTS

| | | | |
|---|---|---|---|
| 8,677,227 B2 | 3/2014 | Gross et al. | |
| 2005/0091568 A1* | 4/2005 | Levy | H03M 13/2975 714/755 |
| 2011/0044399 A1* | 2/2011 | Dowling | H04L 27/3433 375/286 |
| 2012/0054576 A1* | 3/2012 | Gross | H03M 13/1137 714/752 |
| 2013/0117344 A1 | 5/2013 | Gross et al. | |
| 2014/0019820 A1 | 1/2014 | Vardy et al. | |
| 2014/0208183 A1 | 7/2014 | Mahdavifar et al. | |
| 2015/0194987 A1 | 7/2015 | Li et al. | |
| 2015/0229337 A1 | 8/2015 | Alhussien et al. | |
| 2015/0333769 A1* | 11/2015 | Jeong | H03M 13/271 714/790 |
| 2015/0358113 A1* | 12/2015 | Callard | H04L 1/0041 714/776 |
| 2016/0013810 A1 | 1/2016 | Gross et al. | |
| 2016/0182187 A1 | 6/2016 | Kim et al. | |
| 2016/0218743 A1 | 7/2016 | Li et al. | |
| 2016/0254876 A1 | 9/2016 | Shen et al. | |
| 2016/0285479 A1* | 9/2016 | El-Khamy | H03M 13/616 |
| 2016/0308643 A1 | 10/2016 | Li et al. | |
| 2017/0047947 A1* | 2/2017 | Hong | H03M 13/2906 |
| 2017/0324514 A1 | 11/2017 | Shen et al. | |
| 2019/0089380 A1 | 3/2019 | Shen et al. | |

FOREIGN PATENT DOCUMENTS

| | | |
|---|---|---|
| CN | 102122966 | 7/2011 |
| CN | 103023618 | 4/2013 |
| CN | 103414540 | 11/2013 |
| CN | 104158550 | 1/2014 |
| CN | 103684477 | 3/2014 |
| CN | 103825669 | 5/2014 |
| CN | 103888151 | 6/2014 |
| CN | 104124979 | 10/2014 |
| CN | 105075163 | 11/2015 |
| CN | 105099622 | 11/2015 |
| CN | 105281785 | 1/2016 |
| CN | 105811998 | 7/2016 |
| EP | 3054599 A1 | 8/2016 |

OTHER PUBLICATIONS

Huawei, HiSilicon, "Overview of Polar Codes [online]," 3GPP TSG-RAN WG1 #84b R1-162161, Apr. 2016, total 7 pages.
Huawei, HiSilicon,"Polar code design and rate matching ", 3GPP TSG RAN WG1 Meeting #86 R1-167209, Gothenburg, Sweden, Aug. 22-26, 2016,total 5 pages.
Intel Corpoation "Polar code design for NR," 3GPP TSG RAN WG1 Meeting #85 R1-164184, Nanjing, China, May 23-27, 2016, total 4 pages.
Intel Corporation, "Polar code constructions for evaluations," 3GPP TSG RAN WG1 Meeting #85 R1-164185, Nanjing, China, May 23-27, 2016, total 2 pages.
MediaTek Inc., "Discussion on Polar Code Design and Performance," 3GPP TSG RAN WG1 Meeting #85bis, R1-165165, Nanjing, China, May 23-27, 2016, total 7 pages, XP051089827.
Niu Kai et al:"Polar codes:Primary concepts and practical decoding algorithms",IEEE Communications Magazine. IEEE Service Center, Piscataway, US, vol. 52, No. 7, Jul. 2014, total 12 pages.
Wang Runxin et al:"A Novel Puncturing Scheme for Polar Codes", IEEE Communications Letters,IEEE Service Center, Piscataway, NJ ,US, vol. 18, No. 12, Dec. 2014, total 4 pages.
Extended European Search Report issued in European Application No. 21177890.7 dated May 11, 2022, 13 pages.

\* cited by examiner

| N=16 | 0 | 1 | 2 | 4 | 8 | 3 | 5 | 6 | 9 | 10 | 12 | 7 | 11 | 13 | 14 | 15 |

| L=8 | 0 | 1 | 2 | 4 | 3 | 5 | 6 | 7 |

| L=4 | 0 | 1 | 2 | 3 |

FIG. 2

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|
| 000 | 001 | 010 | 100 | 101 | 011 | 100 | 100 | 101 | 101 | 110 | 100 | 101 | 110 | 110 | 110 |
|  |  |  | 0+4 | 0+8 | 3 | 1+4 | 2+4 | 1+8 | 2+8 | 0+12 | 3+4 | 3+8 | 1+12 | 2+12 | 3+12 |

FIG. 3

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|
| 0000 | 0001 | 0010 | 0100 | 1000 | 0011 | 0101 | 0110 | 1001 | 1010 | 1100 | 0111 | 1011 | 1101 | 1110 | 1111 |

FIG. 4

| 0 | 1 | 2 | 4 | 8 | 3 | 5 | 6 | 9 | 10 | 12 | 7 | 11 | 13 | 14 | 15 |
|---|---|---|---|---|---|---|---|---|----|----|---|----|----|----|----|
| 0000 | 0001 | 0010 | 0100 | 1000 | 0011 | 0101 | 0110 | 1000 | 1000 | 1000 | 0111 | 1000 | 1000 | 1000 | 1000 |
|  |  |  | 0+8 |  |  |  |  | 1+8 | 2+8 | 4+8 |  | 3+8 | 5+8 | 6+8 | 7+8 |

FIG. 5

POLAR CODING METHOD, APPARATUS, AND DEVICE

CROSS-REFERENCE TO RELATED APPLICATIONS

This application is a continuation of U.S. patent application Ser. No. 16/295,151, filed on Mar. 7, 2019, which is a continuation of U.S. patent application Ser. No. 16/110,873, filed on Aug. 23, 2018, now U.S. Pat. No. 10,326,555, which is a continuation of International Application No. PCT/CN2017/091675, filed on Jul. 4, 2017, which claims priority to Chinese Patent Application No. 201610664987.6, filed on Aug. 11, 2016. All of the afore-mentioned patent applications are hereby incorporated by reference in their entireties.

TECHNICAL FIELD

This application relates to the field of channel coding, and more specifically, to a polar coding method, apparatus, and device.

BACKGROUND

In a communications system, channel coding is usually used to improve data transmission reliability and ensure communication quality. It has been theoretically proved that polar (Polar) codes are a coding scheme that can achieve a Shannon capacity with easy coding and decoding methods. A polar code is a linear block code. A generator matrix of the polar code is $G_N$, and a coding process of the polar code is $x_1^N = u_1^N \cdot G_N, u_1^N = (u_1, u_2, \ldots, u_N)$ is a binary row vector, $G_N = F_2^{\otimes (\log_2(N))}$, and a code length $N = 2^n$, where n is a positive integer.

$$F_2 = \begin{bmatrix} 1 & 0 \\ 1 & 1 \end{bmatrix},$$

and $F_2^{\otimes (\log_2(N))}$ is a Kronecker product of $F_2$ and is defined as $F_2^{\otimes (\log_2(N))} = F \otimes F_2^{\otimes (\log_2(N)-1)}$.

In a polar code coding process, one portion of bits in $u_1^N$ are used to carry information and are referred to as information bits. A set of sequence numbers of the information bits is denoted by A. The other portion of bits are set to fixed values that are pre-agreed by a receive end and a transmit end and are referred to as frozen bits. A set of sequence numbers of the frozen bits is represented by a complementary set Ac of A. In general, these frozen bits are set to 0s. Actually, a frozen bit sequence may be randomly set provided that the receive end and the transmit end have a pre-agreement. Therefore, a polar code coded bit sequence may be obtained in the following method: $x_1^N = u_A \cdot G_N(A)$. Herein, $u_A$ is a set of the information bits in $u_1^N$ and is a K-length row vector, meaning $|A|=K$. $|\bullet|=K$ represents a quantity of elements in the set; to be specific, K represents a quantity of elements in the set A. $G_N(A)$ is a sub-matrix obtained by using rows, corresponding to indexes in the set A, in the matrix $G_N$. $G_N(A)$ is a K×N matrix. When a CRC-aided improved SC decoding algorithm is used, polar codes can obtain better FER performance than LDPC and Turbo codes.

A key of polar code coding lies in determining a code length M and the information bit set A. In existing polar code coding solutions, the information bit set A cannot be determined through simple calculation. Therefore, the information bit set A is generally determined by offline calculation and storage. To be specific, an encoder and a decoder pre-store a relationship table of correspondences between a plurality of mother code sequences and code lengths and/or bit rates. During polar code coding, a corresponding mother code sequence is selected based on a required bit rate and/or code length.

A large quantity of mother code sequences need to be stored to support all combinations of code lengths and bit rates required by a system. Therefore, storage overheads of the system are extremely high.

SUMMARY

This application provides a polar coding method, apparatus, and device, so as to reduce storage overheads of a system.

According to a first aspect, this application provides a polar coding method. The method includes: obtaining reliability metrics of N polarized channels, where $N=2^n$, and n and N are positive integers; obtaining a maximum mother code sequence by sort sequence numbers of the N polarized channels in ascending order or descending order of the metrics, where the maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z \leq n$, and z is a positive integer; and storing the maximum mother code sequence.

It should be understood that the maximum mother code sequence is a sequence in a maximum length that can be supported by the system, and the length of the maximum mother code sequence $N=2^n$, where n is a positive integer. The first sequence is a sequence that is read from the maximum mother code sequence and that is in any code length (with a maximum length N).

In the prior art, a system needs to store one sequence for each mother code length In addition, under a same mother code length, different bit rates correspond to different sequences; therefore, the system needs to store sequences corresponding to all combinations of code lengths and bit rates. With such a storage method, storage overheads of a hardware system are extremely high.

In embodiments of this application, only the maximum mother code sequence that can be supported by the system is stored (in other words, only one sequence is stored). During polar code coding, a mother code sequence in a required length is read from the maximum mother code sequence, and then rate matching and coding are performed based on a polar code puncturing method. A quantity of mother code sequences that need to be stored by the system is less than that in the prior art, so that storage overheads of the system can be reduced.

In a possible implementation, the method further includes: determining a second sequence from the maximum mother code sequence based on a code length M of a target polar code, where the second sequence is used as a mother code sequence when coding into the target polar code is performed, the second sequence includes L sequence numbers, and ordering, in the second sequence, of the L sequence numbers is the same as ordering, in the maximum mother code sequence, of the L sequence numbers, where $M \leq L \leq N$, and M and L are positive integers.

It should be understood that the second sequence is meant for a polar code that needs to be obtained (that is, the target polar code). For the given code length M of the target polar code, a sequence that is used as a mother code sequence when coding into the target polar code is performed and that is read from the maximum mother code sequence is the second sequence.

It should be further understood that $L=2^b$, $b \leq n$, and b is a positive integer.

In a possible implementation, the determining a second sequence from the maximum mother code sequence based on a code length M of a target polar code includes: determining a mother code length L of the target polar code based on the code length M of the target polar code; and obtaining the second sequence by successively reading, from the maximum mother code sequence, sequence numbers that are less than L.

It should be noted that, in the embodiments of this application, sequence numbers of the polarized channels start with 0, and therefore a sequence number range of the N polarized channels is from 0 to N−1.

It can be understood that the foregoing first sequence is in general a sequence read from the maximum mother code sequence. Herein, the second sequence is a sequence that is read from the maximum mother code sequence and that is used as the mother code of the target polar code when the code length of the target polar code is M.

In other words, during polar coding, the mother code sequence in the required length (that is, the second sequence) is first read from the maximum mother code sequence, and then polar coding is performed on to-be-coded bits by using the second sequence.

In a possible implementation, the determining a mother code length L of the target polar code based on the code length M of the target polar code includes: determining L=M when $M=2^m$; and $L=2^{\lceil \log_2 M \rceil}$ when $M \neq 2^m$, where m is a positive integer, and the symbol ⌈ ⌉ represents rounding up.

In a possible implementation, the storing the maximum mother code sequence includes: calculating, based on the length of the maximum mother code sequence and a preset rule, a quantity S of bits that need to be used to represent a sequence number in the maximum mother code sequence; calculating a maximum sequence length Q that is represented by (S−1) bits; determining a sequence obtained by successively sorting sequence numbers that are less than Q and that are in the maximum mother code sequence, as a base sequence; grouping sequence numbers that are greater than or equal to Q and that are in the maximum mother code sequence into $$\left(\frac{N-Q}{Q}\right)$$

offset sequences, where a quantity of sequence numbers included in each offset sequence is the same as a quantity of sequence numbers included in the base sequence, and an $i^{th}$ sequence number in each offset sequence corresponds to an $i^{th}$ sequence number in the base sequence, where $0 \leq i \leq Q-1$, and i is a nonnegative integer; storing, by using S bits, each sequence number that belongs to the base sequence and that is in the maximum mother code sequence, where the S bits include a first bit and a plurality of second bits, the first bit is used to indicate that a sequence number stored at a current location belongs to the base sequence, and the plurality of second bits are used to indicate a value of the sequence number stored at the current location; and storing, by using S bits, each sequence number that belongs to an offset sequence and that is in the maximum mother code sequence, where the S bits include a third bit and a plurality of fourth bits, the third bit is used to indicate that a sequence number stored at a current location belongs to an offset sequence, the plurality of fourth bits are used to indicate an offset multiplier of the sequence number stored at the current location with respect to a sequence number stored at a corresponding location in the base sequence, the offset multiplier is a result of dividing a difference between the sequence number stored at the current location and the sequence number stored at the corresponding location in the base sequence by a length of the base sequence, and the first bit is different from the third bit.

It should be noted that, in the embodiments of this application, when the quantity S of bits that need to be used to store the sequence number in the maximum mother code sequence is determined, the quantity S is calculated based on the length N of the maximum mother code sequence and the preset rule. In the embodiments of this application, the preset rule may be understood as an equation $N=2^{2S-2}$ pre-configured by the system. N is the length of the maximum mother code sequence, S is the quantity of bits used to represent each sequence number in the maximum mother code sequence. Based on the foregoing equation, for a maximum mother code sequence in any length, a quantity of bits that need to be used for storage using the compressed storage method provided in the embodiments of this application can be calculated.

Therefore, on the basis that the storage overheads of the system can be reduced because the system needs to store only one maximum mother code sequence, using the compressed storage method provided in the embodiments of this application to store the maximum mother code sequence can reduce the quantity of bits that are used to represent each sequence number in the maximum mother code sequence, so that storage overheads of the system can be further reduced.

In a possible implementation, the obtaining reliability metrics of N polarized channels includes:

obtaining the reliability metrics of the N polarized channels based on the following equation:

$$W_i = \sum_{j=0}^{n-1} B_j * 2^{\frac{1}{4} \cdot j},$$

where $0 \leq i \leq N-1$, $N=2^n$, n is a positive integer, $i=B_{n-1} B_{n-2}, B_{n-1} B_{n-2} \ldots B_0$ is a binary representation of i, $B_{n-1}$ is the most significant bit, $B_0$ is the least significant bit, $B_j \in \{0, 1\}$, and $W_i$ is used to represent a reliability of an $i^{th}$ polarized channel.

It should be understood that a polarization weight may be used as a parameter for measuring a reliability of a polarized channel. Therefore, in the embodiments of this application, when the reliabilities of the polarized channels are calculated, the foregoing formula may be optionally used to calculate polarization weights of the N polarized channels. A larger polarization weight of a polarized channel represents a higher reliability of the polarized channel.

In a possible implementation, the obtaining reliability metrics of N polarized channels includes:

obtaining error probabilities of the N polarized channels by using density evolution or Gaussian approximation. A lower error probability of a polarized channel represents a higher reliability of the polarized channel. The polarized channels are sorted based on the error probabilities, and in an sorted sequence, order of a sequence number of a polarized channel that fails to present the characteristic that the maximum mother code sequence in the embodiments of this application is supposed to have, is adjusted, so as to obtain the maximum mother code sequence in the embodiments of this application.

In a possible implementation, the method further includes: using the second sequence as a mother code sequence of the target polar code, and obtaining the target polar code according to a shortening method.

It should be noted that, shortening herein is one of polar code puncturing schemes.

According to a second aspect, this application provides a polar coding apparatus, configured to perform the method in any one of the first aspect or the possible implementations of the first aspect. Specifically, the apparatus includes units configured to perform the method in any one of the first aspect or the possible implementations of the first aspect.

According to a third aspect, this application provides a polar coding device. Specifically, the device includes: a memory, a processor, and a network interface. The memory, the processor, and the network interface may be connected to each other by using a bus system. The memory is configured to store an instruction, the processor is configured to execute the instruction stored in the memory, and when the instruction is executed, the processor performs, by using the network interface, the method in any one of the first aspect or the possible implementations of the first aspect.

According to a fourth aspect, this application provides a computer readable medium, configured to store a computer program. The computer program includes an instruction for performing the method in any one of the first aspect or the possible implementations of the first aspect.

According to a fifth aspect, this application provides a chip (or a chip system), including a memory and a processor. The memory is configured to store a computer program, the processor is configured to call the computer program from the memory and run the computer program, to enable a communications device provided with the chip to perform the method in any one of the first aspect or the possible implementations of the first aspect.

It should be understood that the communications device herein may be the apparatus described in any one of the second aspect or the possible implementation of the second aspect.

According to a sixth aspect, this application provides a polar coding method. The method includes: obtaining a maximum mother code sequence, where the maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z \le n$, and z is a positive integer; and performing polar coding by using the maximum mother code sequence.

In a possible implementation, the performing polar coding by using the maximum mother code sequence includes: determining a second sequence from the maximum mother code sequence based on a code length M of a target polar code, where the second sequence is used as a mother code sequence when coding into the target polar code is performed, the second sequence includes L sequence numbers, and ordering, in the second sequence, of the L sequence numbers is the same as ordering, in the maximum mother code sequence, of the L sequence numbers, where $M \le L \le N$, and M and L are positive integers; and performing polar coding on to-be-coded bits based on the second sequence.

In a possible implementation, the method further includes: obtaining reliability metrics of N polarized channels based on the following equation:

$$W_i = \sum_{j=0}^{n-1} B_j * 2^{\frac{1}{4} \cdot j},$$

where $0 \le i \le N-1$, $N=2^n$, n is a positive integer, $i = B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$, $W_i$ is used to represent a reliability of an $i^{th}$ polarized channel, and N equals a length of the maximum mother code sequence; and determining the maximum mother code sequence based on the reliability metrics of the N polarized channels.

In the embodiments of this application, the system stores only the maximum mother code sequence that can be supported (in other words, one sequence is stored), and during polar code coding, the mother code sequence in the required length is then read from the maximum mother code sequence, so that the storage overheads of the system can be reduced.

BRIEF DESCRIPTION OF DRAWINGS

FIG. 2 is a schematic diagram of reading a sequence in any code length from a maximum mother code sequence according to an embodiment of this application;

FIG. 3 is a storage form of a maximum mother code sequence according to an embodiment of this application;

FIG. 4 is a schematic diagram of storing a maximum mother code sequence in a direct storage mode;

FIG. 5 is another storage form of a maximum mother code sequence according to an embodiment of this application;

DESCRIPTION OF EMBODIMENTS

The following describes the technical solutions of embodiments in this application with reference to accompanying drawings.

The embodiments of this application may be applied to various communications systems, such as a Global System for Mobile Communications (Global System for Mobile Communications, GSM) system, a Code Division Multiple Access (Code Division Multiple Access, CDMA) system, a Wideband Code Division Multiple Access (Wideband Code Division Multiple Access, WCDMA) system, a General Packet Radio Service (General Packet Radio Service, GPRS) system, a Long Term Evolution (Long Term Evolution, LTE) system, an LTE frequency division duplex (Frequency Division Duplex, FDD) system, an LTE time division duplex (Time Division Duplex, TDD) system, and a Universal Mobile Telecommunications System (Universal Mobile Telecommunications System, UMTS). Any information or data coded by a base station or a terminal in the foregoing systems by using a conventional Turbo code or low density parity check code (Low Density Parity Check Code, LDPC) may be coded by using a polar code in the embodiments.

The base station may be a device configured to communicate with a terminal device. For example, the base station may be a base station (Base Transceiver Station, BTS) in a GSM or CDMA system, or may be a base station (NodeB, NB) in a WCDMA system, or may be an evolved NodeB (Evolved Node B, eNB or eNodeB) in an LTE system. Alternatively, the base station may be a relay node, an access point, an in-vehicle device, a wearable device, a network side device on a future 5G network, or the like. The base station may alternatively be a terminal that functions as a base station in device-to-device (device-to-device D2D) communication.

The terminal may communicate with one or more core networks by using a radio access network (Radio Access Network, RAN). The terminal may be user equipment (User Equipment, UE), an access terminal, a subscriber unit, a subscriber station, a mobile station, a mobile console, a remote station, a remote terminal, a mobile device, a user terminal, a wireless communications device, a user agent, a user apparatus, or the like. The access terminal may be a cellular phone, a cordless phone, a Session Initiation Protocol (Session Initiation Protocol, SIP) phone, a wireless local loop (Wireless Local Loop, WLL) station, a personal digital assistant (Personal Digital Assistant, PDA), a handheld device or computing device having a wireless communications function or another processing device connected to a wireless modem, an in-vehicle device, a wearable device, a terminal device on a future 5G network, or the like.

For ease of understanding, the following describes a polar coding method 100 in an embodiment of this application in detail with reference to FIG. 1 to FIG. 5.

Figure 1:
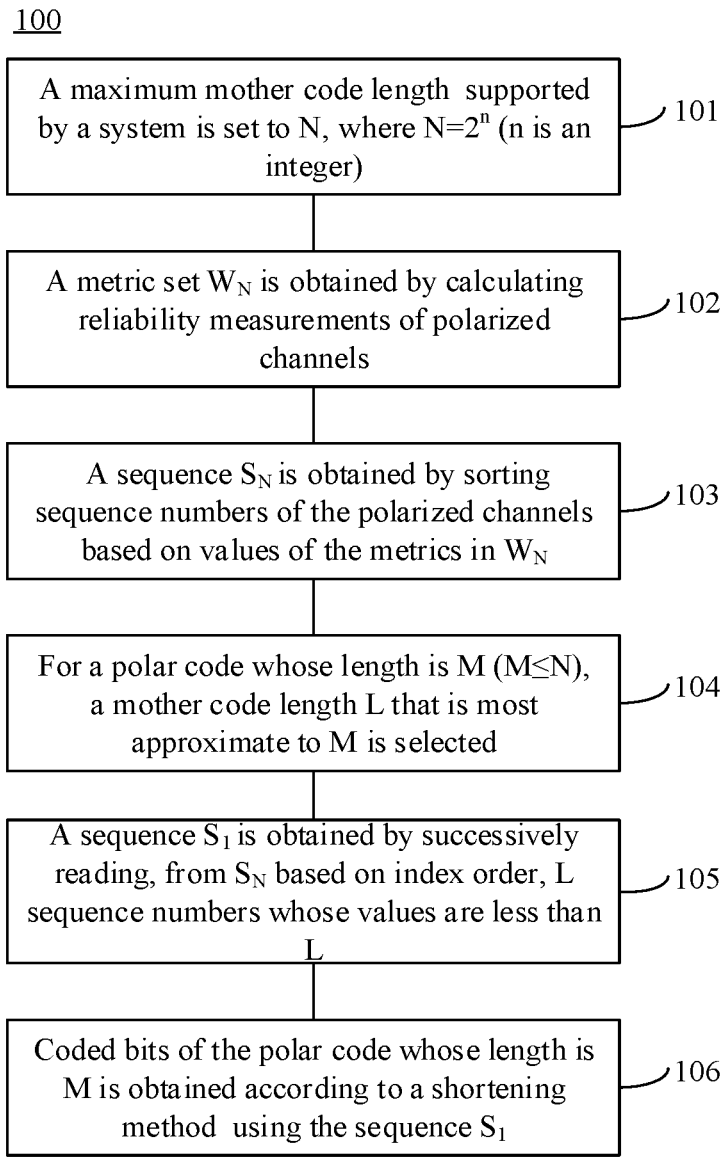
FIG. 1 is a schematic flowchart of a polar coding method 100 according to an embodiment of this application.

FIG. 1 is a schematic flowchart of the polar coding method 100 in this embodiment of this application. As shown in FIG. 1, the method 100 mainly includes steps 101 to 106.

101. A maximum mother code length supported by a system is set to N.

It can be understood that a mother code length of a polar code is limited to 2 to the power of n (n is a positive integer). Therefore, a maximum mother code sequence length set by the system is $N=2^n$, where n is a positive integer. For example, N=16, 128, 256, 65536, or the like.

102. A metric set $W_N$ is obtained by calculating reliability metrics of polarized channels.

It should be understood that, during polar code coding, a mother code length is consistent with a quantity of the polarized channels. To be specific, if the maximum mother code length supported by the system is N, correspondingly, there are N polarized channels.

Specifically, when the reliability metrics of the polarized channels are calculated, a prior-art method such as density evolution, Gaussian approximation, or linear fitting may be used. A specific calculation process may be the same as that in the prior art. For brevity, details are not described herein.

Optionally, when the reliabilities of the polarized channels are calculated, a parameter such as an error probability, a channel capacity, or a polarization weight may be used as a parameter for measuring the reliabilities of the polarized channels, or another parameter that can measure the polarized channels may be used. This is not particularly limited in this embodiment of this application.

Optionally, when the polarization weight is used as the parameter for measuring the reliabilities of the polarized channels, the reliabilities of the polarized channels may be calculated based on the following equation:

$$W_i = \sum_{j=0}^{n-1} B_j * 2^{\frac{1}{4}j},$$

where $0 \leq i \leq N-1$, $N=2^n$, n is a positive integer, $i=B_{n-1} B_{n-2} \ldots B_0$, $B_{n-1} B_{n-2} \ldots B_0$ is a binary representation of i, $B_{n-1}$ is the most significant bit, $B_0$ is the least significant bit, $B_j \in \{0,1\}$ and $W_i$ is used to represent a reliability of an $i^{th}$ polarized channel.

There are N polarized channels, and therefore N metrics are obtained by calculating the reliabilities of the polarized channels. In other words, a metric set (which, for ease of description, is denoted by the set $W_N$ in the following description) is obtained.

103. A maximum mother code sequence $S_N$ is obtained by sorting sequence numbers of the polarized channels based on values of the metrics in $W_N$.

Specifically, the N polarized channels are in one-to-one correspondence with the N metrics, and each metric is used to represent a reliability of a corresponding polarized channel. The reliabilities of the N polarized channels are sorted based on values of the N metrics in the set $W_N$, and a sorting result is recorded by using the sequence numbers of the polarized channels, to obtain the sequence $S_N$. In other words, the sequence $S_N$ includes N sequence numbers, and ordering of the N sequence numbers indicates ordering of the reliabilities of the N polarized channels.

It can be understood that the sorting in step 103 is performed depending on a parameter selected for measuring the reliabilities of the polarized channels in step 102. It can be learned from the description in step 102 that, in step 103, the ordering of the polarized channels may be optionally determined based on the polarization weight, the error probability, the channel capacity, or another parameter that can measure the reliabilities of the polarized channels. This is not limited in this embodiment of this application.

It should be noted that, the sequence numbers of the polarized channels may be sorted in ascending order or descending order. This is not particularly limited in this embodiment of this application.

In this embodiment of this application, the maximum mother code sequence is stored in a coding device. Afterwards, when performing polar coding, the coding device may first obtain the maximum mother code sequence, and then perform polar coding by using the maximum mother code sequence. Specifically, the coding device first reads, from the maximum mother code sequence, a mother code sequence in a required length, then determines an information bit index set (which is also referred to as an information bit sequence number set) based on the read mother code sequence, and finally performs polar coding on to-be-coded bits by using the information bit index set.

104. For a polar code whose length is M ($M \leq N$), a mother code length L that is most approximate to M is selected.

Specifically, two cases are differentiated when a mother code sequence of the polar code whose length is M is determined.

Case 1

$M=2^m$, where m is a positive integer.

The length of the polar code is the $m^{th}$ power of 2. For example, M=4 or 8. In this case, a value of the mother code length L of the polar code is M.

Case 2

$M \neq 2^m$, where m and M are positive integers.

The length of the polar code is not a value of the $m^{th}$ power of 2. For example, M=5, 7, 11, or the like. In this case, a value of the mother code length L of the polar code may be calculated based on a formula $L=2^{\lceil \log_2 M \rceil}$. The symbol $\lceil \ \rceil$ represents rounding up.

For example, when M=5, the value of L is $L=2^{\lceil \log_2 5 \rceil}=8$. For another example, when M=9, the value of L is $L=2^{\lceil \log_2 9 \rceil}=2^4=16$.

105. A sequence $S_1$ is obtained by successively reading, from the sequence $S_N$ based on index order, L sequence numbers that are less than L.

It should be understood that, when L<N, the sequence $S_1$ (an example of the first sequence) is a sub-sequence of the sequence $S_N$. When L=N, the sequence $S_1$ is the sequence $S_N$.

In step 104, if polar coding needs to be performed to obtain the polar code whose length is M, the mother code length is L. In step 105, the sequence $S_1$ that is used as the mother code of the polar code is read from the sequence $S_N$. Specifically, when the sequence $S_1$ is read, sequence numbers that are less than L need to be successively read based on index order of the sequence $S_N$.

With reference to FIG. 2, the following describes, by using an example, how the mother code sequence $S_1$ of the polar code is read.

FIG. 2 is a schematic diagram of reading a sequence in any code length from the maximum mother code sequence according to this embodiment of this application. As shown in FIG. 2, first, it is assumed that the maximum mother code length supported by the system is N=16. Correspondingly, there should be 16 sequence numbers stored in the sequence $S_N$, and ordering of the 16 sequence numbers corresponds to ordering of reliabilities of 16 polarized channels. It is assumed that a sequence $S_N$ obtained by sorting the reliabilities of the 16 polarized channels in ascending order is {0, 1, 2, 4, 8, 3, 5, 6, 9, 10, 12, 7, 11, 13, 14, 15}. For example, L=8. A sequence $S_1$ obtained by successively reading, from the sequence $S_N$, sequence numbers that are less than L (that is, less than 8) is {0, 1, 2, 4, 3, 5, 6, 7}. For another example, L=4. A sequence $S_1$ obtained by successively reading, from the sequence $S_N$, sequence numbers that are less than L (that is, less than 4) is {0, 1, 2, 3}.

106. Coded bits of the polar code whose length is M is obtained according to a shortening method using the sequence $S_1$.

Specifically, the sequence $S_1$ is used as the mother code sequence, and the polar code whose code length is M (that is, a target polar code) may be obtained according to the shortening (English name: Shorten, one of polar code puncturing schemes) method.

It can be learned from the foregoing process that, in this embodiment of this application, the system needs to store only one sequence (that is, the maximum mother code sequence that can be supported by the system). During implementation, the mother code sequence in the required length is read from the maximum mother code sequence based on the mother code length required by the polar code, so that storage overheads of the system can be reduced.

A specific maximum mother code sequence (denoted by a sequence #A in the following description) when N=65536 is as follows.

The sequence #A={0 1 2 4 8 16 3 32 5 6 9 64 10 17 12 18 128 33 20 34 7 24 36 65 11 256 66 40 13 19 68 14 129 48 21 72 130 35 22 25 512 132 37 80 26 38 257 67 136 41 28 258 96 69 42 15 144 49 260 70 44 73 131 50 23 1024 264 74 160 513 133 52 81 27 76 514 134 39 272 82 137 56 29 516 259 192 97 138 84 43 30 145 288 98 261 71 520 140 45 88 146 51 262 100 1025 46 265 75 2048 161 528 148 53 320 1026 266 104 77 162 515 135 54 273 83 152 57 1028 268 78 544 164 517 274 193 112 139 85 58 31 1032 518 384 289 194 99 276 168 86 521 141 60 89 147 290 576 263 196 101 522 142 1040 47 280 90 2049 176 529 149 292 102 321 1027 524 267 200 105 2050 92 163 530 150 55 4096 322 1056 153 296 1029 106 269 79 640 545 2052 165 532 275 208 113 154 324 59 1030 270 108 546 1033 166 519 385 304 195 114 2056 277 169 87 536 156 61 1088 328 1034 548 386 291 224 577 278 197 170 116 523 143 1041 62 281 91 2064 177 1036 768 578 388 293 198 103 552 336 172 1042 525 282 201 120 2051 93 178 531 151 294 580 4097 323 1152 1057 526 392 297 202 1044 107 284 2080 94 641 560 2053 180 533 4098 209 352 1058 155 325 298 1031 584 271 204 109 642 547 2054 1048 167 534 400 305 210 115 2057 4100 184 326 537 1060 157 300 1089 110 329 8192 1035 644 549 387 2112 306 225 592 2058 279 212 171 117 538 158 1280 63 1090 4104 330 1064 2065 550 416 1037 769 226 579 389 308 199 648 118 553 2060 337 173 1043 540 283 216 121 1092 2066 332 179 1038 770 608 390 295 228 581 4112 554 338 1153 174 1072 527 393 312 203 1045 122 2176 285 2081 95 656 561 2068 181 1096 772 582 4099 448 353 1154 1059 556 394 340 299 232 1046 585 286 205 2082 124 643 562 2055 1049 182 535 401 4128 211 354 2072 1536 4101 185 327 1156 776 1061 586 396 301 206 1104 111 672 344 8193 2084 1050 645 564 402 2113 307 240 593 2059 4102 213 186 356 539 1062 159 1281 302 1091 588 4105 331 1160 8194 1065 646 2304 551 417 2114 1052 784 227 594 404 2088 309 214 649 119 568 2061 4160 188 1282 541 1120 4106 217 360 1093 1066 2067 333 8196 418 1039 771 704 609 391 2116 310 229 650 596 4113 555 2062 339 1168 175 1073 542 408 313 218 1284 123 1094 2177 4108 2096 334 657 1068 800 2069 610 420 1097 773 230 583 4114 449 8200 368 1155 652 1074 557 395 2120 341 314 233 1047 600 2178 287 220 2083 125 658 16384 563 2070 1288 183 1098 774 4224 612 4129 450 355 1184 2073 1537 4116 558 424 342 1157 777 234 1076 587 397 316 207 2560 1105 126 673 2180 345 8208 2085 1051 660 565 403 2128 4130 241 1100 832 2074 1538 4103 452 187 357 1158 778 1063 616 398 1296 303 236 1106 589 4120 674 346 1161 8195 2086 1080 647 2305 566 432 2115 1053 785 242 2184 595 405 2089 4132 215 664 358 569 2076 1540 4161 189 1283 1216 780 1121 590 4107 456 361 1162 8224 1108 1067 676 2306 348 8197 419 2144 1054 786 705 624 406 2117 2090 311 244 651 597 4352 570 2063 4162 1169 190 1312 543 409 1122 4136 219 1285 362 1095 2192 1544 4109 2097 335 1164 8198 896 1069 801 706 2308 611 421 2118 1112 788 231 680 598 4115 464 8201 2092 369 1170 653 1075 572 410 2121 4164 315 248 1286 601 1124 2179 4110 221 2098 364 659 16385 1070 802 2071 1289 8256 422 1099 775 708 4225 613 4144 451 3072 8202 370 1185 654 2312 1552 4117 559 425 2122 343 1172 792 235 1077 602 412 2208 317 222 2561 1344 127 688 16386 2181 4168 8209 2100 1290 661 1128 804 4226 2129 614 4131 480 1101 833 1186 2075 1539 4118 453 8204 426 372 1159 779 712 1078 617 399 2124 1297 318 237 2562 1107 604 4121 675 2182 347 1176 8210 2087 1081 662 2320 16388 567 433 2130 1292 4608 243 1102 2185 834 4228 2104 1568 4133 454 665 359 1188 808 2077 1541 4176 618 428 1298 1217 781 238 1136 591 4122 457 8320 376 1163 8225 2564 1109 1082 677 2307 2240 349 8212 434 2145 1055 787 720 2186 625 407 2132 2091 4134 245 666 16392 836 4353 571 2078 1542 4163 1408 191 1313 1218 782 4232 1123 620 4137 458 1300 363 1192 8226 1110 2193 1545 4124 678 2336 350 1165 8199 897 2146 1084 816 707 2309

626 436 2119 2568 1113 789 246 681 2188 599 4354 465
8216 2093 4192 1171 668 1314 573 411 2136 1600 4165
4138 249 1287 1220 840 1125 2194 1546 4111 460 2099
365 1166 8228 898 16400 1071 803 736 2310 1304 8257
423 2148 1114 790 709 4240 682 628 4145 466 3073 8203
2094 371 1200 655 2313 1553 4356 574 440 2123 4166
1173 793 250 1316 32768 603 413 1126 2209 4140 223
2576 1345 366 689 16387 2196 1548 4169 8448 2101 1291
1224 8258 900 1129 805 710 4227 2368 615 4146 481 3074
8232 1116 848 1187 684 2314 1554 4119 468 8205 427
2152 373 1174 794 713 1079 632 414 2125 5120 2210 319
252 2563 1346 605 4360 690 16416 2183 4170 1177 8211
2102 1320 663 2321 16389 1130 806 4256 2131 1293 8260
4609 482 1103 2200 835 1664 4229 2105 1569 4148 455
3076 8206 904 374 1189 809 714 2316 1556 4177 619 429
2126 1299 1232 796 239 2592 1137 606 4123 472 8321
2212 377 1178 8240 2565 1348 1083 692 2322 16390 2241
4172 8213 435 2160 1294 4610 721 1132 2187 864 4230
2133 2106 1570 4135 484 667 16393 837 4368 1190 810
2079 1543 4178 1409 8264 430 1328 1219 783 716 4233
1138 621 4152 459 3080 8322 1301 378 1193 8227 2566
1111 2432 1560 4125 679 2337 2242 351 1180 8214 912
2147 1085 817 722 2324 16448 2216 627 437 2134 2569
1352 4612 247 696 16394 2189 838 4355 4288 8217 2108
1572 4193 1410 669 1315 1248 812 4234 2137 1601 4180
622 4139 488 1302 1221 841 1194 8704 1140 2195 1547
4126 461 8324 2338 380 1167 8229 899 2624 16401 1086
818 737 2311 2244 1305 8272 438 2149 2570 1115 791 724
4241 683 2190 629 4384 467 3088 8218 2095 4194 1201
670 2328 16396 1792 4357 575 441 2138 1602 4167 1412
4616 251 1317 1222 32769 842 4236 1127 2224 1576 4141
462 2577 1360 367 1196 8230 928 16402 2197 1549 4184
8449 738 2340 1306 1225 8259 901 2150 1144 820 711
4242 2369 8328 630 4147 496 3075 8233 2572 1117 849
1202 685 2315 2248 1555 4358 469 8220 442 2153 4196
1175 795 728 1318 32770 633 415 2140 1604 5121 2211
4142 253 2578 1347 16512 844 4361 691 16417 2198 1550
4171 1416 8450 2103 1321 1226 8288 902 6144 16404 1131
807 740 4257 2370 1308 8261 4624 483 3104 8234 1118
2201 850 1665 4244 686 2344 1584 4149 470 3077 8207
905 2154 375 1204 824 715 2317 1557 4416 634 444 2127
5122 2688 1233 797 254 2593 1376 32772 607 4362 473
8336 16418 2213 4200 1179 8241 2580 1349 1322 693 2323
16391 2256 1608 4173 8452 4258 2161 1295 1228 8262
4611 960 1133 2202 865 1666 4231 2372 2107 1571 4150
485 3078 8236 906 16408 852 4369 1191 811 744 2318
1558 4179 1424 8265 431 2156 1329 1234 798 717 4248
2594 1139 636 4153 474 3081 8323 5124 2214 379 1208
8242 2567 1350 2433 1561 4364 694 2352 16420 2243 4174
1181 8215 913 2162 1324 4640 32776 723 2325 16449 1134
2217 866 4260 2135 2584 1353 9216 4613 486 697 16395
2204 839 4370 1668 4289 8456 2109 1573 4208 1411 3136
8266 908 1330 1249 813 718 4235 2376 1616 4181 623
4154 489 3082 8352 1303 1236 856 1195 8705 2596 1141
2434 1562 4127 476 8325 2339 2272 381 1182 8244 914
2625 16640 1087 819 752 2326 16450 2245 5128 2218 8273
439 2164 2571 1354 4614 725 4480 698 16424 2191 868
4385 4290 3089 8219 2110 1574 4195 1440 671 2329 16397
1793 4372 1250 814 4264 2139 1603 4182 1413 8268 4617
490 1332 1223 32784 843 1672 4237 8706 1142 2225 1577
4156 463 3084 8326 2816 1361 382 1197 8231 929 2626
16403 2436 1564 4185 8464 739 2341 2246 1307 1240 8274
916 2151 2600 1145 821 726 4243 2384 16452 8329 2220
631 4386 497 3090 8248 2573 1356 4672 1203 700 2330
16398 2249 1794 4359 4292 8221 443 2168 1632 4197 1414
4618 729 1319 1252 32771 872 4238 2141 1605 5136 2226
1578 4143 492 2579 1362 16513 845 4376 1198 8708 930
16432 2199 1551 4186 1417 8451 8384 2342 1336 1227
8289 903 2628 6145 16405 1146 822 741 4272 2371 3200
8330 1309 8276 4625 498 3105 8235 2574 1119 2440 851
1680 4245 687 2345 2250 1585 4388 471 3092 8222 920
2155 4198 1205 825 730 2332 16456 1796 4417 32800 635
445 2142 1606 5123 2689 1472 4620 255 2608 1377 16514
32773 846 4363 4296 8337 16419 2228 1580 4201 1418
8480 2581 1364 1323 1256 8290 932 6146 16406 2257 1609
4188 8453 742 4259 2400 1310 1229 8263 4626 961 3106
8712 1148 2203 880 1667 4246 2373 8332 2346 1586 4151
500 3079 8237 907 2632 16409 853 1206 826 745 2319
2252 1559 4418 1425 8280 446 2157 5152 2690 1235 799
732 4249 2595 1378 32774 637 4392 475 3096 8338 16896
5125 2215 4202 1209 8243 2582 1351 2448 16516 1800
4365 695 2353 16421 2258 1610 4175 1420 8454 4736 2163
1325 1230 8292 4641 32777 962 6148 16464 1135 2232 867
1696 4261 2374 2585 1368 9217 4628 487 3108 8238 936
16410 2205 854 4371 1669 4304 8457 746 2348 1588 4209
1426 3137 8267 909 2158 1331 1264 828 719 4250 2377
10240 1617 4420 638 4155 504 3083 8353 5126 2692 1237
857 1210 8720 2597 1380 2435 32832 1563 4366 477 8340
2354 16422 2273 4204 1183 8245 915 2640 16641 1326
4642 32778 753 2327 16451 2260 1612 5129 2219 8512
4262 2165 2586 1355 16520 9218 4615 964 4481 699 16425
2206 869 4400 1670 4291 3328 8458 2111 1575 4210 1441
3138 8296 910 6152 16412 1808 4373 1251 815 748 4265
2378 1618 4183 1428 8269 4632 491 3112 8354 1333 1238
32785 858 1673 4252 8707 2598 1143 2464 1592 4157 478
3085 8327 2817 5184 2274 383 1212 8246 944 2627 16642
2437 1565 4424 8465 754 2356 16480 2247 5130 2696 1241
8275 917 2166 2601 1384 4644 32780 727 4482 2385 16453
8344 16426 2221 870 4387 4320 3091 8249 2588 1357 9220
4673 1442 701 2331 16399 2264 1795 4374 1728 4293 8460
4266 2169 1633 4212 1415 3140 8270 4619 968 1334 1253
32786 873 1674 4239 8736 2380 1620 5137 2227 1579 4158
493 3086 8356 2818 1363 16528 860 4377 1199 8709 931
2656 16433 2438 1566 4187 1432 8466 8385 2343 2276
1337 1242 8304 918 2629 6160 16644 2602 1147 823 756
4273 2386 16454 3201 8331 5132 2222 8277 4864 499 3120
8250 2575 1358 2441 4674 1681 4484 702 2360 16428 2251
1824 4389 4294 3093 8223 921 2170 1634 4199 1444 4648
32896 731 2333 16457 1797 4432 1254 32801 874 4268
2143 1607 5138 2704 1473 9224 4621 494 2609 1392 16515
32788 847 4378 1676 4297 8710 8576 16434 2229 1581
4216 1419 8481 3144 8386 2820 1365 1338 1257 8291 933
2630 6147 16407 2496 1624 4189 8468 743 4274 2401 3202
8360 1311 1244 8278 4627 976 3107 8713 2604 1149 2442
881 1682 4247 2388 17408 8333 2347 2280 1587 4390 501
3094 8252 922 2633 16648 4676 1207 827 760 2334 16458
2253 1798 4419 5248 32802 8281 447 2172 1636 5153 2691
1474 4622 733 4488 2610 1379 16544 32775 876 4393 4298
3097 8339 16897 5140 2230 1582 4203 1448 8482 2583
1366 2449 16517 1801 4380 1258 8768 934 6176 16436
2259 1611 4190 1421 8455 8388 4737 2402 1340 1231 8293
4656 32792 963 3584 6149 8714 16465 1150 2233 882 1697
4276 2375 3204 8334 2824 1369 9232 4629 502 3109 8239
937 2634 16411 2444 855 1684 4305 8472 747 2349 2254
1589 4448 1427 3152 8282 924 2159 5154 2720 1265 829
734 4251 2392 16460 10241 1856 4421 32804 639 4394 505
3098 8368 16898 5127 2693 1476 4680 1211 8721 2612
1381 2450 16518 32833 1802 4367 4300 8341 2355 16423
2288 1640 4205 1422 8484 4738 2641 16656 1327 1260
8294 4643 32779 992 6150 16466 2261 1613 5144 2234
8513 1698 4263 2404 2587 1370 16521 9219 4630 965 4496
3110 8716 938 16440 2207 884 4401 1671 4306 3329 8459
8392 2350 1590 4211 1456 3139 8297 911 2636 6153 16413
1809 1266 830 749 4280 2379 3208 10242 1619 4422 1429

8284 4633 506 3113 8355 5156 2694 1239 33024 859 1688
4253 8722 2599 1382 2465 32834 1593 4396 479 3100 8342
2832 16900 5185 2275 4206 1213 8247 945 2642 16643
2452 16576 1804 4425 12288 32808 755 2357 16481 2262
1614 5131 2697 1480 8514 4740 2167 2616 1385 16522
9248 4645 32781 966 4483 6208 16468 8345 16427 2236
871 4402 1700 4321 3330 8488 2589 1372 9221 4688 1443
3168 8298 940 6154 16414 2265 1810 4375 1729 4308 8461
750 4267 2408 1648 4213 1430 3141 8271 4634 969 3114
8832 1335 1268 32787 888 1675 4254 8737 2381 10244
1621 5376 2466 1594 4159 508 3087 8357 2819 5186 2752
16529 861 1214 8724 946 2657 16672 2439 32836 1567
4426 1433 8467 8400 2358 16482 2277 5160 2698 1243
8305 919 2644 6161 16645 2603 1386 4646 32782 757 4512
2387 16455 3216 8346 16904 5133 2223 8516 4865 4322
3121 8251 2590 1359 2456 16524 9222 4675 1920 4485 703
2361 16429 2266 1825 4404 1730 4295 3332 8462 4744
2171 1635 4214 1445 3142 8300 4649 32897 970 6156
16472 1812 4433 1255 32816 875 1704 4269 8738 2382
1622 5139 2705 1488 9225 4636 495 3116 8358 2848 1393
16530 32789 862 4379 1677 4312 8711 8577 2658 16435
2468 1596 4217 1434 8496 3145 8387 2821 5188 2278 1339
1272 8306 948 2631 6162 16646 2497 10248 1625 4428
8469 758 4275 2416 16484 3203 8361 5134 2700 1245 8279
4866 977 3122 8728 2605 1388 2443 4704 32840 1683 4486
2389 17409 8348 2362 16430 2281 1826 4391 4324 3095
8253 923 2648 16649 9280 4677 1446 4650 32898 761 2335
16459 2268 1799 4434 1732 5249 32803 8520 4270 2173
1637 5168 2706 1475 18432 9226 4623 972 4489 2611 1394
16545 32790 877 4408 1678 4299 8740 3336 8578 16912
5141 2231 1583 4218 1449 8483 3146 8416 2822 1367 6272
16532 1816 4381 1259 8769 935 2660 6177 16437 2498
1626 4191 1436 8470 8389 4752 2403 3232 8362 1341 1246
8308 4657 32793 978 3585 6164 8715 16704 2606 1151
2472 883 1712 4277 2390 17410 3205 8335 2825 5192 2282
9233 4868 503 3124 8254 952 2635 16650 2445 4678 1685
4544 8473 762 2364 16488 2255 1828 4449 5250 33280
3153 8283 925 2174 1638 5155 2721 1504 4652 32900 735
4490 2393 16461 10256 1857 4436 16546 32805 878 4395
4328 3099 8369 16899 5142 2708 1477 9228 4681 1450
8960 2613 1396 2451 16519 32848 1803 4382 1736 4301
8770 8580 6178 16438 2289 1641 4220 1423 8485 3148
8390 4739 2880 16657 1342 1261 8295 4658 32794 993
3586 6151 8744 16467 2500 1628 5145 2235 8528 1699
4278 2405 3206 8364 2826 1371 16536 9234 4631 980 4497
3111 8717 939 2664 16441 2446 885 1686 4307 3344 8474
17412 8393 2351 2284 1591 4450 1457 3154 8312 926 2637
6168 16652 5632 2722 1267 831 764 4281 2394 16462 3209
10243 1858 4423 5252 32806 8285 4872 507 3128 8370
16928 5157 2695 1478 33025 4682 1689 4492 8723 2614
1383 2480 16548 32835 1832 4397 4302 3101 8343 2833
16901 5200 2290 1642 4207 1452 8486 4768 32904 2643
16658 2453 16577 1805 4440 1262 8772 12289 32809 994
6180 16496 2263 1615 5146 2712 1481 8515 9344 4741
2406 2617 1400 16523 9249 4660 32796 967 4498 3588
6209 8718 16469 8584 16442 2237 886 4403 1701 4336
3331 8489 3264 8394 2828 1373 9236 4689 1458 3169 8299
941 2638 6155 16415 2504 1811 1744 4309 8476 751 4282
2409 3210 10272 1649 4452 1431 3156 8286 4635 984 3115
8833 5158 2724 1269 33026 889 1690 4255 8752 2396
17416 10245 1860 5377 2467 32864 1595 4398 509 3102
8372 2834 16902 5187 2753 16768 4684 1215 8725 947
2672 16673 2454 16578 32837 1806 4427 5256 12290
32810 8401 2359 16483 2292 1644 5161 2699 1482 8544
4742 2645 6400 16660 2618 1387 16552 9250 4647 32783
996 4513 6210 16470 3217 8347 16905 5148 2238 8517
4880 1702 4323 3360 8490 2591 1374 2457 16525 9223

4690 1921 4500 3170 8776 942 6184 16444 2267 1840 4405
1731 4310 3333 8463 8396 4745 2410 1650 4215 1460 3143
8301 4664 32912 971 3592 6157 8834 16473 1813 1270
32817 890 1705 4284 8739 2383 3212 10246 1623 5378
2944 1489 9240 4637 510 3117 8359 2849 5216 2754 16531
33028 863 1692 4313 8726 8592 2659 16674 2469 32838
1597 4456 1435 8497 3160 8402 2836 16960 5189 2279
5162 2728 1273 8307 949 2646 6163 16647 2512 16580
10249 1864 4429 12292 32812 759 4514 2417 16485 3218
8376 16906 5135 2701 1484 8518 4867 4800 3123 8729
2620 1389 2458 16526 9252 4705 32841 1922 4487 6212
17424 8349 2363 16431 2296 1827 4406 1760 4325 3334
8492 4746 2649 16664 9281 4692 1447 3172 8302 4651
32899 1000 6158 16474 2269 1814 4435 1733 5264 32818
8521 1706 4271 2412 1652 5169 2707 1490 18433 9227
4638 973 4504 3118 8836 2850 1395 16560 32791 892 4409
1679 4314 8741 3337 8579 10304 16913 5380 2470 1598
4219 1464 8498 3147 8417 2823 5190 2756 6273 16533
1817 1274 8784 950 2661 6192 16676 2499 33792 10250
1627 4430 1437 8471 8404 4753 2418 16486 3233 8363
5164 2702 1247 8309 4896 33032 979 3600 6165 8730
16705 2607 1390 2473 4706 32842 1713 4516 2391 17411
3220 8350 2840 16908 5193 2283 9472 4869 4326 3125
8255 953 2650 16651 2460 16584 9282 4679 1924 4545
12296 32928 763 2365 16489 2270 1829 4464 1734 5251
33281 3392 8522 4748 2175 1639 5170 2736 1505 18434
9256 4653 32901 974 4491 6216 16476 10257 1872 4437
16547 32820 879 4410 1708 4329 8742 3338 8608 16914
5143 2709 1492 9229 4696 1451 8961 3176 8418 2852 1397
6274 16534 32849 1818 4383 1737 4316 8771 8581 2662
6179 16439 2528 1656 4221 1438 8500 3149 8391 4754
2881 20480 3234 8840 1343 1276 8310 4659 32795 1008
3587 6166 8745 16706 2501 10252 1629 5384 2474 8529
1714 4279 2420 17440 3207 8365 2827 5194 2760 16537
9235 4870 981 3126 8732 954 2665 16680 2447 4708 32844
1687 4546 3345 8475 17413 8408 2366 16490 2285 1830
4451 5280 33282 3155 8313 927 2652 6169 16653 9284
5633 2723 1506 4654 32902 765 4520 2395 16463 3224
10258 1859 4438 17024 5253 32807 8524 4873 4330 3129
8371 16929 5172 2710 1479 33040 18436 9230 4683 1928
4493 8962 2615 1398 2481 16549 32850 1833 4412 1738
4303 8800 3340 8582 6656 16916 5201 2291 1643 4222
1453 8487 3150 8420 4769 32905 2882 16659 6276 16592
1820 4441 1263 8773 12304 32824 995 3616 6181 8746
16497 2502 1630 5147 2713 1496 8530 9345 4756 2407
3236 8366 2856 1401 16538 9264 4661 32797 982 4499
3589 6224 8719 16708 8585 2666 16443 2476 887 1716
4337 3346 8504 17414 3265 8395 2829 5196 2286 9237
4928 1459 3184 8314 956 2639 6170 16654 2505 5634
10368 1745 4548 8477 766 4283 2424 16492 3211 10273
1888 4453 5254 33284 3157 8287 4874 985 3130 8848
16930 5159 2725 1508 33027 4712 32960 1691 4494 8753
2397 17417 10260 1861 5392 2482 16550 32865 1834 4399
4332 3103 8373 2835 16903 5202 2768 16769 9288 4685
1454 8964 4770 32906 2673 16688 2455 16579 32852 1807
4442 1740 5257 8774 12291 32811 8640 6182 16498 2293
1645 5176 2714 1483 8545 18440 9346 4743 2884 6401
16661 2619 1402 16553 9251 4662 32798 997 4528 3590
6211 8748 16471 3456 8586 16920 5149 2239 8532 4881
1703 4338 3361 8491 3266 8424 2830 1375 6280 16540
9238 4691 1936 4501 3171 8777 943 2668 6185 16445 2506
1841 1746 4311 3348 8478 17472 8397 4760 2411 3240
10274 1651 4454 1461 3158 8316 4665 32913 986 3593
6172 8835 16712 5636 2726 1271 33056 891 1720 4285
8754 2398 17418 3213 10247 1862 5379 2945 5312 32866
9241 4876 511 3132 8374 2864 16932 5217 2755 16770
33029 4686 1693 4552 8727 8593 2674 16675 2484 16608

32839 1836 4457 5258 12320 33288 3161 8403 2837 16961
5204 2294 1646 5163 2729 1512 8546 4772 32908 2647
6402 16662 2513 16581 10264 1865 4444 16554 9728
12293 32813 998 4515 6240 16500 3219 8377 16907 5150
2716 1485 8519 4882 9348 4801 3362 8968 2621 1404 2459
16527 9253 4720 32856 1923 4502 3648 6213 8778 17425
8588 6186 16446 2297 1842 4407 1761 4340 3335 8493
3268 8398 4747 2888 16665 9296 4693 1462 3173 8303
4666 32914 1001 3594 6159 8864 16475 2508 1815 1748
5265 32819 8536 1707 4286 2413 3214 10276 1653 5408
2946 1491 18448 9242 4639 988 4505 3119 8837 2851 5218
2784 16561 33030 893 1694 4315 8756 3352 8594 17420
10305 17152 5381 2471 32868 1599 4458 1465 8499 3162
8432 2838 16962 5191 2757 6288 16772 5640 2730 1275
8785 951 2676 6193 16677 2514 16582 33793 10251 1866
4431 5260 12294 32814 8405 4992 2419 16487 3248 8378
16936 5165 2703 1486 8548 4897 33033 4802 3601 6404
8731 16720 2622 1391 2488 16556 9254 4707 32843 1952
4517 6214 17426 3221 8351 2841 16909 5208 2298 9473
4884 1762 4327 3364 8494 4776 34816 2651 16666 2461
16585 9283 4694 1925 4560 3174 8780 12297 32929 1002
6188 16504 2271 1844 4465 1735 5266 33296 3393 8523
9352 4749 2414 1654 5171 2737 1520 18435 9257 4668
32916 975 4506 3596 6217 8838 16477 10496 1873 16562
32821 894 4411 1709 4344 8743 3339 8609 3272 10306
16915 5382 2948 1493 9244 4697 1466 8976 3177 8419
2853 5220 2758 6275 16535 33088 1819 1752 4317 8786
8596 2663 6194 16678 2529 33794 10280 1657 4460 1439
8501 3164 8406 4755 2896 16964 20481 3235 8841 5166
2732 1277 8311 4898 33034 1009 3602 6167 8760 16707
2516 17536 10253 1868 5385 2475 12352 32872 1715 4518
2421 17441 3222 8380 2842 16910 5195 2761 16776 9474
4871 4804 3127 8733 955 2680 16681 2462 16586 9312
4709 32845 1926 4547 7168 12298 17428 32930 8409 2367
16491 2300 1831 4466 1764 5281 33283 3394 8552 4750
2653 6408 16668 9285 5648 2738 1507 18464 9258 4655
32903 1004 4521 6218 16478 3225 10259 1874 4439 17025
5268 32822 8525 4888 1710 4331 3368 8610 16944 5173
2711 1494 33041 18437 9231 4698 1929 4508 8963 3178
8896 2854 1399 6304 16564 32851 1848 4413 1739 4318
8801 3341 8583 10308 6657 16917 5440 2530 1658 4223
1468 8502 3151 8421 4784 32920 2883 20482 3712 6277
8842 16593 1821 1278 8788 12305 32825 1010 3617 6196
8747 16736 2503 33796 10254 1631 5386 2952 1497 8531
9360 4757 2422 17442 3237 8367 2857 5224 2762 16539
9265 4900 33036 983 3604 6225 8734 16709 8600 2667
16682 2477 4710 32846 1717 4576 3347 8505 17415 3280
8410 2844 16968 5197 2287 9476 4929 5282 33312 3185
8315 957 2654 6171 16655 2520 16588 9286 5635 10369
1984 4549 12300 32932 767 4522 2425 16493 3226 10288
1889 4468 17026 5255 33285 3396 8526 4875 4808 3131
8849 16931 5174 2740 1509 33042 18438 9260 4713 32961
1930 4495 8992 6220 17432 10261 1876 5393 2483 16551
32880 1835 4414 1768 4333 8802 3342 8612 6658 16918
5203 2769 16784 9289 4700 1455 8965 3180 8422 4771
32907 2912 16689 6278 16594 32853 1822 4443 1741 5272
8775 12306 32826 8641 3618 6183 16499 2532 1660 5177
2715 1498 8560 18441 9347 4758 2885 6416 20484 3238
8844 2858 1403 16568 9266 4663 32799 1012 4529 3591
6226 8749 16710 3457 8587 10312 16921 5388 2478 8533
1718 4339 3376 8506 17444 3267 8425 2831 5198 2764
6281 16541 9239 4930 1937 3186 8792 958 2669 6200
16684 2507 5664 33800 10370 1747 4550 3349 8479 17473
8412 4761 2426 16494 3241 10275 1890 4455 5284 33286
3159 8317 4904 33152 987 3608 6173 8850 16713 24576
5637 2727 1510 33057 4714 32962 1721 4524 8755 2399
17419 3228 10262 1863 5394 2960 17028 5313 32867 9480

4877 4334 3133 8375 2865 16933 5232 2770 16771 33044
18496 9290 4687 1932 4553 8966 12416 32936 2675 16690
2485 16609 32854 1837 4472 1742 5259 8804 12321 33289
3400 8642 6660 16976 5205 2295 1647 5178 2744 1513
8547 18442 9376 4773 32909 2886 6403 16663 6336 16596
10265 1880 4445 16555 9729 12308 32828 999 4530 3620
6241 8750 16501 3458 8616 16922 5151 2717 1500 8534
4883 9349 4816 3363 8969 3296 8426 2860 1405 6282
16542 9268 4721 32857 1938 4503 3649 6228 8779 17664
8589 2670 6187 16447 2536 1843 1776 4341 3350 8508
17474 3269 8399 4762 2889 20488 3242 10752 9297 4932
1463 3188 8318 4667 32915 1016 3595 6174 8865 16714
2509 5638 10372 1749 5504 33058 8537 1722 4287 2428
17448 3215 10277 1892 5409 2947 5314 33344 18449 9243
4878 989 3134 8852 2866 16934 5219 2785 16800 33031
4716 32964 1695 4554 8757 3353 8595 17421 10320 17153
5396 2486 16610 32869 1838 4459 5288 12322 33290 3163
8433 2839 16963 5206 2772 6289 16773 9292 5641 2731
1514 9024 4774 32910 2677 6432 16692 2515 16583 33808
10266 1867 4446 17032 5261 9730 12295 32815 8644 4993
6242 16502 3249 8379 16937 5180 2718 1487 8549 4912
33048 18444 9350 4803 3840 6405 8970 16721 2623 1406
2489 16557 9255 4722 32858 1953 4532 3650 6215 8808
17427 3460 8590 6664 16924 5209 2299 9488 4885 1763
4342 3365 8495 3270 8428 4777 34817 2890 16667 6284
16600 9298 4695 1940 4561 3175 8781 12312 32944 1003
3624 6189 8866 16505 2510 1845 1750 5267 33297 3408
8538 17476 9353 4764 2415 3244 10278 1655 5410 2976
1521 18450 9272 4669 32917 990 4507 3597 6232 8839
16716 10497 5696 2786 16563 33060 895 1724 4345 8758
3354 8624 17422 3273 10307 17154 5383 2949 5316 32870
9245 4936 1467 8977 3192 8434 2868 16992 5221 2759
6290 16774 33089 5642 10376 1753 4556 8787 8597 2678
6195 16679 2544 16612 33795 10281 1896 4461 5262
12324 33292 3165 8407 4994 2897 16965 20496 3250 8856
16938 5167 2733 1516 8550 4899 33035 4832 32968 3603
6406 8761 16722 2517 17537 10268 1869 5400 2490 16558
9732 12353 32873 1954 4519 6244 17456 3223 8381 2843
16911 5210 2776 16777 9475 4886 9408 4805 3366 8972
4778 34818 2681 16696 2463 16587 9313 4724 32860 1927
4562 3652 7169 8782 12299 17429 32931 8648 6190 16506
2301 1846 4467 1765 5296 33298 3395 8553 18560 9354
4751 2892 6404 16669 9300 5649 2739 1522 18465 9259
4670 32918 1005 4536 3598 6219 8868 16479 3464 10498
1875 17040 5269 32823 8540 4889 1711 4346 3369 8611
3274 10336 16945 5412 2950 1495 36864 18452 9246 4699
1944 4509 8978 3179 8897 2855 5222 2788 6305 16565
33090 1849 1754 4319 8816 3356 8598 17480 10309 6672
17156 5441 2531 33824 10282 1659 4462 1469 8503 3166
8436 4785 32921 2898 16966 20483 3713 6292 8843 16832
5644 2734 1279 8789 12544 33064 1011 3632 6197 8762
16737 2518 17538 33797 10255 1870 5387 2953 5320
12354 32874 9361 4996 2423 17443 3252 8382 2872 16940
5225 2763 16778 9504 4901 33037 4806 3605 6464 8735
16724 8601 2682 16683 2492 16616 9314 4711 32847 1956
4577 7170 12328 17430 33408 3281 8411 2845 16969 5212
2302 9477 4944 1766 5283 33313 3424 8554 4780 34820
2655 6410 16670 2521 16589 9287 5650 10384 1985 4564
18466 9736 12301 32933 1006 4523 6248 16508 3227
10289 1904 4469 17027 5270 33300 3397 8527 4890 9356
4809 3370 9088 16946 5175 2741 1524 33043 18439 9261
4728 32976 1931 4510 8993 3656 6221 8898 17433 10500
1877 6306 16566 32881 1850 4415 1769 4348 8803 3343
8613 3276 16376 10310 6659 16919 5442 3008 16785 9304 4701
1470 8980 3181 8423 4786 32922 2913 20512 3714 6279
8872 16595 33092 1823 1756 5273 8790 12307 32827 8656
3619 6198 16738 2533 33798 10284 1661 5416 2954 1499

8561 18456 9362 4759 2900 6417 17920 20485 3239 8845
2859 5226 2792 16569 9267 4902 33038 1013 3606 6227
8764 16711 3472 8602 17540 10313 17160 5389 2479
12356 32876 1719 4578 3377 8507 17445 3282 8440 2846
16970 5199 2765 6296 16780 9478 4931 5760 33314 3187
8793 959 2684 6201 16685 2522 16590 9316 5665 33801
10371 1986 4551 7172 12302 17488 32934 8413 5000 2427
16495 3256 10290 1891 4470 17056 5285 33287 3398 8556
4905 33153 4810 3609 6412 8851 16728 24577 5652 2742
1511 33072 18468 9262 4715 32963 1960 4525 8994 6222
17434 3229 10263 1878 5395 2961 17029 5328 32882 9481
4892 1770 4335 3372 8614 6688 16948 34824 5233 2771
16786 33045 18497 9291 4702 1933 4568 8967 3182 8900
12417 32937 2914 16691 6308 16624 32855 1852 4473
1743 5274 8805 12336 33304 3401 8643 11264 6661 16977
5444 2534 1662 5179 2745 1528 8562 18443 9377 4788
32924 2887 6418 20486 3716 6337 8846 16597 10504 1881
16570 9744 12309 32829 1014 4531 3621 6256 8751 16740
3459 8617 33856 10314 16923 5390 2956 1501 8535 9364
4817 3378 8984 17446 3297 8427 2861 5228 2766 6283
16543 9269 4960 33096 1939 3664 6229 8794 17665 8604
2671 6202 16686 2537 5666 33802 10400 1777 4580 3351
8509 17475 3284 8414 4763 2904 16972 20489 3243 10753
9536 4933 5286 33316 3189 8319 4906 33154 1017 3610
6175 8880 16715 2524 17544 24578 5639 10373 1988 5505
33059 12360 32992 1723 4526 2429 17449 3230 10292
1893 5424 2962 17030 5315 33345 18688 9482 4879 4812
3135 8853 2867 16935 5234 2800 16801 33046 18498 9320
4717 32965 1934 4555 8996 7176 12418 17436 32938
10321 17168 5397 2487 16611 32884 1839 4474 1772 5289
8806 12323 33291 3402 8672 6662 16978 5207 2773 6528
16788 9293 5656 2746 1515 9025 18472 9378 4775 32911
2916 6433 16693 6338 16598 33809 10267 1882 4447
17033 5276 9731 12310 32830 8645 5008 3622 6243 16503
3488 8618 16952 5181 2719 1502 8564 4913 33049 18445
9351 4818 3841 6420 8971 20544 3298 8904 2862 1407
6312 16572 9270 4723 32859 1968 4533 3651 6230 8809
17666 3461 8591 10316 6665 16925 5448 2538 9489 1778
4343 3380 8510 17504 3271 8429 4792 34832 2891 20490
3720 6285 10754 16601 9299 4934 1941 3190 8796 12313
32945 1018 3625 6204 8867 16744 2511 5668 33804 10374
1751 5506 33536 3409 8539 17477 9368 4765 2430 17450
3245 10279 1894 5411 2977 5344 33346 18451 9273 4908
33156 991 3612 6233 8854 16717 10512 24580 5697 2787
16802 33061 4718 32966 1725 4584 8759 3355 8625 17423
3288 10322 17155 5398 2964 17088 5317 32871 9484 4937
5290 12800 33320 3193 8435 2869 16993 5236 2774 6291
16775 33104 18500 9294 5643 10377 1992 4557 9026
12420 32940 2679 6434 16694 2545 16613 33810 10296
1897 4476 17034 5263 9760 12325 33293 3404 8646 4995
6720 16980 20497 3251 8857 16939 5182 2748 1517 8551
4914 33050 18446 9380 4833 32969 3842 6407 9000 16723
6340 17552 10269 1884 5401 2491 16559 9733 12368
32888 1955 4534 3680 6245 8810 17457 3462 8620 6666
16926 5211 2777 16792 9490 4887 9409 4820 3367 8973
3300 8430 4779 34819 2920 16697 6286 16602 9328 4725
32861 1942 4563 3653 7184 8783 12314 17668 32946 8649
3626 6191 16507 2540 1847 1780 5297 33299 3410 8568
17478 18561 9355 4766 2893 6424 20492 3246 10756 9301
5888 2978 1523 18480 9274 4671 32919 1020 4537 3599
6234 8869 16718 3465 10499 5698 10432 17041 5508
33062 8541 1726 4347 3384 8626 17452 3275 10337 17184
5413 2951 5318 33348 36865 18453 9247 4938 1945 8979
3194 8912 2870 16994 5223 2789 6320 16804 33091 5672
33920 10378 1755 4558 8817 3357 8599 17481 10324 6673
17157 5456 2546 16614 33825 10283 1898 4463 5292
12326 33294 3167 8437 5024 33160 2899 16967 20498

3728 6293 8858 16833 24584 5645 2735 1518 9028 12545
33065 4834 32970 3633 6436 8763 16752 2519 17539
33812 10270 1871 5402 2968 17036 5321 9734 12355
32875 9600 4997 6246 17458 3253 8383 2873 16941 5240
2778 16779 9505 4916 33052 18504 9410 4807 3844 6465
8974 16725 12424 34848 2683 16698 2493 16617 9315
4726 32862 1957 4592 3654 7171 8812 12329 17431 33409
3520 8650 6668 16984 5213 2303 9492 4945 1767 5298
33328 3425 8555 18562 9384 4781 34821 2894 6411 16671
6344 16604 9302 5651 10385 2000 4565 18467 9737 12316
32948 1007 4538 3628 6249 8870 16509 3466 10528 1905
17042 5271 33301 3412 8542 4891 9357 4824 3371 9089
3304 10338 16947 5414 2980 1525 36866 18454 9276 4729
32977 1946 4511 9008 3657 6236 8899 17672 10501 5700
2790 6307 16567 33120 1851 1784 4349 8818 3358 8628
17482 3277 10311 6674 17158 5443 3009 20608 33826
10760 9305 4940 1471 8981 3196 8438 4787 32923 2928
16996 20513 3715 6294 8873 16834 33093 5646 10380
1757 5512 8791 12546 33066 8657 3634 6199 16739 2548
17568 33799 10285 1900 5417 2955 5322 12384 33352
18457 9363 4998 2901 17921 20500 3254 8860 2874 16942
5227 2793 16808 9506 4903 33039 4836 32972 3607 6466
8765 16726 3473 8603 17541 10328 17161 5404 2494
16618 9792 12357 32877 1958 4579 7200 12320 17460
33410 3283 8441 2847 16971 5214 2780 6297 16781 9479
4946 9412 5761 33315 3426 9032 4782 34822 2685 6440
16700 2523 16591 9317 5680 33816 10386 1987 4566
18944 7173 9738 12303 17489 32935 8652 5001 6250
16510 3257 10291 1906 4471 17057 5300 33302 3399 8557
4920 33168 18564 9358 4811 3848 6413 9090 16729 24592
5653 2743 1526 33073 18469 9263 4730 32978 1961 4540
8995 3658 6223 8928 17435 3468 10502 1879 6784 17044
5329 32883 9496 4893 1771 4350 3373 8615 3278 10340
6689 16949 34825 5472 3010 16787 36868 18512 9306
4703 1948 4569 8982 3183 8901 12432 32952 2915 20514
3744 6309 8874 16625 33094 1853 1758 5275 8820 12337
33305 3416 8658 17484 11265 6676 17216 5445 2535
33828 10286 1663 5418 2984 1529 8563 18458 9392 4789
32925 2902 6419 17922 20487 3717 6352 8847 16836
10505 5704 2794 16571 9745 12548 33068 1015 3636 6257
8766 16741 3474 8632 17542 33857 10315 17162 5391
2957 5324 12358 32878 9365 5056 3379 8985 17447 3312
8442 2876 17000 5229 2767 6298 16782 9508 4961 33097
5762 40960 3665 6468 8795 17680 8605 2686 6203 16687
2552 16620 9318 5667 33803 10401 2016 4581 7174 12332
17490 33412 3285 8415 5002 2905 16973 20504 3258
10768 9537 4948 17058 5287 33317 3428 8558 4907 33155
4840 34880 3611 6414 8881 16730 2525 17545 24579 5654
10388 1989 5520 33074 18470 9740 12361 32993 1962
4527 6252 17464 3231 10293 1908 5425 2963 17031 5330
33360 18689 9483 4894 9416 4813 3374 9092 6690 16950
34826 5235 2801 16816 33047 18499 9321 4732 32980
1935 4570 8997 3660 7177 8902 12419 17437 32939 10560
17169 6310 16626 32885 1854 4475 1773 5304 8807 12338
33306 3403 8673 18568 11266 6663 16979 5446 3012 6529
16789 9308 5657 2747 1530 9040 18473 9379 4790 32926
2917 6448 20516 3718 6339 8876 16599 34048 10506 1883
17048 5277 9746 12311 32831 8660 5009 3623 6258 16742
3489 8619 33858 10344 16953 5420 2958 1503 8565 36872
18460 9366 4819 3856 6421 8986 17924 20545 3299 8905
2863 5230 2796 6313 16573 9271 4962 33098 1969 3666
6231 8824 17667 3476 8606 17600 10317 6680 17164 5449
2539 13312 33832 10402 1779 4582 3381 8511 17505 3286
8444 4793 34833 2906 16974 20491 3721 6300 10755
16840 9538 4935 5764 33318 3191 8797 12552 33184 1019
3640 6205 8882 16745 2526 17546 24608 5669 33805
10375 1990 5507 33537 7232 12362 17492 32994 9369

5004 2431 17451 3260 10294 1895 5426 2992 17060 5345
33347 18690 9512 4909 33157 4814 3613 6472 8855 16732
10513 24581 5712 2802 16803 33076 18528 9322 4719
32967 1964 4585 8998 7178 12448 17438 33416 3289
10323 17170 5399 2965 17089 5332 32886 9485 4952 1774
5291 12801 33321 3432 8674 6692 17008 34828 5237 2775
6530 16790 33105 18501 9295 5658 10392 1993 4572 9027
18474 9856 12421 32941 2918 6435 16695 6368 16628
33811 10297 1912 4477 17035 5278 9761 12340 33308
3405 8647 5010 11268 6721 16981 20736 3490 9096 16954
5183 2749 1532 8566 4915 33051 18447 9381 4848 32984
3843 6422 9001 20546 3776 6341 8906 17553 10508 1885
6314 16574 9748 12369 32889 1970 4535 3681 6260 8811
17696 3463 8621 33860 10318 6667 16927 5450 3016
16793 9491 9424 4821 3382 8988 17506 3301 8431 4794
34834 2921 20520 3722 6287 10784 16603 9329 4964
33100 1943 3668 7185 8798 12315 17669 32947 8664 3627
6206 16746 2541 5670 33806 10404 1781 5536 33538 3411
8569 17479 18576 9370 4767 2908 6425 17928 20493 3247
10757 9540 5889 2979 5346 33376 18481 9275 4910 33158
1021 3614 6235 8884 16719 3480 10514 17548 24582 5699
10433 17280 5509 33063 12364 32996 1727 4586 3385
8627 17453 3290 10352 17185 5428 2966 17090 5319
33349 36880 18692 9486 4939 5768 12802 33322 3195
8913 2871 16995 5238 2804 6321 16805 33106 18502 9324
5673 33921 10379 1994 4559 9056 7180 12422 17496
32942 10325 6912 17172 5457 2547 16615 33840 10298
1899 4478 17064 5293 9762 12327 33295 3406 8676 5025
33161 6722 16982 20499 3729 6532 8859 16848 24585
5660 2750 1519 9029 12560 33080 18476 9382 4835 32971
3872 6437 9002 16753 6342 17554 33813 10271 1886 5403
2969 17037 5336 9735 12370 32890 9601 5012 3682 6247
17459 3492 8622 6696 16956 34944 5241 2779 16794 9520
4917 33053 18505 9411 4822 3845 6480 8975 20548 3302
8908 12425 34849 2922 16699 6316 16632 9330 4727
32863 1972 4593 3655 7186 8813 12344 17670 33424 3521
8651 11272 6669 16985 5452 2542 9493 1782 5299 33329
3440 8570 17508 18563 9385 4796 34836 2895 6426 20494
3724 6345 10758 16605 9303 5890 10624 2001 18482 9752
12317 32949 1022 4539 3629 6264 8871 16748 3467 10529
5728 33864 10434 17043 5510 33540 3413 8543 9372 4825
3386 9104 17454 3305 10339 17186 5415 2981 5348 33350
36867 18455 9277 4968 33216 1947 9009 3672 6237 8914
17673 10516 24640 5701 2791 6322 16806 33121 5674
33922 10408 1785 4588 8819 3359 8629 17483 3292 10326
6675 17159 5458 3024 17092 20609 33827 10761 9544
4941 5294 12804 33324 3197 8439 5026 33162 2929 16997
20528 3730 6295 8888 16835 33108 19456 24586 5647
10381 1996 5513 9030 12547 33067 12480 33000 3635
6438 16754 2549 17569 33814 10300 1901 5432 2970
17038 5323 9764 12385 33353 18696 9602 4999 6724
17936 20501 3255 8861 2875 16943 5242 2808 16809 9507
4918 33054 18506 9440 4837 32973 3846 6467 9004 16727
7296 12426 17556 34850 10329 17176 5405 2495 16619
9793 12372 32892 1959 4594 3684 7201 8814 12331 17461
33411 3522 8680 6670 16986 5215 2781 6536 16796 9494
4947 9413 5776 33330 3427 9033 18592 9386 4783 34823
2924 6441 16701 6346 16606 9332 5681 33817 10387 2002
4567 18945 7188 9739 12318 17728 32950 8653 5016 3630
6251 16511 3496 10530 1907 17072 5301 33303 3414 8572
4921 33169 18565 9359 4826 3849 6428 9091 20552 3306
10816 24593 5892 2982 1527 36896 18484 9278 4731
32979 1976 4541 9010 3659 6238 8929 17674 3469 10503
5702 10436 6785 17045 5568 33122 9497 1786 4351 3388
8630 17512 3279 10341 6704 17188 34840 5473 3011
20610 34304 36869 10762 18513 9307 4942 1949 8983
3198 8916 12433 32953 2930 16998 20515 3745 6324 8875

16864 33095 5676 33924 10382 1759 5514 8821 12576
33544 3417 8659 17485 11280 6677 17217 5460 2550
17570 33829 10287 1902 5419 2985 5352 12386 33354
18459 9393 5028 33164 2903 17923 20502 3732 6353 8862
16837 10520 24588 5705 2795 16810 9984 12549 33069
4838 32974 3637 6496 8767 16756 3475 8633 17543 33872
10330 17163 5406 2972 17096 5325 9794 12359 32879
9604 5057 7202 12808 17462 33440 3313 8443 2877 17001
5244 2782 6299 16783 9509 4976 33112 18508 9414 5763
40961 3904 6469 9034 17681 12428 34852 2687 6442
16702 2553 16621 9319 5682 33818 10416 2017 4596
18946 7175 9768 12333 17491 33413 3524 8654 5003 6728
16988 20505 3259 10769 9552 4949 17059 5302 33332
3429 8559 4922 33170 18566 9388 4841 34881 3850 6415
9120 16731 6348 17560 24594 5655 10389 2004 5521
33075 18471 9741 12376 33008 1963 4542 3688 6253 8930
17465 3470 10532 1909 6786 17046 5331 33361 18704
9498 4895 9417 4828 3375 9093 3308 10342 6691 16951
34827 5474 3040 16817 36870 18514 9336 4733 32981
1950 4571 9012 3661 7192 8903 12434 17676 32954 10561
20992 3746 6311 16627 33124 1855 1788 5305 8822 12339
33307 3418 8688 17486 18569 11267 6678 17218 5447
3013 6544 20612 33830 10764 9309 5896 2986 1531 9041
18488 9394 4791 32927 2932 6449 17952 20517 3719 6354
8877 16838 34049 10507 5706 10440 17049 5516 9747
12550 33070 8661 3638 6259 16743 3504 8634 17572
33859 10345 17192 5421 2959 5326 12388 33356 36873
18461 9367 5058 3857 8987 17925 20560 3314 8920 2878
17002 5231 2797 6328 16812 9510 4963 33099 5792 33928
40962 3667 6470 8825 17682 3477 8607 17601 10332 6681
17165 5464 2554 16622 9796 13313 33833 10403 2018
4583 7204 12334 17520 33414 3287 8445 5032 35072 2907
16975 20506 3736 6301 10770 16841 9539 4950 24704
5765 33319 3430 9036 12553 33185 4842 34882 3641 6444
8883 16760 2527 17547 24609 5684 33820 10390 1991
5522 33552 18948 7233 9742 12363 17493 32995 9608
5005 6254 17466 3261 10295 1910 5427 2993 17061 5360
33362 18691 9513 4924 33172 18624 9418 4815 3852 6473
9094 16733 14336 24596 34856 5713 2803 16818 33077
18529 9323 4734 32982 1965 4600 8999 3662 7179 8932
12449 17439 33417 3528 10562 17171 6788 17104 5333
32887 9500 4953 1775 5306 12816 33336 3433 8675 18570
11296 6693 17009 34829 5476 3014 6531 16791 36928
18516 9310 5659 10393 2008 4573 9042 18475 9857 12436
32956 2919 6450 20518 3748 6369 8878 16629 34050
10536 1913 17050 5279 9776 12341 33309 3420 8662 5011
11269 6736 17220 20737 3491 9097 33888 10346 16955
5422 2988 1533 8567 36874 18462 9396 4849 32985 3858
6423 9016 17926 20547 3777 6356 8907 17792 10509 5708
2798 6315 16575 9749 12608 33128 1971 3696 6261 8826
17697 3478 8636 17602 33861 10319 6682 17166 5451
3017 20616 13314 33834 10880 9425 5060 3383 8989
17507 3316 8446 4795 34835 2936 17004 20521 3723 6302
10785 16842 9568 4965 33101 5766 40964 3669 7424 8799
12554 17684 33186 8665 3642 6207 16747 2556 17576
24610 5671 33807 10405 2020 5537 33539 7234 12392
17494 33472 18577 9371 5006 2909 17929 20508 3262
10772 9541 5904 2994 17062 5347 33377 18720 9514 4911
33159 4844 34884 3615 6474 8885 16734 3481 10515
17549 24583 5714 10448 17281 5524 33078 18530 9800
12365 32997 1966 4587 7208 12450 17468 33418 3291
10353 17200 5429 2967 17091 5334 33364 36881 18693
9487 4954 9420 5769 12803 33323 3434 9152 6694 17010
34830 5239 2805 6560 16820 33107 18503 9325 5688
33936 10394 1995 4574 9057 18952 7181 9858 12423
17497 32943 10564 6913 17173 6370 16630 33841 10299
1914 4479 17065 5308 9763 12342 33310 3407 8677 5040

33176 18572 11270 6723 16983 20738 3968 6533 9098
16849 24600 5661 2751 1534 9044 12561 33081 18477
9383 4850 32986 3873 6452 9003 20576 3778 6343 8936
17555 34052 10510 1887 6792 17052 5337 9750 12371
32891 9616 5013 3683 6262 17698 3493 8623 33862 10348
6697 16957 34945 5480 3018 16795 9521 36876 18520
9426 4823 3860 6481 8990 17984 20549 3303 8909 12440
34864 2923 20522 3752 6317 10786 16633 9331 4966
33102 1973 3670 7187 8828 12345 17671 33425 3536 8666
17604 11273 6684 17224 5453 2543 13316 33836 10406
1783 5538 33568 3441 8571 17509 18578 9400 4797 34837
2910 6427 17930 20495 3725 6360 10759 16844 9542 5891
10625 5824 33378 18483 9753 12556 33188 1023 3644
6265 8886 16749 3482 10544 17550 24612 5729 33865
10435 17282 5511 33541 7236 12366 32998 9373 5064
3387 9105 17455 3320 10354 17187 5430 2996 17120 5349
33351 36882 18694 9516 4969 33217 5770 12832 40968
3673 6476 8915 17688 10517 24641 5716 2806 6323 16807
33136 18532 9326 5675 33923 10409 2024 4589 9058 7182
12452 17498 33420 3293 10327 6914 17174 5459 3025
17093 20624 33842 10776 9545 4956 17066 5295 12805
33325 3436 8678 5027 33163 6752 17012 34888 20529
3731 6534 8889 16850 33109 19457 24587 5662 10396
1997 5528 9031 12562 33082 18478 9860 12481 33001
3874 6439 16755 6372 17584 33815 10301 1916 5433 2971
17039 5338 9765 12400 33368 18697 9603 5014 11328
6725 17937 20740 3494 9100 6698 16958 34946 5243 2809
16824 9522 4919 33055 18507 9441 4852 32988 3847 6482
9005 20550 3780 7297 8910 12427 17557 34851 10568
17177 6318 16634 9808 12373 32893 1974 4595 3685 7216
8815 12346 17700 33426 3523 8681 49152 11274 6671
16987 5454 3020 6537 16797 9495 9428 5777 33331 3442
9048 17510 18593 9387 4798 34838 2925 6456 20524 3726
6347 10788 16607 9333 5920 34056 10626 2003 18960
7189 9754 12319 17729 32951 8668 5017 3631 6266 16750
3497 10531 5730 33866 10464 17073 5540 33542 3415
8573 36992 18580 9374 4827 3864 6429 9106 17932 20553
3307 10817 24832 5893 2983 5350 33380 36897 18485
9279 4970 33218 1977 9011 3674 6239 8944 17675 3484
10518 17608 24642 5703 10437 6800 17284 5569 33123
13320 33952 10410 1787 4590 3389 8631 17513 3294
10356 6705 17189 34841 5488 3026 17094 20611 34305
36884 10763 18752 9546 4943 5772 12806 33326 3199
8917 12672 33192 2931 16999 20530 3760 6325 8890
16865 33110 19458 24616 5677 33925 10383 1998 5515
9060 12577 33545 7240 12482 17500 33002 11281 6916
17232 5461 2551 17571 33844 10302 1903 5434 3000
17068 5353 9766 12387 33355 18698 9632 5029 33165
6726 17938 20503 3733 6592 8863 16852 10521 24589
5720 2810 16811 9985 12564 33084 18536 9442 4839
32975 3876 6497 9006 16757 7298 12456 17558 35328
33873 10331 17178 5407 2973 17097 5340 9795 12374
32894 9605 5072 3686 7203 12809 17463 33441 3552 8682
6700 17016 34948 5245 2783 6538 16798 9524 4977 33113
18509 9415 5778 40976 3905 6484 9035 21504 18594 9864
12429 34853 2926 6443 16703 6376 16636 9334 5683
33819 10417 2032 4597 18947 7190 9769 12348 17730
33428 3525 8655 5018 11276 6729 16989 20744 3498
11008 9553 17074 5303 33333 3444 8574 4923 33171
18567 9389 4856 34896 3851 6430 9121 20554 3784 6349
10818 17561 24595 5894 10628 2005 36898 18486 9756
12377 33009 1978 4543 3689 6268 8931 17704 3471 10533
5732 33868 10438 6787 17047 5570 33600 18705 9499
9432 4829 3390 9108 17514 3309 10343 6706 17190 34842
5475 3041 20640 34306 36871 10792 18515 9337 4972
33220 1951 9013 3676 7193 8918 12435 17677 32955
10576 24644 20993 3747 6326 16866 33125 5678 33926

10412 1789 5544 8823 12578 33546 3419 8689 17487
18584 11282 6679 17219 5462 3028 6545 18048 20613
33831 10765 9548 5897 2987 5354 12864 33384 18489
9395 5030 33166 2933 17953 20532 3734 6355 8892 16839
34064 10522 19460 24590 5707 10441 17288 5517 9986
12551 33071 12484 33004 3639 6498 16758 3505 8635
17573 33874 10360 17193 5436 2974 17098 5327 9824
12389 33357 36888 18700 9606 5059 7680 12810 17940
20561 33442 3315 8921 2879 17003 5246 2812 6329 16813
9511 4978 33114 18510 9444 5793 33929 40963 3906 6471
9064 17683 7300 12430 17616 34854 10333 6920 17180
5465 2555 16623 9797 13328 33848 10418 2019 4598
18976 7205 9770 12335 17521 33415 3526 8684 5033
35073 6730 16990 20507 3737 6540 10771 16856 9554
4951 24705 5780 33334 3431 9037 12568 33200 18596
9390 4843 34883 3880 6445 9122 16761 6350 17562 24624
5685 33821 10391 2006 5523 33553 18949 7248 9743
12378 17732 33010 9609 5020 3690 6255 17467 3500
10534 1911 6816 17076 34952 5361 33363 18706 9528
4925 33173 18625 9419 4830 3853 6488 9095 20556 3310
10820 14337 24597 34857 5952 3042 16819 36900 18544
9338 4735 32983 1980 4601 9014 3663 7194 8933 12464
17678 33432 3529 10563 20994 11392 6789 17105 5572
33126 9501 1790 5307 13337 3448 8690 17516
18571 11297 6708 17248 34844 5477 3015 6546 20614
34308 36929 10766 18517 9311 5898 10632 2009 9043
18490 9872 12437 32957 2934 6451 17954 20519 3749
6384 8879 16868 34051 10537 5736 33984 10442 17051
5518 9777 12580 33548 3421 8663 11284 6737 17221
20752 3506 9112 17574 33889 10347 17194 5423 2989
5356 12390 33358 36875 18463 9397 5088 33224 3859
9017 17927 20562 3792 6357 8922 17793 10524 24648
5709 2799 6330 16814 9988 12609 33129 5794 33930
40992 3697 6500 8827 17712 3479 8637 17603 33876
10334 6683 17167 5466 3032 17100 20617 9798 13315
33835 10881 9664 5061 7206 12812 17522 33444 3317
8447 5034 35074 2937 17005 20536 3738 6303 10800
16843 9569 4980 33116 19464 24706 5767 40965 3908
7425 9038 12555 17685 33187 12488 34912 3643 6446
16762 2557 17577 24611 5686 33822 10420 2021 5552
33554 18950 7235 9772 12393 17495 33473 18816 9610
5007 6732 17944 20509 3263 10773 9556 5905 2995 17063
5362 33392 18721 9515 4926 33174 18626 9448 4845
34885 3854 6475 9124 16735 7304 14338 17564 24598
34858 5715 10449 17296 5525 33079 18531 9801 12380
33012 1967 4602 3692 7209 8934 12451 17469 33419 3530
10592 17201 6790 17106 5335 33365 37120 18708 9502
4955 9421 5784 12818 33338 3435 9153 18600 11298 6695
17011 34831 5478 3044 6561 16821 36930 18518 9340
5689 33937 10395 2010 4575 9072 18953 7196 9859 12438
17736 32958 10565 6928 20996 3750 6371 16631 34080
10538 1915 17080 5309 9778 12343 33311 3422 8692 5041
33177 18573 11271 6738 17222 20739 3969 6548 9099
20672 33890 10824 24601 5900 2990 1535 9045 36904
18492 9398 4851 32987 3888 6453 9018 17956 20577 3779
6358 8937 17794 34053 10511 5710 10444 6793 17053
5576 9751 12610 33130 9617 3698 6263 17699 3508 8638
17632 33863 10349 6712 17196 34960 5481 3019 20618
13344 34312 36877 10882 18521 9427 5062 3861 8991
17985 20564 3318 8924 12441 34865 2938 17006 20523
3753 6332 10787 16872 9570 4967 33103 5796 33932
40966 3671 7426 8829 12584 17686 33664 3537 8667
17605 11288 6685 17225 5468 2558 17578 25088 13317
33837 10407 2022 5539 33569 7264 12394 17524 33474
18579 9401 5036 35076 2911 17931 20510 3740 6361
10774 16845 9543 5906 10640 24708 5825 33379 18722
9992 12557 33189 4846 34886 3645 6504 8887 16764 3483

10545 17551 24613 5744 33880 10450 17283 5526 33556
19008 7237 9802 12367 32999 9612 5065 7210 12928
17470 33448 3321 10355 17202 5431 2997 17121 5364
33366 36883 18695 9517 4984 33232 18628 9422 5771
12833 40969 3912 6477 9154 17689 14340 24656 34860
5717 2807 6562 16822 33137 18533 9327 5690 33938
10424 2025 4604 9059 18954 7183 9888 12453 17499
33421 3532 10566 6915 17175 6848 17108 20625 33843
10777 9560 4957 17067 5310 12820 33340 3437 8679 5042
33178 18574 11300 6753 17013 34889 20768 3970 6535
9128 16851 36932 19472 24602 5663 10397 2012 5529
9046 12563 33083 18479 9861 12496 33016 3875 6454
20578 3808 6373 8938 17585 34054 10540 1917 6794
17054 5339 9780 12401 33369 18712 9618 5015 11329
6740 18176 20741 3495 9101 33892 10350 6699 16959
34947 5482 3048 16825 9523 36878 18522 9456 4853
32989 3862 6483 9020 17986 20551 3781 7312 8911 12442
17796 34866 10569 21000 3754 6319 16635 9809 12612
33132 1975 3700 7217 8830 12347 17701 33427 3538 8696
17606 49153 11275 6686 17226 5455 3021 6552 20620
13318 33838 10884 9429 6016 33570 3443 9049 17511
18608 9402 4799 34839 2940 6457 17960 20525 3727 6362
10789 16846 9572 5921 34057 10627 5826 41024 18961
7428 9755 12558 17744 33190 8669 3646 6267 16751 3512
10546 17580 24614 5731 33867 10465 17312 5541 33543
7238 12396 33476 36993 18581 9375 5066 3865 9107
17933 20568 3322 10832 24833 5908 2998 17122 5351
33381 36912 18724 9518 4971 33219 5800 12834 35840
40970 3675 6478 8945 17690 3485 10519 17609 24643
5718 10452 6801 17285 5584 33138 18534 9804 13321
33953 10411 2026 4591 7212 12454 17528 33422 3295
10357 6944 17204 35080 5489 3027 17095 20626 34320
36885 10778 18753 9547 4958 24712 5773 12807 33327
3438 9156 12673 33193 6754 17014 34890 20531 3761
6564 8891 16880 33111 19459 24617 5692 33940 10398
1999 5530 9061 12592 33560 18956 7241 9862 12483
17501 33003 11520 6917 17233 6374 17586 33845 10303
1918 5435 3001 17069 5368 9767 12402 33370 18699 9633
5044 33180 18632 11330 6727 17939 20742 3972 6593
9102 16853 14344 24604 34976 5721 2811 16826 10000
12565 33085 18537 9443 4854 32990 3877 6512 9007
20580 3782 7299 8940 12457 17559 35329 34112 10570
17179 6796 17112 5341 9810 12375 32895 9620 5073 3687
7218 12824 17702 33456 3553 8683 49154 11304 6701
17017 34949 5484 3022 6539 16799 9525 36936 18524
9430 5779 40977 3920 6485 9050 17988 21505 18595 9865
12444 34868 2927 6458 20526 3756 6377 10790 16637
9335 5922 34058 10656 2033 18962 7191 9784 12349
17731 33429 3540 8670 5019 11277 6744 17228 20745
3499 11009 13376 33896 10466 17075 5542 33572 3445
8575 36994 18582 9404 4857 34897 3866 6431 9136 17934
20555 3785 6364 10819 17800 24834 5895 10629 5828
33382 36899 18487 9757 12616 33248 1979 3704 6269
8946 17705 3486 10548 17610 24672 5733 33869 10439
6802 17286 5571 33601 22528 13322 33954 10888 9433
5068 3391 9109 17515 3324 10358 6707 17191 34843 5490
3056 17124 20641 34307 36886 10793 18754 9576 4973
33221 5774 12836 40972 3677 7432 8919 12674 17692
33194 10577 24645 21008 3762 6327 16867 33140 19488
24618 5679 33927 10413 2028 5545 9062 12579 33547
7242 12512 17502 33480 18585 11283 6918 17234 5463
3029 18049 20628 33846 10780 9549 5912 3002 17070
5355 12865 33385 18728 9634 5031 33167 6756 17968
34892 20533 3735 6594 8893 16854 34065 10523 19461
24591 5722 10456 17289 5532 9987 12566 33086 18538
9920 12485 33005 3878 6499 16759 7328 12458 17588
35330 33875 10361 17208 5437 2975 17099 5342 9825

12404 33372 36889 18701 9607 5074 11332 7681 12811
17941 20800 33443 3554 9160 6702 17018 34950 5247
2813 6568 16828 9526 4979 33115 18511 9445 5808 33944
40978 3907 6486 9065 21506 19072 7301 9866 12431
17617 34855 10572 6921 17181 6378 16638 9812 13329
33849 10419 2034 4599 18977 7220 9771 12350 17760
33430 3527 8685 5048 35088 49156 11278 6731 16991
20746 3976 6541 11010 16857 9555 24720 5781 33335
3446 9052 12569 33201 18597 9391 4858 34898 3881 6460
9123 20584 3786 6351 10848 17563 24625 5924 34060
10630 2007 37376 18964 7249 9758 12379 17733 33011
9624 5021 3691 6270 17706 3501 10535 5734 33870 10468
6817 17077 34953 5600 33602 18707 9529 36996 18640
9434 4831 3868 6489 9110 17992 20557 3311 10821 14352
24836 34872 5953 3043 20642 34336 36901 10794 18545
9339 4974 33222 1981 9015 3678 7195 8948 12465 17679
33433 3544 10578 17612 24646 20995 11393 6804 17344
5573 33127 13324 33956 10414 1791 5546 13056 33576
3449 8691 17517 18586 11312 6709 17249 34845 5492
3030 6547 18050 20615 34309 36944 10767 18756 9550
5899 10633 5832 12866 33386 18491 9873 12676 33196
2935 17955 20534 3764 6385 8894 16869 34066 10552
19462 24620 5737 33985 10443 17290 5519 10016 12581
33549 7244 12486 33006 11285 6976 17236 20753 3507
9113 17575 33904 10362 17195 5438 3004 17128 5357
9826 12391 33359 36890 18702 9636 5089 33225 7682
12840 17942 20563 41088 3793 6596 8923 17808 10525
24649 5724 2814 6331 16815 9989 12624 33144 18540
9446 5795 33931 40993 3936 6501 9066 17713 7302 12460
17618 35332 33877 10335 6922 17182 5467 3033 17101
20632 9799 13330 33850 10896 9665 5076 18978 7207
12813 17523 33445 3556 8686 5035 35075 6760 17020
35008 20537 3739 6542 10801 16858 9584 4981 33117
19465 24707 5782 40980 3909 7440 9039 12570 21508
33202 18598 9868 12489 34913 3882 6447 16763 6380
17592 24626 5687 33823 10421 2036 5553 33555 18951
7250 9773 12408 17734 33488 18817 9611 5022 11336
6733 17945 20748 3502 11012 9557 6818 17078 34954
5363 33393 18736 9530 4927 33175 18627 9449 4860
34900 3855 6490 9125 20558 3788 7305 10822 14339
17565 24599 34859 5954 10688 17297 36902 18546 9816
12381 33013 1982 4603 3693 7224 8935 12466 17708
33434 3531 10593 21024 49160 11394 6791 17107 5574
33604 37121 18709 9503 9436 5785 12819 33339 3450
9168 17518 18601 11299 6710 17250 34846 5479 3045
6576 20644 34310 36931 10796 18519 9341 5928 34176
10634 2011 9073 18968 7197 9874 12439 17737 32959
10580 6929 25600 20997 3751 6386 16870 34081 10539
5738 33986 10472 17081 5548 9779 12582 33550 3423
8693 37000 18588 11286 6739 17223 20754 3984 6549
9114 18052 20673 33891 10825 24840 5901 2991 5358
12868 33388 36905 18493 9399 5090 33226 3889 9019
17957 20592 3794 6359 8952 17795 34068 10526 19520
24650 5711 10445 6808 17292 5577 9990 12611 33131
13440 33960 40994 3699 6502 17714 3509 8639 17633
33878 10364 6713 17197 34961 5496 3034 17102 20619
9828 13345 34313 36892 10883 18760 9666 5063 7684
12814 18000 20565 33446 3319 8925 12680 35104 2939
17007 20538 3768 6333 10802 16873 9571 4982 33118
19466 24736 5797 33933 40967 3910 7427 9068 12585
17687 33665 7360 12490 17620 34914 11289 6924 17240
5469 2559 17579 25089 13332 33852 10422 2023 5554
33584 18980 7265 9774 12395 17525 33475 18818 9640
5037 35077 6734 17946 20511 3741 6600 10775 16860
9558 5907 10641 24709 5840 33394 18723 9993 12572
33204 18656 9450 4847 34887 3884 6505 9126 16765 7306
14368 17566 24628 35336 5745 33881 10451 17298 5527

33557 19009 7252 9803 12382 33014 9613 5080 3694 7211
12929 17471 33449 3560 10594 17203 6820 17136 34956
5365 33367 37122 18710 9532 4985 33233 18629 9423
5786 12848 40984 3913 6492 9155 21512 18602 11776
14341 24657 34861 5956 3046 6563 16823 36960 18548
9342 5691 33939 10425 2040 4605 9074 18955 7198 9889
12468 17738 33436 3533 10567 6930 20998 11396 6849
17109 20864 34082 11016 9561 17082 5311 12821 33341
3452 8694 5043 33179 18575 11301 6768 17252 34904
20769 3971 6550 9129 20674 34368 36933 10826 19473
24603 5902 10636 2013 9047 36906 18494 9876 12497
33017 3890 6455 17958 20579 3809 6388 8939 17824
34055 10541 5740 33988 10446 6795 17055 5578 9781
12640 33608 18713 9619 11344 6741 18177 20756 3510
9116 17634 33893 10351 6714 17198 34962 5483 3049
20648 13346 34314 36879 10912 18523 9457 5092 33228
3863 9021 17987 20566 3796 7313 8926 12443 17797
34867 10584 24652 21001 3755 6334 16874 10048 12613
33133 5798 33934 40996 3701 7456 8831 12586 17716
33666 3539 8697 17607 49168 11290 6687 17227 5470
3036 6553 18056 20621 25090 13319 33839 10885 9668
6017 33571 7266 12872 17526 33504 18609 9403 5038
35078 2941 17961 20540 3742 6363 10804 16847 9573
5936 34072 10642 19468 24710 5827 41025 19200 7429
9994 12559 17745 33191 12492 34916 3647 6506 16766
3513 10547 17581 24615 5746 33882 10480 17313 5556
33558 19010 7239 9832 12397 33477 37008 18820 9614
5067 7688 12930 17948 20569 33450 3323 10833 24848
5909 2999 17123 5366 33396 36913 18725 9519 4986
33234 18630 9452 5801 12835 35841 40971 3914 6479
9184 17691 7308 14342 17624 24658 34862 5719 10453
7040 17300 5585 33139 18535 9805 13336 33968 10426
2027 4606 18984 7213 9890 12455 17529 33423 3534
10596 6945 17205 35081 6850 17110 20627 34321 37124
10779 18768 9562 4959 24713 5788 12822 33342 3439
9157 12688 33208 18604 11302 6755 17015 34891 20770
4000 6565 9130 16881 36934 19474 24632 5693 33941
10399 2014 5531 9076 12593 33561 18957 7256 9863
12498 17740 33018 11521 6932 21056 3810 6375 17587
34084 10542 1919 6824 17084 5369 9782 12403 33371
18714 9648 5045 33181 18633 11331 6742 18178 20743
3973 6608 9103 20676 33894 10828 14345 24605 34977
5960 3050 16827 10001 36908 18552 9458 4855 32991
3892 6513 9022 18016 20581 3783 7314 8941 12472 17798
35344 34113 10571 21002 11400 6797 17113 5580 9811
12614 33134 9621 3702 7219 12825 17703 33457 3568
8698 17636 49155 11305 6716 17256 34964 5485 3023
6554 20622 13348 34316 36937 10886 18525 9431 6018
41216 3921 9051 17989 21520 18610 9880 12445 34869
2942 6459 17962 20527 3757 6392 10791 16876 9574 5923
34059 10657 5856 33992 41026 18963 7430 9785 12588
17746 33668 3541 8671 11292 6745 17229 20760 3514
11024 17582 25092 13377 33897 10467 17314 5543 33573
7268 12398 33478 36995 18583 9405 5096 35136 3867
9137 17935 20570 3800 6365 10834 17801 24835 5910
10644 24768 5829 33383 36914 18726 9996 12617 33249
5802 35842 41000 3705 6508 8947 17720 3487 10549
17611 24673 5748 33884 10454 6803 17287 5586 33616
19012 22529 9806 13323 33955 10889 9672 5069 7214
12932 17530 33452 3325 10359 6946 17206 35082 5491
3057 17125 20656 34322 36887 10808 18755 9577 4988
33236 19584 24714 5775 12837 40973 3916 7433 9158
12675 17693 33195 14400 24660 34920 21009 3763 6566
16882 33141 19489 24619 5694 33942 10428 2029 5560
9063 12594 33562 18958 7243 9892 12513 17503 33481
18824 11522 6919 17235 6852 18064 20629 33847 10781
9564 5913 3003 17071 5370 12880 33400 18729 9635 5046

33182 18634 11360 6757 17969 34893 20772 3974 6595
9132 16855 37888 14346 19476 24606 34978 5723 10457
17304 5533 10002 12567 33087 18539 9921 12500 33020
3879 6514 20582 3812 7329 8942 12459 17589 35331
34114 10600 17209 6798 17114 5343 9840 12405 33373
37128 18716 9622 5075 11333 7696 12826 18180 20801
33458 3555 9161 49184 11306 6703 17019 34951 5486
3052 6569 16829 9527 36938 18526 9460 5809 33945
40979 3922 6487 9080 17990 21507 19073 7316 9867
12446 17856 34870 10573 6936 21004 3758 6379 16639
9813 13568 34088 10658 2035 18992 7221 9786 12351
17761 33431 3542 8700 5049 35089 49157 11279 6746
17230 20747 3977 6556 11011 20680 13378 33898 10944
24721 6020 33574 3447 9053 37024 18612 9406 4859
34899 3896 6461 9138 17964 20585 3787 6366 10849
17802 24864 5925 34061 10631 5830 41028 37377 18965
7488 9759 12618 17748 33250 9625 3706 6271 17707 3516
10550 17640 24674 5735 33871 10469 6832 17316 34968
5601 33603 22530 13352 34432 36997 10890 18641 9435
5070 3869 9111 17993 20572 3326 10836 14353 24837
34873 5968 3058 17126 20643 34337 36916 10795 18784
9578 4975 33223 5804 12838 35844 40974 3679 7434 8949
12704 17694 33672 3545 10579 17613 24647 21010 11408
6805 17345 5588 33142 19490 25096 13325 33957 10415
2030 5547 13057 33577 7272 12514 17532 33482 18587
11313 6948 17264 35084 5493 3031 18051 20630 34324
36945 10782 18757 9551 5914 10648 24716 5833 12867
33387 18730 10112 12677 33197 6758 17970 34894 20535
3765 6624 8895 16884 34067 10553 19463 24621 5752
34000 10458 17291 5534 10017 12596 33564 19016 7245
9922 12487 33007 11524 6977 17237 7330 12936 17590
35360 33905 10363 17210 5439 3005 17129 5372 9827
12406 33374 36891 18703 9637 5104 33240 18636 11334
7683 12841 17943 20802 41089 4032 6597 9162 17809
14348 24664 34980 5725 2815 6570 16830 10004 12625
33145 18541 9447 5810 33946 41008 3937 6516 9067
21536 19074 7303 9896 12461 17619 35333 34116 10574
6923 17183 6856 17116 20633 9814 13331 33851 10897
9680 5077 18979 7222 12828 17762 33460 3557 8687 5050
35090 49158 11308 6761 17021 35009 20776 3978 6543
11040 16859 9585 36940 19480 24722 5783 40981 3924
7441 9054 12571 21509 33203 18599 9869 12504 34928
3883 6462 20586 3816 6381 10850 17593 24627 5926
34062 10660 2037 37378 18966 7251 9788 12400 17735
33489 18832 9626 5023 11337 6748 18184 20749 3503
11013 13380 33900 10470 6819 17079 34955 5602 33632
18737 9531 36998 18642 9464 4861 34901 3870 6491 9140
17994 20559 3789 7320 10823 14354 17804 24838 34874
5955 10689 21120 34338 36903 18547 9817 12620 33252
1983 3708 7225 8950 12467 17709 33435 3546 10608
17614 24676 21025 49161 11395 6806 17346 5575 33605
37136 22532 13326 33958 10892 9437 6024 13058 33578
3451 9169 17519 18616 11314 6711 17251 34847 5494
3060 6577 18080 20645 34311 36946 10797 18758 9580
5929 34177 10635 5834 12896 41032 18969 7436 9875
12678 17752 33198 10581 25601 21012 3766 6387 16871
34096 10554 19492 24622 5739 33987 10473 17320 5549
10018 12583 33551 7246 12516 33484 37001 18589 11287
6978 17238 20755 3985 9115 18053 20688 33906 10840
24841 5916 3006 17130 5359 12869 33389 36920 18732
9638 5091 33227 7712 12842 17972 35848 20593 41090
3795 6598 8953 17810 34069 10527 19521 24651 5726
10460 6809 17293 5592 9991 12626 33146 18542 9924
13441 33961 40995 3938 6503 17715 7332 12462 17648
35334 33879 10365 6952 17212 35200 5497 3035 17103
20634 9829 13360 34328 36893 10898 18761 9667 5078
26624 7685 12815 18001 20804 33447 3558 9164 12681

35105 6762 17022 35010 20539 3769 6572 10803 16888
9586 4983 33119 19467 24737 5812 33948 40982 3911
7442 9069 12600 21510 33680 19076 7361 9870 12491
17621 34915 11528 6925 17241 6382 17594 25104 13333
33853 10423 2038 5555 33585 18981 7280 9775 12410
17764 33490 18819 9641 5052 35092 49216 11338 6735
17947 20750 3980 6601 11014 16861 9559 14464 24724
34984 5841 33395 18738 10008 12573 33205 18657 9451
4862 34902 3885 6520 9127 20588 3790 7307 10852 14369
17567 24629 35337 5984 34120 10690 17299 37380 19024
7253 9818 12383 33015 9628 5081 3695 7226 12944 17710
33464 3561 10595 21026 49162 11424 6821 17137 34957
5604 33606 37123 18711 9533 37056 18644 9438 5787
12849 40985 3928 6493 9170 17996 21513 18603 11777
14356 24896 34876 5957 3047 6578 20646 34340 36961
10798 18549 9343 5930 34178 10664 2041 9075 18970
7199 9904 12469 17739 33437 3548 10582 6931 25602
20999 11397 6864 17348 20865 34083 11017 13384 34016
10474 17083 5550 13060 33580 3453 8695 37002 18590
11316 6769 17253 34905 20784 3986 6551 9144 18054
20675 34369 36948 10827 19712 24842 5903 10637 5836
12870 33390 36907 18495 9877 12736 33256 3891 17959
20594 3824 6389 8954 17825 34070 10556 19522 24680
5741 33989 10447 6810 17294 5579 10020 12641 33609
22536 13442 33962 41472 11345 6980 18192 20757 3511
9117 17635 33908 10366 6715 17199 34963 5498 3064
17132 20649 9830 13347 34315 36894 10913 18762 9696
5093 33229 7686 12844 18002 20567 41092 3797 7552
8927 12682 17812 35106 10585 24653 21016 3770 6335
16875 10049 12628 33148 19496 24738 5799 33935 40997
3940 7457 9070 12587 17717 33667 7362 12520 17622
35392 49169 11291 6926 17242 5471 3037 18057 20636
25091 13334 33854 10900 9669 6032 33586 18982 7267
12873 17527 33505 18848 9642 5039 35079 6764 17976
35012 20541 3743 6602 10805 16862 9588 5937 34073
10643 19469 24711 5842 41040 19201 7444 9995 12574
21568 33206 18658 9928 12493 34917 3886 6507 16767
7336 14370 17596 24630 35338 5747 33883 10481 17328
5557 33559 19011 7254 9833 12412 33492 37009 18821
9615 5082 11340 7689 12931 17949 20808 33451 3562
11072 24849 6822 17138 34958 5367 33397 37152 18740
9534 4987 33235 18631 9453 5816 12850 35856 40986
3915 6494 9185 21514 19080 7309 11778 14343 17625
24659 34863 5958 10692 7041 17301 36962 18550 9820
13337 33969 10427 2042 4607 18985 7228 9891 12470
17768 33438 3535 10597 6960 21028 35096 49164 11398
6851 17111 20866 34560 37125 11018 18769 9563 24728
5789 12823 33343 3454 9172 12689 33209 18605 11303
6770 17254 34906 20771 4001 6580 9131 20704 34370
36935 10856 19475 24633 5932 34180 10638 2015 9077
37384 18972 7257 9878 12499 17741 33019 11536 6933
25604 21057 3811 6390 17826 34085 10543 5742 33990
10476 6825 17085 5608 9783 12642 33610 18715 9649
37004 18648 11346 6743 18179 20758 3988 6609 9118
18112 20677 33895 10829 14360 24844 34992 5961 3051
20650 13824 34344 36909 10914 18553 9459 5094 33230
3893 9023 18017 20596 3798 7315 8956 12473 17799
35345 34128 10586 19524 24654 21003 11401 6812 17352
5581 10050 12615 33135 13444 33964 40998 3703 7458
13064 17718 33696 3569 8699 17637 49170 11320 6717
17257 34965 5500 3038 6555 18058 20623 25120 13349
34317 36952 10887 18764 9670 6019 41217 7744 12874
18004 21521 33506 18611 9881 12684 35108 2943 17963
20542 3772 6393 10806 16877 9575 5938 34074 10672
19470 24740 5857 33993 41027 19202 7431 10024 12589
17747 33669 7364 12494 34918 11293 6984 17244 20761
3515 11025 17583 25093 13392 33912 10482 17315 5558

33588 19040 7269 9834 12399 33479 37010 18822 9644
5097 35137 7690 12960 17950 20571 41096 3801 6604
10835 17816 24850 5911 10645 24769 5844 33398 36915
18727 9997 12632 33264 18660 9454 5803 35843 41001
3944 6509 9186 17721 7310 14372 17626 24688 35340
5749 33885 10455 7042 17302 5587 33617 19013 22544
9807 13338 33970 10904 9673 5084 18986 7215 12933
17531 33453 3564 10598 6947 17207 35083 6880 17140
35016 20657 34323 37126 10809 18770 9592 4989 33237
19585 24715 5790 12852 40988 3917 7448 9159 12690
21516 33210 18606 11780 14401 24661 34921 21248 4002
6567 16883 36964 19504 24634 5695 33943 10429 2044
5561 9078 12595 33563 18959 7258 9893 12528 17742
33496 18825 11523 6934 21058 11456 6853 18065 20868
34086 11020 9565 6826 17086 5371 12881 33401 18744
9650 5047 33183 18635 11361 6772 18208 34908 20773
3975 6610 9133 20678 34372 37889 10830 14347 19477
24607 34979 5962 10696 17305 10003 36910 18554 9936
12501 33021 3894 6515 18018 20583 3813 7344 8943
12474 17828 35346 34115 10601 21032 49280 11402 6799
17115 5582 9841 12644 33612 37129 18717 9623 11348
7697 12827 18181 20816 33459 3570 9176 17638 49185
11307 6718 17258 34966 5487 3053 6584 20652 13350
34318 36939 10916 18527 9461 6048 34184 41218 3923
9081 17991 21522 19088 7317 9882 12447 17857 34871
10588 6937 25608 21005 3759 6394 16878 10052 13569
34089 10659 5858 33994 41056 18993 7460 9787 12590
17776 33670 3543 8701 38912 49172 11294 6747 17231
20762 3992 6557 11026 18060 20681 25094 13379 33899
10945 24960 6021 33575 7270 12876 33508 37025 18613
9407 5098 35138 3897 9139 17965 20600 3802 6367 10864
17803 24865 5940 34076 10646 19528 24770 5831 41029
37392 19204 7489 9998 12619 17749 33251 13448 35872
41002 3707 6510 17722 3517 10551 17641 24675 5750
33886 10484 6833 17317 34969 5616 33618 19014 22531
9836 13353 34433 37012 10891 18880 9674 5071 7692
12934 18008 20573 33454 3327 10837 14592 24852 35112
5969 3059 17127 20658 34352 36917 10810 18785 9579
4990 33238 19586 24744 5805 12839 35845 40975 3918
7435 9188 12705 17695 33673 7368 14402 17628 24662
34922 21011 11409 7044 17360 5589 33143 19491 25097
13340 33972 10430 2031 5562 13072 33592 18988 7273
9894 12515 17533 33483 18826 11552 6949 17265 35085
6854 18066 20631 34325 37184 10783 18772 9566 5915
10649 24717 5848 12882 33402 18731 10113 12692 33212
18664 11362 6759 17971 34895 20774 4004 6625 9134
16885 37890 14376 19478 24636 35456 5753 34001 10459
17306 5535 10032 12597 33565 19017 7260 9923 12502
33022 11525 6992 21060 3814 7331 12937 17591 35361
34144 10602 17211 6828 17144 5373 9842 12407 33375
37130 18718 9652 5105 33241 18637 11335 7698 12856
18182 20803 41104 4033 6612 9163 21632 49186 11784
14349 24665 34981 5964 3054 6571 16831 10005 36968
18556 9462 5811 33947 41009 3952 6517 9082 18020
21537 19075 7318 9897 12476 17858 35348 34117 10575
6938 21006 11404 6857 17117 20872 9815 13570 34090
11136 9681 18994 7223 12829 17763 33461 3572 8702
5051 35091 49159 11309 6776 17260 35024 20777 3979
6558 11041 20682 13408 34376 36941 10946 19481 24723
6022 41220 3925 9055 21524 37026 18614 9884 12505
34929 3898 6463 17966 20587 3817 6396 10851 17832
24866 5927 34063 10661 5860 33996 41030 37379 18967
7490 9789 12648 17750 33728 18833 9627 11352 6749
18185 20764 3518 11028 17642 25152 13381 33901 10471
6834 17318 34970 5603 33633 22560 13354 34434 36999
10920 18643 9465 5100 35140 3871 9141 17995 20574
3804 7321 10838 14355 17805 24839 34875 5970 10704

24772 21121 34339 36918 18786 10056 12621 33253 5806
35846 41004 3709 7464 8951 12706 17724 33674 3547
10609 17615 24677 21040 49176 11410 6807 17347 5590
33620 37137 19968 22533 25098 13327 33959 10893 9676
6025 13059 33579 7274 12992 17534 33512 18617 11315
6950 17266 35086 5495 3061 18081 20660 34326 36947
10812 18759 9581 5944 34192 10650 19588 24718 5835
12897 41033 19208 7437 10114 12679 17753 33199 14404
25616 34924 21013 3767 6626 16886 34097 10555 19493
24623 5754 34002 10488 17321 5564 10019 12598 33566
19018 7247 9952 12517 33485 37016 18828 11526 6979
17239 7808 12938 18068 20689 35362 33907 10841 24856
5917 3007 17131 5374 12884 33404 36921 18733 9639
5106 33242 18638 11364 7713 12843 17973 35849 20832
41091 4034 6599 9192 17811 37892 14350 19536 24666
34982 5727 10461 7048 17308 5593 10006 12627 33147
18543 9925 13456 33976 41010 3939 6518 21538 19104
7333 9898 12463 17649 35335 34118 10604 6953 17213
35201 6858 17118 20635 9844 13361 34329 37132 10899
18776 9682 5079 26625 7700 12830 18240 20805 33462
3559 9165 12696 35120 49188 11310 6763 17023 35011
20778 4008 6573 11042 16889 9587 36942 19482 24752
5813 33949 40983 3926 7443 9084 12601 21511 33681
19077 7376 9871 12506 17860 34930 11529 6940 21064
3818 6383 17595 25105 13572 34092 10662 2039 37408
18996 7281 9790 12411 17765 33491 18834 9656 5053
35093 49217 11339 6750 18186 20751 3981 6616 11015
20684 13382 33902 10948 14465 24725 34985 6080 33634
18739 10009 37028 18672 9466 4863 34903 3900 6521
9142 18024 20589 3791 7322 10853 14384 17806 24868
35352 5985 34121 10691 21122 41984 37381 19025 7492
9819 12622 33254 9629 3710 7227 12945 17711 33465
3576 10610 17644 24678 21027 49163 11425 6836 17376
34972 5605 33607 37138 22534 13356 34436 37057 10894
18645 9439 6026 13088 41224 3929 9171 17997 21528
18618 11792 14357 24897 34877 5972 3062 6579 18082
20647 34341 36976 10799 18788 9582 5931 34179 10665
5864 12898 35904 41034 18971 7438 9905 12708 17754
33676 3549 10583 25603 21014 11412 6865 17349 20880
34098 11032 19494 25100 13385 34017 10475 17322 5551
13061 33581 7276 12518 33486 37003 18591 11317 7008
17268 35144 20785 3987 9145 18055 20690 34384 36949
10842 19713 24843 5918 10652 24776 5837 12871 33391
36922 18734 10116 12737 33257 7714 17974 35850 20595
41120 3825 6628 8955 17840 34071 10557 19523 24681
5756 34004 10462 6811 17295 5594 10021 12656 33624
19020 22537 9926 13443 33963 41473 11584 6981 18193
7334 12940 17650 35364 33909 10367 6954 17214 35202
5499 3065 17133 20664 9831 13362 34330 36895 10928
18763 9697 5108 33244 19592 26626 7687 12845 18003
20806 41093 4036 7553 9166 12683 17813 35107 14408
24668 35040 21017 3771 6574 16890 10064 12629 33149
19497 24739 5814 33950 41012 3941 7472 9071 12602
21540 33682 19078 7363 9900 12521 17623 35393 49408
11530 6927 17243 6860 18072 20637 25106 13335 33855
10901 9684 6033 33587 18983 7282 12888 17766 33520
18849 9643 5054 35094 49218 11368 6765 17977 35013
20780 3982 6603 11044 16863 9589 37896 14466 19484
24726 34986 5843 41041 19216 7445 10010 12575 21569
33207 18659 9929 12508 34932 3887 6522 20590 3820
7337 10854 14371 17597 24631 35339 5986 34122 10720
17329 37382 19026 7255 9848 12413 33493 37248 18836
9630 5083 11341 7704 12946 18188 20809 33466 3563
11073 28672 49192 11426 6823 17139 34959 5606 33636
37153 18741 9535 37058 18646 9468 5817 12851 35857
40987 3930 6495 9200 17998 21515 19081 7324 11779
14358 17864 24898 34878 5959 10693 7056 21124 34342
36963 18551 9821 13576 34208 10666 2043 19000 7229
9906 12471 17769 33439 3550 10612 6961 25632 21029
35097 49165 11399 6866 17350 20867 34561 37140 11019
22592 13386 34018 10952 24729 6028 13062 33582 3455
9173 37032 18620 11318 6771 17255 34907 20786 4016
6581 9146 18084 20705 34371 36950 10857 19714 24872
5933 34181 10639 5838 12900 41036 37385 18973 7496
9879 12738 17756 33258 11537 25605 21072 3826 6391
17827 34100 10558 19552 24682 5743 33991 10477 6840
17324 5609 10022 12643 33611 22538 13472 34440 37005
41474 18649 11347 6982 18194 20759 3989 9119 18113
20692 33910 10844 14361 24845 34993 5976 3066 17134
20651 13825 34345 36924 10915 18792 9698 5095 33231
7716 12846 18032 35852 20597 41094 3799 7554 8957
12712 17814 35584 34129 10587 19525 24655 21018
11416 6813 17353 5596 10051 12630 33150 19498 25216
13445 33965 40999 3942 7459 13065 17719 33697 7392
12522 17652 35394 49171 11321 6956 17272 35204 5501
3039 18059 20638 25121 13364 34332 36953 10902 18765
9671 6034 41232 26628 7745 12875 18005 21760 33507
18850 10120 12685 35109 6766 17978 35014 20543 3773
6632 10807 16892 9590 5939 34075 10673 19471 24741
5872 34008 41042 19203 7446 10025 12604 21570 33684
19136 7365 9930 12495 34919 11532 6985 17245 7338
14848 17598 25108 35368 13393 33913 10483 17330 5559
33589 19041 7284 9835 12414 33494 37011 18823 9645
5112 35152 49220 11342 7691 12961 17951 20810 41097
4040 6605 11074 17817 24851 14468 24784 34988 5845
33399 37154 18742 10012 12633 33265 18661 9455 5818
35858 41016 3945 6524 9187 21544 19082 7311 11808
14373 17627 24689 35341 5988 34124 10694 7043 17303
37440 19028 22545 9822 13339 33971 10905 9688 5085
18987 7230 12948 17770 33468 3565 10599 6962 21030
35098 49166 11428 6881 17141 35017 20896 34562 37127
11048 18771 9593 37060 19600 24730 5791 12853 40989
3932 7449 9174 12691 21517 33211 18607 11781 14416
24900 34936 21249 4003 6582 20706 34400 36965 10858
19505 24635 5934 34182 10668 2045 9079 37386 18974
7259 9908 12529 17743 33497 18840 11538 6935 25606
21059 11457 6868 18304 20869 34087 11021 13388 34020
10478 6827 17087 5610 13120 33640 18745 9651 37006
18650 11376 6773 18209 34909 20788 3990 6611 9148
18114 20679 34373 37904 10831 14362 19716 24846
34994 5963 10697 21128 13826 34346 36911 18555 9937
12740 33260 3895 18019 20598 3828 7345 8958 12475
17829 35347 34130 10616 19526 24684 21033 49281
11403 6814 17354 5583 10080 12645 33613 37144 22540
13446 33966 41476 11349 7936 13066 18196 20817 33698
3571 9177 17639 49200 11322 6719 17259 34967 5502
3068 6585 18088 20653 25122 13351 34319 36954 10917
18766 9700 6049 34185 41219 7746 12904 18006 21523
41152 19089 7556 9883 12686 17872 35110 10589 25609
21020 3774 6395 16879 10053 13584 34104 10674 19500
24742 5859 33995 41057 19232 7461 10026 12591 17777
33671 7366 12524 35396 38913 49173 11295 6986 17246
20763 3993 11027 18061 20696 25095 13394 33914 10960
24961 6036 33590 19042 7271 12877 33509 37040 18852
9646 5099 35139 7720 12962 17980 35968 20601 41098
3803 6606 10865 17818 24880 5941 34077 10647 19529
24771 5846 41044 37393 19205 7504 9999 12634 21572
33266 18662 9932 13449 35873 41003 3946 6511 17723
7340 14374 17656 24690 35342 5751 33887 10485 7072
17332 35208 5617 33619 19015 22546 9837 13368 34448
37013 10906 18881 9675 5086 26632 7693 12935 18009
20812 33455 3566 11076 14593 24853 35113 6882 17142
35018 20659 34353 37156 10811 18800 9594 4991 33239
19587 24745 5820 12854 35860 40990 3919 7450 9189

12720 21518 33688 19084 7369 11782 14403 17629 24663
34923 21250 11648 7045 17361 36966 19506 25112 13341
33973 10431 2046 5563 13073 33593 18989 7288 9895
12530 17772 33498 18827 11553 6964 21088 35100 49224
11458 6855 18067 20870 34564 37185 11022 18773 9567
14472 24732 5849 12883 33403 18746 10128 12693 33213
18665 11363 6774 18210 34910 20775 4005 6640 9135
20708 34374 37891 10860 14377 19479 24637 35457 5992
34240 10698 17307 10033 37388 19032 7261 9938 12503
33023 11540 6993 25664 21061 3815 7346 12952 17830
35376 34145 10603 21034 49282 11432 6829 17145 5612
9843 12646 33614 37131 18719 9653 37064 18652 11350
7699 12857 18183 20818 41105 4048 6613 9178 18116
21633 49187 11785 14364 24904 34996 5965 3055 6586
20654 13828 34348 36969 10918 18557 9463 6050 34186
41248 3953 9083 18021 21552 19090 7319 9912 12477
17859 35349 34132 10590 6939 25610 21007 11405 6872
17356 20873 10054 13571 34091 11137 13504 34024
41058 18995 7462 13068 17778 33700 3573 8703 38914
49174 11324 6777 17261 35025 20792 3994 6559 11056
18062 20683 25124 13409 34377 36956 10947 19720
24962 6023 41221 7748 12878 21525 33510 37027 18615
9885 12744 35168 3899 17967 20602 3832 6397 10866
17833 24867 5942 34078 10676 19530 24800 5861 33997
41031 37394 19206 7491 10028 12649 17751 33729 22656
13450 35874 41480 11353 6988 18200 20765 3519 11029
17643 25153 13396 33916 10486 6835 17319 34971 5618
33648 19044 22561 9838 13355 34435 37014 10921 18882
9704 5101 35141 7694 12964 18010 20575 41100 3805
7560 10839 14594 17820 24854 35114 5971 10705 24773
21136 34354 36919 18787 10057 12636 33268 19616
24746 5807 35847 41005 3948 7465 9190 12707 17725
33675 7370 14432 17630 24692 35400 21041 49177 11411
7046 17362 5591 33621 19969 22548 25099 13342 33974
10908 9677 6040 13074 33594 18990 7275 12993 17535
33513 18856 11554 6951 17267 35087 6884 18096 35020
20661 34327 37186 10813 18774 9596 5945 34193 10651
19589 24719 5850 12912 41048 19209 7452 10115 12694
21576 33214 18666 11840 14405 25617 34925 21252 4006
6627 16887 37920 14378 19508 24638 35458 5755 34003
10489 17336 5565 10034 12599 33567 19019 7262 9953
12532 33500 37017 18829 11527 6994 21062 11460 7809
12939 18069 20928 35363 34146 11080 24857 6830 17146
5375 12885 33405 37160 18748 9654 5107 33243 18639
11365 7728 12858 18212 35864 20833 41106 4035 6614
9193 21634 49664 37893 11786 14351 19537 24667 34983
5966 10700 7049 17309 10007 36970 18558 9940 13457
33977 41011 3954 6519 18022 21539 19105 7348 9899
12478 17888 35350 34119 10605 6968 21036 35216 49284
11406 6859 17119 20874 9845 13600 34568 37133 11138
18777 9683 26640 7701 12831 18241 20820 33463 3574
9180 12697 35121 49189 11311 6778 17262 35026 20779
4009 6588 11043 20712 13410 34378 36943 10976 19483
24753 6052 34188 41222 3927 9085 21526 37504 19092
7377 9886 12507 17861 34931 11544 6941 25612 21065
3819 6398 17834 25344 13573 34093 10663 5862 33998
41060 37409 18997 7520 9791 12650 17780 33730 18835
9657 38916 49232 11354 6751 18187 20766 3996 6617
11030 18120 20685 25154 13383 33903 10949 14480
24964 35000 6081 33635 22562 13832 34464 37029 10922
18673 9467 5102 35142 3901 9143 18025 20604 3806 7323
10868 14385 17807 24869 35353 6000 34136 10706 19532
24774 21123 41985 37396 19264 7493 10058 12623 33255
13452 35876 41006 3711 7466 13184 17726 33704 3577
10611 17645 24679 21042 49178 11440 6837 17377 34973
5620 33622 37139 19970 22535 25128 13357 34437 37072
10895 18884 9678 6027 13089 41225 7752 12994 18012

21529 33514 18619 11793 14596 24912 35116 5973 3063
18083 20662 34356 36977 10814 18789 9583 5946 34194
10680 19590 24748 5865 12899 35905 41035 19210 7439
10144 12709 17755 33677 7372 14406 25618 34926 21015
11413 7104 17364 20881 34099 11033 19495 25101 13400
34032 10490 17323 5566 13076 33596 19048 7277 9954
12519 33487 37018 18830 11556 7009 17269 35145 7810
12968 18070 20691 43008 34385 37188 10843 19728
24858 5919 10653 24777 5852 12886 33406 36923 18735
10117 12752 33272 18668 11366 7715 17975 35851 20834
41121 4064 6629 9194 17841 37894 14380 19538 24696
35460 5757 34005 10463 7050 17310 5595 10036 12657
33625 19021 22552 9927 13458 33978 41488 11585 6996
22016 19106 7335 12941 17651 35365 34148 10606 6955
17215 35203 6888 17148 20665 9846 13363 34331 37134
10929 18778 9712 5109 33245 19593 26627 7702 12860
18242 20807 41108 4037 7568 9167 12698 21636 35122
49190 11788 14409 24669 35041 21256 4010 6575 16891
10065 36972 19512 24754 5815 33951 41013 3956 7473
9086 12603 21541 33683 19079 7378 9901 12536 17862
35408 49409 11531 6942 21066 11464 6861 18073 20876
25107 13574 34094 11140 9685 37410 18998 7283 12889
17767 33521 18864 9658 5055 35095 49219 11369 6780
18216 35028 20781 3983 6618 11045 20686 13412 34380
37897 10950 14467 19485 24727 34987 6082 41280 19217
10011 21584 37030 18674 9944 12509 34933 3902 6523
18026 20591 3821 7352 10855 14386 17836 24870 35354
5987 34123 10721 21152 49288 41986 37383 19027 7494
9849 12652 33732 37249 18837 9631 11356 7705 12947
18189 20824 33467 3578 11088 17646 25156 28673 49193
11427 6838 17378 34974 5607 33637 37168 22564 13358
34438 37059 10924 18647 9469 6056 13090 36096 41226
3931 9201 17999 21530 19096 7325 11794 14359 17865
24899 34879 5974 10708 7057 25728 21125 34343 36978
18790 10060 13577 34209 10667 5866 35906 41064 19001
7468 9907 12710 17784 33678 3551 10613 25633 21044
38920 49180 11414 6867 17351 20882 34576 37141 11034
19972 22593 25102 13387 34019 10953 24968 6029 13063
33583 7278 12996 33516 37033 18621 11319 7010 17270
35146 20787 4017 9147 18085 20720 34386 36951 10872
19715 24873 5948 34196 10654 19648 24778 5839 12901
41037 37400 19212 7497 10118 12739 17757 33259 15360
25620 35880 21073 41122 3827 6630 17842 34101 10559
19553 24683 5758 34006 10492 6841 17325 5624 10023
12658 33626 19022 22539 9956 13473 34441 37020 41475
18888 11586 6983 18195 7812 12942 18128 20693 35366
33911 10845 14600 24860 35232 5977 3067 17135 20666
13840 34360 36925 10930 18793 9699 5110 33246 19594
26656 7717 12847 18033 35853 20836 41095 4038 7555
9196 12713 17815 35585 37952 14410 19540 24670 35042
21019 11417 7052 17368 5597 10066 12631 33151 19499
25217 13460 33980 41014 3943 7474 13080 21542 33712
19108 7393 9902 12523 17653 35395 49410 11560 6957
17273 35205 6862 18074 20639 25136 13365 34333 37192
10903 18780 9686 6035 41233 26629 7760 12890 18244
21761 33522 18851 10121 12700 35124 49248 11370 6767
17979 35015 20782 4012 6633 11046 16893 9591 37898
14496 19486 24756 35464 5873 34009 41043 19218 7447
10040 12605 21571 33685 19137 7380 9931 12510 34934
11533 7000 21068 3822 7339 14849 17599 25109 35369
13632 34152 10722 17331 37412 19056 7285 9850 12415
33495 37250 18838 9660 5113 35153 49221 11343 7706
12976 18190 20811 41112 4041 6620 11075 21640 28674
49194 11904 14469 24785 34989 6084 33638 37155 18743
10013 37088 18676 9470 5819 35859 41017 3960 6525
9202 18028 21545 19083 7326 11809 14388 17866 24928
35356 5989 34125 10695 7058 21126 41988 37441 19029

22784 9823 13578 34210 11144 9689 19002 7231 12949
17771 33469 3580 10614 6963 25634 21031 35099 49167
11429 6896 17380 35032 20897 34563 37142 11049 22594
13416 34496 37061 10954 19601 24731 6030 13092 41228
3933 9175 21532 37034 18622 11796 14417 24901 34937
21264 4018 6583 18086 20707 34401 36980 10859 19744
24874 5935 34183 10669 5868 12902 35908 41038 37387
18975 7498 9909 12768 17758 33736 18841 11539 25607
21074 11472 6869 18305 20884 34102 11036 19554 25160
13389 34021 10479 6842 17326 5611 13121 33641 22568
13474 34442 37007 41504 18651 11377 7012 18224 35148
20789 3991 9149 18115 20694 34388 37905 10846 14363
19717 24847 34995 5978 10712 24780 21129 13827 34347
36926 18794 10176 12741 33261 7718 18034 35854 20599
41124 3829 7584 8959 12714 17844 35586 34131 10617
19527 24685 21048 49296 11418 6815 17355 5598 10081
12660 33628 37145 19976 22541 25218 13447 33967
41477 11588 7937 13067 18197 33699 7394 13000 17654
35424 49201 11323 6958 17274 35206 5503 3069 18089
20668 25123 13366 34334 36955 10932 18767 9701 6064
34200 41234 19596 26630 7747 12905 18007 21762 41153
19328 7557 10122 12687 17873 35111 14412 25624 35044
21021 3775 6634 16894 10068 13585 34105 10675 19501
24743 5874 34010 41072 19233 7476 10027 12606 21600
33686 19138 7367 9960 12525 35397 38928 49412 11534
6987 17247 7816 14850 18076 20697 25110 35370 13395
33915 10961 24976 6037 33591 19043 7286 12892 33524
37041 18853 9647 5114 35154 49222 11372 7721 12963
17981 35969 20840 41099 4042 6607 11104 17819 24881
37900 14470 19544 24786 34990 5847 41045 37632 19220
7505 10014 12635 21573 33267 18663 9933 13464 35888
41018 3947 6526 21546 19112 7341 11810 14375 17657
24691 35343 5990 34126 10724 7073 17333 35209 37442
19030 22547 9852 13369 34449 37252 10907 18896 9690
5087 26633 7708 12950 18248 20813 33470 3567 11077
14608 28676 35128 49196 11430 6883 17143 35019 20898
34592 37157 11050 18801 9595 37062 19602 24760 5821
12855 35861 40991 3934 7451 9204 12721 21519 33689
19085 7384 11783 14418 17868 24902 34938 21251 11649
7060 21184 34402 36967 19507 25113 13580 34212 10670
2047 37416 19004 7289 9910 12531 17773 33499 18842
11568 6965 25636 21089 35101 49225 11459 6870 18306
20871 34565 37200 11023 22596 13390 34022 10956
14473 24733 6088 13122 33642 18747 10129 37036 18680
11378 6775 18211 34911 20790 4020 6641 9150 18144
20709 34375 37906 10861 14392 19718 24876 35472 5993
34241 10699 21130 13856 41992 37389 19033 7500 9939
12742 33262 11541 25665 21076 3830 7347 12953 17831
35377 34160 10618 19556 24686 21035 49283 11433 6844
17384 5613 10082 12647 33615 37146 22542 13476 34444
37065 41478 18653 11351 7938 13096 18198 20819 41344
4049 9179 18117 21648 49202 11800 14365 24905 34997
5980 3070 6587 18090 20655 13829 34349 36984 10919
18796 9702 6051 34187 41249 7776 12906 18036 35912
21553 41154 19091 7558 9913 12716 17874 35588 34133
10591 25611 21022 11420 6873 17357 20888 10055 13586
34106 11152 19502 25220 13505 34025 41059 19234 7463
13069 17779 33701 7396 12526 35398 38915 49175 11325
7016 17276 35264 20793 3995 11057 18063 20698 25125
13424 34392 36957 10962 19721 24963 6038 41236 26688
7749 12879 21764 33511 37042 18854 10124 12745 35169
7722 17982 35970 20603 41128 3833 6636 10867 17848
24882 5943 34079 10677 19531 24801 5876 34012 41046
37395 19207 7506 10029 12664 21574 33744 19140 22657
9934 13451 35875 41481 11592 6989 18201 7342 14852
17658 25168 35372 13397 33917 10487 7074 17334 35210
5619 33649 19045 22576 9839 13370 34450 37015 10936

18883 9705 5116 35156 50176 26634 7695 12965 18011
20814 41101 4044 7561 11078 14595 17821 24855 35115
14528 24788 35048 21137 34355 37158 18802 10072
12637 33269 19617 24747 5822 35862 41020 3949 7480
9191 12722 21548 33690 19086 7371 11812 14433 17631
24693 35401 21280 49416 11650 7047 17363 37444 19984
22549 25114 13343 33975 10909 9692 6041 13075 33595
18991 7290 13008 17774 33528 18857 11555 6966 21090
35102 49226 11488 6885 18097 35021 20900 34566 37187
11052 18775 9597 38016 14474 19604 24734 5851 12913
41049 19224 7453 10130 12695 21577 33215 18667 11841
14420 25856 34940 21253 4007 6642 20710 34404 37921
10862 14379 19509 24639 35459 5994 34242 10728 17337
10035 37390 19034 7263 9968 12533 33501 37256 18844
11542 6995 25666 21063 11461 7824 12954 18308 20929
35378 34147 11081 28680 49312 11434 6831 17147 5614
13124 33644 37161 18749 9655 37066 18654 11380 7729
12859 18213 35865 20848 41107 4050 6615 9208 18118
21635 49665 37908 11787 14366 19776 24906 34998 5967
10701 7064 21132 13830 34350 36971 18559 9941 13696
34216 41250 3955 18023 21554 19120 7349 9914 12479
17889 35351 34134 10620 6969 25640 21037 35217 49285
11407 6874 17358 20875 10084 13601 34569 37148 11139
22600 13506 34026 41536 26641 7940 13070 18256 20821
33702 3575 9181 38944 49204 11326 6779 17263 35027
20794 4024 6589 11058 18092 20713 25126 13411 34379
36958 10977 19722 24992 6053 34189 41223 7750 12908
21527 41156 37505 19093 7616 9887 12746 17876 35170
11545 25613 21080 3834 6399 17835 25345 13588 34108
10678 19560 24802 5863 33999 41061 37424 19236 7521
10030 12651 17781 33731 22658 13480 36352 38917
41482 49233 11355 6990 18202 20767 3997 11031 18121
20700 25155 13398 33918 10964 14481 24965 35001 6096
33650 19046 22563 13833 34465 37044 10923 18912 9706
5103 35143 7724 12966 18040 35972 20605 41102 3807
7562 10869 14624 17822 24884 35592 6001 34137 10707
19533 24775 21138 42000 37397 19265 7508 10059 12638
33270 19618 25224 13453 35877 41007 3950 7467 13185
17727 33705 7400 14434 17660 24694 35402 21043 49179
11441 7076 17392 35212 5621 33623 19971 22550 25129
13372 34452 37073 10910 18885 9679 6042 13104 41240
26636 7753 12995 18013 21768 33515 18858 12032 14597
24913 35117 6886 18098 35022 20663 34357 37216 10815
18804 9598 5947 34195 10681 19591 24749 5880 12914
35920 41050 19211 7454 10145 12724 21578 33692 19144
7373 11842 14407 25619 34927 21254 11652 7105 17365
37922 14856 19510 25116 35488 13401 34033 10491
17338 5567 13077 33597 19049 7292 9955 12534 33502
37019 18831 11557 7024 21092 35160 49228 11462 7811
12969 18071 20930 43009 34624 37189 11082 19729
24859 14476 24792 5853 12887 33407 37162 18750 10132
12753 33273 18669 11367 7730 18214 35866 20835 41136
4065 6644 9195 21664 49666 37895 11816 14381 19539
24697 35461 5996 34244 10702 7051 17311 10037 37448
19036 22553 9942 13459 33979 41489 11600 6997 25668
22017 19107 7350 12956 17890 35380 34149 10607 6970
21038 35218 49286 11436 6889 17149 20904 9847 13602
34570 37135 11168 18779 9713 37068 19608 26642 7703
12861 18243 20822 41109 4052 7569 9182 12699 21637
35123 49191 11789 14424 24908 35056 21257 4011 6590
20714 13888 34408 36973 10978 19513 24755 6054 34190
41252 3957 9087 21556 37506 19094 7379 9916 12537
17863 35409 49424 11546 6943 25614 21067 11465 6876
18312 20877 25346 13575 34095 11141 13508 34028
41062 37411 18999 7522 13128 17782 33760 18865 9659
38918 49234 11384 6781 18217 35029 20796 3998 6619
11060 18122 20687 25184 13413 34381 37912 10951

14482 19724 24966 35002 6083 41281 23040 13834 21585
34466 37031 18675 9945 12748 35172 3903 18027 20606
3836 7353 10870 14387 17837 24871 35355 6002 34138
10736 19534 24804 21153 49289 41987 37398 19266 7495
10088 12653 33733 37264 22660 13454 35878 41484
11357 7944 13186 18204 20825 33706 3579 11089 17647
25157 28688 49208 11442 6839 17379 34975 5622 33652
37169 20000 22565 25130 13359 34439 37074 10925
18886 9708 6057 13091 36097 41227 7754 13024 18014
21531 41160 19097 7564 11795 14598 17880 24914 35118
5975 10709 25729 21140 34358 36979 18791 10061 13592
34224 10682 19620 24750 5867 35907 41065 19240 7469
10146 12711 17785 33679 7374 14436 25648 35404 21045
38921 49181 11415 7106 17366 20883 34577 11035 19973
22608 25103 13402 34034 10968 24969 6044 13078 33598
19050 7279 12997 33517 37048 18860 11558 7011 17271
35147 7840 12970 18100 35976 20721 43010 34387 37190
10873 19730 24888 5949 34197 10655 19649 24779 5854
12916 41052 37401 19213 7512 10119 12754 21580 33274
18670 11844 15361 25621 35881 21312 41123 4066 6631
17843 37924 14382 19568 24698 35462 5759 34007 10493
7080 17340 5625 10038 12659 33627 19023 22554 9957
13488 34456 37021 41490 18889 11587 6998 22018 26752
7813 12943 18129 20932 35367 34150 11084 14601 24861
35233 6890 17150 20667 13841 34361 37164 10931 18808
9714 5111 33247 19595 26657 7732 12862 18272 35868
20837 41110 4039 7570 9197 12728 21638 35600 49668
37953 11790 14411 19541 24671 35043 21258 11656 7053
17369 10067 36974 19514 25232 13461 33981 41015 3958
7475 13081 21543 33713 19109 7408 9903 12538 17892
35410 49411 11561 6972 21096 35220 49344 11466 6863
18075 20878 25137 13604 34572 37193 11142 18781 9687
45056 26644 7761 12891 18245 21776 33523 18866 10136
12701 35125 49249 11371 6782 18218 35030 20783 4013
6648 11047 20716 13414 34382 37899 10980 14497 19487
24757 35465 6112 34248 41282 19219 10041 21586 37508
19152 7381 9946 12511 34935 11548 7001 25672 21069
3823 7354 14864 17838 25348 35384 13633 34153 10723
21154 49290 42016 37413 19057 7524 9851 12654 33734
37251 18839 9661 38976 49236 11358 7707 12977 18191
20826 41113 4056 6621 11090 18124 21641 25158 28675
49195 11905 14484 25024 35004 6085 33639 37170 22566
13836 34468 37089 10926 18677 9471 6058 36098 41256
3961 9203 18029 21560 19098 7327 11824 14389 17867
24929 35357 6004 34140 10710 7059 25730 21127 41989
37456 19268 22785 10062 13579 34211 11145 13512 35936
41066 19003 7470 13188 17786 33708 3581 10615 25635
21046 38922 49182 11444 6897 17381 35033 20912 34578
37143 11064 19974 22595 25132 13417 34497 37076
10955 19840 24970 6031 13093 41229 7756 12998 21533
33518 37035 18623 11797 14656 24916 35176 21265 4019
18087 20722 34416 36981 10874 19745 24875 5950 34198
10684 19650 24808 5869 12903 35909 41039 37402 19214
7499 10148 12769 17759 33737 22664 15362 25622 35882
21075 41600 11473 7108 18320 20885 34103 11037 19555
25161 13404 34036 10494 6843 17327 5626 13136 33656
19052 22569 9958 13475 34443 37022 41505 18890 11616
7013 18225 35149 7814 12972 18130 20695 43012 34389
38144 10847 14602 19732 24862 35234 5979 10713 24781
21144 13842 34362 36927 18795 10177 12756 33276
19624 26658 7719 18035 35855 20838 41125 4068 7585
9198 12715 17845 35587 37954 14440 19542 24700 35520
21049 49297 11419 7054 17370 5599 10096 12661 33629
19977 22556 25219 13462 33982 41492 11589 7952 13082
22020 33714 19110 7395 13001 17655 35425 49440 11562
6959 17275 35207 6892 18104 20669 25138 13367 34335
37194 10933 18782 9716 6065 34201 41235 19597 26631

7762 12920 18246 21763 41168 19329 7572 10123 12702
21696 35126 49250 11848 14413 25625 35045 21260 4014
6635 16895 10069 37928 14498 19516 24758 35466 5875
34011 41073 19248 7477 10042 12607 21601 33687 19139
7382 9961 12540 35412 38929 49413 11535 7002 21070
11468 7817 14851 18077 20936 25111 35371 13634 34154
11200 24977 37414 19058 7287 12893 33525 37280 18868
9662 5115 35155 49223 11373 7736 12978 18220 35984
20841 41114 4043 6622 11105 21642 28704 49672 37901
11906 14471 19545 24787 34991 6086 41284 37633 19221
10015 21588 37090 18678 9948 13465 35889 41019 3962
6527 18030 21547 19113 7356 11811 14390 17896 24930
35358 5991 34127 10725 7088 21156 35224 49292 41990
37443 19031 22786 9853 13608 34688 37253 11146 18897
9691 26648 7709 12951 18249 20828 33471 3582 11092
14609 26112 28677 35129 49197 11431 6898 17382 35034
20899 34593 37172 11051 22624 13418 34498 37063
10984 19603 24761 6060 13094 36100 41230 3935 9205
21534 37512 19100 7385 11798 14419 17869 24903 34939
21266 11664 7061 25732 21185 34403 36982 19746 25352
13581 34213 10671 5870 35910 41068 37417 19005 7528
9911 12770 17788 33738 18843 11569 25637 21104 38924
49240 11474 6871 18307 20886 34580 37201 11038 20032
22597 25162 13391 34023 10957 14488 24972 6089 13123
33643 22570 13952 34472 37037 41506 18681 11379 7014
18226 35150 20791 4021 9151 18145 20724 34390 37907
10876 14393 19719 24877 35473 6008 34256 10714 19652
24782 21131 13857 41993 37404 19272 7501 10178 12743
33263 15364 25680 35884 21077 41126 3831 7586 13192
17846 35616 34161 10619 19557 24687 21050 49298
11448 6845 17385 5628 10083 12662 33630 37147 19978
22543 25248 13477 34445 37080 41479 18892 11590 7939
13097 18199 41345 7872 13002 18132 21649 35426 49203
11801 14604 24920 35236 5981 3071 18091 20670 13844
34364 36985 10934 18797 9703 6066 34202 41264 19598
26660 7777 12907 18037 35913 21792 41155 19330 7559
10152 12717 17875 35589 37956 14414 25626 35046
21023 11421 7112 17372 20889 10070 13587 34107 11153
19503 25221 13520 34040 41074 19235 7478 13084 21602
33716 19168 7397 9962 12527 35399 38930 49414 11564
7017 17277 35265 7818 14880 18078 20699 25140 43016
13425 34393 37196 10963 19736 24978 6039 41237 26689
7764 12894 21765 33526 37043 18855 10125 12760 35184
49252 11374 7723 17983 35971 20842 41129 4072 6637
11106 17849 24883 37902 14500 19546 24816 35468 5877
34013 41047 37634 19222 7507 10044 12665 21575 33745
19141 22672 9935 13466 35890 41496 11593 7004 22024
19114 7343 14853 17659 25169 35373 13636 34156 10726
7075 17335 35211 37472 19060 22577 9854 13371 34451
37254 10937 18898 9720 5117 35157 50177 26635 7710
12980 18250 20815 41116 4045 7576 11079 14610 21644
28678 35130 49198 11908 14529 24789 35049 21376
34594 37159 18803 10073 37092 19632 24762 5823 35863
41021 3964 7481 9206 12723 21549 33691 19087 7386
11813 14448 17870 24932 35416 21281 49417 11651 7062
21186 42048 37445 19985 22788 25115 13582 34214 11148
9693 37418 19006 7291 13009 17775 33529 18872 11570
6967 25638 21091 35103 49227 11489 6900 18336 35036
20901 34567 37202 11053 22598 13420 34500 38017
10958 14475 19605 24735 6090 13152 41288 19225 10131
21592 37038 18682 11856 14421 25857 34941 21268 4022
6643 18146 20711 34405 37936 10863 14394 19748 24878
35474 5995 34243 10729 21160 13858 51200 41994 37391
19035 7502 9969 12772 33740 37257 18845 11543 25667
21078 11476 7825 12955 18309 20944 35379 34162 11096
19558 25164 28681 49313 11435 6846 17386 5615 13125
33645 37176 22572 13478 34446 37067 41508 18655

11381 7968 13098 18228 36104 20849 41346 4051 9209
18119 21650 49680 37909 11802 14367 19777 24907
34999 5982 10716 7065 25736 21133 13831 34351 36986
18798 10180 13697 34217 41251 7778 18038 35914 21555
41184 19121 7588 9915 12718 17904 35590 34135 10621
25641 21052 39040 49300 11422 6875 17359 20890 10085
13616 34584 37149 11154 19980 22601 25222 13507
34027 41537 26880 7941 13071 18257 33703 7398 13004
35428 38945 49205 11327 7018 17278 35266 20795 4025
11059 18093 20728 25127 13426 34394 36959 10992
19723 24993 6068 34204 41238 19656 26690 7751 12909
21766 41157 37520 19332 7617 10126 12747 17877 35171
15368 25628 36000 21081 41130 3835 6638 17850 25360
13589 34109 10679 19561 24803 5878 34014 41076 37425
19237 7536 10031 12666 21604 33746 19142 22659 9964
13481 36353 38932 41483 49472 11594 6991 18203 7820
14854 18136 20701 25170 35374 13399 33919 10965
14720 24980 35240 6097 33651 19047 22578 13848 34480
37045 10938 18913 9707 5118 35158 50178 26664 7725
12967 18041 35973 20844 41103 4046 7563 11108 14625
17823 24885 35593 37960 14530 19548 24790 35050
21139 42001 37636 19280 7509 10074 12639 33271 19619
25225 13468 35892 41022 3951 7482 13200 21550 33720
19116 7401 11814 14435 17661 24695 35403 21282 49418
11680 7077 17393 35213 37446 19986 22551 25144 13373
34453 37312 10911 18900 9694 6043 13105 41241 26637
7768 13010 18252 21769 33530 18859 12033 14612 28736
35132 49256 11490 6887 18099 35023 20902 34596 37217
11054 18805 9599 38018 14504 19606 24764 5881 12915
35921 41051 19226 7455 10160 12725 21579 33693 19145
7388 11843 14422 25858 34942 21255 11653 7120 21188
34406 37923 14857 19511 25117 35489 13640 34272
10730 17339 37420 19064 7293 9970 12535 33503 37258
18846 11572 7025 25696 21093 35161 49229 11463 7826
12984 18310 20931 43024 34625 37204 11083 23552
28682 49314 11912 14477 24793 6092 13126 33646 37163
18751 10133 37096 18684 11382 7731 18215 35867 20850
41137 4080 6645 9210 18148 21665 49667 37910 11817
14396 19778 24936 35476 5997 34245 10703 7066 21134
13860 41996 37449 19037 22792 9943 13698 34218 41728
11601 25669 22032 19122 7351 12957 17891 35381 34164
10622 6971 25642 21039 35219 49287 11437 6904 17388
20905 10086 13603 34571 37150 11169 22602 13536
34504 37069 41538 19609 26643 7942 13100 18258 20823
41348 4053 9183 21652 38946 49206 11804 14425 24909
35057 21272 4026 6591 18094 20715 13889 34409 36988
10979 19752 24994 6055 34191 41253 7780 12910 35916
21557 41158 37507 19095 7618 9917 12776 17878 35648
49425 11547 25615 21082 11480 6877 18313 20892 25347
13590 34110 11156 19562 25280 13509 34029 41063 37426
19238 7523 13129 17783 33761 22688 13482 36354 38919
41512 49235 11385 7020 18232 35268 20797 3999 11061
18123 20702 25185 13428 34396 37913 10966 14483
19725 24967 35003 6098 41296 26692 23041 13835 21824
34467 37046 18914 10184 12749 35173 7726 18042 35974
20607 41132 3837 7592 10871 14626 17852 24886 35594
6003 34139 10737 19535 24805 21168 49304 42002 37399
19267 7510 10089 12668 33748 37265 20096 22661 25226
13455 35879 41485 11596 7945 13187 18205 33707 7402
14912 17662 25172 35432 28689 49209 11443 7078 17394
35214 5623 33653 20001 22580 25131 13374 34454 37075
10940 18887 9709 6072 13106 36112 41242 50180 26638
7755 13025 18015 21770 41161 19336 7565 12034 14599
17881 24915 35119 14532 25744 35052 21141 34359
37218 18806 10076 13593 34225 10683 19621 24751 5882
35922 41080 19241 7484 10147 12726 21608 33694 19146
7375 11872 14437 25649 35405 21284 38936 49420 11654
7107 17367 38400 14858 19988 22609 25118 35490 13403
34035 10969 24984 6045 13079 33599 19051 7294 13012
33532 37049 18861 11559 7026 21094 35162 49230 11492
7841 12971 18101 35977 20960 43011 34626 37191 11112
19731 24889 38020 14478 19664 24794 5855 12917 41053
37640 19228 7513 10134 12755 21581 33275 18671 11845
15376 25860 35896 21313 41138 4067 6646 21666 49696
37925 11818 14383 19569 24699 35463 5998 34246 10732
7081 17341 10039 37450 19038 22555 9972 13489 34457
37260 41491 18904 11602 6999 25670 22019 26753 7828
12958 18368 20933 35382 34151 11085 14616 28684
35248 49316 11438 6891 17151 20906 14080 34600 37165
11170 18809 9715 37070 19610 26672 7733 12863 18273
35869 20852 41111 4054 7571 9212 12729 21639 35601
49669 37968 11791 14426 19780 24910 35058 21259
11657 7068 21192 13890 34410 36975 19515 25233 13700
34220 41254 3959 21558 37536 19124 7409 9918 12539
17893 35411 49426 11576 6973 25644 21097 35221 49345
11467 6878 18314 20879 25376 13605 34573 37208 11143
22604 13510 34030 41540 45057 26645 8000 13130 18260
21777 33762 18867 10137 38948 49264 11386 6783 18219
35031 20798 4028 6649 11062 18152 20717 25186 13415
34383 37914 10981 14512 19726 24996 35480 6113 34249
41283 23042 13864 21587 42112 37509 19153 7620 9947
12750 35174 11549 25673 21084 3838 7355 14865 17839
25349 35385 13648 34168 10738 19564 24806 21155
49291 42017 37428 19296 7525 10090 12655 33735 37266
22662 13484 36356 38977 41486 49237 11359 7946 13216
18206 20827 41352 4057 11091 18125 21656 25159 28690
49210 11920 14485 25025 35005 6100 33654 37171 20002
22567 13837 34469 37104 10927 18916 9710 6059 36099
41257 7784 13026 18044 36032 21561 41162 19099 7566
11825 14628 17882 24944 35596 6005 34141 10711 25731
21142 42004 37457 19269 22800 10063 13594 34226 11160
19622 25228 13513 35937 41067 19242 7471 13189 17787
33709 7404 14438 25650 35406 21047 38923 49183 11445
7136 17396 35272 20913 34579 11065 19975 22610 25133
13432 34512 37077 10970 19841 24971 6046 13108 41244
26696 7757 12999 21772 33519 37050 18862 12036 14657
24917 35177 7842 18102 35978 20723 43040 34417 37220
10875 19760 24890 5951 34199 10685 19651 24809 5884
12918 35924 41054 37403 19215 7514 10149 12784 21582
33752 19148 22665 11846 15363 25623 35883 21314
41601 11712 7109 18321 37926 14860 19570 25176 35492
13405 34037 10495 7082 17342 5627 13137 33657 19053
22584 9959 13490 34458 37023 41520 18891 11617 7028
22048 35164 50184 26754 7815 12973 18131 20934 43013
34628 38145 11086 14603 19733 24863 35235 14536
24796 21145 13843 34363 37166 18810 10192 12757
33277 19625 26659 7734 18274 35870 20839 41140 4069
7600 9199 12730 21668 35602 49670 37955 11820 14441
19543 24701 35521 21288 49536 11658 7055 17371 10097
37452 19992 22557 25234 13463 33983 41493 11604 7953
13083 22021 33715 19111 7410 13016 17894 35440 49441
11563 6974 21098 35222 49346 11496 6893 18105 20908
25139 13606 34574 37195 11172 18783 9717 38024 45058
19612 26646 7763 12921 18247 21778 41169 19344 7573
10138 12703 21697 35127 49251 11849 14428 25864
35060 21261 4015 6650 20718 13892 34412 37929 10982
14499 19517 24759 35467 6114 34250 41312 19249 10043
21616 37510 19154 7383 9976 12541 35413 39168 49428
11550 7003 25674 21071 11469 7832 14866 18316 20937
25350 35386 13635 34155 11201 28800 49320 42018
37415 19059 7526 13132 33764 37281 18869 9663 38978
49238 11388 7737 12979 18221 35985 20856 41115 4058
6623 11120 18126 21643 25188 28705 49673 37916 11907
14486 19784 25026 35006 6087 41285 37648 23044 13838

21589 34470 37091 18679 9949 13704 36128 41258 3963
18031 21562 19128 7357 11826 14391 17897 24931 35359
6006 34142 10740 7089 25760 21157 35225 49293 41991
37458 19270 22787 10092 13609 34689 37268 11147
22720 13514 35938 41544 26649 7948 13190 18264 20829
33710 3583 11093 26113 28692 38952 49212 11446 6899
17383 35035 20914 34608 37173 11066 20004 22625
25134 13419 34499 37078 10985 19842 25000 6061 13095
36101 41231 7758 13028 21535 41164 37513 19101 7624
11799 14658 17884 24918 35178 21267 11665 25733
21200 34418 36983 19747 25353 13596 34228 10686
19680 24810 5871 35911 41069 37432 19244 7529 10150
12771 17789 33739 22666 15392 25652 36360 21105
38925 41602 49241 11475 7110 18322 20887 34581 11039
20033 22612 25163 13406 34038 10972 14489 24973 6104
13138 33658 19054 22571 13953 34473 37052 41507
18920 11618 7015 18227 35151 7844 12974 18160 35980
20725 43014 34391 38146 10877 14632 19734 24892
35712 6009 34257 10715 19653 24783 21146 13872 42008
37405 19273 7516 10179 12758 33278 19626 27136 15365
25681 35885 21316 41127 4070 7587 13193 17847 35617
37984 14442 19572 24702 35522 21051 49299 11449 7084
17400 5629 10098 12663 33631 19979 22558 25249 13492
34460 37081 41494 18893 11591 7954 13112 22022 41360
26756 7873 13003 18133 21888 35427 49442 12040 14605
24921 35237 6894 18106 20671 13845 34365 37224 10935
18812 9718 6067 34203 41265 19599 26661 7792 12922
18276 35928 21793 41170 19331 7574 10153 12732 21698
35604 49728 37957 11850 14415 25627 35047 21262
11660 7113 17373 10071 37930 14976 19518 25236 35496
13521 34041 41075 19250 7479 13085 21603 33717 19169
7412 9963 12542 35414 38931 49415 11565 7032 21100
35280 49348 11470 7819 14881 18079 20938 25141 43017
13664 34632 37197 11202 19737 24979 45060 26704 7765
12895 21780 33527 37282 18870 10140 12761 35185
49253 11375 7738 18222 35986 20843 41144 4073 6652
11107 21672 28706 49674 37903 11936 14501 19547 24817
35469 6116 34252 41286 37635 19223 10045 21590 37568
19156 22673 9950 13467 35891 41497 11608 7005 25676
22025 19115 7358 14868 17898 25408 35388 13637 34157
10727 7090 21158 35226 49294 42020 37473 19061 22816
9855 13610 34690 37255 11176 18899 9721 38980 50192
26650 7711 12981 18251 20830 41117 4060 7577 11094
14611 21645 26114 28679 35131 49199 11909 14544 25028
35064 21377 34595 37174 22626 13896 34528 37093
10986 19633 24763 6062 36102 41260 3965 9207 21564
37514 19102 7387 11828 14449 17871 24933 35417 21296
49432 11666 7063 25734 21187 42049 37460 20224 22789
25354 13583 34215 11149 13516 35940 41070 37419
19007 7530 13248 17790 33768 18873 11571 25639 21106
38926 49242 11504 6901 18337 35037 20916 34582 37203
11068 20034 22599 25192 13421 34501 38032 10959
14490 19844 24974 6091 13153 41289 23048 13954 21593
34474 37039 18683 11857 14660 25872 35180 21269 4023
18147 20726 34420 37937 10878 14395 19749 24879
35475 6010 34258 10744 19654 24812 21161 13859 51201
41995 37406 19274 7503 10208 12773 33741 37272 22668
15366 25682 35886 21079 41604 11477 8064 13194 18324
20945 35618 34163 11097 19559 25165 28696 49328
11450 6847 17387 5630 13140 33660 37177 20008 22573
25250 13479 34447 37082 41509 18894 11620 7969 13099
18229 36105 41347 7874 13032 18134 21651 43072 49681
38148 11803 14606 19792 24922 35238 5983 10717 25737
21148 13846 34366 36987 18799 10181 13712 34232
41266 19628 26662 7779 18039 35915 21794 41185 19360
7589 10154 12719 17905 35591 37958 14444 25656 35524
21053 39041 49301 11423 7114 17374 20891 10100 13617

34585 11155 19981 22616 25223 13522 34042 41552
26881 7956 13086 22080 33718 19170 7399 13005 35429
38960 49444 11566 7019 17279 35267 7848 14882 18108
20729 25142 43018 13427 34395 37198 10993 19738
25008 6069 34205 41239 19657 26691 7766 12924 21767
41172 37521 19333 7632 10127 12762 21700 35186 49254
11852 15369 25629 36001 21320 41131 4074 6639 17851
25361 37932 14502 19576 24818 35470 5879 34015 41077
37664 19252 7537 10046 12667 21605 33747 19143 22674
9965 13496 36368 38933 41498 49473 11595 7006 22026
26760 7821 14855 18137 20940 25171 35375 13638 34158
11204 14721 24981 35241 37474 19062 22579 13849
34481 37284 10939 18928 9722 5119 35159 50179 26665
7740 12982 18280 35988 20845 41118 4047 7578 11109
14640 21646 28708 35608 49676 37961 11910 14531
19549 24791 35051 21378 42240 37637 19281 10075
37094 19634 25240 13469 35893 41023 3966 7483 13201
21551 33721 19117 7416 11815 14450 17900 24934 35418
21283 49419 11681 7092 21216 35228 49352 42050 37447
19987 22790 25145 13612 34692 37313 11150 18901 9695
45064 26652 7769 13011 18253 21784 33531 18874 12048
14613 26116 28737 35133 49257 11491 6902 18338 35038
20903 34597 37232 11055 22628 13422 34502 38019
10988 14505 19607 24765 6120 13154 36160 41290 19227
10161 21594 37516 19160 7389 11858 14423 25859 34943
21270 11668 7121 25792 21189 34407 37938 14872 19750
25356 35504 13641 34273 10731 21162 51202 42024
37421 19065 7532 9971 12774 33742 37259 18847 11573
25697 21108 38984 49244 11478 7827 12985 18311 20946
43025 34640 37205 11098 20036 23553 25166 28683
49315 11913 14492 25032 6093 13127 33647 37178 22574
13956 34476 37097 41510 18685 11383 7970 18230 36106
20851 41376 4081 9211 18149 21680 49682 37911 11832
14397 19779 24937 35477 6012 34260 10718 7067 25738
21135 13861 41997 37464 19276 22793 10182 13699
34219 41729 15424 25684 35944 22033 41186 19123 7590
13196 17906 35620 34165 10623 25643 21054 39042
49302 11452 6905 17389 20920 10087 13618 34586 37151
11184 19982 22603 25252 13537 34505 37084 41539
19848 26882 7943 13101 18259 41349 7876 13006 21653
35430 38947 49207 11805 14664 24924 35296 21273 4027
18095 20730 13904 34424 36989 10994 19753 24995 6070
34206 41268 19658 26720 7781 12911 35917 21796 41159
37522 19334 7619 10156 12777 17879 35649 53248 15370
25630 36002 21083 41608 11481 7116 18328 20893 25362
13591 34111 11157 19563 25281 13524 34044 41078 37427
19239 7538 13144 21606 33776 19172 22689 9966 13483
36355 38934 41513 49474 11624 7021 18233 35269 7822
14884 18138 20703 25200 43020 13429 34397 38152
10967 14722 19740 24982 35242 6099 41297 26693 23056
13850 21825 34482 37047 18915 10185 12764 35188
50208 26666 7727 18043 35975 20846 41133 4076 7593
11110 14627 17853 24887 35595 37962 14560 19550 24820
35528 21169 49305 42003 37638 19282 7511 10104 12669
33749 20097 22676 25227 13470 35894 41500 11597 7960
13202 22028 33722 19118 7403 14913 17663 25173 35433
28928 49448 11682 7079 17395 35215 37476 20016 22581
25146 13375 34455 37314 10941 18902 9724 6073 13107
36113 41243 50181 26639 7770 13040 18254 21771 41176
19337 7580 12035 14614 21704 28738 35134 49258 11968
14533 25745 35053 21380 34598 37219 18807 10077
38048 14506 19636 24766 5883 35923 41081 19256 7485
10162 12727 21609 33695 19147 7390 11873 14452 25888
35420 21285 38937 49421 11655 7122 21190 42052 38401
14859 19989 22848 25119 35491 13642 34274 11208
24985 37422 19066 7295 13013 33533 37288 18876 11574
7027 25698 21095 35163 49231 11493 7856 12986 18340

35992 20961 43026 34627 37206 11113 23554 28712 49792
38021 11914 14479 19665 24795 6094 13156 41292 37641
19229 10135 21596 35798 18686 11860 15377 25861
35897 21328 41139 4082 6647 18150 21667 49697 37940
11819 14398 19808 24938 35478 5999 34247 10733 7096
21164 13862 51204 41998 37451 19039 22794 9973 13728
34696 37261 41730 18905 11603 25671 22034 26768 7829
12959 18369 20948 35383 34166 11100 14617 26120
28685 35249 49317 11439 6906 17390 20907 14081 34601
37180 11171 22632 13538 34506 37071 41568 19611 26673
7972 13102 18288 36108 20853 41350 4055 9213 21654
39424 49684 37969 11806 14427 19781 24911 35059
21274 11672 7069 25740 21193 13891 34411 36990 19754
25472 13701 34221 41255 7782 35918 21559 41188 37537
19125 7648 9919 12778 17908 35650 49427 11577 25645
21112 39044 49360 11482 6879 18315 20894 25377 13620
34588 37209 11158 20040 22605 25282 13511 34031 41541
45072 26884 8001 13131 18261 33763 22690 13960 36384
38949 41514 49265 11387 7022 18234 35270 20799 4029
11063 18153 20732 25187 13430 34398 37915 10996
14513 19727 24997 35481 6128 34264 41298 19660 26694
23043 13865 21826 42113 37524 19392 7621 10186 12751
35175 15372 25688 36004 21085 41134 3839 7594 15104
17854 25364 35624 13649 34169 10739 19565 24807
21170 49306 42032 37429 19297 7540 10091 12670 33750
37267 20098 22663 25256 13485 36357 38992 41487
49476 11598 7947 13217 18207 41353 7880 14914 18140
21657 25174 35434 28691 49211 11921 14724 25040
35244 6101 33655 20003 22582 13852 34484 37105 10942
18917 9711 6074 36114 41272 50182 26668 7785 13027
18045 36033 21800 41163 19338 7567 12064 14629 17883
24945 35597 37964 14534 25746 35054 21143 42005
37696 19284 22801 10078 13595 34227 11161 19623
25229 13528 35952 41082 19243 7486 13204 21610 33724
19176 7405 11874 14439 25651 35407 21286 38938 49422
11684 7137 17397 35273 38402 14888 19990 22611 25148
43136 13433 34513 37316 10971 19856 24986 6047 13109
41245 26697 7772 13014 21773 33534 37051 18863 12037
14672 28740 35192 49260 11494 7843 18103 35979 20962
43041 34656 37221 11114 19761 24891 38022 14508 19666
24824 5885 12919 35925 41055 37642 19230 7515 10164
12785 21583 33753 19149 22680 11847 15378 25862
35898 21315 41616 11713 7124 22144 49698 37927 14861
19571 25177 35493 13644 34276 10734 7083 17343 37480
19068 22585 9974 13491 34459 37262 41521 18906 11632
7029 25700 22049 35165 50185 26755 7830 12988 18370
20935 43028 34629 38160 11087 14618 23556 28686
35250 49318 11916 14537 24797 21384 14082 34602
37167 18811 10193 37100 19640 26674 7735 18275 35871
20854 41141 4084 7601 9214 12731 21669 35603 49671
37970 11821 14456 19782 24940 35536 21289 49537
11659 7070 21194 13920 42056 37453 19993 22796 25235
13702 34222 41732 11605 22036 37538 19126 7411 13017
17895 35441 49456 11578 6975 25646 21099 35223 49347
11497 6908 18344 20909 25378 13607 34575 37210 11173
22606 13540 34508 38025 41542 45059 19613 26647 8002
13160 18262 21779 41408 19345 10139 21712 38950
49266 11864 14429 25865 35061 21276 4030 6651 18154
20719 13893 34413 37944 10983 14514 19756 24998
35482 6115 34251 41313 23072 13866 51208 21617 42114
37511 19155 7622 9977 12780 35652 39169 49429 11551
25675 21086 11484 7833 14867 18317 20952 25351 35387
13650 34170 11216 19566 25284 28801 49321 42019
37430 19298 7527 13133 33765 37296 22692 13486 36358
38979 41516 49239 11389 7976 13218 18236 36224 20857
41354 4059 11121 18127 21658 25189 28720 49688 37917
11922 14487 19785 25027 35007 6102 41300 37649 27648

23045 13839 21828 34471 37106 18918 10188 13705
36129 41259 7786 18046 36034 21563 41192 19129 7596
11827 14630 17912 24946 35598 6007 34143 10741 25761
21172 39048 49308 42006 37459 19271 22802 10093
13624 34704 37269 11162 20100 22721 25230 13515
35939 41545 26888 7949 13191 18265 33711 7406 14916
26128 35436 28693 38953 49213 11447 7138 17398 35274
20915 34609 11067 20005 22640 25135 13434 34514
37079 11000 19843 25001 6076 13110 36116 41246 50240
26698 7759 13029 21774 41165 37528 19340 7625 12038
14659 17885 24919 35179 15488 25748 36008 21201
43042 34419 37222 19762 25368 13597 34229 10687
19681 24811 5886 35926 41084 37433 19245 7544 10151
12786 21612 33754 19150 22667 11876 15393 25653
36361 21344 38940 41603 49480 11714 7111 18323 38404
14862 20048 22613 25178 35494 13407 34039 10973
14728 24988 6105 13139 33659 19055 22586 13968 34488
37053 41522 18921 11619 7030 22050 35166 50186 26784
7845 12975 18161 35981 20964 43015 34630 38147 11116
14633 19735 24893 35713 38080 14538 19668 24798
21147 13873 42009 37644 19288 7517 10194 12759 33279
19627 27137 15380 25920 35900 21317 41142 4071 7602
13208 21670 35632 49700 37985 11822 14443 19573
24703 35523 21290 49538 11688 7085 17401 10099 37454
19994 22559 25264 13493 34461 37320 41495 18908
11606 7955 13113 22023 41361 26757 7888 13018 18372
21889 35442 49443 12041 14620 28744 35252 49376
11498 6895 18107 20910 14084 34604 37225 11174 18813
9719 38026 45088 19614 26676 7793 12923 18277 35929
21808 41171 19346 7575 10168 12733 21699 35605 49729
37972 11851 14430 25866 35062 21263 11661 7128 21196
13894 34414 37931 14977 19519 25237 35497 13760
34280 41314 19251 21618 37540 19184 7413 9978 12543
35415 39170 49430 11580 7033 25704 21101 35281 49349
11471 7834 14896 18318 20939 25380 43032 13665 34633
37212 11203 23560 28802 49322 42496 45061 26705 8004
13134 21781 33766 37283 18871 10141 39008 49268
11390 7739 18223 35987 20858 41145 4088 6653 11122
18156 21673 25190 28707 49675 37918 11937 14516
19786 25056 35484 6117 34253 41287 37650 23046 13868
21591 42116 37569 19157 22912 9951 13706 36130 41736
11609 25677 22040 19130 7359 14869 17899 25409 35389
13652 34172 10742 7091 25762 21159 35227 49295 42021
37488 19300 22817 10094 13611 34691 37270 11177 22722
13544 36416 38981 41546 50193 26651 7950 13220 18266
20831 41356 4061 11095 21660 26115 28694 38954 49214
11924 14545 25029 35065 21392 34610 37175 20006
22627 13897 34529 37108 10987 19872 25002 6063 36103
41261 7788 13030 36036 21565 41166 37515 19103 7626
11829 14688 17886 24948 35656 21297 49433 11667
25735 21202 42064 37461 20225 22804 25355 13598
34230 11164 19682 25288 13517 35941 41071 37434
19246 7531 13249 17791 33769 22696 15394 25654 36362
21107 38927 41632 49243 11505 7140 18352 35276 20917
34583 11069 20035 22614 25193 13436 34516 38033
10974 14491 19845 24975 6106 13168 41304 26700 23049
13955 21832 34475 37054 18922 12096 14661 25873
35181 7846 18162 35982 20727 43044 34421 38176 10879
14634 19764 24894 35714 6011 34259 10745 19655 24813
21176 13874 51216 42010 37407 19275 7518 10209 12788
33756 37273 20104 22669 27138 15367 25683 35887
21318 41605 11716 8065 13195 18325 35619 37986 14920
19574 25180 35552 28697 49329 11451 7086 17402 5631
13141 20009 22588 25251 13494 34462 37083
41524 18895 11621 7984 13114 22052 36120 41362 50188
26758 7875 13033 18135 21890 43073 49920 38149 12042
14607 19793 24923 35239 14540 25752 21149 13847

34367 37226 18814 10196 13713 34233 41267 19629
26663 7794 18278 35930 21795 41200 19361 7604 10155
12734 21728 35606 49730 37959 11880 14445 25657
35525 21292 39056 49540 11662 7115 17375 10101 38408
14978 19996 22617 25238 35498 13523 34043 41553
26896 7957 13087 22081 33719 19171 7414 13020 35444
38961 49445 11567 7034 21102 35282 49350 11500 7849
14883 18109 20968 25143 43019 13666 34634 37199
11232 19739 25009 38028 45062 19672 26706 7767 12925
21782 41173 37760 19348 7633 10142 12763 21701 35187
49255 11853 15384 25868 36016 21321 41146 4075 6654
21674 29184 49704 37933 11938 14503 19577 24819
35471 6118 34254 41316 37665 19253 10047 21620 37570
19158 22675 9980 13497 36369 39172 41499 49488 11610
7007 25678 22027 26761 7836 14870 18376 20941 25410
35390 13639 34159 11205 14736 28804 35256 49324
42022 37475 19063 22818 14088 34720 37285 11178
18929 9723 38982 50194 26680 7741 12983 18281 35989
20860 41119 4062 7579 11124 14641 21647 26144 28709
35609 49677 37976 11911 14546 19788 25030 35066
21379 42241 37652 23104 13898 34530 37095 19635
25241 13708 36132 41262 3967 21566 37544 19132 7417
11830 14451 17901 24935 35419 21298 49434 11696 7093
25764 21217 35229 49353 42051 37462 20226 22791
25384 13613 34693 37328 11151 22724 13518 35942
41548 45065 26653 8008 13250 18268 21785 33770 18875
12049 26117 28752 38956 49272 11506 6903 18339 35039
20918 34612 37233 11070 20064 22629 25194 13423
34503 38034 10989 14520 19846 25004 6121 13155 36161
41291 23050 13984 21595 42120 37517 19161 7628 11859
14662 25874 35182 21271 11669 25793 21204 34422
37939 14873 19751 25357 35505 13656 34288 10746
19684 24814 21163 51203 42025 37436 19304 7533 10210
12775 33743 37274 22670 15396 25712 36364 21109
38985 41606 49245 11479 8066 13224 18326 20947 43264
34641 11099 20037 23568 25167 28698 49330 11928
14493 25033 6108 13142 33662 37179 20010 22575 13957
34477 37112 41511 18924 11622 7971 18231 36107 41377
7904 13034 18164 36040 21681 43074 49683 38150 11833
14636 19794 24952 35716 6013 34261 10719 25739 21150
13876 42012 37465 19277 22808 10183 13714 34234
41744 19630 27140 15425 25685 35945 22272 41187
19362 7591 13197 17907 35621 37988 14446 25658 35526
21055 39043 49303 11453 7144 17404 20921 10102 13619
34587 11185 19983 22618 25253 13552 34520 37085
41554 19849 26883 7958 13116 22082 41364 26816 7877
13007 21892 35431 38962 49446 12044 14665 24925
35297 7850 18110 20731 43048 13905 34425 37228 10995
19768 25010 6071 34207 41269 19659 26721 7796 12926
35932 21797 41174 37523 19335 7634 10157 12792 21702
35664 49732 53249 11854 15371 25631 36003 21322
41609 11720 7117 18329 25363 37934 14980 19578 25296
35500 13525 34045 41079 37666 19254 7539 13145 21607
33777 19173 22704 9967 13498 36370 38935 41528 49475
11625 7036 22056 35284 50304 26762 7823 14885 18139
20942 25201 43021 13668 34636 38153 11206 14723
19741 24983 35243 45120 26708 23057 13851 21840
34483 37286 18930 10200 12765 35189 50209 26667 7742
18282 35990 20847 41148 4077 7608 11111 14642 21676
28710 35610 49678 37963 11940 14561 19551 24821
35529 21408 49544 42242 37639 19283 10105 37572
20112 22677 25242 13471 35895 41501 11612 7961 13203
22029 33723 19119 7418 14928 17902 25412 35448 28929
49449 11683 7094 21218 35230 49354 42080 37477 20017
22820 25147 13614 34694 37315 11180 18903 9725 39936
45066 50196 26654 7771 13041 18255 21786 41177 19352
7581 12050 14615 21705 26118 28739 35135 49259 11969

14548 25984 35068 21381 34599 37234 22630 13900
34532 38049 10990 14507 19637 24767 6122 36162 41320
19257 10163 21624 37518 19162 7391 11888 14453 25889
35421 21300 39176 49436 11670 7123 25794 21191 42053
38416 14874 20228 22849 25358 35506 13643 34275
11209 28808 51232 42026 37423 19067 7534 13252 33772
37289 18877 11575 25699 21110 38986 49246 11508 7857
12987 18341 35993 20976 43027 34642 37207 11128
20038 23555 25196 28713 49793 38036 11915 14494
19904 25034 6095 13157 41293 37656 23052 13958 21597
34478 37099 18687 11861 15616 25876 36136 21329
41378 4083 18151 21682 49712 37941 11834 14399 19809
24939 35479 6014 34262 10748 7097 25768 21165 13863
51205 41999 37466 19278 22795 10212 13729 34697
37276 41731 22728 15426 25686 35946 22035 41664
26769 8068 13198 18384 20949 35622 34167 11101 26121
28700 39072 49332 11454 6907 17391 20922 14096 34616
37181 11186 20012 22633 25254 13539 34507 37086
41569 19850 26912 7973 13103 18289 36109 41351 7878
13036 21655 43076 39425 49685 38208 11807 14666
19796 24926 35298 21275 11673 25741 21208 13906
34426 36991 19755 25473 13716 34236 41270 19688
26722 7783 35919 21798 41189 37552 19364 7649 10158
12779 17909 35651 53250 15400 25660 36480 21113
39045 41610 49361 11483 7118 18330 20895 25392 13621
34589 11159 20041 22620 25283 13526 34046 41556
45073 26885 8016 13146 22084 33778 19174 22691 13961
36385 38964 41515 49504 11626 7023 18235 35271 7852
14886 18168 20733 25202 43022 13431 34399 38154
10997 14752 19742 25012 35720 6129 34265 41299 19661
26695 23058 13880 21827 42128 37525 19393 7636 10187
12766 35190 50210 27144 15373 25689 36005 21324
41135 4078 7595 15105 17855 25365 35625 37992 14562
19580 24822 35530 21171 49307 42033 37668 19312 7541
10106 12671 33751 20099 22678 25257 13500 36372
38993 41502 49477 11599 7962 13232 22030 41368 26764
7881 14915 18141 21896 25175 35435 28930 49450 12160
14725 25041 35245 37478 20018 22583 13853 34485
37344 10943 18932 9726 6075 36115 41273 50183 26669
7800 13042 18284 36048 21801 41178 19339 7582 12065
14644 21706 28768 35612 49736 37965 11970 14535
25747 35055 21382 42244 37697 19285 10079 38050
14984 19638 25244 13529 35953 41083 19258 7487 13205
21611 33725 19177 7420 11675 14454 25890 35422 21287
38939 49423 11685 7152 21220 35288 49356 42054 38403
14889 19991 22850 25149 43137 13672 34752 37317
11210 19857 24987 45068 26712 7773 13015 21788 33535
37290 18878 12052 14673 26176 28741 35193 49261
11495 7858 18342 35994 20963 43056 34657 37236 11115
23584 28714 49794 38023 11944 14509 19667 24825 6124
13158 36164 41294 37643 19231 10165 21598 37576
19164 22681 11862 15379 25863 35899 21330 41617
11728 7125 25796 22145 49699 37942 14876 19810 25416
35508 13645 34277 10735 7098 21166 51206 42028 37481
19069 22824 9975 13730 34698 37263 41760 18907 11633
25701 22064 38988 50200 26770 7831 12989 18371 20950
43029 34644 38161 11102 14619 23557 26122 28687
35251 49319 11917 14552 25036 21385 14083 34603
37182 22634 14016 34536 37101 41570 19641 26675 7974
18290 36110 20855 41380 4085 9215 21684 39426 49686
37971 11836 14457 19783 24941 35537 21304 49552
11674 7071 25742 21195 13921 42057 37468 20232 22797
25474 13703 34223 41733 15428 35948 22037 41190
37539 19127 7650 13256 17910 35680 49457 11579 25647
21114 39046 49362 11512 6909 18345 20924 25379 13622
34590 37211 11188 20042 22607 25312 13541 34509 38040
41543 45074 19852 26886 8003 13161 18263 41409 23168

13962 21713 36386 38951 49267 11865 14668 25880
35300 21277 4031 18155 20734 13908 34428 37945 10998
14515 19757 24999 35483 6130 34266 41328 19662 26724
23073 13867 51209 21856 42115 37526 19394 7623 10216
12781 35653 39184 53252 15374 25690 36006 21087
41612 11485 8072 15106 18332 20953 25366 35626 13651
34171 11217 19567 25285 28816 49336 42034 37431
19299 7542 13148 33780 37297 20128 22693 25258 13487
36359 38994 41517 49478 11628 7977 13219 18237 36225
41355 7882 14944 18142 21659 25204 43080 28721 49689
38156 11923 14726 19800 25042 35246 6103 41301 27649
23060 13854 21829 34486 37107 18919 10189 13720
36144 41274 50212 26670 7787 18047 36035 21802 41193
19368 7597 12066 14631 17913 24947 35599 37966 14564
25776 35532 21173 39049 49309 42007 37698 19286
22803 10108 13625 34705 11163 20101 22736 25231
13530 35954 41560 26889 7964 13206 22088 33726 19178
7407 14917 26129 35437 28932 38968 49452 11686 7139
17399 35275 38432 14890 20020 22641 25150 43138
13435 34515 37318 11001 19858 25016 6077 13111 36117
41247 50241 26699 7774 13044 21775 41180 37529 19341
7640 12039 14674 21708 28742 35194 49262 11972 15489
25749 36009 21440 43043 34658 37223 19763 25369
38052 14510 19696 24826 5887 35927 41085 37672 19260
7545 10166 12787 21613 33755 19151 22682 11877 15408
25892 36376 21345 38941 41618 49481 11715 7126 22146
57344 38405 14863 20049 22852 25179 35495 13646
34278 11212 14729 24989 37482 19070 22587 13969
34489 37292 41523 18936 11634 7031 25702 22051 35167
50187 26785 7860 12990 18400 35996 20965 43030 34631
38162 11117 14648 23558 28716 35728 49796 38081 11918
14539 19669 24799 21386 14112 42248 37645 19289
10195 37102 19642 27152 15381 25921 35901 21332
41143 4086 7603 13209 21671 35633 49701 38000 11823
14458 19812 24942 35538 21291 49539 11689 7100 21224
13922 51264 42058 37455 19995 22798 25265 13732
34700 37321 41734 18909 11607 22038 45184 26772 7889
13019 18373 21904 35443 49458 12056 14621 26124
28745 35253 49377 11499 6910 18346 20911 14085 34605
37240 11175 22636 13542 34510 38027 41572 45089
19615 26677 8032 13162 18292 36168 21809 41410 19347
10169 21714 39428 49744 37973 11866 14431 25867
35063 21278 11676 7129 25800 21197 13895 34415 37946
14992 19758 25476 35512 13761 34281 41315 23074
51210 21619 42144 37541 19185 7652 9979 12782 35654
39171 49431 11581 25705 21116 39104 49364 11486 7835
14897 18319 20954 25381 43033 13680 34648 37213
11218 20044 23561 25286 28803 49323 42497 45076
26944 8005 13135 33767 37298 22694 13964 36388 39009
41518 49269 11391 7978 18238 36226 20859 41384 4089
11123 18157 21688 25191 28722 49690 37919 11952 14517
19787 25057 35485 6132 34268 41302 37651 27650 23047
13869 21830 42117 37584 19396 22913 10190 13707
36131 41737 15432 25692 36064 22041 41194 19131 7598
15108 17914 25424 35628 13653 34173 10743 25763
21174 39050 49310 42036 37489 19301 22832 10095
13626 34706 37271 11192 20102 22723 25260 13545
36417 38996 41547 50432 26890 7951 13221 18267 41357
7884 14918 21661 26130 35438 28695 38955 49215 11925
14784 25044 35304 21393 34611 20007 22642 13912
34544 37109 11002 19873 25003 6078 36118 41276 50242
26728 7789 13031 36037 21804 41167 37530 19342 7627
12068 14689 17887 24949 35657 53256 15490 25750
36010 21203 43520 42065 37700 20240 22805 25370
13599 34231 11165 19683 25289 13532 35956 41086
37435 19247 7546 13264 21614 33784 19180 22697 11878
15395 25655 36363 21346 38942 41633 49482 11744 7141

18353 35277 38406 14892 20050 22615 25208 43140
13437 34517 38272 10975 14730 19860 24990 6107 13169
41305 26701 23064 13970 21833 34490 37055 18923
12097 14676 29696 35196 50216 26786 7847 18163 35983
20966 43045 34660 38177 11118 14635 19765 24895 35715
38082 14568 19670 24828 21177 13875 51217 42011
37646 19290 7519 10224 12789 33757 20105 22684 27139
15382 25922 35902 21319 41620 11717 8080 13210 22148
35634 49702 37987 14921 19575 25181 35553 28936
49568 11690 7087 17403 37484 20024 22589 25266 13495
34463 37322 41525 18910 11636 7985 13115 22053 36121
41363 50189 26759 7890 13048 18374 21891 43088 49921
38164 12043 14622 23616 28746 35254 49378 11976
14541 25753 21388 14086 34606 37227 18815 10197
38056 45090 19644 26678 7795 18279 35931 21810 41201
19376 7605 10170 12735 21729 35607 49731 37974 11881
14460 25896 35540 21293 39057 49541 11663 7130 21198
13924 42060 38409 14979 19997 22856 25239 35499
13762 34282 41792 26897 22096 37542 19186 7415 13021
35445 39200 49460 11582 7035 25706 21103 35283 49351
11501 7864 14898 18348 20969 25382 43034 13667 34635
37214 11233 23562 28832 49800 38029 42498 45063
19673 26707 8006 13164 21783 41412 37761 19349 10143
21716 39010 49270 11868 15385 25869 36017 21336
41147 4090 6655 18158 21675 29185 49705 37948 11939
14518 19816 25058 35486 6119 34255 41317 37680 23076
13870 51212 21621 42118 37571 19159 22914 9981 13736
36608 39173 41738 49489 11611 25679 22042 26776 7837
14871 18377 20956 25411 35391 13654 34174 11220
14737 26240 28805 35257 49325 42023 37490 19302
22819 14089 34721 37300 11179 22752 13546 36418
38983 41576 50195 26681 7980 13222 18296 36228 20861
41358 4063 11125 21662 26145 28724 39432 49692 37977
11926 14547 19789 25031 35067 21394 42256 37653
27652 23105 13899 34531 37110 19874 25480 13709
36133 41263 7790 36038 21567 41196 37545 19133 7656
11831 14690 17916 24950 35658 21299 49435 11697
25765 21232 39052 49368 42066 37463 20227 22806
25385 13628 34708 37329 11166 20160 22725 25290
13519 35943 41549 45080 26892 8009 13251 18269 33771
22698 15872 26132 36392 28753 38957 41634 49273
11507 7142 18354 35278 20919 34613 11071 20065 22644
25195 13438 34518 38035 11004 14521 19847 25005 6136
13170 36176 41306 50244 26702 23051 13985 21834
42121 37532 19400 7629 12098 14663 25875 35183 15492
25808 36012 21205 43046 34423 38178 15112 19766
25372 35744 13657 34289 10747 19685 24815 21178
51218 42040 37437 19305 7548 10211 12790 33758 37275
20106 22671 27168 15397 25713 36365 21348 39000
41607 49484 11718 8067 13225 18327 43265 38464 14922
20052 23569 25182 35554 28699 49331 11929 14732
25048 6109 13143 33663 20011 22590 13972 34492 37113
41526 18925 11623 7986 22054 36122 41392 50190 26788
7905 13035 18165 36041 21920 43075 49922 38151 12072
14637 19795 24953 35717 38084 14542 25754 21151
13877 42013 37704 19292 22809 10198 13715 34235
41745 19631 27141 15440 25924 35960 22273 41202
19363 7606 13212 21730 35636 49760 37989 11882 14447
25659 35527 21294 39058 49542 11692 7145 17405 10103
38410 15008 19998 22619 25268 43144 13553 34521
37324 41555 19864 26898 7959 13117 22083 41365 26817
7892 13022 21893 35446 38963 49447 12045 14680 28748
35312 49380 11502 7851 18111 20970 43049 14144 34664
37229 11234 19769 25011 38030 45092 19674 26736 7797
12927 35933 21812 41175 37762 19350 7635 10172 12793
21703 35665 49733 53264 11855 15386 25870 36018
21323 41624 11721 7132 22152 29186 49706 37935 14981

19579 25297 35501 13764 34284 41318 37667 19255
21622 37600 19188 22705 9982 13499 36371 39174 41529
49490 11640 7037 25708 22057 35285 50305 26763 7838
14900 18378 20943 25440 43036 13669 34637 38168
11207 14738 23564 28806 35258 49326 42500 45121
26709 23296 14090 21841 34722 37287 18931 10201
39012 50224 26682 7743 18283 35991 20862 41149 4092
7609 11126 14643 21677 26146 28711 35611 49679 37978
11941 14576 19790 25060 35544 21409 49545 42243
37654 23106 13928 42176 37573 20113 22916 25243
13710 36134 41740 11613 22044 37546 19134 7419 14929
17903 25413 35449 28944 49464 11698 7095 25766 21219
35231 49355 42081 37492 20256 22821 25386 13615
34695 37330 11181 22726 13548 36420 39937 41550
45067 50197 26655 8010 13280 18270 21787 41416 19353
12051 21720 26119 28754 38958 49274 11984 14549
25985 35069 21396 34614 37235 20066 22631 13901
34533 38064 10991 14522 19876 25006 6123 36163 41321
23080 13986 51328 21625 42122 37519 19163 7630 11889
14692 25904 35660 21301 39177 49437 11671 25795
21206 42068 38417 14875 20229 22864 25359 35507
13658 34290 11224 19686 25292 28809 51233 42027
37438 19306 7535 13253 33773 37304 22700 15398 25714
36366 21111 38987 41636 49247 11509 8096 13226 18356
36232 20977 43266 34643 11129 20039 23570 25197
28728 49808 38037 11930 14495 19905 25035 6110 13172
41308 37657 27656 23053 13959 21836 34479 37114
18926 12100 15617 25877 36137 41379 7906 18166 36042
21683 43104 49713 38180 11835 14638 19824 24954
35718 6015 34263 10749 25769 21180 13878 51220 42014
37467 19279 22810 10213 13744 34712 37277 41746
20108 22729 27142 15427 25687 35947 22274 41665
27008 8069 13199 18385 35623 37990 14924 26136 35556
28701 39073 49333 11455 7146 17406 20923 14097 34617
11187 20013 22648 25255 13554 34522 37087 41584
19851 26913 7988 13118 22112 36124 41366 50248 26818
7879 13037 21894 43077 39440 49924 38209 12046 14667
19797 24927 35299 15496 25756 21209 43050 13907
34427 37230 19770 25488 13717 34237 41271 19689
26723 7798 35934 21799 41204 37553 19365 7664 10159
12794 21732 35666 49734 53251 11884 15401 25661
36481 21352 39060 41611 49600 11722 7119 18331 25393
38412 14982 20056 22621 25298 35502 13527 34407
41557 45312 26900 8017 13147 22085 33779 19175 22706
13976 36400 38965 41530 49505 11627 7038 22058 35286
50306 26792 7853 14887 18169 20972 25203 43023 13670
34638 38155 11236 14753 19743 25013 35721 38088
45122 19676 26710 23059 13881 21842 42129 37764
19408 7637 10202 12767 35191 50211 27145 15388 25928
36020 21325 41150 4079 7610 15120 21678 29188 35640
49708 37993 11942 14563 19581 24823 35531 21410
49546 42272 37669 19313 10107 37574 20114 22679
25272 13501 36373 39232 41503 49492 11614 7963 13233
22031 41369 26765 7896 14930 18380 21897 25414 35450
28931 49451 12161 14740 28864 35260 49384 42082
37479 20019 22822 14092 34724 37345 11182 18933 9727
39938 45096 50198 26684 7801 13043 18285 36049 21816
41179 19354 7583 12080 14645 21707 26148 28769 35613
49737 37980 11971 14550 25986 35070 21383 42245
37712 23108 13902 34534 38051 14985 19639 25245
13768 36192 41322 19259 21626 37548 19192 7421 11890
14455 25891 35423 21302 39178 49438 11700 7153 25824
21221 25289 49357 42055 38418 14904 20230 22851
25388 43152 13673 34753 37332 11211 23680 28810
51234 42504 45069 26713 8012 13254 21789 33774 37291
18879 12053 26177 28756 39016 49276 11510 7859 18343
35995 20978 43057 34672 37237 11130 20068 23585

25198 28715 49795 38038 11945 14524 19906 25064 6125
13159 36165 41295 37658 23054 13988 21599 42124
37577 19165 22920 11863 15618 25878 36138 21331
41856 11729 25797 22160 49714 37943 14877 19811
25417 35509 13660 34292 10750 7099 25770 21167 51207
42029 37496 19308 22825 10214 13731 34699 37278
41761 22730 15456 25716 36424 22065 38989 41666
50201 26771 8070 13228 18386 20951 43268 34645 11103
23572 26123 28702 39074 49334 11932 14553 25037
21400 14098 34618 37183 20014 22635 14017 34537
37116 41571 19880 26914 7975 18291 36111 41381 7908
13038 36044 21685 43078 39427 49687 38210 11837
14696 19798 24956 35776 21305 49553 11675 25743
21210 13936 42072 37469 20233 22812 25475 13718
34238 41748 19690 27200 15429 35949 22276 41191
37554 19366 7651 13257 17911 35681 53280 15402 25662
36482 21115 39047 41640 49363 11513 7148 18360 20925
25394 13623 34591 11189 20043 22622 25313 13556
34524 38041 41558 45075 19853 26887 8018 13176 22086
41424 26820 23169 13963 21952 36387 38966 49506
12104 14669 25881 35301 7854 18170 20735 43052 13909
34429 38184 10999 14754 19772 25014 35722 6131 34267
41329 19663 26725 23088 13882 51224 21857 42130
37527 19395 7638 10217 12796 35668 39185 50688 53253
27146 15375 25691 36007 21326 41613 11724 8073 15107
18333 25367 35627 37994 15040 19582 25300 35560
28817 49337 42035 37670 19314 7543 13149 33781 20129
22708 25259 13502 36374 38995 41532 49479 11629 7992
13234 22060 36240 41370 50308 26766 7883 14945 18143
21898 25205 43081 28960 49928 38157 12162 14727
19801 25043 35247 45124 27664 23061 13855 21844
34487 37346 18934 10204 13721 36145 41275 50213
26671 7802 18286 36050 21803 41208 19369 7612 12067
14646 21736 28770 35614 49738 37967 12000 14565
25777 35533 21412 39064 49548 42246 37699 19287
10109 38528 14986 20116 22737 25246 13531 35955
41561 26904 7965 13207 22089 33727 19179 7422 14932
26368 35452 28933 38969 49453 11687 7154 21222 35290
49358 42084 38433 14891 20021 22880 25151 43139
13674 34754 37319 11240 19859 25017 39940 45070
50256 26714 7775 13045 21790 41181 37768 19356 7641
12054 14675 21709 26178 28743 35195 49263 11973
15504 25988 36024 21441 43058 34659 37238 23586
29192 49824 38053 11946 14511 19697 24827 6126 36166
41324 37673 19261 10167 21628 37578 19166 22683
11892 15409 25893 36377 21360 39180 41619 49496
11730 7127 25798 22147 57345 38420 14878 20288 22853
25418 35510 13647 34279 11213 14744 28812 51236
42030 37483 19071 22826 14208 34728 37293 41762
18937 11635 25703 22066 38990 50202 26800 7861 12991
18401 35997 20980 43031 34646 38163 11132 14649
23559 26152 28717 35729 49797 38096 11919 14554
19908 25038 21387 14113 42249 37660 23112 14018
34538 37103 19643 27153 15620 25936 36140 21333
41382 4087 21686 39456 49716 38001 11838 14459 19813
24943 35539 21306 49554 11704 7101 25772 21225 13923
51265 42059 37470 20234 22799 25504 13733 34701
37336 41735 22732 15430 35950 22039 41668 45185
26773 8128 13258 18388 21905 35682 49459 12057 26125
28760 39076 49392 11514 6911 18347 20926 14100 34620
37241 11190 20072 22637 25314 13543 34511 38042 41573
45104 19854 26916 8033 13163 18293 36169 41411 23170
13992 21715 44032 39429 49745 38212 11867 14670
25882 35302 21279 11677 25801 21212 13910 34430
37947 14993 19759 25477 35513 13776 34296 41330
19692 26726 23075 51211 21858 42145 37556 19424 7653
10218 12783 35655 39186 53254 15404 25720 36484

21117 39105 41614 49365 11487 8074 15136 18334 20955
25396 43272 13681 34649 11219 20045 23576 25287
28818 49338 42512 45077 26945 8020 13150 33782 37299
20130 22695 13965 36389 39024 41519 49508 11630 7979
18239 36227 41385 7912 14946 18172 21689 25206 43082
28723 49691 38158 11953 14756 19802 25072 35724 6133
34269 41303 27651 23062 13884 21831 42132 37585
19397 22928 10191 13722 36146 41752 50214 27148
15433 25693 36065 22280 41195 19370 7599 15109 17915
25425 35629 37996 14566 25778 35534 21175 39051
49311 42037 37728 19316 22833 10110 13627 34707 11193
20103 22738 25261 13560 36432 38997 41562 50433
26891 7966 13236 22090 41372 26824 7885 14919 21900
26131 35439 28934 38970 49454 12164 14785 25045
35305 38434 20022 22643 43168 13913 34545 37348
11003 19888 25018 6079 36119 41277 50243 26729 7804
13046 36052 21805 41182 37531 19343 7642 12069 14704
21710 28772 35672 49740 53257 11974 15491 25751
36011 21442 43521 42304 37701 20241 25371 38054
14988 19698 25304 13533 35957 41087 37674 19262 7547
13265 21615 33785 19181 22712 11879 15410 25894
36378 21347 38943 41648 49483 11745 7156 22176 35292
50312 57346 38407 14893 20051 22854 25209 45123
13676 34756 38273 11214 14731 19861 24991 45128
26716 23065 13971 21848 34491 37294 18938 12112
14677 26180 29697 35197 50217 26787 7862 18402 35998
20967 43060 34661 38192 11119 14650 23588 28718 35730
49798 38083 11948 14569 19671 24829 21416 14114
51456 42250 37647 19291 10225 37580 20120 22685
27154 15383 25923 35903 21334 41621 11732 8081 13211
22149 35635 49703 38002 14936 19814 25420 35568
28937 49569 11691 7102 21226 51266 42088 37485 20025
22828 25267 13734 34702 37323 41764 18911 11637
22068 39944 45186 50204 26774 7891 13049 18375 21906
43089 49936 38165 12058 14623 23617 26126 28747
35255 49379 11977 14556 25992 21389 14087 34607
37242 22638 14020 34540 38057 41574 45091 19645
26679 8034 18294 36170 21811 41440 19377 10171 21744
39430 49746 37975 11896 14461 25897 35541 21308
39296 49556 11678 7131 25802 21199 13925 42061 38424
14994 20236 22857 25478 35514 13763 34283 41793
30720 51240 22097 42146 37543 19187 7654 13260 35684
39201 49461 11583 25707 21118 39106 49366 11516 7865
14899 18349 20984 25383 43035 13682 34650 37215
11248 20046 23563 25316 28833 49801 38044 42499
45078 19912 26946 8007 13165 41413 37776 23172 13966
21717 36390 39011 49271 11869 15624 25884 36256
21337 41386 4091 18159 21690 29200 49720 37949 11954
14519 19817 25059 35487 6134 34270 41332 37681 27680
23077 13871 51213 21860 42119 37586 19398 22915
10220 13737 36609 39188 41739 53312 15434 25694
36066 22043 41672 26777 8076 15110 18392 20957 25426
35630 13655 34175 11221 26241 28820 39080 49340
42038 37491 19303 22834 14104 34736 37301 11194
20132 22753 25262 13547 36419 38998 41577 50434
26920 7981 13223 18297 36229 41359 7886 14948 21663
26160 43084 28725 39433 49693 38216 11927 14786
19804 25046 35306 21395 42257 27653 23120 13914
34546 37111 19875 25481 13724 36148 41278 50272
26730 7791 36039 21806 41197 37560 19372 7657 12070
14691 17917 24951 35659 53258 15520 25780 36488
21233 39053 43522 49369 42067 37702 20242 22807
25400 13629 34709 11167 20161 22740 25291 13534
35958 41564 45081 26893 8024 13266 22092 33786 19182
22699 15873 26133 36393 28992 38972 41635 49512
11746 7143 18355 35279 38436 14894 20080 22645 25210
43142 13439 34519 38274 11005 14760 19862 25020 6137

13171 36177 41307 50245 26703 23066 14000 21835
42136 37533 19401 7644 12099 14678 29698 35198 50218
27264 15493 25809 36013 21444 43047 34662 38179
15113 19767 25373 35745 38112 14570 19700 24830 21179
51219 42041 37676 19320 7549 10226 12791 33759 20107
22686 27169 15412 25952 36380 21349 39001 41622
49485 11719 8082 13240 22150 43280 57348 38465 14923
20053 23808 25183 35555 28938 49570 12168 14733
25049 37486 20026 22591 13973 34493 37352 41527
18940 11638 7987 22055 36123 41393 50191 26789 7920
13050 18404 36056 21921 43090 49923 38166 12073
14652 23618 28776 35732 49856 38085 11978 14543
25755 21390 14116 42252 37705 19293 10199 38058
45568 19646 27156 15441 25925 35961 22288 41203
19378 7607 13213 21731 35637 49761 38004 11883 14462
25898 35542 21295 39059 49543 11693 7160 21228 13926
51268 42062 38411 15009 19999 22858 25269 43145
13792 34760 37325 41794 19865 26899 22098 45188
26832 7893 13023 21908 35447 39202 49462 12060 14681
26184 28749 35313 49381 11503 7866 18350 20971 43064
14145 34665 37244 11235 23592 28834 49802 38031
42528 45093 19675 26737 8036 13166 36172 21813 41414
37763 19351 10173 21718 39488 49748 53265 11870
15387 25871 36019 21338 41625 11736 7133 25804 22153
29187 49707 37950 14996 19818 25536 35516 13765
34285 41319 37682 23078 51214 21623 42148 37601
19189 22944 9983 13738 36610 39175 41768 49491 11641
25709 22072 39108 50320 26778 7839 14901 18379 20958
25441 43037 13684 34652 38169 11222 14739 23565
26242 28807 35259 49327 42501 45136 26948 23297
14091 34723 37302 22754 14024 36448 39013 41578
50225 26683 7982 18298 36230 20863 41388 4093 11127
21692 26147 28726 39434 49694 37979 11956 14577
19791 25061 35545 21424 49560 42258 37655 27654
23107 13929 42177 37588 20352 22917 25482 13711
36135 41741 15436 36068 22045 41198 37547 19135 7658
15168 17918 25428 35688 28945 49465 11699 25767
21234 39054 49370 42096 37493 20257 22836 25387
13630 34710 37331 11196 20162 22727 25320 13549
36421 39952 41551 45082 50436 26894 8011 13281 18271
41417 23176 15874 21721 26134 36394 28755 38959
49275 11985 14788 26000 35308 21397 34615 20067
22646 13916 34548 38065 11006 14523 19877 25007 6138
36178 41336 50246 26732 23081 13987 51329 21864
42123 37534 19402 7631 12128 14693 25905 35661 39192
53260 15494 25810 36014 21207 43524 42069 38656
15114 20244 22865 25374 35746 13659 34291 11225
19687 25293 28824 51248 42042 37439 19307 7550 13268
33788 37305 20136 22701 27170 15399 25715 36367
21350 39002 41637 49486 11748 8097 13227 18357 36233
43267 38466 14952 20054 23571 25212 43200 28729
49809 38276 11931 14734 19920 25050 6111 13173 41309
27657 23068 13974 21837 34494 37115 18927 12101
15632 29700 36152 41394 50220 26790 7907 18167 36043
21922 43105 49952 38181 12074 14639 19825 24955
35719 38086 14572 25784 21181 13879 51221 42015
37706 19294 22811 10228 13745 34713 41747 20109
22744 27143 15442 25926 35962 22275 41680 27009 8084
13214 22208 35638 49762 37991 14925 26137 35557
28940 39088 49572 11694 7147 17407 38440 15010 20028
22649 25270 43146 13555 34523 37326 41585 19866
26928 7989 13119 22113 36125 41367 50249 26819 7894
13052 21895 43092 39441 49925 38224 12047 14682
23620 28750 35314 49382 11980 15497 25757 21448
43051 14146 34666 37231 19771 25489 38060 45094
19704 26738 7799 35935 21814 41205 37792 19380 7665
10174 12795 21733 35667 49735 53266 11885 15416

25900 36496 21353 39061 41626 49601 11723 7134 22154
29216 57352 38413 14983 20057 22860 25299 35503
13766 34286 41796 45313 26901 22100 37602 19190
22707 13977 36401 39204 41531 49520 11642 7039 25710
22059 35287 50307 26793 7868 14902 18408 20973 25442
43038 13671 34639 38170 11237 14768 23566 28836
35736 49804 38089 42502 45123 19677 26711 23298
14120 21843 42368 37765 19409 10203 39014 50226
27160 15389 25929 36021 21340 41151 4094 7611 15121
21679 29189 35641 49709 38008 11943 14578 19820
25062 35546 21411 49547 42273 37684 23136 13930
51272 42178 37575 20115 22918 25273 13740 36612
39233 41742 49493 11615 22046 45192 26780 7897 14931
18381 21912 25415 35451 28946 49466 12176 14741
26244 28865 35261 49385 42083 37494 20258 22823
14093 34725 37360 11183 22756 13550 36422 39939
41580 45097 50199 26685 8040 13282 18300 36288 21817
41418 19355 12081 21722 26149 28784 39436 49752
37981 11986 14551 25987 35071 21398 42260 37713
27712 23109 13903 34535 38066 15000 19878 25484
13769 36193 41323 23082 51330 21627 42152 37549
19193 7660 11891 14694 25906 35662 21303 39179 49439
11701 25825 21236 39112 49372 42070 38419 14905
20231 22866 25389 43153 13688 34768 37333 11226
20164 23681 25294 28811 51235 42505 45084 26952 8013
13255 33775 37306 22702 15876 26192 36396 28757
39017 41638 49277 11511 8098 18358 36234 20979 43296
34673 11131 20069 23600 25199 28730 49810 38039 11960
14525 19907 25065 6140 13174 36180 41310 37659 27658
23055 13989 21838 42125 37592 19404 22921 12102
15619 25879 36139 41857 15552 25812 36072 22161
43106 49715 38182 15116 19826 25432 35748 13661
34293 10751 25771 21182 51222 42044 37497 19309
22840 10215 13746 34714 37279 41776 20110 22731
27172 15457 25717 36425 22304 39004 41667 50440
27010 8071 13229 18387 43269 38468 14926 23573 26138
35558 28703 39075 49335 11933 14792 25052 21401
14099 34619 20015 22650 14032 34552 37117 41586
19881 26915 7990 22114 36126 41396 50250 26848 7909
13039 36045 21924 43079 39442 49926 38211 12076
14697 19799 24957 35777 53376 15498 25758 21211
43528 13937 42073 37708 20248 22813 25490 13719
34239 41749 19691 27201 15444 35964 22277 41206
37555 19367 7666 13272 21734 35696 49764 53281 11886
15403 25663 36483 21354 39062 41641 49602 11752 7149
18361 25395 38414 15012 20058 22623 25328 43148
13557 34525 38280 41559 45314 19868 26902 8019 13177
22087 41425 26821 23184 13978 21953 36402 38967
49507 12105 14684 29704 35316 50336 26794 7855 18171
20974 43053 14148 34668 38185 11238 14755 19773
25015 35723 38090 45152 19678 26740 23089 13883
51225 21872 42131 37766 19410 7639 10232 12797 35669
50689 53268 27147 15390 25930 36022 21327 41628
11725 8088 15122 22156 29190 35642 49710 37995 15041
19583 25301 35561 29056 49576 42274 37671 19315
37604 20144 22709 25274 13503 36375 39234 41533
49494 11644 7993 13235 22061 36241 41371 50309 26767
7898 14960 18382 21899 25444 43096 28961 49929 38172
12163 14742 23624 28866 35262 49386 42560 45125
27665 23300 14094 21845 34726 37347 18935 10205
39968 45098 50228 26686 7803 18287 36051 21818 41209
19384 7613 12082 14647 21737 26150 28771 35615 49739
37982 12001 14580 26016 35548 21413 39065 49549
42247 37714 23110 13932 42180 38529 14987 20117
22976 25247 13770 36194 41800 26905 22104 37550
19194 7423 14933 26369 35453 28948 39208 49468 11702
7155 25826 21223 35291 49359 42085 38448 14906 20260

22881 25390 43154 13675 34755 37334 11241 23682
28840 51712 39941 42506 45071 50257 26715 8014 13284
21791 41420 37769 19357 12055 21724 26179 28758
39018 49278 11988 15505 25989 36025 21456 43059
34674 37239 20070 23587 29193 49825 38068 11947
14526 19936 25066 6127 36167 41325 37688 23084 13990
51332 21629 42126 37579 19167 22922 11893 15648
25908 36616 21361 39181 41858 49497 11731 25799
22162 57360 38421 14879 20289 22868 25419 35511
13662 34294 11228 14745 26248 28813 51237 42031
37498 19310 22827 14209 34729 37308 41763 22760
15458 25718 36426 22067 38991 41696 50203 26801 8100
13230 18416 36236 20981 43270 34647 11133 23574
26153 28732 39552 49812 38097 11934 14555 19909
25039 21402 14128 42264 37661 27660 23113 14019
34539 37118 19882 27392 15621 25937 36141 41383 7910
36046 21687 43108 39457 49717 38240 11839 14698
19828 24958 35778 21307 49555 11705 25773 21240
13938 51280 42074 37471 20235 22814 25505 13748
34716 37337 41750 20168 22733 27202 15431 35951
22278 41669 45200 27012 8129 13259 18389 35683 53282
15880 26140 36512 28761 39077 41642 49393 11515 7150
18362 20927 14101 34621 11191 20073 22652 25315
13558 34526 38043 41588 45105 19855 26917 8048 13178
22116 36184 41426 50252 26822 23171 13993 21954
44033 39444 49984 38213 12106 14671 25883 35303
15500 25816 21213 43054 13911 34431 38186 15232
19774 25492 35752 13777 34297 41331 19693 26727
23090 51226 21859 42160 37557 19425 7668 10219 12798
35670 39187 50690 53255 27176 15405 25721 36485
21356 39120 41615 49604 11726 8075 15137 18335 25397
43273 38472 15042 20060 23577 25302 35562 28819
49339 42513 45316 26960 8021 13151 33783 20131 22710
13980 36404 39025 41534 49509 11631 7994 22062 36242
41400 50310 26796 7913 14947 18173 21928 25207 43083
28962 49930 38159 12192 14757 19803 25073 35725
38092 45126 27666 23063 13885 21846 42133 37824
19412 22929 10206 13723 36147 41753 50215 27149
15448 25932 36080 22281 41210 19371 7614 15124 21738
29248 35644 49768 37997 12002 14567 25779 35535
21414 39066 49550 42276 37729 19317 10111 38530
15016 20118 22739 25276 13561 36433 39236 41563
50448 26906 7967 13237 22091 41373 26825 7900 14934
21901 26370 35454 28935 38971 49455 12165 14800
28868 35320 49388 42086 38435 20023 22882 43169
14152 34784 37349 11242 19889 25019 39942 45100
50258 26744 7805 13047 36053 21820 41183 37770 19358
7643 12084 14705 21711 26208 28773 35673 49741 53272
11975 15506 25990 36026 21443 43536 42305 37716
24064 29194 49826 38055 14989 19699 25305 13772
36196 41326 37675 19263 21630 37608 19196 22713
11894 15411 25895 36379 21362 39182 41649 49498 11760
7157 25828 22177 35293 50313 57347 38422 14908 20290
22855 25448 43156 13677 34757 38288 11215 14746
23684 28814 51238 42508 45129 26717 23304 14210
21849 34730 37295 18939 12113 26181 29712 39020
50232 26802 7863 18403 35999 20982 43061 34676 38193
11134 14651 23589 26154 28719 35731 49799 38098 11949
14584 19910 25068 21417 14115 51457 42251 37662
23114 14048 42184 37581 20121 22924 27155 15622
25938 36142 21335 41860 11733 22164 39458 49718
38003 14937 19815 25421 35569 28952 49584 11706 7103
25774 21227 51267 42089 37500 20264 22829 25506
13735 34703 37338 41765 22734 15460 36428 22069
39945 41670 45187 50205 26775 8130 13288 18390 21907
43328 49937 12059 23632 26127 28762 39078 49394
11992 14557 25993 21404 14102 34622 37243 20074

22639 14021 34541 38072 41575 45106 19884 26918 8035
18295 36171 41441 23200 13994 51336 21745 44034
39431 49747 38214 11897 14700 25912 35780 21309
39297 49557 11679 25803 21214 13940 42076 38425
14995 20237 22872 25479 35515 13778 34298 41808
19694 27204 30721 51241 22336 42147 37558 19426 7655
13261 35685 39216 53284 15406 25722 36486 21119
39107 41644 49367 11517 8104 15138 18364 20985 25398
43274 13683 34651 11249 20047 23578 25317 28848
49816 38045 42514 45079 19913 26947 8022 13180 41428
37777 27776 23173 13967 21956 36391 39026 49510
12108 15625 25885 36257 41387 7914 18174 21691 43112
29201 49721 38188 11955 14758 19832 25074 35726 6135
34271 41333 27681 23092 13886 51228 21861 42134
37587 19399 22930 10221 13752 36624 39189 41754
50692 53313 27150 15435 25695 36067 22282 41673
27016 8077 15111 18393 25427 35631 37998 15044 26256
35564 28821 39081 49341 42039 37730 19318 22835
14105 34737 11195 20133 22768 25263 13562 36434
38999 41592 50435 26921 7996 13238 22120 36244 41374
50368 26826 7887 14949 21902 26161 43085 28964 39448
49932 38217 12166 14787 19805 25047 35307 46080
27668 23121 43170 13915 34547 37350 19890 25894
13725 36149 41279 50273 26731 7806 36054 21807 41212
37561 19373 7672 12071 14706 21740 28774 35674 49742
53259 12004 15521 25781 36489 21472 39068 43523
49608 42306 37703 20243 25401 38532 14990 20176
22741 25306 13535 35959 41565 45320 26908 8025 13267
22093 33787 19183 22714 15888 26372 36408 28993
38973 41650 49513 11747 7158 22178 35294 50314 57376
38437 14895 20081 22884 25211 43143 13678 34758
38275 11244 14761 19863 25021 40000 45130 50260
26718 23067 14001 21850 42137 37772 19416 7645 12114
14679 26182 29699 35199 50219 27265 15508 26048
36028 21445 43062 34663 38194 15128 23590 29196
35760 49828 38113 11950 14571 19701 24831 21418
51458 42280 37677 19321 10227 37582 20122 22687
27184 15413 25953 36381 21364 39240 41623 49500
11734 8083 13241 22151 43281 57349 38480 14938 20292
23809 25422 35570 28939 49571 12169 14748 28872
51296 42090 37487 20027 22830 14212 34732 37353
41766 18941 11639 22070 39946 45216 50206 26804 7921
13051 18405 36057 21936 43091 49938 38167 12088
14653 23619 26156 28777 35733 49857 38100 11979
14558 25994 21391 14117 42253 37720 23116 14022
34542 38059 45569 19647 27157 15680 25940 36200
22289 41442 19379 21746 39460 49776 38005 11898
14463 25899 35543 21310 39298 49558 11708 7161 25832
21229 13927 51269 42063 38426 15024 20238 22859
25508 43160 13793 34761 37340 41795 23688 30722
51242 22099 42624 45189 26833 8132 13262 21909 35686
39203 49463 12061 26185 28764 39136 49396 11518 7867
18351 20986 43065 14160 34680 37245 11250 20076
23593 25318 28835 49803 38046 42529 45108 19914
26976 8037 13167 36173 41415 37778 23174 13996 21719
44036 39489 49749 53504 11871 15626 25886 36258
21339 41864 11737 25805 22168 29202 49722 37951
14997 19819 25537 35517 13780 34300 41334 37683
27682 23079 51215 21862 42149 37616 19428 22945
10222 13739 36611 39190 41769 53314 15464 25724
36544 22073 39109 41674 50321 26779 8078 15140 18394
20959 25456 43276 13685 34653 11223 23580 26243
28822 39082 49342 42516 45137 26949 23312 14106
34738 37303 20134 22755 14025 36449 39028 41579
50464 26922 7983 18299 36231 41389 7916 14950 21693
26162 43086 28727 39435 49695 38218 11957 14816
19806 25076 35784 21425 49561 42259 27655 23122
13944 42192 37589 20353 22932 25483 13726 36150
41756 50274 27208 15437 36069 22284 41199 37562
19374 7659 15169 17919 25429 35689 53288 15522 25782
36490 21235 39055 43552 49371 42097 37732 20272
22837 25402 13631 34711 11197 20163 22742 25321 13564
36436 39953 41566 45083 50437 26895 8026 13296 22094
41432 26828 23177 15875 21960 26135 36395 28994
38974 49514 12224 14789 26001 35309 38438 20082
22647 43172 13917 34549 38304 11007 14762 19892
25022 6139 36179 41337 50247 26733 23096 14002 51344
21865 42138 37535 19403 7646 12129 14708 29728 35676
39193 50696 53261 27266 15495 25811 36015 21446
43525 42308 38657 15115 20245 25375 35747 38114
15048 19702 25308 28825 51249 42043 37678 19322 7551
13269 33789 20137 22716 27171 15414 25954 36382
21351 39003 41652 49487 11749 8112 13242 22180 36248
43282 50316 57350 38467 14953 20055 23810 25213
43201 28968 50048 38277 12170 14735 19921 25051
45132 27672 23069 13975 21852 34495 37354 18942
12116 15633 29701 36153 41395 50221 26791 7922 18406
36058 21923 43120 49953 38196 12075 14654 23648
28778 35734 49858 38087 12008 14573 25785 21420
14118 51460 42254 37707 19295 10229 38536 45570
20124 22745 27158 15443 25927 35963 22290 41681
27024 8085 13215 22209 35639 49763 38006 14940 26376
35572 28941 39089 49573 11695 7162 21230 51270 42092
38441 15011 20029 22888 25271 43147 13794 34762
37327 41824 19867 26929 22128 39948 45190 50264
26834 7895 13053 21910 43093 39680 49940 38225 12062
14683 23621 26186 28751 35315 49383 11981 15512
25996 21449 43066 14147 34667 37246 23594 29312
49832 38061 42530 45095 19705 26739 8038 36174 21815
41444 37793 19381 10175 21748 39490 49750 53267
11900 15417 25901 36497 21368 39300 41627 49616
11738 7135 25806 22155 29217 57353 38428 14998 20296
22861 25538 35518 13767 34287 41797 45328 30724
51244 22101 42150 37603 19191 22946 14216 36640
39205 41770 49521 11643 25711 22074 39110 50322 26808
7869 14903 18409 20988 25443 43039 13686 34654 38171
11252 14769 23567 26272 28837 35737 49805 38104
42503 45138 19916 26950 23299 14121 42369 37780
23232 14026 36450 39015 50227 27161 15628 25944
36260 21341 41390 4095 21694 29204 39464 49724 38009
11958 14579 19821 25063 35547 21426 49562 42288
37685 27684 23137 13931 51273 42179 37590 20354
22919 25512 13741 36613 39248 41743 53316 15438
36070 22047 41676 45193 26781 8136 15170 18396 21913
25430 35690 28947 49467 12177 26245 28880 39084
49400 42098 37495 20259 22838 14108 34740 37361
11198 20192 22757 25322 13551 36423 39954 41581 45112
50438 26924 8041 13283 18301 36289 41419 23178 15904
21723 26164 44040 28785 39437 49753 38220 11987
14790 26002 35310 21399 42261 27713 23124 13918
34550 38067 15001 19879 25485 13784 36208 41338
50276 26734 23083 51331 21866 42153 37564 19432 7661
12130 14695 25907 35663 39194 53262 15524 25840
36492 21237 39113 43526 49373 42071 38658 15144
20246 22867 25404 43392 13689 34769 11227 20165
23696 25295 28826 51250 42520 45085 26953 8028 13270
33790 37307 20138 22703 15877 26193 36397 28996
39032 41639 49516 11750 8099 18359 36235 43297 38496
14954 20084 23601 25214 43202 28731 49811 38278
11961 14764 19922 25080 6141 13175 36181 41311 27659
23070 14004 21839 42140 37593 19405 22936 12103
15634 29702 36154 41872 50222 27268 15553 25813
36073 22400 43107 49954 38183 15117 19827 25433
35749 38116 14574 25786 21183 51223 42045 37736

19324 22841 10230 13747 34715 41777 20111 22746
27173 15472 25956 36440 22305 39005 41682 50441
27011 8086 13244 22210 43284 57408 38469 14927 23812
26139 35559 28942 39090 49574 12172 14793 25053
38442 20030 22651 43176 14033 34553 37356 41587
19896 26930 7991 22115 36127 41397 50251 26849 7924
13054 36060 21925 43094 39443 49927 38226 12077
14712 23622 28780 35792 49860 53377 11982 15499
25759 21450 43529 14176 42312 37709 20249 25491
38062 45572 19706 27216 15445 35965 22292 41207
37794 19382 7667 13273 21735 35697 49765 53296 11887
15418 25902 36498 21355 39063 41656 49603 11753 7164
22184 29218 52224 57354 38415 15013 20059 22862
25329 43149 13796 34764 38281 41798 45315 19869
26903 22102 45248 26836 23185 13979 21968 36403
39206 49522 12120 14685 26188 29705 35317 50337
26795 7870 18410 20975 43068 14149 34669 38200 11239
14770 23596 28838 35738 49806 38091 42532 45153
19679 26741 23328 14122 51464 21873 42370 37767
19411 10233 39492 50704 53269 27162 15391 25931
36023 21342 41629 11740 8089 15123 22157 29191 35643
49711 38010 15056 19822 25540 35576 29057 49577
42275 37686 23138 51274 42208 37605 20145 22948
25275 13742 36614 39235 41772 49495 11645 22076
40064 45194 50324 26782 7899 14961 18383 21914 25445
43097 28976 49944 38173 12178 14743 23625 26246
28867 35263 49387 42561 45140 27904 23301 14095
34727 37362 22758 14028 36452 39969 41582 45099
50229 26687 8042 18302 36290 21819 41448 19385 12083
21752 26151 28786 39438 49754 37983 12016 14581
26017 35549 21428 39304 49564 42262 37715 27714
23111 13933 42181 38544 15002 20356 22977 25486
13771 36195 41801 30728 51360 22105 42154 37551
19195 7662 15172 26384 35692 28949 39209 49469 11703
25827 21238 39114 49374 42100 38449 14907 20261
22896 25391 43155 13690 34770 37335 11256 20166
23683 25324 28841 51713 39956 42507 45086 50496
26954 8015 13285 41421 37784 23180 15878 21725 26194
36398 28759 39019 49279 11989 15744 26004 36264
21457 43298 34675 20071 23602 29208 49840 38069
11962 14527 19937 25067 6142 36182 41340 37689 27688
23085 13991 51333 21868 42127 37594 19406 22923
12132 15649 25909 36617 39196 41859 53320 15554
25814 36074 22163 43584 57361 38660 15118 20304
22869 25434 35750 13663 34295 11229 26249 28828
51252 42046 37499 19311 22842 14224 34744 37309
41778 20140 22761 27174 15459 25719 36427 22306
39006 41697 50442 27040 8101 13231 18417 36237 43271
38470 14956 23575 26168 43204 28733 39553 49813
38336 11935 14794 19924 25054 21403 14129 42265
27661 23128 14034 34554 37119 19883 27393 15636
29760 36156 41398 50280 26850 7911 36047 21926 43109
39472 49956 38241 12078 14699 19829 24959 35779
53378 15528 25788 21241 43530 13939 51281 42075
37710 20250 22815 25520 13749 34717 41751 20169
22748 27203 15446 35966 22279 41684 45201 27013 8144
13274 22212 35698 49766 53283 15881 26141 36513
29000 39092 41643 49632 11754 7151 18363 38444 15014
20088 22653 25330 43150 13559 34527 38282 41589
45344 19870 26932 8049 13179 22117 36185 41427 50253
26823 23186 14008 21955 44048 39445 49985 38228
12107 14686 29706 35318 50338 27272 15501 25817
21452 43055 14150 34670 38187 15233 19775 25493
35753 38120 45154 19708 26742 23091 51227 21874
42161 37796 19440 7669 10234 12799 35671 50691 53270
27177 15420 25960 36500 21357 39121 41630 49605
11727 8090 15152 22158 29220 43288 57356 38473 15043

20061 23816 25303 35563 29058 49578 42752 45317
26961 37606 20146 22711 13981 36405 39264 41535
49524 11646 7995 22063 36243 41401 50311 26797 7928
14962 18412 21929 25446 43098 28963 49931 38174
12193 14772 23626 28896 35740 49864 38093 42562
45127 27667 23302 14124 21847 42372 37825 19413
10207 39970 45576 50230 27164 15449 25933 36081
22296 41211 19386 7615 15125 21739 29249 35645 49769
38012 12003 14582 26018 35550 21415 39067 49551
42277 37744 23140 13934 51276 42182 38531 15017
20119 22978 25277 13800 36672 39237 41802 50449
26907 22106 45196 26840 7901 14935 21916 26371 35455
28950 39210 49470 12180 14801 26304 28869 35321
49389 42087 38450 20262 22883 43184 14153 34785
37364 11243 23712 28842 51714 39943 42536 45101
50259 26745 8044 13286 36292 21821 41422 37771 19359
12085 21726 26209 28788 39496 49756 53273 11990
15507 25991 36027 21458 43537 42320 37717 27716
24065 29195 49827 38070 15004 19938 25544 13773
36197 41327 37690 23086 51334 21631 42156 37609
19197 22952 11895 15650 25910 36618 21363 39183
41888 49499 11761 25829 22192 39116 50328 57362
38423 14909 20291 22870 25449 43157 13692 34772
38289 11230 14747 23685 26250 28815 51239 42509
45144 26956 23305 14211 34731 37310 22762 15936
26196 36456 29713 39021 41698 50233 26803 8102 18418
36238 20983 43300 34677 11135 23604 26155 28734
39554 49814 38099 11964 14585 19911 25069 21432
14130 51472 42266 37663 27662 23115 14049 42185
37596 20360 22925 27394 15623 25939 36143 41861
15556 36076 22165 43110 39459 49719 38242 15176
19830 25436 35808 28953 49585 11707 25775 21242
51282 42104 37501 20265 22844 25507 13750 34718
37339 41780 20170 22735 27232 15461 36429 22308
39960 41671 45202 50444 27014 8131 13289 18391 43329
53760 15882 23633 26142 36514 28763 39079 49395
11993 14796 26008 21405 14103 34623 20075 22654
14036 34556 38073 41590 45107 19885 26919 8050 22118
36186 41456 50254 26852 23201 13995 51337 21984
44035 39446 49986 38215 12136 14701 25913 35781
39312 53380 15502 25818 21215 43532 13941 42077
38664 15234 20252 22873 25494 35754 13779 34299
41809 19695 27205 30736 51256 22337 42162 37559
19427 7670 13276 35700 39217 50720 53285 27178 15407
25723 36487 21358 39122 41645 49606 11756 8105 15139
18365 25399 43275 38474 15072 20062 23579 25332
43208 28849 49817 38284 42515 45318 19928 26962 8023
13181 41429 27777 23188 13982 21957 36406 39027
49511 12109 15640 29708 36272 41402 50340 26798 7915
18175 21930 43113 29440 49960 38189 12194 14759
19833 25075 35727 38094 45156 27696 23093 13887
51229 21876 42135 37826 19414 22931 10236 13753
36625 41755 50693 53328 27151 15450 25934 36082
22283 41688 27017 8092 15126 22216 29250 35646 49770
37999 15045 26257 35565 29060 39096 49580 42278
37731 19319 38560 15018 20148 22769 25278 13563
36435 39238 41593 50450 26936 7997 13239 22121 36245
41375 50369 26827 7902 14964 21903 26400 43100 28965
39449 49933 38232 12167 14802 23628 28870 35322
49390 42564 46081 27669 23360 43171 14154 34786
37351 19891 25497 39972 45102 50288 26746 7807 36055
21822 41213 37800 19388 7673 12086 14707 21741 26210
28775 35675 49743 53274 12005 15536 26020 36504
21473 39069 43538 49609 42307 37718 24066 29224
57472 38533 14991 20177 22980 25307 13774 36198
41804 45321 26909 22108 37610 19198 22715 15889
26373 36409 29008 39212 41651 49528 11762 7159 25830

22179 35295 50315 57377 38452 14910 20320 22885
25450 43158 13679 34759 38290 11245 14776 23686
28844 51716 40001 42510 45131 50261 26719 23306
14240 21851 42376 37773 19417 12115 26183 29714
39022 50234 27280 15509 26049 36029 21460 43063
34678 38195 15129 23591 29197 35761 49829 38128
11951 14586 19940 25070 21419 51459 42281 37692
23144 14050 51392 42186 37583 20123 22926 27185
15652 25968 36620 21365 39241 41862 49501 11735
22166 47104 57364 38481 14939 20293 23824 25423
35571 28954 49586 12184 14749 26252 28873 51297
42091 37502 20266 22831 14213 34733 37368 41767
22764 15462 36430 22071 39947 41700 45217 50207
26805 8160 13290 18420 36296 21937 43330 49939 12089
23634 26157 28792 39556 49872 38101 11994 14559
25995 21406 14132 42268 37721 27720 23117 14023
34543 38074 45584 19886 27396 15681 25941 36201
41443 23202 51338 21747 44064 39461 49777 38244
11899 14702 25914 35782 21311 39299 49559 11709 25833
21244 13942 51284 42078 38427 15025 20239 22874
25509 43161 13808 34776 37341 41810 20172 23689
27206 30723 51243 22338 42625 45204 27072 8133 13263
35687 39218 53286 15884 26200 36516 28765 39137
41646 49397 11519 8106 18366 20987 43304 14161 34681
11251 20077 23608 25319 28850 49818 38047 42544
45109 19915 26977 8052 13182 36188 41430 37779 27778
23175 13997 21958 44037 39504 49988 53505 12110
15627 25887 36259 41865 15560 25820 22169 43114
29203 49723 38190 15236 19834 25552 35756 13781
34301 41335 27683 23094 51230 21863 42164 37617
19429 22960 10223 13754 36626 39191 41784 50694
53315 27180 15465 25725 36545 22312 39124 41675
50560 27018 8079 15141 18395 25457 43277 38476 15046
23581 26258 35566 28823 39083 49343 42517 45376
26964 23313 14107 34739 20135 22770 14040 36464
39029 41594 50465 26923 7998 22122 36246 41404 50370
26856 7917 14951 21932 26163 43087 28966 39450 49934
38219 12196 14817 19807 25077 35785 53384 46082
27670 23123 43648 13945 42193 37828 20368 22933
25498 13727 36151 41757 50275 27209 15452 36084
22285 41214 37563 19375 7674 15184 21742 29252 35704
49772 53289 12006 15523 25783 36491 21474 39070
43553 49610 42336 37733 20273 25403 38534 15020
20178 22743 25336 13565 36437 40192 41567 45322
50452 26910 8027 13297 22095 41433 26829 23192 15890
21961 26374 36410 28995 38975 49515 12225 14804
29824 35324 50344 57378 38439 20083 22886 43173
14156 34788 38305 11246 14763 19893 25023 40002
45160 50262 26748 23097 14003 51345 21880 42139
37774 19418 7647 12144 14709 26212 29729 35677 50697
53276 27267 15510 26050 36030 21447 43540 42309
38672 15130 24068 29198 35762 49830 38115 15049
19703 25309 29064 51488 42282 37679 19323 37612
20152 22717 27186 15415 25955 36383 21366 39242
41653 49502 11764 8113 13243 22181 36249 43283 50317
57351 38482 14968 20294 23811 25452 43216 28969
50049 38292 12171 14750 23744 28874 51298 42568
45133 27673 23308 14214 21853 34734 37355 18943
12117 29716 39976 45218 50236 26806 7923 18407 36059
21938 43121 49968 38197 12090 14655 23649 26158
28779 35735 49859 38102 12009 14588 26024 21421
14119 51461 42255 37722 23118 14052 42188 38537
45571 20125 22984 27159 15682 25942 36202 22291
41920 27025 22224 39462 49778 38007 14941 26377
35573 28956 39328 49588 11710 7163 25834 21231 51271
42093 38456 15026 20268 22889 25510 43162 13795
34763 37342 41825 23690 30752 51720 22129 39949

42626 45191 50265 26835 8134 13292 21911 43332 39681
49941 12063 23636 26187 28766 39138 49398 11996
15513 25997 21464 43067 14162 34682 37247 20078
23595 29313 49833 38076 42531 45110 19944 26978 8039
36175 41445 37808 23204 13998 51340 21749 44038
39491 49751 53506 11901 15656 25916 36736 21369
39301 41866 49617 11739 25807 22170 29232 57368
38429 14999 20297 22876 25539 35519 13782 34302
41812 45329 28160 30725 51245 22340 42151 37618
19430 22947 14217 36641 39220 41771 53344 15466
25726 36546 22075 39111 41704 50323 26809 8108 15142
18424 20989 25458 43278 13687 34655 11253 23582
26273 28852 39560 49820 38105 42518 45139 19917
26951 23314 14136 42384 37781 27780 23233 14027
36451 39030 50466 27400 15629 25945 36261 41391 7918
21695 43116 29205 39465 49725 38248 11959 14818
19836 25078 35786 21427 49563 42289 27685 23152
13946 51288 42194 37591 20355 22934 25513 13756
36628 39249 41758 50752 53317 27210 15439 36071
22286 41677 45208 27020 8137 15171 18397 25431 35691
53290 16000 26260 36520 28881 39085 43554 49401
42099 37734 20274 22839 14109 34741 11199 20193
22772 25323 13566 36438 39955 41596 45113 50439
26925 8056 13298 22124 36304 41434 50372 26830 23179
15905 21962 26165 44041 29024 39452 49992 38221
12226 14791 26003 35311 46084 27728 23125 43174
13919 34551 38306 15240 19894 25500 13785 36209
41339 50277 26735 23098 51346 21867 42168 37565
19433 7676 12131 14710 29730 35678 39195 50698 53263
27296 15525 25841 36493 21476 39128 43527 49612
42310 38659 15145 20247 25405 43393 38592 15050
20180 23697 25310 28827 51251 42521 45324 26968 8029
13271 33791 20139 22718 15892 26432 36412 28997
39033 41654 49517 11751 8114 22182 36250 43312 50318
57380 38497 14955 20085 23840 25215 43203 28970
50050 38279 12200 14765 19923 25081 40004 45134
27674 23071 14005 21854 42141 37832 19420 22937
12118 15635 29703 36155 41873 50223 27269 15568
26052 36088 22401 43122 49955 38198 15132 23650
29256 35764 49888 38117 12010 14575 25787 21422
51462 42284 37737 19325 10231 38538 45600 20126
22747 27188 15473 25957 36441 22320 39244 41683
50456 27026 8087 13245 22211 43285 57409 38484 14942
23813 26378 35574 28943 39091 49575 12173 14808
28876 51300 42094 38443 20031 22890 43177 14272
34792 37357 41826 19897 26931 22130 39950 45220
50266 26864 7925 13055 36061 21940 43095 39682 49942
38227 12092 14713 23623 26216 28781 35793 49861
53392 11983 15514 25998 21451 43544 14177 42313
37724 24072 29314 49834 38063 45573 19707 27217
15684 36204 22293 41446 37795 19383 21750 39520
49780 53297 11902 15419 25903 36499 21370 39302
41657 49618 11768 7165 25836 22185 29219 52225 57355
38430 15028 20298 22863 25568 43164 13797 34765
38296 41799 45330 23692 30726 51246 22103 42628
45249 26837 23424 14218 21969 36642 39207 49523
12121 26189 29720 39140 50352 26810 7871 18411 20990
43069 14164 34684 38201 11254 14771 23597 26274
28839 35739 49807 38106 42533 45168 19918 26980
23329 14123 51465 42371 37782 23234 14056 44096
39493 50705 53508 27163 15630 25946 36262 21343
41868 11741 22172 29206 39466 49726 38011 15057
19823 25541 35577 29072 49592 42290 37687 27686
23139 27169 42209 37620 20384 22949 25514 13743
36615 39250 41773 53318 15468 36548 22077 40065
41678 45195 50325 26783 8138 15200 18398 21915 25460
43336 28977 49945 12179 23640 26247 28882 39086

49402 42576 45141 27905 23316 14110 34742 37363
20194 22759 14029 36453 39984 41583 45114 50468
26926 8043 18303 36291 41449 23208 15906 21753 26166
44042 28787 39439 49755 38222 12017 14820 26032
35788 21429 39305 49565 42263 27715 23126 13948
42196 38545 15003 20357 22992 25487 13786 36210
41816 50278 27212 30729 51361 22344 42155 37566
19434 7663 15173 26385 35693 39224 53292 15526 25842
36494 21239 39115 43556 49375 42101 38688 15146
20276 22897 25406 43394 13691 34771 11257 20167
23698 25325 28856 51728 39957 42522 45087 50497
26955 8030 13300 41436 37785 27784 23181 15879 21964
26195 36399 28998 39034 49518 12228 15745 26005
36265 43299 38498 20086 23603 43232 29209 49841
38308 11963 14766 19952 25082 6143 36183 41341 27689
23100 14006 51348 21869 42142 37595 19407 22938
12133 15664 29732 36632 39197 41874 50700 53321
27270 15555 25815 36075 22402 43585 57600 38661
15119 20305 25435 35751 38118 15052 26264 28829
51253 42047 37738 19326 22843 14225 34745 41779
20141 22776 27175 15474 25958 36442 22307 39007
41712 50443 27041 8116 13246 22240 36252 43286 50376
57410 38471 14957 23814 26119 43205 28972 39568
50052 38337 12174 14795 19925 25055 46088 27676
23129 43178 14035 34555 37358 19898 27408 15637
29761 36157 41399 50281 26851 7926 36062 21927 43124
39473 49957 38256 12079 14714 23652 28782 35794
49862 53379 12012 15529 25789 21480 43531 14178
51520 42314 37711 20251 25521 38540 45574 20184
22749 27218 15447 35967 22294 41685 45440 27028 8145
13275 22213 35699 49767 53298 15896 26380 36528
29001 39093 41658 49633 11755 7166 22186 52226 57384
38445 15015 20089 22892 25331 43151 13798 34766
38283 41828 45345 19871 26933 22132 40008 45250
50268 26838 23187 14009 21970 44049 39684 50000
38229 12122 14687 26190 29707 35319 50339 27273
15516 26056 21453 43070 14151 34671 38202 15248
23598 29316 35768 49836 38121 42534 45155 19709
26743 23330 51466 21875 42400 37797 19441 10235
39494 50706 53271 27192 15421 25961 36501 21372
39360 41631 49620 11742 8091 15153 22159 29221 43289
57357 38488 15058 20300 23817 25542 35578 29059
49579 42753 45332 30784 51304 42210 37607 20147
22950 14220 36644 39265 41774 49525 11647 22078
40066 45224 50326 26812 7929 14963 18413 21944 25447
43099 28978 49946 38175 12208 14773 23627 26276
28897 35741 49865 38108 42563 45142 27906 23303
14125 42373 37840 23236 14030 36454 39971 45577
50231 27165 15688 25948 36320 22297 41450 19387
21754 29264 39468 49784 38013 12018 14583 26019
35551 21430 39306 49566 42292 37745 27744 23141
13935 51277 42183 38546 15032 20358 22979 25516
13801 36673 39252 41803 54272 30730 51362 22107
42632 45197 26841 8140 15174 21917 26386 35694 28951
39211 49471 12181 26305 28884 39144 49404 42102
38451 20263 22898 43185 14168 34800 37365 11258
20196 23713 25326 28843 51715 39958 42537 45116
50498 26984 8045 13287 36293 41423 37786 23182 15908
21727 26224 44044 28789 39497 49757 53512 11991
15746 26006 36266 21459 43776 42321 27717 24080
29210 49842 38071 15005 19939 25545 13788 36212
41342 37691 27690 23087 51335 21870 42157 37624
19436 22953 12134 15651 25911 36619 39198 41889
53322 15584 25844 36552 22193 39117 43586 50329
57363 38662 15148 20306 22871 25464 43396 13693
34773 11231 23700 26251 28830 51254 42524 45145
26957 23320 14226 34746 37311 20142 22763 15937

26197 36457 29952 39036 41699 50472 27042 8103 18419
36239 43301 38500 14958 23605 26170 43206 28735
39555 49815 38338 11965 14824 19926 25084 21433
14131 51473 42267 27663 23130 14064 44200 37597
20361 22940 27395 15638 29762 36158 41876 50282
27328 15557 36077 22404 43111 39474 49958 38243
15177 19831 25437 35809 53408 15530 25790 21243
43560 51283 42105 37740 20280 22845 25522 13751
34719 41781 20171 22750 27233 15476 36444 22309
39961 41686 45203 50445 27015 8146 13304 22214 43344
57412 53761 15883 23872 26143 36515 29002 39094
49634 12232 14797 26009 38446 20090 22655 43180
14037 34557 38312 41591 45346 19900 26934 8051 22119
36187 41457 50255 26853 23216 14010 51352 21985
44050 39447 49987 38230 12137 14716 29736 35796
39313 50816 53381 27274 15503 25819 21454 43533
14180 42316 38665 15235 20253 25495 35755 38122
45632 19710 27220 30737 51257 22352 42163 37798
19442 7671 13277 35701 50721 53300 27179 15422 25962
36502 21359 39123 41660 49607 11757 8120 15154 22188
29222 43290 52228 57358 38475 15073 20063 23818
25333 43209 29088 50056 38285 42754 45319 19929
26963 45252 27792 23139 13983 21972 36407 39266
49526 12124 15641 29709 36273 41403 50341 26799 7930
18414 21931 43128 29441 49961 38204 12195 14774
23656 28898 35742 49866 38095 42592 45157 27697
23332 14126 51468 21877 42374 37827 19415 10237
40448 45578 50708 53329 27166 15451 25935 36083
22298 41689 27032 8093 15127 22217 29251 35647 49771
38014 15060 26496 35580 29061 39097 49581 42279
37746 23142 51278 42212 38561 15019 20149 23008
25279 13802 36674 39239 41832 50451 26937 22136
40068 45198 50384 26842 7903 14965 21918 26401 43101
28980 39688 49948 38233 12182 14803 23629 26306
28871 35323 49391 42565 46096 27908 23361 43186
14155 34787 37366 23714 29320 51744 39973 42538
45103 50289 26747 8046 36294 21823 41452 37801 19389
12087 21756 26211 28790 39498 49758 53275 12020
15537 26021 36505 21488 39308 43539 49624 42322
37719 27718 24067 29225 57473 38548 15006 20416
22981 25546 13775 36199 41805 45336 30732 51364
22109 42158 37611 19199 22954 16128 26388 36648
29009 39213 41890 49529 11763 25831 22194 39118
50330 57392 38453 14911 20321 22900 25451 43159
13694 34774 38291 11260 14777 23687 26280 28845
51717 40016 42511 45146 50500 26958 23307 14241
42377 37788 23240 15938 26198 36458 29715 39023
50235 27281 15748 26064 36268 21461 43302 34679
23606 29212 39584 49844 38129 11966 14587 19941
25071 21434 51474 42296 37693 27692 23145 14051
51393 42187 37598 20362 22927 27424 15653 25969
36621 39256 41863 53324 15558 36078 22167 43588
47105 57365 38720 15178 20308 23825 25438 35810
28955 49587 12185 26253 28888 51312 42106 37503
20267 22846 14228 34748 37369 41782 20200 22765
27234 15463 36431 22310 39962 41701 45232 50446
27044 8161 13291 18421 36297 43331 53762 15912 23635
26172 44160 28793 39557 49873 38340 11995 14798
26010 21407 14133 42269 27721 23132 14038 34558
38075 45585 19887 27397 15696 29764 36216 41458
50284 26854 23203 51339 21986 44065 39476 50016
38245 12138 14703 25915 35783 39314 53382 15532
25848 21245 43534 13943 51285 42079 38666 15264
20254 22875 25524 43400 13809 34777 41811 20173
23704 27207 30738 51258 22339 42640 45205 27073 8148
13278 35702 39219 50722 53287 15885 26201 36517
29004 39152 41647 49636 11758 8107 18367 43305 38504

15074 20092 23609 25334 43210 28851 49819 38286
42545 45348 19930 26992 8053 13183 36189 41431 27779
23190 14012 21959 44052 39505 49989 53520 12111
15642 29710 36274 41880 50342 27276 15561 25821
22408 43115 29442 49962 38191 15237 19835 25553
35757 38124 45158 27698 23095 51231 21878 42165
37856 19444 22961 10238 13755 36627 41785 50695
53330 27181 15480 25964 36560 22313 39125 41690
50561 27019 8094 15156 22218 29280 43292 57416 38477
15047 23820 26259 35567 29062 39098 49582 42756
45377 26965 38562 20150 22771 14041 36465 39268
41595 50480 26938 7999 22123 36247 41405 50371 26857
7932 14966 21933 26402 43102 28967 39451 49935 38234
12197 14832 23630 28900 35800 49868 53385 42566
46083 27671 23362 43649 14184 42432 37829 20369
25499 39974 45580 50290 27224 15453 36085 22300
41215 37802 19390 7675 15185 21743 29253 35705 49773
53304 12007 15538 26022 36506 21475 39071 43568
49611 42337 37748 24096 29226 52232 57474 38535
15021 20179 22982 25337 13804 36676 40193 41806
45323 50453 26911 22110 45256 26844 23193 15891
21976 26375 36411 29010 39214 49530 12240 14805
26308 29825 35325 50345 57379 38454 20322 22887
43188 14157 34789 38320 11247 14778 23716 28846
51718 40003 42540 45161 50263 26749 23336 14242
51584 21881 42378 37775 19419 12145 26213 29744
39500 50712 53277 27282 15511 26051 36031 21462
43541 42324 38673 15131 24069 29199 35763 49831
38130 15064 19942 25548 29065 51489 42283 37694
23146 51394 42216 37613 20153 22956 27187 15654
25970 36622 21367 39243 41892 49503 11765 22196
40072 47106 50332 57366 38483 14969 20295 23826
25453 43217 28984 50064 38293 12186 14751 23745
26254 28875 51299 42569 45148 27912 23309 14215
34735 37370 22766 15940 36460 29717 39977 41702
45219 50237 26807 8162 18422 36298 21939 43360 49969
12091 23664 26159 28794 39558 49874 38103 12024
14589 26025 21436 14134 51476 42270 37723 27722
23119 14053 42189 38552 45586 20364 22985 27398
15683 25943 36203 41921 30848 51368 22225 44066
39463 49779 38246 15180 26392 35812 28957 39329
49589 11711 25835 21246 51286 42108 38457 15027
20269 22904 25511 43163 13810 34778 37343 41840
20174 23691 27236 30753 51721 22368 39964 42627
45206 50504 27074 8135 13293 43333 39696 53764 15886
23637 26202 36518 28767 39139 49399 11997 15752
26012 21465 43306 14163 34683 20079 23610 29328
49848 38077 42546 45111 19945 26979 8054 36190 41460
37809 27808 23205 13999 51341 21988 44039 39506
49990 53507 12140 15657 25917 36737 39316 41867
53440 15562 25822 22171 43592 29233 57369 38668
15238 20312 22877 25554 35758 13783 34303 41813
28161 30740 51260 22341 42166 37619 19431 22962
14232 36656 39221 41786 50724 53345 27182 15467
25727 36547 22314 39126 41705 50562 27048 8109 15143
18425 25459 43279 38478 15076 23583 26288 43212
28853 39561 49821 38344 42519 45378 19932 26966
23315 14137 42385 27781 23248 14042 36466 39031
50467 27401 15644 29768 36276 41406 50400 26858 7919
21934 43117 29444 39480 49964 38249 12198 14819
19837 25079 35787 53386 46112 27700 23153 43650
13947 51289 42195 37830 20370 22935 25528 13757
36629 41759 50753 53332 27211 15454 36086 22287
41692 45209 27021 8152 15186 22220 29254 35706 49774
53291 16001 26261 36521 29120 39100 43555 49640
42338 37735 20275 38564 15022 20208 22773 25338
13567 36439 40194 41597 45352 50454 26940 8057 13299

22125 36305 41435 50373 26831 23194 15920 21963
26404 44056 29025 39453 49993 38236 12227 14806
29826 35326 50346 57856 46085 27729 23364 43175
14158 34790 38307 15241 19895 25501 40032 45162
50292 26750 23099 51347 21882 42169 37804 19448 7677
12146 14711 26214 29731 35679 50699 53278 27297
15540 26080 36508 21477 39129 43542 49613 42311
38674 15160 24070 29228 43408 57476 38593 15051
20181 23936 25311 29066 51490 42760 45325 26969
37614 20154 22719 15893 26433 36413 29012 39272
41655 49532 11766 8115 22183 36251 43313 50319 57381
38512 14970 20324 23841 25454 43218 28971 50051
38294 12201 14780 23746 28904 51776 40005 42570
45135 27675 23310 14244 21855 42380 37833 19421
12119 29718 39978 45696 50238 27284 15569 26053
36089 22416 43123 49970 38199 15133 23651 29257
35765 49889 38132 12011 14590 26026 21423 51463
42285 37752 23148 14054 51396 42190 38539 45601
20127 22986 27189 15712 25972 36680 22321 39245
41922 50457 27027 22226 47108 57424 38485 14943
23828 26379 35575 28958 39330 49590 12188 14809
26312 28877 51301 42095 38458 20270 22891 43192
14273 34793 37372 41827 23720 30754 51722 22131
39951 42656 45221 50267 26865 8164 13294 36300 21941
43334 39683 49943 12093 23638 26217 28796 39616
49876 53393 11998 15515 25999 21466 43545 14192
42328 37725 27724 24073 29315 49835 38078 45588
19946 27456 15685 36205 41447 37810 23206 51342
21751 44068 39521 49781 53536 11903 15658 25918
36738 21371 39303 41896 49619 11769 25837 22200
29234 52240 57370 38431 15029 20299 22878 25569
43165 13812 34780 38297 41814 45331 23693 28162
30727 51247 22342 42629 45264 27076 23425 14219
36643 39222 53346 15944 26204 36576 29721 39141
41706 50353 26811 8110 18426 20991 43308 14165 34685
11255 23612 26275 28854 39562 49822 38107 42548
45169 19919 26981 23344 14138 51480 42386 37783
27782 23235 14057 44097 39508 50944 53509 27402
15631 25947 36263 41869 15564 22173 43118 29207
39467 49727 38250 15296 19838 25556 35816 29073
49593 42291 27687 23154 51290 42224 37621 20385
22964 25515 13758 36630 39251 41788 50754 53319
27240 15469 36549 22310 44080 41679 45210 50564
27022 8139 15201 18399 25461 43337 53768 16002 23641
26262 36522 28883 39087 49403 42577 45380 27920
23317 14111 34743 20195 22774 14044 36468 39985
41598 45115 50469 26927 8058 22126 36306 41464 50374
26860 23209 15907 21992 26167 44043 29026 39454
49994 38223 12256 14821 26033 35789 39320 53388
46086 27730 23127 43652 13949 42197 38784 15242
20372 22993 25502 13787 36211 41817 50279 27213
30744 51376 22345 42170 37567 19435 7678 15188 30208
35708 39225 50728 53293 27298 15527 25843 36495
21478 39130 43557 49614 42340 38689 15147 20277
25407 43395 38594 15080 20182 23699 25340 28857
51729 40196 42523 45326 50512 26970 8031 13301 41437
27785 23196 15894 21965 26434 36414 28999 39035
49519 12229 15760 29828 36280 43314 50348 57382
38499 20087 23842 43233 29448 50080 38309 12202
14767 19953 25083 40006 45164 27704 23101 14007
51349 21884 42143 37834 19422 22939 12148 15665
29733 36633 41875 50701 53336 27271 15570 26054
36090 22403 43600 57601 38676 15134 24128 29258
35766 49890 38119 15053 26265 29068 51492 42286
37739 19327 38568 45602 20156 22777 27190 15475
25959 36443 22322 39246 41713 50458 27056 8117 13247
22241 36253 43287 50377 57411 38486 14972 23815

26408 43220 28973 39569 50053 38352 12175 14810
23748 28878 51302 42572 46089 27677 23368 43179
14274 34794 37359 19899 27409 29776 39980 43222
50296 26866 7927 36063 21942 43125 39712 49972 38257
12094 14715 23653 26218 28783 35795 49863 53394
12013 15544 26028 21481 43546 14179 51521 42315
37726 24074 29344 57480 38541 45575 20185 22988
27219 15686 36206 22295 41924 45441 27029 22228
39522 49782 53299 15897 26381 36529 29016 39332
41659 49648 11770 7167 25838 22187 52227 57385 38460
15030 20328 22893 25570 43166 13799 34767 38298
41829 45360 23694 30756 51724 22133 40009 42630
45251 50269 26839 23426 14248 21971 44288 39685
50001 12123 26191 29722 39142 50354 27288 15517
26057 21468 43071 14166 34686 38203 15249 23599
29317 35769 49837 38136 42535 45170 19948 26982
23331 51467 42401 37812 23264 14058 51400 44098
39495 50707 53510 27193 15660 25976 36740 21373
39361 41870 49621 11743 22174 29236 47112 57372
38489 15059 20301 23832 25543 35579 29074 49594
42768 45333 28164 30785 51305 42211 37622 20386
22951 14221 36645 39280 41775 53348 15470 36550
22079 40067 41708 45225 50327 26813 8168 15202 18428
21945 25462 43338 28979 49947 12209 23642 26277
28912 39564 49880 38109 42578 45143 27907 23318
14140 42388 37841 27840 23237 14031 36455 39986
45592 50470 27404 15689 25949 36321 41451 23210
21755 44072 29265 39469 49785 38252 12019 14822
26034 35790 21431 39307 49567 42293 27745 23156
13950 51292 42198 38547 15033 20359 22994 25517
13816 36688 39253 41818 50756 54273 27214 30731
51363 22346 42633 45212 27080 8141 15175 26387 35695
39226 53294 16004 26320 36524 28885 39145 43558
49405 42103 38690 20278 22899 43424 14169 34801
11259 20197 23728 25327 28858 51730 39959 42552
45117 50499 26985 8060 13302 36308 41438 37787 27786
23183 15909 21966 26225 44045 29028 39512 49996
53513 12230 15747 26007 36267 43777 46144 27732
24081 43234 29211 49843 38310 15244 19954 25560
13789 36213 41343 27691 23102 51350 21871 42172
37625 19437 22968 12135 15666 29734 36634 39199
41904 50702 53323 27300 15585 25845 36553 22432
39132 43587 50568 57602 38663 15149 20307 25465
43397 38596 15054 23701 26266 28831 51255 42525
45384 26972 23321 14227 34747 20143 22778 15952
26436 36472 29953 39037 41714 50473 27043 8118 22242
36254 43316 50378 57440 38501 14959 23844 26171
43207 28974 39570 50054 38339 12204 14825 19927
25085 55296 46090 27678 23131 43656 14065 42201
37836 20376 22941 27410 15639 29763 36159 41877
50283 27329 15572 36092 22405 43126 39475 49959
38258 15192 23654 29260 35824 49892 53409 12014
15531 25791 21482 43561 51522 42344 37741 20281
25523 38542 45604 20186 22751 27248 15477 36445
22324 40200 41687 45442 50460 27030 8147 13305 22215
43345 57413 53776 15898 23873 26382 36530 29003
39095 49635 12233 14812 29832 52256 57386 38447
20091 22894 43181 14276 34796 38313 41830 45347
19901 26935 22134 40010 45280 50270 26868 23217
14011 51353 22000 44051 39686 50002 38231 12152
14717 26220 29737 35797 50817 53396 27275 15518
26058 21455 43548 14181 42317 38680 15250 24076
29318 35770 49838 38123 45633 19711 27221 39091
51496 22353 42402 37799 19443 39524 50736 53301
27194 15423 25963 36503 21374 39362 41661 49622
11772 8121 15155 22189 29223 43291 52229 57359 38490
15088 20302 23819 25572 43224 29089 50057 38300

42755 45334 23752 30786 51306 42688 45253 27793
23428 14222 21973 36646 39267 49527 12125 29724
40096 45226 50356 26814 7931 18415 21946 43129 29456
49976 38205 12210 14775 23657 26278 28899 35743
49867 38110 42593 45172 27936 23333 14127 51469
42375 37842 23238 14060 44100 40449 45579 50709
53568 27167 15690 25950 36322 22299 41928 27033
22232 29266 39470 49786 38015 15061 26497 35581
29076 39336 49596 42294 37747 27746 23143 51279
42213 38576 15034 20388 23009 25518 13803 36675
39254 41833 54274 30760 51840 22137 40069 42634
45199 50385 26843 8142 15204 21919 26416 43340 28981
39689 49949 12183 23644 26307 28886 39146 49406
42580 46097 27909 23376 43187 14170 34802 37367
20198 23715 29321 51745 39988 42539 45118 50528
26986 8047 36295 41453 37816 23212 15910 21757 26226
44046 28791 39499 49759 53514 12021 15776 26036
36744 21489 39309 43778 49625 42323 27719 24082
29240 57488 38549 15007 20417 22996 25547 13790
36214 41820 45337 28168 30733 51365 22348 42159
37626 19438 22955 16129 26389 36649 39228 41891
53352 15586 25846 36554 22195 39119 43616 50331
57393 38692 15150 20336 22901 25466 43398 13695
34775 11261 23702 26281 28860 51732 40017 42526
45147 50501 26959 23322 14256 42392 37789 27788
23241 15939 26199 36459 29954 39038 50474 27520
15749 26065 36269 43303 38502 23607 43236 29213
39585 49845 38368 11967 14826 19956 25086 21435
51475 42297 27693 23160 14066 51408 42202 37599
20363 22942 27425 15668 29792 36636 39257 41878
50760 53325 27330 15559 36079 22406 43589 47120
57604 38721 15179 20309 25439 35811 53410 16008
26268 28889 43562 51313 42107 37742 20282 22847
14229 34749 41783 20201 22780 27235 15478 36446
22311 39963 41716 45233 50447 27045 8176 13306 22244
36312 43346 50380 57414 53763 15913 23874 26173
44161 29032 39572 50112 38341 12234 14799 26011
46092 27736 23133 43182 14039 34559 38314 45824
19902 27412 15697 29765 36217 41459 50285 26855
23218 51354 21987 44080 39477 50017 38260 12139
14718 29738 35798 39315 50818 53383 27304 15533
25849 21484 43535 14182 51524 42318 38667 15265
20255 25525 43401 38600 45634 20188 23705 27222
30739 51259 22354 42641 45444 27088 8149 13279 35703
50723 53302 15900 26440 36532 29005 39153 41662
49637 11759 8122 22190 43320 52230 57388 38505 15075
20093 23848 25335 43211 29090 50058 38287 42784
45349 19931 26993 40012 45254 27794 23191 14013
21974 44053 39744 50004 53521 12126 15643 29711
36275 41881 50343 27277 15576 26060 22409 43130
29443 49963 38206 15252 23658 29376 35772 49896
38125 42594 45159 27699 23334 51470 21879 42404
37857 19445 10239 40450 45608 50710 53331 27196
15481 25965 36561 22328 39364 41691 50576 27034 8095
15157 22219 29281 43293 57417 38492 15062 23821
26498 35582 29063 39099 49583 42757 45392 30788
51308 42214 38563 20151 23010 14280 36704 39269
41834 50481 26939 22138 40070 45228 50386 26872 7933
14967 21948 26403 43103 28982 39690 49950 38235
12212 14833 23631 26336 28901 35801 49869 53400
42567 46098 27910 23363 43664 14185 42433 37844
24192 29322 51746 39975 45581 50291 27225 15692
36324 22301 41454 37803 19391 21758 29268 39528
49788 53305 12022 15539 26023 36507 21490 39310
43569 49626 42352 37749 27748 24097 29227 52233
57475 38550 15036 20418 22983 25576 13805 36677
40208 41807 45338 54276 30734 51366 22111 42636

45257 26845 23432 16130 21977 26390 36650 29011
39215 49531 12241 26309 29840 39148 50360 57394
38455 20323 22902 43189 14172 34804 38321 11262
14779 23717 26282 28847 51719 40018 42541 45176
50502 26988 23337 14243 51585 42379 37790 23242
15968 26228 44104 29745 39501 50713 53516 27283
15750 26066 36270 21463 43780 42325 24084 29214
39586 49846 38131 15065 19943 25549 29080 51504
42298 37695 27694 23147 51395 42217 37628 20392
22957 27426 15655 25971 36623 39258 41893 53326
15588 36556 22197 40073 43590 47107 50333 57367
38722 15208 20310 23827 25468 43456 28985 50065
12187 23760 26255 28890 51314 42584 45149 27913
23324 14230 34750 37371 20202 22767 15941 36461
29956 39992 41703 45234 50476 27046 8163 18423 36299
43361 53792 15914 23665 26174 44162 28795 39559
49875 38342 12025 14828 26040 21437 14135 51477
42271 27723 23134 14068 42204 38553 45587 20365
23000 27399 15698 29766 36218 41936 50286 27332
30849 51369 22464 44067 39478 50018 38247 15181
26393 35813 39344 53412 15534 25850 21247 43564
51287 42109 38696 15266 20284 22905 25526 43402
13811 34779 41841 20175 23706 27237 30768 51736
22369 39965 42642 45207 50505 27075 8150 13308 43348
39697 58368 53765 15887 23876 26203 36519 29006
39154 49638 12236 15753 26013 43307 38506 20094
23611 43240 29329 49849 38316 42547 45350 19960
26994 8055 36191 41461 27809 23220 14014 51356 21989
44054 39507 49991 53522 12141 15672 29740 36752
39317 41882 50820 53441 27278 15563 25823 22410
43593 29472 57608 38669 15239 20313 25555 35759
38126 45636 28176 30741 51261 22356 42167 37858
19446 22963 14233 36657 41787 50725 53360 27183
15482 25966 36562 22315 39127 41720 50563 27049 8124
15158 22248 29282 43294 52288 57418 38479 15077
23822 26289 43213 29092 39576 50060 38345 42758
45379 19933 26967 46208 27796 23249 14043 36467
39270 50482 27416 15645 29769 36277 41407 50401
26859 7934 21935 43132 29445 39481 49965 38264 12199
14834 23660 28902 35802 49870 53387 42596 46113
27701 23392 43651 14186 51528 42434 37831 20371
25529 40452 45582 50768 53333 27226 15455 36087
22302 41693 45448 27036 8153 15187 22221 29255 35707
49775 53306 16016 26500 36536 29121 39101 43570
49641 42339 37750 24098 52234 57504 38565 15023
20209 23012 25339 13806 36678 40195 41836 45353
50455 26941 22140 40128 45258 50388 26846 23195
15921 21978 26405 44057 29040 39692 50008 38237
12242 14807 26310 29827 35327 50347 57857 46100
27968 23365 43190 14159 34791 38322 15256 23718
29324 51748 40033 42542 45163 50293 26751 23338
51586 21883 42408 37805 19449 12147 26215 29746
39502 50714 53279 27312 15541 26081 36509 21492
39368 43543 49628 42326 38675 15161 24071 29229
43409 57477 38608 15066 20420 23937 25550 29067
51491 42761 45340 30792 51424 42218 37615 20155
22958 16132 26448 36652 29013 39273 41894 49533
11767 22198 40074 47136 50334 57396 38513 14971
20325 23856 25455 43219 28986 50066 38295 12216
14781 23747 26284 28905 51777 40020 42571 45150
27914 23311 14245 42381 37848 23244 15942 36462
29719 39979 45697 50239 27285 15808 26068 36328
22417 43362 49971 23666 29272 39588 49904 38133
12026 14591 26027 21438 51478 42300 37753 27752
23149 14055 51397 42191 38554 45616 20366 22987
27428 15713 25973 36681 39260 41923 54280 30850
51370 22227 44544 47109 57425 38724 15182 23829

26394 35814 28959 39331 49591 12189 26313 28892
51316 42110 38459 20271 22906 43193 14288 34808
37373 41842 20204 23721 27238 30755 51723 22370
39966 42657 45236 50506 27104 8165 13295 36301 43335
39698 53766 15916 23639 26232 44164 28797 39617
49877 53632 11999 15754 26014 21467 43784 14193
42329 27725 24088 29330 49850 38079 45589 19947
27457 15700 36220 41462 37811 27810 23207 51343
21990 44069 39536 50020 53537 12142 15659 25919
36739 39318 41897 53442 15592 25852 22201 43594
29235 52241 57371 38670 15268 20314 22879 25584
43404 13813 34781 41815 23708 28163 30742 51262
22343 42644 45265 27077 23440 14234 36658 39223
50726 53347 15945 26205 36577 29960 39156 41707
50592 27050 8111 18427 43309 38508 15078 23613 26290
43214 28855 39563 49823 38346 42549 45408 19934
26996 23345 14139 51481 42387 27783 23250 14072
44112 39509 50945 53524 27403 15646 29770 36278
41884 50402 27336 15565 22412 43119 29446 39482
49966 38251 15297 19839 25557 35817 53416 46114
27702 23155 43680 51291 42225 37860 20400 22965
25530 13759 36631 41789 50755 53334 27241 15484
36564 22317 40081 41694 45211 50565 27023 8154 15216
22222 29284 43352 57420 53769 16003 23880 26263
36523 29122 39102 49642 42816 45381 27921 38566
20210 22775 14045 36469 40224 41599 45354 50484
26942 8059 22127 36307 41465 50375 26861 23224 15922
21993 26406 44058 29027 39455 49995 38238 12257
14836 29856 35804 39321 50824 53389 57858 46087
27731 23366 43653 14188 42436 38785 15243 20373
25503 40034 45640 50294 27228 30745 51377 22360
42171 37806 19450 7679 15189 30209 35709 50729 53308
27299 15542 26082 36510 21479 39131 43572 49615
42341 38704 15162 24100 29230 43410 52236 57478
38595 15081 20183 23938 25341 29096 51968 40197
42762 45327 50513 26971 45260 27800 23197 15895
21980 26435 36415 29014 39274 49534 12244 15761
29829 36281 43315 50349 57383 38514 20326 23843
43248 29449 50081 38324 12203 14782 23776 28906
51778 40007 42600 45165 27705 23340 14246 51588
21885 42382 37835 19423 12149 29748 40456 45698
50716 53337 27286 15571 26055 36091 22418 43601
57616 38677 15135 24129 29259 35767 49891 38134
15068 26504 29069 51493 42687 37754 23150 51398
42220 38569 45603 20157 23016 27191 15714 25974
36682 22323 39247 41952 50459 27057 22256 40076
47110 50392 57426 38487 14973 23830 26409 43221
28988 39808 50068 38353 12190 14811 23749 26314
28879 51303 42573 46104 27916 23369 43194 14275
34795 37374 23722 31232 51752 29777 39981 42658
45223 50297 26867 8166 36302 21943 43364 39713 49973
12095 23668 26219 28798 39618 49878 53395 12028
15545 26029 21496 43547 14194 51536 42330 37727
27726 24075 29345 57481 38556 45590 20424 22989
27458 15687 36207 41925 45456 30852 51372 22229
44070 39523 49783 53538 16136 26396 36768 29017
39333 41898 49649 11771 25839 22202 52242 57400
38461 15031 20329 22908 25571 43167 13814 34782
38299 41844 45361 23695 28192 30757 51725 22372
40024 42631 45266 50508 27078 23427 14249 44289
39700 53824 15946 26206 36578 29723 39143 50355
27289 15756 26072 21469 43310 14167 34687 23614
29332 39592 49852 38137 42550 45171 19949 26983
23346 51482 42416 37813 27812 23265 14059 51401
44099 39510 50946 53511 27432 15661 25977 36741
39376 41871 53444 15566 22175 43596 29237 47113
57373 38728 15298 20316 23833 25558 35818 29075

49595 42769 28165 30800 51320 42226 37623 20387
22966 14236 36660 39281 41790 50784 53349 27242
15471 36551 22318 40082 41709 45240 50566 27052 8169
15203 18429 25463 43339 53770 16032 23643 26292
44168 28913 39565 49881 38348 42579 45382 27922
23319 14141 42389 27841 23252 14046 36470 39987
45593 50471 27405 15704 29772 36336 41466 50404
26862 23211 21994 44073 29504 39484 50024 38253
12258 14823 26035 35791 39322 53390 46116 27760
23157 43654 13951 51293 42199 38786 15272 20374
22995 25532 13817 36689 41819 50757 54288 27215
30746 51378 22347 42648 45213 27081 8156 15190 30210
35710 39227 50730 53295 16005 26321 36525 29124
39160 43559 49644 42342 38691 20279 43425 38624
15082 20212 23729 25342 28859 51731 40198 42553
45356 50514 27000 8061 13303 36309 41439 27787 23198
15924 21967 26464 44060 29029 39513 49997 53528
12231 15762 29830 36282 43792 50350 57860 46145
27733 24320 43235 29450 50082 38311 15245 19955
25561 40036 45166 27706 23103 51351 21886 42173
37864 19452 22969 12150 15667 29735 36635 41905
50703 53338 27301 15600 26084 36568 22433 39133
43602 50569 57603 38678 15164 24130 29288 43412
57536 38597 15055 23940 26267 29070 51494 42764
45385 26973 38570 20158 22779 15953 26437 36473
29968 39276 41715 50488 27058 8119 22243 36255 43317
50379 57441 38516 14974 23845 26410 43222 28975
39571 50055 38354 12205 14840 23750 28908 51780
55297 42574 46091 27679 23370 43657 14304 42440
37837 20377 27411 29778 39982 45700 50298 27344
15573 36093 22420 43127 39714 49974 38259 15193
23655 29261 35825 49893 53424 12015 15546 26030
21483 43576 51523 42345 37756 24104 29346 52352
57482 38543 45605 20187 22990 27249 15716 36684
22325 40201 41926 45443 50461 27031 22230 47168
57428 53777 15899 23888 26383 36531 29018 39334
49650 12248 14813 26316 29833 52257 57387 38462
20330 22895 43196 14277 34797 38328 41831 45362
23724 30758 51726 22135 40011 42660 45281 50271
26869 23456 14250 51592 22001 44290 39687 50003
12153 26221 29752 39620 50832 53397 27290 15519
26059 21470 43549 14196 42332 38681 15251 24077
29319 35771 49839 38138 45648 19950 27460 30977
51497 42403 37814 23266 51402 44128 39525 50737
53540 27195 15662 25978 36742 21375 39363 41900
49623 11773 22204 29238 47114 52244 57374 38491
15089 20303 23834 25573 43225 29104 50072 38301
42770 45335 23753 28166 30787 51307 42689 45268
28032 23429 14223 36647 39282 53350 15948 36580
29725 40097 41710 45227 50357 26815 8170 18430 21947
43368 29457 49977 12211 23672 26279 28914 39566
49882 38111 42608 45173 27937 23348 14142 51484
42390 37843 27842 23239 14061 44101 40464 45594
50948 53569 27406 15691 25951 36323 41929 30856
22233 44074 29267 39471 49787 38254 15300 26512
35820 29077 49337 49597 42295 27747 23158 51294
42228 38577 15035 20389 23024 25519 13818 36690
39255 41848 50758 54275 27244 30761 51841 22376
40084 42635 45214 50624 27082 8143 15205 26417 43341
39704 53772 16006 23645 26322 36526 28887 39147
49407 42581 46336 27924 23377 43426 14171 34803
20199 23730 29336 51760 39989 42554 45119 50529
26987 8062 36310 41468 37817 27816 23213 15911 21996
26227 44047 29030 39514 49998 53515 12260 15777
26037 36745 39324 43779 53448 46146 27734 24083
43712 29241 57489 38788 15246 20432 22997 25562
13791 36215 41821 28169 30748 51380 22349 42174

37627 19439 22970 16144 30212 36664 39229 41906
50732 53353 27302 15587 25847 36555 22434 39134
43617 50570 57632 38693 15151 20337 25467 43399
38598 15084 23703 26296 28861 51733 40256 42527
45386 50516 26974 23323 14257 42393 27789 23256
15954 26438 36474 29955 39039 50475 27521 15764
29888 36284 43318 50408 57442 38503 23846 43237
29452 39600 50084 38369 12206 14827 19957 25087
55298 46120 27708 23161 43658 14067 51409 42203
37838 20378 22943 27440 15669 29793 36637 41879
50761 53340 27331 15574 36094 22407 43604 47121
57605 38736 15194 24132 29262 35826 49894 53411
16009 26269 29128 43563 51552 42346 37743 20283
38572 45606 20216 22781 27250 15479 36447 22326
40202 41717 45472 50462 27060 8177 13307 22245 36313
43347 50381 57415 53778 15928 23875 26412 44176
29033 39573 50113 38356 12235 14814 29834 52258
57864 46093 27737 23372 43183 14278 34798 38315
45825 19903 27413 29780 40040 45282 50300 26870
23219 51355 22002 44081 39716 50032 38261 12154
14719 26222 29739 35799 50819 53398 27305 15548
26088 21485 43550 14183 51525 42319 38682 15280
24078 29348 43416 57484 38601 45635 20189 23944
27223 30978 51498 22355 42880 45445 27089 39529
50738 53303 15901 26441 36533 29020 39392 41663
49652 11774 8123 22191 43321 52231 57389 38520 15090
20332 23849 25574 43226 29091 50059 38302 42785
45364 23754 30816 51784 40013 42690 45255 27795
23430 14252 21975 44292 39745 50005 12127 29726
40098 45704 50358 27292 15577 26061 22424 43131
29458 49978 38207 15253 23659 29377 35773 49897
38140 42595 45174 27938 23335 51471 42405 37872
23268 14062 51404 44102 40451 45609 50711 53570
27197 15720 25980 36800 22329 39365 41930 50577
27035 22234 29296 47116 57432 38493 15063 23836
26499 35583 29078 39338 49598 42772 45393 28224
30789 51309 42215 38578 20390 23011 14281 36705
39284 41835 54304 30762 51842 22139 40071 42664
45229 50387 26873 8172 15206 21949 26418 43342 28983
39691 49951 12213 23646 26337 28916 39624 49884
53401 42582 46099 27911 23378 43665 14200 42448
37845 27844 24193 29323 51747 39990 45596 50530
27464 15693 36325 41455 37818 23214 21759 44076
29269 39529 49789 53544 12023 15778 26038 36746
21491 39311 43808 49627 42353 27749 24112 29242
52248 57490 38551 15037 20419 22998 25577 13820
36692 40209 41822 45339 54277 28170 30735 51367
22350 42637 45272 27084 23433 16131 26391 36651
39230 53354 16064 26324 36584 29841 39149 43618
50361 57395 38694 20338 22903 43428 14173 34805
11263 23732 26283 28862 51734 40019 42556 45177
50503 26989 23352 14258 51600 42394 37791 27790
23243 15969 26229 44105 29984 39516 50952 53517
27522 15751 26067 36271 43781 46148 24085 43238
29215 39587 49847 38370 15304 19958 25564 29081
51505 42299 27695 23162 51410 42232 37629 20393
22972 27427 15670 29794 36638 39259 41908 50762
53327 27360 15589 36557 22436 40088 43591 47122
50572 57606 38723 15209 20311 25469 43457 53888
16010 23761 26270 28891 51315 42585 45388 27928
23325 14231 34751 20203 22782 15956 36476 29957
39993 41718 45235 50477 27047 8178 22246 36314 43376
50382 57444 53793 15915 23904 26175 44163 29034
39574 50114 38343 12264 14829 26041 55300 46094
27738 23135 43660 14069 44205 38792 45826 20380
23001 27414 15699 29767 36219 41937 50287 27333
30864 51384 22465 44082 39479 50019 38262 15196

30216 35828 39345 50848 53413 27306 15535 25851
21486 43565 51526 42348 38697 15267 20285 25527
43403 38602 45664 20190 23707 27252 30769 51737
22384 40204 42643 45446 50520 27090 8151 13309 43349
58369 53780 15902 23877 26442 36534 29007 39155
49639 12237 15768 29836 43322 52260 57390 38507
20095 23850 43241 29568 50088 38317 42786 45351
19961 26995 40014 45284 27824 23221 14015 51357
22004 44055 39746 50006 53523 12156 15673 29741
36753 41883 50821 53456 27279 15578 26062 22411
43608 29473 57609 38684 15254 24136 29378 35774
49898 38127 45637 28177 30980 51500 22357 42406
37859 19447 40480 45610 50740 53361 27198 15483
25967 36563 22330 39366 41721 50578 27064 8125 15159
22249 29283 43295 52289 57419 38494 15092 23823
26528 43228 29093 39577 50061 38360 42759 45394
23756 30790 51310 42692 46209 27797 23488 14282
36706 39271 50483 27417 29784 40100 45230 50416
26874 7935 21950 43133 29460 39720 49980 38265 12214
14835 23661 26338 28903 35803 49871 53402 42597
46128 27940 23393 43666 14187 51529 42435 37846
24194 29352 59392 40453 45583 50769 53572 27227
15694 36326 22303 41932 45449 27037 22236 29270
39530 49790 53307 16017 26501 36537 29136 39340
43571 49656 42354 37751 27750 24099 52235 57505
38580 15038 20448 23013 25578 13807 36679 40210
41837 45368 54278 30764 51844 22141 40129 42638
45259 50389 26847 23434 16160 21979 26420 44296
29041 39693 50009 12243 26311 29842 39150 50362
57872 46101 27969 23380 43191 14174 34806 38323
15257 23719 29325 51749 40048 42543 45178 50532
26990 23339 51587 42409 37820 23272 15970 26230
44106 29747 39503 50715 53518 27313 15780 26096
36748 21493 39369 43782 49629 42327 24086 29244
47232 57492 38609 15067 20421 23952 25551 29082
51506 42776 45341 28172 30793 51425 42219 37630
20394 22959 16133 26449 36653 39288 41895 53356
15590 36558 22199 40075 43620 47137 50335 57397
38752 15210 20340 23857 25470 43458 28987 50067
12217 23762 26285 28920 51792 40021 42586 45151
27915 23326 14260 42396 37849 27848 23245 15943
36463 29958 39994 45712 50478 27524 15809 26069
36329 43363 53794 23667 44192 29273 39589 49905
38372 12027 14830 26042 21439 51479 42301 27753
23164 14070 51412 42206 38555 45617 20367 23002
27429 15728 29796 36696 39261 41938 50764 54281
27334 30851 51371 22466 44545 47124 57664 38725
15183 26395 35815 39346 53414 16012 26328 28893
43566 51317 42111 38698 20286 22907 43432 14289
34809 41843 20205 23736 27239 30770 51738 22371
39967 42672 45237 50507 27105 8180 13310 36316 43350
39699 58370 53767 15917 23878 26233 44165 29036
39632 50116 53633 12238 15755 26015 43785 46152
27740 24089 43242 29331 49851 38318 45828 19962
27472 15701 36221 41463 27811 23222 51358 21991
44084 39537 50021 53552 12143 15674 29742 36754
39319 41912 50822 53443 27308 15593 25853 22440
43595 29474 52480 57610 38671 15269 20315 25585
43405 38604 45638 23709 28178 30743 51263 22358
42645 45504 27092 23441 14235 36659 50727 53362
15960 26444 36592 29961 39157 41722 50593 27051 8126
22250 43324 52290 57448 38509 15079 23852 26291
43215 29094 39578 50062 38347 42788 45409 19935
26997 55304 46210 27798 23251 14073 44113 39748
50960 53525 27418 15647 29771 36279 41885 50403
27337 15580 22413 43134 29447 39483 49967 38266
15312 23662 29380 35832 49900 53417 42598 46115

27703 23394 43681 51530 42464 37861 20401 25531
40454 45612 50770 53335 27256 15485 36565 22332
40320 41695 45450 50580 27038 8155 15217 22223 29285
43353 57421 53784 16018 23881 26502 36538 29123
39103 49643 42817 45396 31744 52264 57506 38567
20211 23014 14284 36708 40225 41838 45355 50485
26943 22142 40130 45288 50390 26876 23225 15923
22008 26407 44059 29042 39694 50010 38239 12272
14837 26340 29857 35805 50825 53404 57859 46102
27970 23367 43668 14189 42437 38800 15258 24196
29326 51750 40035 45641 50295 27229 30984 51616
22361 42410 37807 19451 30224 39532 50744 53309
27314 15543 26083 36511 21494 39370 43573 49630
42356 38705 15163 24101 29231 43411 52237 57479
38610 15096 20422 23939 25580 29097 51969 40212
42763 45342 54336 30794 51426 42696 45261 27801
23436 16134 21981 26450 36654 29015 39275 49535
12245 29844 40104 47138 50364 57398 38515 20327
23858 43249 29464 50096 38325 12218 14783 23777
26286 28907 51779 40022 42601 45180 27944 23341
14247 51589 42383 37850 23246 15972 44108 29749
40457 45699 50717 53576 27287 15810 26070 36330
22419 43840 57617 24144 29274 39590 49906 38135
15069 26505 40284 51508 42302 37755 27754 23151
51399 42221 38584 45618 20396 23017 27430 15715
25975 36683 39262 41953 54282 30880 51848 22257
40077 44546 47111 50393 57427 38726 15212 23831
26424 43460 28989 39809 50069 12191 23764 26315
28894 51318 42588 46105 27917 23384 43195 14290
34810 37375 20206 23723 31233 51753 30016 39996
42659 45238 50536 27106 8167 36303 43365 39728 53796
15918 23669 26234 44166 28799 39619 49879 53634
12029 15784 26044 21497 43786 14195 51537 42331
27727 24090 29360 57496 38557 45591 20425 23004
27459 15702 36222 41940 45457 28288 30853 51373
22468 44071 39538 50022 53539 16137 26397 36769
39348 41899 53472 15594 25854 22203 43624 52243
57401 38700 15270 20344 22909 25586 43406 13815
34783 41845 23710 28193 30772 51740 22373 40025
42646 45267 50509 27079 23442 14264 44304 39701
58372 53825 15947 26207 36579 29962 39158 50594
27528 15757 26073 43311 38510 23615 43244 29333
39593 49853 38376 42551 45410 19964 26998 23347
51483 42417 27813 23280 14074 51416 44114 39511
50947 53526 27433 15676 29800 36756 39377 41886
50880 53445 27338 15567 22414 43597 29476 47128
57612 38729 15299 20317 25559 35819 53418 46592
28180 30801 43682 51321 42227 37862 20402 22967
14237 36661 41791 50785 53364 27243 15486 36566
22319 40083 41724 45241 50567 27053 8184 15218 22252
29286 43354 52292 57422 53771 16033 23882 26293
44169 29152 39580 50120 38349 42818 45383 27923
46212 27856 23253 14047 36471 40226 45832 50486
27420 15705 29773 36337 41467 50405 26863 23226
21995 44088 29505 39485 50025 38268 12259 14838
29858 35806 39323 50826 53391 57888 46117 27761
23396 43655 14190 51532 42438 38787 15273 20375
25533 40512 45642 50772 54289 27230 30747 51379
22362 42649 45452 27096 8157 15191 30211 35711 50731
53310 16020 26560 36540 29125 39161 43574 49645
42343 38706 24102 43440 52238 57508 38625 15083
20213 23968 25343 29008 51970 40199 42792 45357
50515 27001 40132 45262 27802 23199 15925 21982
26465 44061 29044 39752 50012 53529 12246 15763
29831 36283 43793 50351 57861 46160 27972 24321
43250 29451 50083 38326 15260 23778 29384 51808
40037 42602 45167 27707 23342 51590 21887 42412

| | |
|---|---|
| 37865 19453 12151 29750 40458 45728 50718 53339 | 29754 39622 50834 53399 27320 15549 26089 21500 |
| 27316 15601 26085 36569 22448 39372 43603 50584 | 43551 14198 51540 42334 38683 15281 24079 29349 |
| 57618 38679 15165 24131 29289 43413 57537 38612 | 43417 57485 38616 45650 20428 23945 27462 30979 |
| 15070 23941 26506 29071 51495 42765 45400 30796 | 51499 42881 45460 30912 51432 44130 39527 50739 |
| 51428 42222 38571 20159 23018 16192 26452 36712 | 53542 16140 26456 36772 29021 39393 41902 49653 |
| 29969 39277 41954 50489 27059 22258 40078 47140 | 11775 22206 47144 52246 57404 38521 15091 20333 |
| 50394 57456 38517 14975 23860 26411 43223 28990 | 23864 25575 43227 29106 50074 38303 42800 45365 |
| 39810 50070 38355 12220 14841 23751 26344 28909 | 23755 28196 30817 51785 40028 42691 45270 28034 |
| 51781 55312 42575 46106 27918 23371 43672 14305 | 23431 14253 44293 39760 53828 15950 36582 29727 |
| 42441 37852 24200 31234 51754 29779 39983 45701 | 40099 45705 50359 27293 15816 26076 22425 43370 |
| 50299 27345 15812 36332 22421 43366 39715 49975 | 29459 49979 23674 29392 39596 49912 38141 42610 |
| 23670 29276 39648 49908 53425 12030 15547 26031 | 45175 27939 23350 51486 42420 37873 27872 23269 |
| 21498 43577 51538 42360 37757 27756 24105 29347 | 14063 51405 44103 40466 45624 50950 53571 27436 |
| 52353 57483 38558 45620 20426 22991 27488 15717 | 15721 25981 36801 39380 41931 54400 30858 22235 |
| 36685 40216 41927 45458 54284 30854 51374 22231 | 44552 29297 47117 57433 38732 15302 23837 26514 |
| 44548 47169 57429 54016 16138 23889 26398 36770 | 35822 29079 39339 49599 42773 28225 30804 51324 |
| 29019 39335 49651 12249 26317 29848 52272 57402 | 42230 38579 20391 23026 14296 36720 39285 41850 |
| 38463 20331 22910 43197 14292 34812 38329 41846 | 50788 54305 27246 30763 51843 22378 40086 42665 |
| 45363 23725 28194 30759 51727 22374 40026 42661 | 45244 50626 27112 8173 15207 26419 43343 39706 53774 |
| 45296 50510 27108 23457 14251 51593 44291 39702 | 16036 23647 26352 44172 28917 39625 49885 53640 |
| 53826 15976 26236 44224 29753 39621 50833 53636 | 42583 46338 27926 23379 43904 14201 42449 27845 |
| 27291 15758 26074 21471 43788 14197 42333 24092 | 24208 29338 51762 39991 45597 50531 27465 15708 |
| 29334 39594 49854 38139 45649 19951 27461 30992 | 36340 41470 37819 27818 23215 21998 44077 29508 |
| 51512 42418 37815 27814 23267 51403 44129 39540 | 39544 50028 53545 12262 15779 26039 36747 39326 |
| 50976 53541 27434 15663 25979 36743 39378 41901 | 43809 53450 46176 27764 24113 43714 29243 52249 |
| 53446 15596 22205 43598 29239 47115 52245 57375 | 57491 38790 15276 20434 22999 25592 13821 36693 |
| 38730 15328 20318 23835 25588 43464 29105 50073 | 41823 54292 28171 30750 51382 22351 42652 45273 |
| 42771 23768 28167 30802 51322 42704 45269 28033 | 27085 23448 16146 30214 36666 39231 50734 53355 |
| 23444 14238 36662 39283 50786 53351 15949 36581 | 16065 26325 36585 30080 39164 43619 50600 57634 |
| 29964 40112 41711 45242 50596 27054 8171 18431 43369 | 38695 20339 43429 38628 15086 23733 26298 28863 |
| 53800 16034 23673 26294 44170 28915 39567 49883 | 51735 40258 42557 45416 50518 27004 23353 14259 |
| 38350 42609 45412 27952 23349 14143 51485 42391 | 51601 42395 27791 23258 15984 26468 44120 29985 |
| 27843 23254 14076 44116 40465 45595 50949 53584 | 39517 50953 53532 27523 15766 29890 36286 43796 |
| 27407 15706 29774 36338 41944 50406 27340 30857 | 50410 57920 46149 24324 43239 29454 39602 50086 |
| 22472 44075 29506 39486 50026 38255 15301 26513 | 38371 15305 19959 25565 55328 46122 27710 23163 |
| 35821 39352 53420 46118 27762 23159 43684 51295 | 43688 51411 42233 37868 20408 22973 27442 15671 |
| 42229 38816 15274 20404 23025 25534 13819 36691 | 29795 36639 41909 50763 53342 27361 15604 36572 |
| 41849 50759 54290 27245 30776 51856 22377 40085 | 22437 40089 43606 47123 50573 57607 38738 15224 |
| 42650 45215 50625 27083 8158 15220 30240 43356 39705 | 24134 29292 43472 57540 53889 16011 24000 26271 |
| 58376 53773 16007 23884 26323 36527 29126 39162 | 29130 51554 42824 45389 27929 38574 20218 22783 |
| 49646 42820 46337 27925 43427 38626 20214 23731 | 15957 36477 29972 40232 41719 45474 50492 27062 8179 |
| 29337 51761 40228 42555 45358 50544 27002 8063 36311 | 22247 36315 43377 50383 57445 53808 15930 23905 |
| 41469 27817 23228 15926 21997 26466 44062 29301 | 26414 44178 29035 39575 50115 38358 12265 14844 |
| 39515 49999 53530 12261 15792 29860 36760 39325 | 29864 52736 55301 57866 46095 27739 23374 43661 |
| 43794 50828 53449 57862 46147 27735 24322 43713 | 14308 42444 38793 45827 20381 27415 29782 40042 |
| 29480 57728 38789 15247 20433 25563 40038 45644 | 45760 50302 27348 30865 51385 22480 44083 39718 |
| 28184 30749 51381 22364 42175 37866 19454 22971 | 50034 38263 15197 30217 35829 50849 53428 27307 |
| 16145 30213 36665 41907 50733 53368 27303 15602 | 15550 26090 21487 43580 51527 42349 38712 15282 |
| 26086 36570 22435 39135 43632 50571 57633 38708 | 24108 29350 43418 52356 57486 38603 45665 20191 |
| 15166 24160 29290 43414 52296 57538 38599 15085 | 23946 27253 31008 51976 22385 40205 42882 45447 |
| 23942 26297 29100 51972 40257 42766 45387 50517 | 50521 27091 47172 58384 53781 15903 23892 26443 |
| 26975 46216 27804 23257 15955 26439 36475 29970 | 36535 29022 39394 49654 12252 15769 29837 43323 |
| 39278 50490 27536 15765 29889 36285 43319 50409 | 52261 57391 38522 20334 23851 43256 29569 50089 |
| 57443 38518 23847 43252 29453 39601 50085 38384 | 38332 42787 45366 23784 30818 51786 40015 42720 |
| 12207 14842 23780 28910 51782 55299 42604 46121 | 45285 27825 23460 14254 51596 22005 44294 39747 |
| 27709 23400 43659 14306 51648 42442 37839 20379 | 50007 12157 29756 40576 45706 50836 53457 27294 |
| 27441 29808 40460 45702 50776 53341 27346 15575 | 15579 26063 22426 43609 29488 57624 38685 15255 |
| 36095 22422 43605 47360 57620 38737 15195 24133 | 24137 29379 35775 49899 38142 45652 28416 30981 |
| 29263 35827 49895 53426 16024 26508 29129 43578 | 51501 42407 37874 23270 51406 44132 40481 45611 |
| 51553 42347 37758 24106 52354 57512 38573 45607 | 50741 53600 27199 15722 25982 36802 22331 39367 |
| 20217 23020 27251 15718 36686 22327 40203 41956 | 41960 50579 27065 22264 29298 47118 52304 57434 |
| 45473 50463 27061 22260 40136 47170 50396 57430 | 38495 15093 23838 26529 43229 29108 39816 50076 |
| 53779 15929 23890 26413 44177 29048 39812 50120 | 38361 42774 45395 23757 28226 30791 51311 42693 |
| 38357 12250 14815 26318 29835 52259 57865 46108 | 46224 28036 23489 14283 36707 39286 54306 31240 |
| 27976 23373 43198 14279 34799 38330 45840 23726 | 51872 29785 40101 42666 45231 50417 26875 8174 21951 |
| 31236 51756 29781 40041 42662 45283 50301 26871 | 43372 29461 39721 49981 12215 23676 26339 28918 |
| 23458 51594 22003 44320 39717 50033 12155 26223 | 39626 49886 53403 42612 46129 27941 23408 43667 |

| | | | | | | | | | | | | | | |
|---|---|---|---|---|---|---|---|---|---|---|---|---|---|---|
|14202|51544|42450|37847|27846|24195|29353|59393|45714|50956|53577|27526|15811|26071|36331|43841|
|40468|45598|51008|53573|27466|15695|36327|41933|61440|24145|44194|29275|39591|49907|38374|15308|
|45464|30860|22237|44078|29271|39531|49791|53546|26520|29085|51509|42303|27755|23166|51414|42236|
|16256|26516|36776|29137|39341|43810|49657|42355|38585|45619|20397|23032|27431|15730|29798|36698|
|27751|24114|52250|57520|38581|15039|20449|23028|39263|41968|50766|54283|27364|30881|51849|22496|
|25579|13822|36694|40211|41852|45369|54279|28200|40092|44547|47126|50632|57666|38727|15213|26425|
|30765|51845|22380|40144|42639|45274|50628|27086|43461|39824|53892|16014|23765|26330|28895|51319|
|23435|16161|26421|44297|39708|53832|16066|26326|42589|46344|27932|23385|43434|14291|34811|20207|
|36586|29843|39151|50363|57873|46340|27984|23381|23738|31248|51768|30017|39997|42674|45239|50537|
|43430|14175|34807|23734|29340|51764|40049|42558|27107|8182|36318|43380|39729|58400|53797|15919|23908|
|45179|50533|26991|23354|51602|42424|37821|27820|26235|44167|29038|39634|50118|53635|12268|15785|
|23273|15971|26231|44107|29986|39518|50954|53519|26045|43787|55360|46154|27742|24091|43720|29361|
|27552|15781|26097|36749|39384|43783|53452|46150|57497|38796|45830|20440|23005|27474|15703|36223|
|24087|43716|29245|47233|57493|38848|15306|20436|41941|28289|30868|51388|22469|44086|39539|50023|
|23953|25566|29083|51507|42777|28173|30808|51440|53554|16152|30220|36784|39349|41914|50852|53473|
|42234|37631|20395|22974|16148|30272|36668|39289|27310|15595|25855|22442|43625|52482|57640|38701|
|41910|50792|53357|27362|15591|36559|22438|40090|15271|20345|25587|43407|38606|45668|23711|28208|
|43621|47152|50574|57636|38753|15211|20341|25471|30773|51741|22388|40264|42647|45506|50524|27094|
|43459|53890|16040|23763|26300|28921|51793|40260|23443|14265|44305|58373|53840|15962|26446|36594|
|42587|45390|27930|23327|14261|42397|27849|23260|29963|39159|50595|27529|15772|29896|43326|52320|
|15958|36478|29959|39995|45713|50479|27525|15824|57450|38511|23854|43245|29572|39608|50092|38377|
|29892|36344|43378|50412|57446|53795|23906|44193|42790|45411|19965|26999|55306|46240|27828|23281|
|29512|39604|50144|38373|12266|14831|26043|55302|14075|51417|44115|39750|50962|53527|27448|15677|
|46124|27768|23165|43662|14071|51413|42207|38794|29801|36757|41887|50881|53460|27339|15582|22415|
|45856|20382|23003|27444|15729|29797|36697|41939|43612|29477|47129|57613|38744|15314|24140|29382|
|50765|54296|27335|30866|51386|22467|44560|47125|35834|49902|53419|46593|28181|31040|43683|51560|
|57665|38740|15198|30218|35830|39347|50850|53415|42466|37863|20403|40484|45614|50800|53365|27258|
|16013|26329|29132|43567|51556|42350|38699|20287|15487|36567|22334|40322|41725|45480|50582|27068|8185|
|43433|38632|45666|20220|23737|27254|30771|51739|15219|22253|29287|43355|52293|57423|53786|16048|
|22386|40206|42673|45476|50522|27120|8181|13311|36317|23883|26532|44184|29153|39581|50121|38364|42819|
|43351|58371|53782|15932|23879|26472|44180|29037|45398|31746|52266|57984|46213|27857|23492|14286|
|39633|50117|53648|12239|15770|29838|43800|52262|36710|40227|45833|50487|27421|29788|40160|45290|
|57868|46153|27741|24328|43243|29570|50090|38319|50420|26878|23227|22010|44089|29520|39724|50040|
|45829|19963|27473|40044|45286|27826|23223|51359|38269|12274|14839|26342|29859|35807|50827|53406|
|22006|44085|39776|50036|53553|12158|15675|29743|57889|46132|28000|23397|43670|14191|51533|42439|
|36755|41913|50823|53458|27309|15608|26092|22441|38802|15288|24198|29356|59396|40513|45643|50773|
|43610|29475|52481|57611|38686|15284|24138|29408|54528|27231|30986|51618|22363|42888|45453|27097|
|43420|57544|38605|45639|23948|28179|30982|51502|30226|39534|50746|53311|16021|26561|36541|29140|
|22359|42884|45505|27093|40482|50742|53363|15961|39400|43575|49660|42358|38707|24103|43441|52239|
|26445|36593|29976|39396|41723|50608|27066|8127|22251|57509|38640|15098|20452|23969|25582|29099|51971|
|43325|52291|57449|38524|15094|23853|26530|43230|40214|42793|45372|54338|30824|51904|40133|42698|
|29095|39579|50063|38362|42789|45424|23758|30820|45263|27803|23438|16164|21983|26480|44300|29045|
|51788|55305|42694|46211|27799|23490|14312|44352|39753|50013|12247|29846|40106|47616|50366|57876|
|39749|50961|27419|29786|40102|45708|50418|27352|46161|27973|24336|43251|29466|50098|38327|15261|
|15581|22428|43135|29462|39722|49982|38267|15313|23779|29385|51809|40052|42603|45182|27946|23343|
|23663|29381|35833|49901|53432|42599|46130|27942|51591|42413|37880|23276|15974|44110|29751|40459|
|23395|43696|51531|42465|37876|24224|29354|52360|45729|50719|53578|27317|15840|26100|36808|22449|
|59394|40455|45613|50771|53574|27257|15724|36804|39373|43842|50585|57619|24146|29304|47236|57552|
|22333|40321|41934|45451|50581|27039|22238|29300|38613|15071|23956|26507|29086|51510|42780|45401|
|47176|57436|53785|16019|23896|26503|36539|29138|28232|30797|51429|42223|38586|20398|23019|16193|
|39342|49658|42832|45397|28228|31745|52265|57507|26453|36713|39292|41955|54312|30882|51850|22259|
|38582|20450|23015|14285|36709|40240|41839|45370|40079|44576|47141|50395|57457|38756|15214|23861|
|54308|30766|51846|22143|40131|42668|45289|50391|26426|43462|28991|39811|50071|12221|23766|26345|
|26877|23464|16162|22009|26422|44298|29043|39695|28924|51796|55313|42590|46107|27919|23386|43673|
|50011|12273|26341|29872|39628|50840|53405|57874|14320|42456|37853|27852|24201|31235|51755|30018|
|46103|27971|23382|43669|14204|42452|38801|15259|39998|45716|50538|27584|15813|36333|43367|39730|
|24197|29327|51751|40050|45656|50534|27468|30985|53798|23671|44196|29277|39649|49909|53664|12031|
|51617|42411|37822|23274|44136|30225|39533|50745|15786|26046|21499|43816|51539|42361|27757|24120|
|53548|27315|15782|26098|36750|21495|39371|43812|29362|52368|57498|38559|45621|20427|23006|27489|
|49631|42357|24116|29246|47234|52252|57494|38611|15732|36700|40217|41942|45459|54285|28290|30855|
|15097|20423|23954|25581|29112|51984|40213|42778|51375|22470|44549|47184|57668|54017|16139|26399|
|45343|54337|28174|30795|51427|42697|45276|28040|36771|39350|53474|16072|26332|29849|43626|52273|
|23437|16135|26451|36655|39290|53358|16068|36585|57403|38702|20346|22911|43436|14293|34813|41847|
|29845|40105|43622|47139|50365|57399|38754|20342|23740|28195|30774|51742|22375|40027|42676|45297|
|23859|43488|29465|50097|12219|23792|26287|28922|50511|27109|23472|14266|51608|44306|39703|58374|
|51794|40023|42616|45181|27945|23356|14262|51604|53827|15977|26237|44225|29992|39636|51072|53637|
|42398|37851|27850|23247|15973|44109|29988|40472|27530|15759|26075|43789|46156|24093|43246|29335|

| | | | | | | | | | | | | | | |
|---|---|---|---|---|---|---|---|---|---|---|---|---|---|---|
|39595|49855|38378|45888|19966|27476|30993|51513|50029|53560|12263|15794|29862|36762|39327|43824|
|42419|27815|23282|51418|44144|39541|50977|53556|50830|53451|57892|46177|27765|24352|43715|29482|
|27435|15678|29802|36758|39379|41916|50882|53447|52488|57730|38791|15277|20435|25593|40516|45646|
|27368|15597|22444|43599|29478|47130|52484|57614|54293|28186|30751|51383|22366|42653|45512|27100|
|38731|15329|20319|25589|43465|53896|46594|23769|23449|16147|30215|36667|50735|53370|16080|26564|
|28182|30803|51323|42705|45508|28048|23445|14239|36600|30081|39165|43634|50601|57635|38710|24162|
|36663|50787|53366|15964|36596|29965|40113|41726|43444|52298|57568|38629|15087|23972|26299|29102|
|45243|50597|27055|8186|22254|43384|52294|57452|53801|51974|40259|42796|45417|50519|27005|55424|46218|
|16035|23912|26295|44171|29154|39582|50122|38351|27806|23259|15985|26469|44121|30000|39756|50968|
|42848|45413|27953|55308|46214|27858|23255|14077|53533|27538|15767|29891|36287|43797|50411|57921|
|44117|40704|45834|50964|53585|27422|15707|29775|46164|24325|43254|29455|39603|50087|38386|15320|
|36339|41945|50407|27341|30872|22473|44090|29507|23782|29388|51812|55329|42606|46123|27711|23402|
|39487|50027|38270|15316|30336|35836|39353|50856|43689|51650|42472|37869|20409|27443|29810|40462|
|53421|57890|46119|27763|23398|43685|51534|42468|45732|50778|53343|27376|15605|36573|22452|40328|
|38817|15275|20405|25535|40514|45672|50774|54291|43607|47362|50588|57622|38739|15225|24135|29293|
|27260|30777|51857|22392|40324|42651|45454|50640|43473|57541|53904|16026|24001|26510|29131|51555|
|27098|8159|15221|30241|43357|58377|53788|16022|23885|42825|45404|31752|52384|57514|38575|20219|23022|
|26562|36542|29127|39163|49647|42821|46352|31748|16196|36716|29973|40233|41958|45475|50493|27063|
|43442|52268|57510|38627|20215|23970|29576|52000|22262|40138|47200|50398|57460|53809|15931|23920|
|40229|42794|45359|50545|27003|40134|45292|27832|26415|44179|29050|39814|50130|38359|12280|14845|
|23229|15927|22012|26467|44063|29046|39754|50014|26348|29865|52737|55316|57867|46110|27978|23375|
|53531|12276|15793|29861|36761|43795|50829|53464|43676|14309|42445|38808|45842|24204|31238|51758|
|57863|46162|27974|24323|43728|29481|57729|38804|29783|40043|45761|50303|27349|31104|51624|22481|
|15262|24256|29386|51810|40039|45645|28185|30988|44322|39719|50035|30232|39652|50864|53429|27322|
|51620|22365|42414|37867|19455|30228|40488|45730|15551|26091|21502|43581|51542|42364|38713|15283|
|50748|53369|27318|15603|26087|36571|22450|39374|24109|29351|43419|52357|57487|38618|45680|20430|
|43633|50586|57648|38709|15167|24161|29291|43415|23947|27492|31009|51977|40220|42883|45462|54344|
|52297|57539|38614|15100|23943|26536|29101|51973|30914|51434|44608|47173|58385|54020|16142|23893|
|40272|42767|45402|54340|30798|51430|42700|46217|26458|36774|29023|39395|49655|12253|29852|47146|
|27805|23496|16194|26454|36714|29971|39279|50491|52276|57406|38523|20335|23866|43257|29584|50104|
|27537|29904|40108|47142|50424|57458|38519|23862|38333|42802|45367|23785|28198|30819|51787|40030|
|43253|29468|39840|50100|38385|12222|14843|23781|42721|45300|28064|23461|14255|51597|44295|39762|
|26346|28911|51783|55314|42605|46136|27948|23401|53830|15980|44228|29757|40577|45707|50837|53696|
|43674|14307|51649|42443|37854|24202|31264|59400|27295|15818|26078|22427|43848|29489|57625|24152|
|29809|40461|45703|50777|53580|27347|15814|36334|29394|39598|49914|38143|45653|28417|30996|51516|
|22423|43844|47361|57621|24148|29278|39650|49910|42422|37875|27874|23271|51407|44133|40496|45626|
|53427|16025|26509|29144|43579|51568|42362|37759|50980|53601|27438|15723|25983|36803|39382|41961|
|27758|24107|52355|57513|38588|45622|20456|23021|54402|30888|22265|44554|29299|47119|52305|57435|
|27490|15719|36687|40218|41957|45488|54286|30884|38734|15332|23839|26544|43468|29109|39817|50077|
|51852|22261|40137|44550|47171|50397|57431|54018|42775|23772|28227|30806|51326|42708|46225|28037|
|16168|23891|26428|44416|29049|39813|50129|12251|23504|14298|36722|39287|50790|54307|31241|51873|
|26319|29850|52274|57880|46109|27977|23388|43199|30024|40116|42667|45246|50656|27114|8175|43373|39736|
|14294|34814|38331|45841|23727|31237|51757|30020|53804|16038|23677|26354|44174|28919|39627|49887|
|40056|42663|45298|50540|27110|23459|21595|44321|53642|42613|46368|27956|23409|43906|14203|51545|
|39732|53856|15978|26238|44226|29755|39623|50835|42451|27847|24210|29368|59408|40469|45599|51009|
|53638|27321|15788|26104|21501|43790|14199|51541|53588|27467|15710|36342|41948|45465|28296|30861|
|42335|24094|29364|47240|57500|38617|45651|20429|22476|44079|29510|39546|50030|53547|16257|26517|
|23960|27463|30994|51514|42896|45461|28292|30913|36777|39356|43811|53480|46178|27766|24115|43744|
|51433|44131|39542|50978|53543|16141|26457|36773|52251|57521|38820|15278|20464|23029|25594|13823|
|39408|41903|53476|15598|22207|43628|47145|52247|36695|41853|54294|28201|30780|51860|22381|40145|
|57405|38760|15330|20348|23865|25590|43466|29107|42654|45275|50629|27087|23450|16176|30244|44312|
|50075|42801|23770|28197|30832|51800|40029|42706|39709|58380|53833|16067|26327|36587|30082|39166|
|45271|28035|23446|14268|44308|39761|58432|53829|50602|58112|46341|27985|43431|38630|23735|29341|
|15951|36583|29966|40114|45720|50598|27532|15817|51765|40288|42559|45418|50548|27006|23355|51603|
|26077|43371|53802|23675|44200|29393|39597|49913|42425|27821|23288|15986|26470|44122|29987|39519|
|38380|42611|45414|27954|23351|51487|42421|27873|50955|53534|27553|15796|29920|36764|39385|43798|
|23284|14078|51420|44118|40467|45625|50951|53586|50888|53453|57922|46151|24326|43717|29484|47248|
|27437|15736|29804|36816|39381|41946|50884|54401|57732|38849|15307|20437|25567|55330|46600|28188|
|27342|30859|22474|44553|29536|47132|57672|38733|30809|43690|51441|42235|37870|20410|22975|16149|
|15303|26515|35823|39354|53422|46596|28240|30805|30273|36669|41911|50793|53372|27363|15606|36574|
|43686|51325|42231|38818|20406|23027|14297|36721|22439|40091|43636|47153|50575|57637|38768|15226|
|41851|50789|54320|27247|30778|51858|22379|40087|24164|29294|43474|52300|57542|53891|16041|24002|
|42680|45245|50627|27113|8188|15222|30242|43358|39707|26301|29160|52032|40261|42826|45391|27931|46220|
|58378|53775|16037|23886|26353|44173|29156|39640|27864|23261|15959|36479|29974|40234|45952|50494|
|50124|53641|42822|46339|27927|43905|46272|27860|27540|15825|29893|36345|43379|50413|57447|53810|
|24209|29339|51763|40230|45836|50546|27480|15709|23907|44208|29513|39605|50145|38388|12267|14846|
|36341|41471|27819|23230|21999|44092|29509|39545|29866|52738|55303|57896|46125|27769|23404|43663|

| | | | | | | | | | | | | | |
|---|---|---|---|---|---|---|---|---|---|---|---|---|---|
|14310|51652|42446|38795|45857|20383|27445|29812|38745|15315|24141|29383|35835|49903|53434|46608
|40520|45762|50780|54297|27350|30867|51387|22482|28420|31041|43698|51561|42467|37878|24226|52362
|44561|47364|57680|38741|15199|30219|35831|50851|59424|40485|45615|50801|53604|27259|15726|36806
|53430|16028|26568|29133|43582|51557|42351|38714|22335|40323|41964|45481|50583|27069|22268|29302
|24110|43448|52358|57516|38633|45667|20221|23976|47178|52308|57438|53787|16049|23898|26533|44185
|27255|31010|51978|22387|40207|42912|45477|50523|29168|39820|50136|38365|42834|45399|28230|31747
|27121|40140|47174|58386|53783|15933|23894|26473|52267|57985|46228|28096|23493|14287|36711|40242
|44181|29052|39872|50132|53649|12254|15771|29839|45848|54310|31244|51876|29789|40161|42670|45291
|43801|52263|57869|46168|27980|24329|43258|29571|50421|26879|23466|22011|44328|29521|39725|50041
|50091|38334|45844|23786|31296|51816|40045|42722|12275|26343|29874|39630|50842|53407|57904|46133
|45287|27827|23462|51598|22007|44324|39777|50037|28001|23412|43671|14206|51548|42454|38803|15289
|12159|29758|40578|45736|50838|53459|27324|15609|24199|29357|59397|40528|45658|51012|54529|27470
|26093|22456|43611|29490|52496|57626|38687|15285|30987|51619|42889|45468|30920|44138|30227|39535
|24139|29409|43421|57545|38620|45654|23949|28418|50747|53550|16260|26576|36780|29141|39401|43814
|30983|51503|42885|45520|30916|51436|44134|40483|49661|42359|24118|47264|52254|57524|38641|15099
|50743|53602|16200|26460|36832|29977|39397|41962|20453|23984|25583|29114|51986|40215|42808|45373
|50609|27067|22266|47148|52306|57464|38525|15095|54339|28204|30825|51905|40148|42699|45278|28042
|23868|26531|43231|29110|39818|50078|38363|42804|23439|16165|26481|44301|39768|53836|16070|36590
|45425|23759|28256|30821|51789|55320|42695|46226|29847|40107|47617|50367|57877|46400|27988|24337
|28038|23491|14313|44353|39764|54784|31242|51874|43490|29467|50099|23794|29400|51824|40053|42618
|29787|40103|45709|50419|27353|15820|22429|43374|45183|27947|23358|51606|42428|37881|27880|23277
|29463|39723|49983|23678|29396|39656|49916|53433|15975|44111|29990|40474|45744|50958|53579|27556
|42614|46131|27943|23410|49697|51546|42480|37877|15841|26101|36809|39388|43843|54408|61442|24147
|27876|24225|29355|52361|59395|40470|45628|51010|44672|29305|47237|57553|38852|15310|23957|26522
|53575|27496|15725|36805|40336|41935|45466|54404|29087|51511|42781|28233|30812|51444|42238|38587
|30862|22239|44556|29301|47177|57437|54024|16258|20399|23034|16208|30276|36728|39293|41970|50796
|23897|26518|36778|29139|39343|49659|42833|28229|54313|27366|30883|51851|22498|40094|44577|47156
|31760|52280|57522|38583|20451|23030|14300|36724|50634|57696|38757|15215|26427|43463|39826|53894
|40241|41854|45371|54309|28202|30767|51847|22382|16044|23767|26360|28925|51797|55552|42591|46346
|40146|42669|45304|50630|27116|23465|16163|26423|27934|23387|43912|14321|42457|27853|24216|31250
|44299|39710|53834|16096|26356|44232|29873|39629|51770|30019|39999|45717|50539|27585|15828|36348
|50841|53644|57875|46342|27986|23383|43908|14205|43382|39731|58402|53799|23910|44197|29516|39664
|42453|24212|29342|51766|40051|45657|50535|27469|50148|53665|12270|15787|26047|43817|55362|46184
|31000|51632|42426|37823|27822|23275|44137|30464|27772|24121|43722|29363|52369|57499|38798|45860
|39548|50984|53549|27554|15783|26099|36751|39386|20442|23007|27504|15733|36701|41943|54300|28291
|43813|53454|46180|24117|43718|29247|47235|52253|30870|51390|22471|44564|47185|57669|54032|16154
|57495|38850|15336|20438|23955|25596|29113|51985|30222|36786|39351|50854|53475|16073|26333|30088
|42779|54352|28175|30810|51442|42712|45277|28041|43627|52512|57642|38703|20347|43437|38636|45670
|23452|16150|30274|36670|39291|50794|53359|16069|23741|28210|30775|51743|22390|40266|42677|45536
|36589|30084|40120|43623|47154|50604|57638|38755|50526|27124|23473|14267|51609|44307|58375|53842
|20343|43489|53920|16042|23793|26302|28923|51795|15992|26476|44240|29993|39637|51073|53652|27531
|40262|42617|45420|27960|23357|14263|51605|42399|15774|29898|43804|52322|57928|46157|24332|43247
|27851|23262|15988|44124|29989|40473|45715|50957|29574|39610|50094|38379|45889|19967|27477|55336
|53592|27527|15826|29894|36346|43856|50414|57924|46242|27830|23283|51419|44145|39780|50992|53557
|61441|24384|44195|29514|39606|50146|38375|15309|27450|15679|29803|36759|41917|50883|53462|27369
|26521|55332|46126|27770|23167|43692|51415|42237|15612|22445|43614|29479|47131|52485|57615|38746
|38824|45858|20412|23033|27446|15731|29799|36699|15344|24142|29412|43480|57548|53897|46595|24008
|41969|50767|54298|27365|30896|51864|22497|40093|28183|31042|51562|42944|45509|28049|40486|50802
|44562|47127|50633|57667|38742|15228|30248|43476|53367|15965|36597|29980|40352|41727|45482|50612
|39825|58496|53893|16015|24004|26331|29134|51558|27070|8187|22255|43385|52295|57453|53816|16050|23913
|42828|46345|27933|43435|38634|20222|23739|31249|26534|44186|29155|39583|50123|38366|42849|45428
|51769|30032|40236|42675|45478|50552|27122|8183|36319|31776|52744|55309|57986|46215|27859|23494|14316
|43381|58401|53812|15934|23909|26474|44182|29039|44356|40705|45835|50965|27423|29790|40162|45768
|39635|50119|53650|12269|15800|29868|43802|52740|50422|27356|30873|22488|44091|29522|39726|50042
|55361|57870|46155|27743|24330|43721|29600|57736|38271|15317|30337|35837|50857|53436|57891|46134
|38797|45831|20441|27475|40046|45764|28304|30869|28002|23399|43700|51535|42469|38832|15290|24228
|51389|22484|44087|39778|50038|53555|16153|30221|29358|52364|59398|40515|45673|50775|54530|27261
|36785|41915|50853|53488|27311|15610|26094|22443|31016|52096|22393|40325|42890|45455|50641|27099
|43640|52483|57641|38716|15286|24168|29410|43422|30256|47180|58392|53789|16023|23900|26563|36543
|52416|57546|38607|45669|23950|28209|31012|51980|29142|39402|49662|42836|46353|31749|43443|52269
|22389|40265|42886|45507|50525|27095|48128|58388|57511|38642|20454|23971|29577|52001|40244|42795
|53841|15963|26447|36595|29978|39398|50610|27544|45374|54368|30826|51906|40135|42728|45293|27833
|15773|29897|43327|52321|57451|38526|23855|43260|23468|16166|22013|26482|44302|29047|39755|50015
|29573|39609|50093|38392|42791|45426|23788|30822|12277|29876|40584|47618|53465|57878|46163
|51790|55307|42724|46241|27829|23520|14314|51656|27975|24338|43729|29496|57744|38805|15263|24257
|44354|39751|50963|27449|29816|40580|45710|50896|29387|51811|40054|45660|28424|30989|51621|42415
|53461|27354|15583|22430|43613|29492|47368|57628|37882|23278|44140|30229|40489|45731|50749|53608

| | | | | | | | | | | | | | | | |
|---|---|---|---|---|---|---|---|---|---|---|---|---|---|---|---|
|27319|15842|26102|36810|22451|39375|43872|50587|54345|28294|30915|51435|44609|47188|58624|54021|
|57649|24176|29306|47238|52312|57554|38615|15101|16143|26459|36775|39410|53478|16076|29853|43630|
|23958|26537|29116|51988|40273|42782|45403|54341|47147|52277|57407|38762|20350|23867|43496|29585|
|28234|30799|51431|42701|46232|28044|23497|16195|50105|42803|23800|28199|30834|51802|40031|42736|
|26455|36715|39294|54314|31360|51880|29905|40109|45301|28065|23476|14270|51612|44310|39763|58434|
|44578|47143|50425|57459|38758|23863|43492|29469|53831|15981|44229|29996|40592|45722|51076|53697|
|39841|50101|12223|23796|26347|28926|51798|55315|27534|15819|26079|43849|61448|24153|44202|29395|
|42620|46137|27949|23416|43675|14322|51664|42458|39599|49915|38382|45892|28432|30997|51517|42423|
|37855|27854|24203|31265|59401|30048|40476|45718|27875|23286|51422|44148|40497|45627|50981|53616|
|51016|53581|27586|15815|36335|43845|47376|61444|27439|15738|29806|36818|39383|41976|50886|54403|
|24149|44198|29279|39651|49911|53666|16264|26524|27372|30889|22504|44555|29538|47134|52544|57674|
|29145|43818|51569|42363|27759|24122|52370|57528|38735|15333|26545|43469|39832|53900|46598|23773|
|38589|45623|20457|23036|27491|15734|36702|40219|28242|30807|51327|42709|46464|28052|23505|14299|
|41972|45489|54287|28320|30885|51853|22500|40152|36723|50791|54322|31256|51888|30025|40117|42682|
|44551|47186|50636|57670|54019|16169|26429|44417|45247|50657|27115|8190|43388|39737|58408|53805|16039|
|39828|53952|16074|26334|29851|52275|57881|46348|23916|26355|44175|29158|39642|50126|53643|42852|
|27992|23389|43438|14295|34815|23742|31252|51772|46369|27957|43907|55368|46274|27862|24211|29369|
|30021|40057|42678|45299|50541|27111|23474|51610|59409|40708|45838|51024|53589|27482|15711|36343|
|44336|39733|58404|53857|15979|26239|44227|29994|41949|28297|30876|22477|44094|29511|39547|50031|
|39638|51074|53639|27560|15789|26105|43791|55364|53562|16272|30340|36792|39357|43826|50860|53481|
|46158|24095|43724|29365|47241|57501|38856|45890|57894|46179|27767|24354|43745|52490|57760|38821|
|20444|23961|27478|30995|51515|42897|28293|30928|15279|20465|25595|40518|45676|54295|28216|30781|
|51448|44146|39543|50979|53558|16156|30280|36788|51861|22396|40384|42655|45514|50644|27102|23451|
|39409|41918|50912|53477|27370|15599|22446|43629|16177|30245|44313|58381|53848|16082|26566|36602|
|47160|52486|57644|38761|15331|20349|25591|43467|30083|39167|50603|58113|46356|31808|43446|52328|
|53898|46624|23771|28212|30833|51801|40268|42707|57570|38631|23974|29580|52004|40289|42798|45419|
|45510|28050|23447|14269|44309|58433|53844|15966|50549|27007|55426|46248|27836|23289|15987|26471|
|36598|29967|40115|45721|50599|27533|15832|29900|44123|30002|39758|50970|53535|27568|15797|29921|
|43386|52324|57454|53803|23914|44201|29632|39612|36765|43799|50889|53468|57923|46166|24327|43732|
|50152|38381|42850|45415|27955|55310|46244|27888|29485|47249|57733|38864|15322|24260|29390|51814|
|23285|14079|51421|44119|40706|45864|50966|53587|55331|46601|28189|31048|43691|51680|42474|37871|
|27452|15737|29805|36817|41947|50885|54416|27343|20411|30288|40492|45734|50808|53373|27378|15607|
|30874|22475|44568|29537|47133|57673|38748|15318|36575|22454|40330|43637|47392|50590|57652|38769|
|30338|35838|39355|50858|53423|46597|28241|31044|15227|24165|29295|43475|52301|57543|53906|16056|
|43687|51564|42470|38819|20407|40544|45674|50804|24003|26540|29161|52033|40276|42827|45406|31754|
|54321|27262|30779|51859|22394|40326|42681|45484|52386|57992|46221|27865|23500|16198|36718|29975|
|50642|27128|8189|15223|30243|43359|58379|53790|16052|40235|45953|50495|27541|29908|40168|47202|50428|
|23887|26592|44188|29157|39641|50125|53656|42823|57462|53811|23922|44209|29528|39844|50160|38389|
|46354|31750|43920|52270|57988|46273|27861|24448|12282|14847|26350|29867|52739|55318|57897|46140|
|29578|52002|40231|45837|50547|27481|40164|45294|28008|23405|43678|14311|51653|42447|38810|45872|
|27834|23231|22014|44093|29524|39784|50044|53561|24206|31268|59404|29813|40521|45763|50781|54536|
|12278|15795|29863|36763|43825|50831|53466|57893|27351|31106|51626|22483|44800|47365|57681|30234|
|46192|28004|24353|43730|29483|52489|57731|38826|39654|50866|53431|16029|26569|29148|43583|51572|
|15292|24258|29416|59456|40517|45647|54532|28187|42366|38715|24111|43449|52359|57517|38648|45682|
|30990|51622|22367|42892|45513|27101|30230|40490|20460|23977|27494|31011|51979|40222|42913|45492|
|50750|53371|16081|26565|36601|30096|39404|43635|54346|30944|51912|40141|44610|47175|58387|54022|
|50616|57650|38711|24163|43445|52299|57569|38644|16172|23895|26488|44420|29053|39873|50133|12255|
|15102|23973|26538|29103|51975|40274|42797|45432|29854|47624|52278|57884|46169|27981|24344|43259|
|54342|30828|51908|55425|42702|46219|27807|23498|29586|50106|38335|45845|23787|31297|51817|40060|
|16224|26484|44360|30001|39757|50969|27539|29906|42723|45302|28066|23463|51599|44325|39792|53860|
|40110|47620|50426|57936|46165|24340|43255|29470|15982|44230|29759|40579|45737|50839|53698|27325|
|39842|50102|38387|15321|23783|29389|51813|55344|15848|26108|22457|43850|29491|52497|57627|24154|
|42607|46138|27950|23403|43704|51651|42473|37884|29424|47244|57560|38621|45655|23964|28419|30998|
|24232|31266|59402|29811|40463|45733|50779|53582|51518|42900|45521|28352|30917|51437|44135|40498|
|27377|15844|36812|22453|40329|43846|47363|50589|50982|53603|16201|26461|36833|39412|41963|54432|
|57623|24150|29308|47296|57556|53905|16027|24016|30890|22267|44584|47149|52307|57465|38764|15334|
|26511|29146|51570|42840|45405|28236|31753|52385|23869|26546|43470|29111|39819|50079|42805|23774|
|57515|38590|20458|23023|16197|36717|40248|41959|28257|30836|51804|55321|42710|46227|28039|23506|
|45490|54316|30886|51854|22263|40139|44580|47201|14328|44368|39765|58436|54785|31243|51875|30026|
|50399|57461|54048|16170|23921|26430|44418|29051|40118|45724|50658|27592|15821|43375|39738|53806|
|39815|50131|12281|26349|29880|52752|55317|57882|23679|44204|29397|39657|49917|53672|42615|46370|
|46111|27979|23390|43677|14324|42460|38809|45843|27958|23411|43936|51547|42481|27877|24240|29370|
|24205|31239|51759|30022|40058|45776|50542|27587|52376|59410|40471|45629|51011|53590|27497|15740|
|31105|51625|44323|39734|53858|44256|30233|39653|36820|40337|41950|45467|54405|28298|30863|22478|
|50865|53668|27323|15790|26106|21503|43820|51543|44557|29540|47192|57676|54025|16259|26519|36779|
|42365|24124|29366|47242|52372|57502|38619|45681|39358|53482|46656|28244|31761|43746|52281|57523|
|20431|23962|27493|31024|51992|40221|42898|45463|38822|20466|23031|14301|36725|41855|54324|28203|

| | | | | | | | | | | | | | | |
|---|---|---|---|---|---|---|---|---|---|---|---|---|---|---|
| 30782 | 51862 | 22383 | 40147 | 42684 | 45305 | 50631 | 27117 | 51771 | 30034 | 40238 | 45956 | 50554 | 27600 | 15829 | 36349 |
| 23480 | 16178 | 30246 | 44314 | 39711 | 58382 | 53835 | 16097 | 43383 | 58403 | 53814 | 23911 | 44212 | 29517 | 39665 | 50149 |
| 26357 | 44233 | 30112 | 39644 | 51080 | 53645 | 58114 | 46343 | 53680 | 12271 | 15802 | 29870 | 43832 | 52742 | 55363 | 57900 |
| 27987 | 43909 | 46276 | 24213 | 29343 | 51767 | 40290 | 45896 | 46185 | 27773 | 24360 | 43723 | 29602 | 52608 | 57738 | 38799 |
| 50550 | 27484 | 31001 | 51633 | 42427 | 27823 | 23290 | 44152 | 45861 | 20443 | 27505 | 40524 | 45766 | 54301 | 28306 | 30871 |
| 30465 | 39549 | 50985 | 53564 | 27555 | 15798 | 29922 | 36766 | 51391 | 22486 | 44565 | 47424 | 57684 | 54033 | 16155 | 30223 |
| 39387 | 43828 | 50890 | 53455 | 57952 | 46181 | 24356 | 43719 | 36787 | 50855 | 53490 | 16088 | 26572 | 30089 | 43642 | 52513 |
| 29486 | 47250 | 52492 | 57734 | 38851 | 15337 | 20439 | 25597 | 57643 | 38718 | 24170 | 43452 | 52418 | 57576 | 38637 | 45671 |
| 55808 | 46602 | 54353 | 28190 | 30811 | 51443 | 42713 | 45516 | 23980 | 28211 | 31014 | 51982 | 22391 | 40267 | 42916 | 45537 |
| 28056 | 23453 | 16151 | 30275 | 36671 | 50795 | 53374 | 16084 | 50527 | 27125 | 55432 | 48130 | 58390 | 53843 | 15993 | 26477 |
| 36604 | 30085 | 40121 | 43638 | 47155 | 50605 | 57639 | 38770 | 44241 | 30008 | 39876 | 51088 | 53653 | 27546 | 15775 | 29899 |
| 24166 | 43504 | 52302 | 57572 | 53921 | 16043 | 24032 | 26303 | 43805 | 52323 | 57929 | 46172 | 24333 | 43262 | 29575 | 39611 |
| 29162 | 52034 | 40263 | 42856 | 45421 | 27961 | 55428 | 46222 | 50095 | 38394 | 45904 | 23790 | 31300 | 51820 | 55337 | 42726 |
| 27866 | 23263 | 15989 | 44125 | 30004 | 40712 | 45954 | 50972 | 46243 | 27831 | 23522 | 51658 | 44384 | 39781 | 50993 | 27451 |
| 53593 | 27542 | 15827 | 29895 | 36347 | 43857 | 50415 | 57925 | 29818 | 40582 | 45740 | 50898 | 53463 | 27384 | 15613 | 22460 |
| 61456 | 24385 | 44210 | 29515 | 39607 | 50147 | 38390 | 15324 | 43615 | 29494 | 47370 | 52500 | 57630 | 38747 | 15345 | 24143 |
| 30344 | 52768 | 55333 | 57898 | 46127 | 27771 | 23406 | 43693 | 29413 | 43481 | 57549 | 53912 | 46610 | 24009 | 28422 | 31043 |
| 51654 | 42476 | 38825 | 45859 | 20413 | 27447 | 29814 | 40522 | 51563 | 42945 | 45524 | 31872 | 52392 | 59426 | 40487 | 50803 |
| 45792 | 50782 | 54299 | 27380 | 30897 | 51865 | 22512 | 40332 | 53606 | 16204 | 36836 | 29981 | 40353 | 41966 | 45483 | 50613 |
| 44563 | 47366 | 50648 | 57682 | 38743 | 15229 | 30249 | 43477 | 27071 | 22270 | 47208 | 52310 | 57468 | 53817 | 16051 | 23928 |
| 58497 | 53908 | 16030 | 24005 | 26570 | 29135 | 51559 | 42829 | 26535 | 44187 | 29170 | 39822 | 50138 | 38367 | 42864 | 45429 |
| 46360 | 31756 | 43450 | 52388 | 57518 | 38635 | 20223 | 23978 | 28260 | 31777 | 52745 | 55324 | 57987 | 46230 | 28098 | 23495 |
| 31488 | 52008 | 30033 | 40237 | 42914 | 45479 | 50553 | 27123 | 14317 | 44357 | 40720 | 45850 | 54788 | 31246 | 51878 | 29791 |
| 40142 | 47204 | 58416 | 53813 | 15935 | 23924 | 26475 | 44183 | 40163 | 45769 | 50423 | 27357 | 31112 | 22489 | 44330 | 29523 |
| 29054 | 39874 | 50134 | 53651 | 12284 | 15801 | 29869 | 43803 | 39727 | 50043 | 30352 | 39660 | 50872 | 53437 | 57906 | 46135 |
| 52741 | 55376 | 57871 | 46170 | 27982 | 24331 | 43736 | 29601 | 28003 | 23414 | 43701 | 51550 | 42484 | 38833 | 15291 | 24229 |
| 57737 | 38812 | 45846 | 24264 | 31298 | 51818 | 40047 | 45765 | 29359 | 52365 | 59399 | 40530 | 45688 | 51014 | 54531 | 27500 |
| 28305 | 31108 | 51628 | 22485 | 44326 | 39779 | 50039 | 30236 | 31017 | 52097 | 40340 | 42891 | 45470 | 54464 | 30922 | 44616 |
| 40608 | 45738 | 50868 | 53489 | 27326 | 15611 | 26095 | 22458 | 30257 | 47181 | 58393 | 54028 | 16262 | 23901 | 26578 | 36782 |
| 43641 | 52498 | 57656 | 38717 | 15287 | 24169 | 29411 | 43423 | 29143 | 39403 | 49663 | 42837 | 31764 | 47266 | 52284 | 57526 |
| 52417 | 57547 | 38622 | 45684 | 23951 | 28448 | 31013 | 51981 | 38643 | 20455 | 23986 | 29592 | 52016 | 40245 | 42810 | 45375 |
| 40280 | 42887 | 45522 | 54348 | 30918 | 51438 | 44612 | 48129 | 54369 | 28206 | 30827 | 51907 | 40150 | 42729 | 45308 | 28072 |
| 58389 | 54080 | 16202 | 26462 | 36834 | 29979 | 39399 | 50611 | 23469 | 16167 | 26483 | 44303 | 39770 | 53838 | 16100 | 44236 |
| 27545 | 29912 | 47150 | 52336 | 57466 | 38527 | 23870 | 43261 | 29877 | 40585 | 47619 | 50845 | 53704 | 57879 | 46402 | 27990 |
| 29588 | 39848 | 50108 | 38393 | 42806 | 45427 | 23789 | 28258 | 24339 | 43968 | 29497 | 57745 | 24272 | 29402 | 51826 | 40055 |
| 30823 | 51791 | 55322 | 42725 | 46256 | 28068 | 23521 | 14315 | 45661 | 28425 | 31004 | 51636 | 42430 | 37883 | 27882 | 23279 |
| 51657 | 44355 | 39766 | 54786 | 31272 | 59520 | 29817 | 40581 | 44141 | 30468 | 40504 | 45746 | 50988 | 53609 | 27558 | 15843 |
| 45711 | 50897 | 53700 | 27355 | 15822 | 22431 | 43852 | 29493 | 26103 | 36811 | 39390 | 43873 | 54410 | 61472 | 24177 | 44674 |
| 47369 | 57629 | 24156 | 29398 | 39658 | 49918 | 53435 | 46609 | 29307 | 47239 | 52313 | 57555 | 38854 | 15340 | 23959 | 26552 |
| 28421 | 31056 | 43699 | 51576 | 42482 | 37879 | 27878 | 24227 | 29117 | 51989 | 42783 | 54356 | 28235 | 30814 | 51446 | 42716 |
| 52363 | 59425 | 40500 | 45630 | 51040 | 53605 | 27498 | 15727 | 46233 | 28045 | 23512 | 16210 | 30278 | 36730 | 39295 | 50798 |
| 36807 | 40338 | 41965 | 45496 | 54406 | 30892 | 22269 | 44558 | 54315 | 31361 | 51881 | 30144 | 40124 | 44579 | 47158 | 50664 |
| 29303 | 47179 | 52309 | 57439 | 54026 | 16288 | 23899 | 26548 | 57698 | 38759 | 43493 | 39856 | 53924 | 16046 | 23797 | 26362 |
| 44424 | 29169 | 39821 | 50137 | 42835 | 28231 | 31762 | 52282 | 28927 | 51799 | 55554 | 42621 | 46376 | 27964 | 23417 | 43914 |
| 58000 | 46229 | 28097 | 23508 | 14302 | 36726 | 40243 | 45849 | 14323 | 51665 | 42459 | 27855 | 24218 | 31280 | 59416 | 30049 |
| 54311 | 31245 | 51877 | 30028 | 40176 | 42671 | 45306 | 50660 | 40477 | 45719 | 51017 | 53596 | 27587 | 15830 | 36350 | 43860 |
| 27118 | 23467 | 44329 | 39740 | 53864 | 16098 | 26358 | 44234 | 47377 | 58880 | 61445 | 24388 | 44199 | 29518 | 39666 | 50150 |
| 29875 | 39631 | 50843 | 53646 | 57905 | 46372 | 28016 | 23413 | 53667 | 16265 | 26525 | 43819 | 55392 | 46186 | 27774 | 24123 |
| 43910 | 14207 | 51549 | 42455 | 24214 | 29372 | 59412 | 40529 | 43752 | 52371 | 57529 | 38828 | 45862 | 20472 | 23037 | 27506 |
| 45659 | 51013 | 54544 | 27471 | 31002 | 51634 | 42904 | 45469 | 15735 | 36703 | 41973 | 54302 | 28321 | 30900 | 51868 | 22501 |
| 28300 | 30921 | 44139 | 30466 | 39550 | 50986 | 53551 | 16261 | 40153 | 44566 | 47187 | 50637 | 57671 | 54034 | 16184 | 30252 |
| 26577 | 36781 | 39416 | 43815 | 53484 | 46182 | 24119 | 43748 | 44432 | 39829 | 58500 | 53953 | 16075 | 26335 | 30090 | 52514 |
| 47265 | 52255 | 57525 | 38880 | 15338 | 20468 | 23985 | 25598 | 58120 | 46349 | 27993 | 43439 | 38638 | 23743 | 31253 | 51773 |
| 29115 | 51987 | 42809 | 54354 | 28205 | 30840 | 51920 | 40149 | 30036 | 40296 | 42679 | 45538 | 50556 | 27126 | 23475 | 51611 |
| 42714 | 45279 | 28043 | 23454 | 16180 | 30304 | 44316 | 39769 | 44337 | 58405 | 53872 | 15994 | 26478 | 44242 | 29995 | 39639 |
| 58440 | 53837 | 16071 | 36591 | 30086 | 40122 | 47632 | 50606 | 51075 | 53654 | 27561 | 15804 | 29928 | 43806 | 52800 | 55365 |
| 58116 | 46401 | 27989 | 43491 | 53922 | 23795 | 29401 | 51825 | 57930 | 46159 | 24334 | 43725 | 29604 | 47256 | 57740 | 38857 |
| 40292 | 42619 | 45422 | 27962 | 23359 | 51607 | 42429 | 27881 | 45891 | 20445 | 27479 | 55338 | 46720 | 28308 | 30929 | 51449 |
| 23292 | 15990 | 44126 | 29991 | 40475 | 45745 | 50959 | 53594 | 44147 | 39782 | 50994 | 53559 | 16157 | 30281 | 36789 | 41919 |
| 27557 | 15856 | 29924 | 36824 | 39389 | 43858 | 50892 | 54409 | 50913 | 53492 | 27371 | 15614 | 22447 | 43644 | 47161 | 52487 |
| 57926 | 61443 | 24386 | 44673 | 29544 | 47252 | 57792 | 38853 | 57645 | 38776 | 15346 | 24172 | 29414 | 43482 | 52420 | 57550 |
| 15311 | 26523 | 55334 | 46604 | 28248 | 30813 | 43694 | 51445 | 53899 | 46625 | 24010 | 28213 | 31072 | 52040 | 40269 | 42946 |
| 42239 | 38826 | 20414 | 23035 | 16209 | 30277 | 36729 | 41971 | 45511 | 28051 | 48132 | 58448 | 53845 | 15967 | 36599 | 29982 |
| 50797 | 54328 | 27367 | 30898 | 51866 | 22499 | 40095 | 44592 | 40354 | 45960 | 50614 | 27548 | 15833 | 29901 | 43387 | 52325 |
| 47157 | 50635 | 57697 | 38772 | 15230 | 30250 | 43478 | 39827 | 57455 | 53818 | 23915 | 44216 | 29633 | 39613 | 50153 | 38396 |
| 58498 | 53895 | 16045 | 24006 | 26361 | 29164 | 52036 | 55553 | 42851 | 45430 | 31778 | 52746 | 55311 | 58016 | 46245 | 27889 |
| 42830 | 46347 | 27935 | 43913 | 46280 | 27868 | 24217 | 31251 | 23524 | 14318 | 51660 | 44358 | 40707 | 45865 | 50967 | 27453 |

| | | | | | | | | | | | | | | |
|---|---|---|---|---|---|---|---|---|---|---|---|---|---|---|
| 29820 | 40640 | 45770 | 50900 | 54417 | 27358 | 30875 | 22490 | 47393 | 50591 | 57653 | 24180 | 29310 | 47298 | 52316 | 57558 |
| 44569 | 29552 | 47372 | 57688 | 38749 | 15319 | 30339 | 35839 | 53907 | 16057 | 24018 | 26541 | 29176 | 52048 | 40277 | 42842 |
| 50859 | 53438 | 46612 | 28480 | 31045 | 43702 | 51565 | 42471 | 45407 | 28238 | 31755 | 52387 | 57993 | 46236 | 28104 | 23501 |
| 38834 | 24230 | 52366 | 59428 | 40545 | 45675 | 50805 | 54560 | 16199 | 36719 | 40250 | 45968 | 54318 | 31364 | 51884 | 29909 |
| 27263 | 31018 | 52098 | 22395 | 40327 | 42920 | 45485 | 50643 | 40169 | 44582 | 47203 | 50429 | 57463 | 54050 | 23923 | 44448 |
| 27129 | 30258 | 47182 | 58394 | 53791 | 16053 | 23902 | 26593 | 29529 | 39845 | 50161 | 12283 | 26351 | 29882 | 52754 | 55319 |
| 44189 | 29172 | 39880 | 50140 | 53657 | 42838 | 46355 | 31751 | 57912 | 46141 | 28009 | 23420 | 43679 | 14326 | 51668 | 42462 |
| 43921 | 52271 | 57989 | 46288 | 28100 | 24449 | 29579 | 52003 | 38811 | 45873 | 24207 | 31269 | 59405 | 30052 | 40536 | 45778 |
| 40246 | 45852 | 54370 | 31304 | 51936 | 40165 | 42730 | 45295 | 51020 | 54537 | 27590 | 31107 | 51627 | 44801 | 47380 | 61504 |
| 27835 | 23470 | 22015 | 44332 | 29525 | 39785 | 50045 | 12279 | 44258 | 30235 | 39655 | 50867 | 53670 | 16268 | 26584 | 29149 |
| 29878 | 40586 | 47648 | 50846 | 53467 | 57908 | 46193 | 28005 | 43822 | 51573 | 42367 | 24126 | 47272 | 52374 | 57532 | 38649 |
| 24368 | 43731 | 29498 | 52504 | 57746 | 38807 | 15293 | 24259 | 45683 | 20461 | 23992 | 27495 | 31026 | 51994 | 40223 | 42928 |
| 29417 | 59457 | 40532 | 45662 | 54533 | 28426 | 30991 | 51623 | 45493 | 54347 | 28324 | 30945 | 51913 | 40156 | 44611 | 47190 |
| 42893 | 45528 | 30924 | 44142 | 30231 | 40491 | 50751 | 53610 | 58626 | 54023 | 16173 | 26489 | 44421 | 39888 | 53956 | 16078 |
| 16320 | 26580 | 36840 | 30097 | 39405 | 43874 | 50617 | 57651 | 29855 | 47625 | 52279 | 57885 | 46408 | 27996 | 24345 | 43498 |
| 24178 | 47268 | 52314 | 57584 | 38645 | 15103 | 23988 | 26539 | 29587 | 50107 | 23802 | 31312 | 51832 | 40061 | 42738 | 45303 |
| 29118 | 51990 | 40275 | 42812 | 45433 | 54343 | 28264 | 30829 | 28067 | 23478 | 51614 | 44340 | 39793 | 58464 | 53861 | 15983 |
| 51909 | 55440 | 42703 | 46234 | 28046 | 23499 | 16225 | 26485 | 44231 | 29998 | 40594 | 45752 | 51078 | 53699 | 27564 | 15849 |
| 44361 | 39772 | 54792 | 31362 | 51882 | 29907 | 40111 | 47621 | 26109 | 43851 | 56320 | 61450 | 24155 | 44680 | 29425 | 47245 |
| 50427 | 57937 | 46404 | 24341 | 43494 | 29471 | 39843 | 50103 | 57561 | 38860 | 45894 | 23965 | 28434 | 30999 | 51519 | 42901 |
| 23798 | 29404 | 51828 | 55345 | 42622 | 46139 | 27951 | 23418 | 28353 | 30932 | 51452 | 44150 | 40499 | 50983 | 53618 | 16216 |
| 43705 | 51666 | 42488 | 37885 | 27884 | 24233 | 31267 | 59403 | 30284 | 36848 | 39413 | 41978 | 50916 | 54433 | 27374 | 30891 |
| 30050 | 40478 | 45748 | 51018 | 53583 | 27616 | 15845 | 36813 | 22506 | 44585 | 47164 | 52546 | 57704 | 38765 | 15335 | 26547 |
| 40344 | 43847 | 47378 | 54412 | 61446 | 24151 | 44676 | 29309 | 43471 | 39834 | 53902 | 46628 | 23775 | 28272 | 30837 | 51805 |
| 47297 | 57557 | 54144 | 16266 | 24017 | 26526 | 29147 | 51571 | 55560 | 42711 | 46466 | 28054 | 23507 | 14329 | 44369 | 58437 |
| 42841 | 28237 | 31768 | 52400 | 57530 | 38591 | 20459 | 23038 | 54800 | 31258 | 51890 | 30027 | 40119 | 45725 | 50659 | 27593 |
| 16212 | 36732 | 40249 | 41974 | 45491 | 54317 | 28322 | 30887 | 15836 | 43390 | 39739 | 58410 | 53807 | 23918 | 44205 | 29636 |
| 51855 | 22502 | 40154 | 44581 | 47216 | 50638 | 57700 | 54049 | 39672 | 50156 | 53673 | 42854 | 46371 | 27959 | 43937 | 55370 |
| 16171 | 26431 | 44419 | 39830 | 53954 | 16104 | 26364 | 29881 | 46304 | 27892 | 24241 | 29371 | 52377 | 59411 | 40710 | 45868 |
| 52753 | 55556 | 57883 | 46350 | 27994 | 23391 | 43916 | 14325 | 51026 | 53591 | 27512 | 15741 | 36821 | 41951 | 54420 | 28299 |
| 42461 | 24220 | 31254 | 51774 | 30023 | 40059 | 45777 | 50543 | 30878 | 22479 | 44572 | 29541 | 47193 | 57677 | 54040 | 16274 |
| 27589 | 31120 | 51640 | 44338 | 39735 | 58406 | 53859 | 44257 | 30342 | 36794 | 39359 | 50862 | 53483 | 46657 | 28245 | 32000 |
| 30472 | 39668 | 51104 | 53669 | 27562 | 15791 | 26107 | 43821 | 43747 | 52520 | 57762 | 38823 | 20467 | 40548 | 45678 | 54325 |
| 55366 | 46188 | 24125 | 43726 | 29367 | 47243 | 52373 | 57503 | 28218 | 30783 | 51863 | 22398 | 40386 | 42685 | 45544 | 50646 |
| 38858 | 45920 | 20446 | 23963 | 27508 | 31025 | 51993 | 42899 | 27132 | 23481 | 16179 | 30247 | 44315 | 58383 | 53850 | 16112 |
| 54360 | 28295 | 30930 | 51450 | 44624 | 47189 | 58625 | 54036 | 26596 | 44248 | 30113 | 39645 | 51081 | 53660 | 58115 | 46358 |
| 16158 | 30282 | 36790 | 39411 | 50914 | 53479 | 16077 | 30092 | 31810 | 43924 | 52330 | 58048 | 46277 | 24452 | 29582 | 52006 |
| 43631 | 47162 | 52516 | 57646 | 38763 | 20351 | 43497 | 53928 | 40291 | 45897 | 50551 | 27485 | 55456 | 46250 | 27838 | 23291 |
| 46626 | 23801 | 28214 | 30835 | 51803 | 40270 | 42737 | 45540 | 44153 | 30480 | 39788 | 51000 | 53565 | 27570 | 15799 | 29923 |
| 28080 | 23477 | 14271 | 51613 | 44311 | 58435 | 53846 | 15996 | 36767 | 43829 | 50891 | 53470 | 57953 | 46196 | 24357 | 43734 |
| 44244 | 29997 | 40593 | 45723 | 51077 | 53712 | 27535 | 15834 | 29487 | 47251 | 52493 | 57735 | 38866 | 15352 | 24262 | 29420 |
| 29902 | 43864 | 52326 | 57932 | 61449 | 24392 | 44203 | 29634 | 59460 | 55809 | 46603 | 54592 | 28191 | 31050 | 51682 | 42952 |
| 39614 | 50154 | 38383 | 45893 | 28433 | 55340 | 46246 | 27890 | 45517 | 28057 | 30290 | 40494 | 50810 | 53375 | 16085 | 36605 |
| 23287 | 51423 | 44149 | 40736 | 45866 | 50996 | 53617 | 27454 | 30100 | 40360 | 43639 | 47394 | 50620 | 57654 | 38771 | 24167 |
| 15739 | 29807 | 36819 | 41977 | 50887 | 54418 | 27373 | 30904 | 43505 | 52303 | 57573 | 53936 | 16058 | 24033 | 26542 | 29163 |
| 22505 | 44570 | 29539 | 47135 | 52545 | 57675 | 38750 | 15348 | 52035 | 40278 | 42857 | 45436 | 31784 | 52864 | 55429 | 57994 |
| 30368 | 43484 | 39833 | 58504 | 53901 | 46599 | 24012 | 28243 | 46223 | 27867 | 23502 | 16228 | 44364 | 30005 | 40713 | 45955 |
| 31046 | 51566 | 42948 | 46465 | 28053 | 40546 | 50806 | 54323 | 50973 | 27543 | 29910 | 40170 | 47680 | 50430 | 57940 | 61457 |
| 31257 | 51889 | 30040 | 40356 | 42683 | 45486 | 50672 | 27130 | 8191 | | | | | | | |
| | | | | | | | | 24400 | 44211 | 29530 | 39846 | 50162 | 38391 | 15325 | 30345 |
| 43389 | 58409 | 53820 | 16054 | 23917 | 26594 | 44190 | 29159 | 52769 | 55348 | 57899 | 46142 | 28010 | 23407 | 43708 | 51655 |
| 39643 | 50127 | 53658 | 42853 | 46384 | 31780 | 43922 | 52748 | 42477 | 38840 | 45874 | 24236 | 31270 | 59406 | 29815 | 40523 |
| 55369 | 57990 | 46275 | 27863 | 24450 | 29608 | 59648 | 40709 | 45793 | 50783 | 54538 | 27381 | 31136 | 52104 | 22513 | 40333 |
| 45839 | 51025 | 27483 | 40166 | 45772 | 28312 | 30877 | 22492 | 44802 | 47367 | 50649 | 57683 | 30264 | 47300 | 58512 | 53909 |
| 44095 | 29526 | 39786 | 50046 | 53563 | 16273 | 30341 | 36793 | 16031 | 24020 | 26571 | 29150 | 51574 | 42844 | 46361 | 31757 |
| 43827 | 50861 | 53496 | 57895 | 46194 | 28006 | 24355 | 43760 | 43451 | 52389 | 57519 | 38650 | 20462 | 23979 | 31489 | 52009 |
| 52491 | 57761 | 38836 | 15294 | 24288 | 29418 | 52424 | 59458 | 40252 | 42915 | 45494 | 54376 | 30946 | 51914 | 40143 | 44640 |
| 40519 | 45677 | 54534 | 28217 | 31020 | 52100 | 22397 | 40385 | 47205 | 58417 | 54052 | 16174 | 23925 | 26490 | 44422 | 29055 |
| 42894 | 45515 | 50645 | 27103 | 30260 | 48136 | 58396 | 53849 | 39875 | 50135 | 12285 | 29884 | 47626 | 52756 | 55377 | 57886 |
| 16083 | 26567 | 36603 | 30098 | 39406 | 50618 | 58128 | 46357 | 46171 | 27983 | 24346 | 43737 | 29616 | 57752 | 38813 | 45847 |
| 31809 | 43447 | 52329 | 57571 | 38646 | 23975 | 29581 | 52005 | 24265 | 31299 | 51819 | 40062 | 45780 | 28544 | 31109 | 51629 |
| 40304 | 42799 | 45434 | 54372 | 30830 | 51910 | 55427 | 42732 | 44327 | 39794 | 53862 | 44260 | 30237 | 40609 | 45739 | 50869 |
| 46249 | 27837 | 23528 | 16226 | 26486 | 44362 | 30003 | 39759 | 53728 | 27327 | 15850 | 26110 | 22459 | 43880 | 52499 | 57657 |
| 50971 | 27569 | 29936 | 40588 | 47622 | 50904 | 53469 | 57938 | 24184 | 29426 | 47246 | 52432 | 57562 | 38623 | 45685 | 23966 |
| 46167 | 24342 | 43733 | 29500 | 47488 | 57748 | 38865 | 15323 | 28449 | 31028 | 51996 | 40281 | 42902 | 45523 | 54349 | 28354 |
| 24261 | 29391 | 51815 | 55346 | 46616 | 28428 | 31049 | 43706 | 30919 | 51439 | 44613 | 48144 | 58628 | 54081 | 16203 | 26426 |
| 51681 | 42475 | 37886 | 24234 | 59432 | 30289 | 40493 | 45735 | 36835 | 39414 | 54434 | 31368 | 29913 | 44586 | 47151 | 52337 |
| 50809 | 53612 | 27379 | 15846 | 36814 | 22455 | 40331 | 43876 | 57467 | 38766 | 23871 | 43500 | 29589 | 39849 | 50109 | 42807 |

| | | | | | | | | | | | | | | |
|---|---|---|---|---|---|---|---|---|---|---|---|---|---|---|
| 23804 | 28259 | 30838 | 51806 | 55323 | 42740 | 46257 | 28069 | 36826 | 39391 | 43888 | 50894 | 54411 | 57956 | 61473 | 24416 |
| 23536 | 14330 | 51672 | 44370 | 39767 | 58438 | 54787 | 31273 | 44675 | 29546 | 47254 | 52552 | 57794 | 38855 | 15341 | 26553 |
| 59521 | 30056 | 40596 | 45726 | 51136 | 53701 | 27594 | 15823 | 55812 | 46606 | 54357 | 28250 | 30815 | 51447 | 42717 | 46472 |
| 43853 | 47384 | 61452 | 24157 | 44206 | 29399 | 39659 | 49919 | 28060 | 23513 | 16211 | 30279 | 36731 | 50799 | 54330 | 31376 |
| 53674 | 46848 | 28436 | 31057 | 43938 | 51577 | 42483 | 27879 | 51896 | 30145 | 40125 | 44594 | 47159 | 50665 | 57699 | 38774 |
| 24242 | 52378 | 59440 | 40501 | 45631 | 51041 | 53620 | 27499 | 43508 | 39857 | 58528 | 53925 | 16047 | 24036 | 26363 | 29166 |
| 15742 | 36822 | 40339 | 41980 | 45497 | 54407 | 28328 | 30893 | 52038 | 55555 | 42860 | 46377 | 27965 | 43915 | 55488 | 46282 |
| 22508 | 44559 | 29542 | 47194 | 52548 | 57678 | 54027 | 16289 | 27870 | 24219 | 31281 | 59417 | 30064 | 40716 | 45958 | 51032 |
| 26549 | 44425 | 39836 | 53960 | 46658 | 28246 | 31763 | 52283 | 53597 | 27602 | 15831 | 36351 | 43861 | 58881 | 61460 | 24389 |
| 58001 | 46468 | 28112 | 23509 | 14303 | 36727 | 54326 | 31260 | 44214 | 29519 | 39667 | 50151 | 53682 | 16280 | 30348 | 43834 |
| 51892 | 30029 | 40177 | 42686 | 45307 | 50661 | 27119 | 23482 | 52772 | 55393 | 57902 | 46187 | 27775 | 24362 | 43753 | 52610 |
| 44344 | 39741 | 58412 | 53865 | 16099 | 26359 | 44235 | 30114 | 57768 | 38829 | 45863 | 20473 | 27507 | 40526 | 45796 | 54303 |
| 39646 | 51082 | 53647 | 58144 | 46373 | 28017 | 43911 | 55372 | 28336 | 30901 | 51869 | 22516 | 40392 | 44567 | 47426 | 50652 |
| 46278 | 24215 | 29373 | 59413 | 40768 | 45898 | 51028 | 54545 | 57686 | 54035 | 16185 | 30253 | 44433 | 58501 | 53968 | 16090 |
| 27486 | 31003 | 51635 | 42905 | 28301 | 30936 | 44154 | 30467 | 26574 | 30091 | 52515 | 58121 | 46364 | 31816 | 43454 | 52448 |
| 39551 | 50987 | 53566 | 16276 | 30400 | 36796 | 39417 | 43830 | 57578 | 38639 | 23982 | 31492 | 52012 | 30037 | 40297 | 42918 |
| 50920 | 53485 | 57954 | 46183 | 24358 | 43749 | 47280 | 52494 | 45539 | 50557 | 27127 | 55434 | 48160 | 58420 | 53873 | 15995 |
| 57764 | 38881 | 15339 | 20469 | 25599 | 55810 | 46632 | 54355 | 26479 | 44243 | 30010 | 39878 | 51090 | 53655 | 27576 | 15805 |
| 28220 | 30841 | 51921 | 40388 | 42715 | 45518 | 28058 | 23455 | 29929 | 43807 | 52801 | 55380 | 57931 | 46174 | 24335 | 43740 |
| 16181 | 30305 | 44317 | 58441 | 53852 | 16086 | 36606 | 30087 | 29605 | 47257 | 57741 | 38872 | 45906 | 24268 | 31302 | 51822 |
| 40123 | 47633 | 50607 | 58117 | 46416 | 31812 | 43506 | 52332 | 55339 | 46721 | 28309 | 31168 | 51688 | 44386 | 39783 | 50995 |
| 57574 | 53923 | 24034 | 29640 | 52064 | 40293 | 42858 | 45423 | 30296 | 40612 | 45742 | 50928 | 53493 | 27386 | 15615 | 22462 |
| 27963 | 55430 | 46252 | 27896 | 23293 | 15991 | 44127 | 30006 | 43645 | 47400 | 52502 | 57660 | 38777 | 15347 | 24173 | 29415 |
| 40714 | 45984 | 50974 | 53595 | 27572 | 15857 | 29925 | 36825 | 43483 | 52421 | 57551 | 53914 | 46640 | 24011 | 28452 | 31073 |
| 43859 | 50893 | 54424 | 57927 | 61458 | 24387 | 44688 | 29545 | 52041 | 40284 | 42947 | 45526 | 31874 | 52394 | 59904 | 48133 |
| 47253 | 57793 | 38868 | 15326 | 30346 | 52770 | 55335 | 46605 | 58449 | 54084 | 16206 | 36838 | 29983 | 40355 | 45961 | 50615 |
| 28249 | 31052 | 43695 | 51684 | 42478 | 38827 | 20415 | 30292 | 27549 | 29916 | 47210 | 52340 | 57470 | 53819 | 23930 | 44217 |
| 40552 | 45794 | 50812 | 54329 | 27382 | 30899 | 51867 | 22514 | 29648 | 39852 | 50168 | 38397 | 42866 | 45431 | 28262 | 31779 |
| 40334 | 44593 | 47396 | 50650 | 57712 | 38773 | 15231 | 30251 | 52747 | 55326 | 58017 | 46260 | 28128 | 23525 | 14319 | 51661 |
| 43479 | 58499 | 53910 | 16060 | 24007 | 26600 | 29165 | 52037 | 44359 | 40722 | 45880 | 54790 | 31276 | 59524 | 29821 | 40641 |
| 55568 | 42831 | 46362 | 31758 | 43928 | 52390 | 57996 | 46281 | 45771 | 50901 | 54656 | 27359 | 31114 | 22491 | 44808 | 29553 |
| 27869 | 24456 | 31490 | 52010 | 30035 | 40239 | 45957 | 50555 | 47373 | 57689 | 30354 | 39662 | 50874 | 53439 | 46613 | 28481 |
| 27601 | 40172 | 47206 | 58418 | 53815 | 23926 | 44213 | 29532 | 31060 | 43703 | 51580 | 42486 | 38835 | 24231 | 52367 | 59429 |
| 39904 | 50164 | 53681 | 12286 | 15803 | 29871 | 43833 | 52743 | 40560 | 45690 | 51044 | 54561 | 27502 | 31019 | 52099 | 40342 |
| 55378 | 57901 | 46200 | 28012 | 24361 | 43738 | 29603 | 52609 | 42921 | 45500 | 54466 | 30952 | 44618 | 30259 | 47183 | 58395 |
| 57739 | 38814 | 45876 | 24266 | 31328 | 59464 | 40525 | 45767 | 54030 | 16292 | 23903 | 26608 | 44428 | 29173 | 39881 | 50141 |
| 54540 | 28307 | 31110 | 51630 | 22487 | 44804 | 47425 | 57685 | 42839 | 31766 | 47744 | 52286 | 58004 | 46289 | 28101 | 24464 |
| 30238 | 40610 | 50870 | 53491 | 16089 | 26573 | 30104 | 43643 | 29594 | 52018 | 40247 | 45853 | 54371 | 31305 | 51937 | 40180 |
| 52528 | 57658 | 38719 | 24171 | 43453 | 52419 | 57577 | 38652 | 42731 | 45310 | 28074 | 23471 | 44333 | 39800 | 53868 | 16102 |
| 45686 | 23981 | 28450 | 31015 | 51983 | 40282 | 42917 | 45552 | 44238 | 29879 | 40587 | 47649 | 50847 | 53706 | 57909 | 46432 |
| 54350 | 30948 | 51916 | 55433 | 44614 | 48131 | 58391 | 54082 | 28020 | 24369 | 43970 | 29499 | 52505 | 57747 | 24274 | 29432 |
| 16232 | 26492 | 44480 | 30009 | 39877 | 51089 | 27547 | 29914 | 59472 | 40533 | 45663 | 54548 | 28427 | 31006 | 51638 | 42908 |
| 47628 | 52338 | 57944 | 46173 | 24348 | 43263 | 29590 | 39850 | 45529 | 28360 | 30925 | 44143 | 30470 | 40506 | 50990 | 53611 |
| 50110 | 38395 | 45905 | 23791 | 31301 | 51821 | 55352 | 42727 | 16321 | 26581 | 36841 | 39420 | 43875 | 54440 | 61474 | 24179 |
| 46258 | 28070 | 23523 | 51659 | 44385 | 39796 | 54816 | 31274 | 44704 | 47269 | 52315 | 57585 | 38884 | 15342 | 23989 | 26554 |
| 59522 | 29819 | 40583 | 45741 | 50899 | 53702 | 27385 | 15852 | 29119 | 51991 | 42813 | 54358 | 28265 | 30844 | 51924 | 55441 |
| 22461 | 43854 | 29495 | 47371 | 52501 | 57631 | 24158 | 29428 | 42718 | 46235 | 28047 | 23514 | 16240 | 30308 | 44376 | 39773 |
| 47304 | 57564 | 53913 | 46611 | 24024 | 28423 | 31058 | 51578 | 58444 | 54793 | 31363 | 51883 | 30146 | 40126 | 47636 | 50666 |
| 42960 | 45525 | 28356 | 31873 | 52393 | 59427 | 40502 | 51042 | 58176 | 46405 | 43495 | 39858 | 53926 | 23799 | 29405 | 51829 |
| 53607 | 16205 | 36837 | 40368 | 41967 | 45498 | 54436 | 30894 | 55584 | 42623 | 46378 | 27966 | 23419 | 43944 | 51667 | 42489 |
| 22271 | 44588 | 47209 | 52311 | 57469 | 54056 | 16290 | 23929 | 27885 | 24248 | 31282 | 59418 | 30051 | 40479 | 45749 | 51019 |
| 26550 | 44426 | 29171 | 39823 | 50139 | 42865 | 28261 | 31792 | 53598 | 27617 | 15860 | 36828 | 40345 | 43862 | 47379 | 54413 |
| 52760 | 55325 | 58002 | 46231 | 28099 | 23510 | 14332 | 44372 | 58882 | 61447 | 24390 | 44677 | 29548 | 47312 | 57796 | 54145 |
| 40721 | 45851 | 54789 | 31247 | 51879 | 30030 | 40178 | 45784 | 16267 | 26527 | 55394 | 46664 | 28252 | 31769 | 43754 | 52401 |
| 50662 | 27596 | 31113 | 44331 | 39742 | 53866 | 44264 | 30353 | 57531 | 38830 | 20474 | 23039 | 16213 | 36733 | 41975 | 54332 |
| 39661 | 50873 | 53676 | 57907 | 46374 | 28018 | 23415 | 43940 | 28323 | 30902 | 51870 | 22503 | 40155 | 44596 | 47217 | 50639 |
| 51551 | 42485 | 24244 | 29374 | 52380 | 59414 | 40531 | 45689 | 57701 | 54064 | 16186 | 30254 | 44434 | 39831 | 58502 | 53955 |
| 51015 | 54546 | 27501 | 31032 | 52112 | 40341 | 42906 | 45471 | 16105 | 26365 | 30120 | 52992 | 55557 | 58122 | 46351 | 27995 |
| 54465 | 28302 | 30923 | 44617 | 30496 | 47196 | 58632 | 54029 | 43917 | 46284 | 24221 | 31255 | 51775 | 30038 | 40298 | 46016 |
| 16263 | 26579 | 36783 | 39418 | 53486 | 46660 | 31765 | 43750 | 50558 | 27604 | 31121 | 51641 | 44339 | 58407 | 53874 | 44272 |
| 47267 | 52285 | 57527 | 38882 | 20470 | 23987 | 29593 | 52017 | 30473 | 39669 | 51105 | 53684 | 27563 | 15806 | 29930 | 43836 |
| 42811 | 54384 | 28207 | 30842 | 51922 | 40151 | 42744 | 45309 | 52802 | 55367 | 57960 | 46189 | 24364 | 43727 | 29606 | 47258 |
| 28073 | 23484 | 16182 | 30306 | 44318 | 39771 | 58442 | 53839 | 52612 | 57742 | 38859 | 45921 | 20447 | 27509 | 55816 | 46722 |
| 16101 | 44237 | 30116 | 40600 | 47634 | 51084 | 53705 | 58118 | 54361 | 28310 | 30931 | 51451 | 44625 | 47428 | 58640 | 54037 |
| 46403 | 27991 | 43969 | 61568 | 24273 | 29403 | 51827 | 40294 | 16159 | 30283 | 36791 | 50915 | 53494 | 16092 | 30093 | 43646 |
| 45900 | 28440 | 31005 | 51637 | 42431 | 27883 | 23294 | 44156 | 47163 | 52517 | 57647 | 38778 | 24174 | 43512 | 52422 | 57580 |
| 30469 | 40505 | 45747 | 50989 | 53624 | 27559 | 15858 | 29926 | 53929 | 46627 | 24040 | 28215 | 31074 | 52042 | 40271 | 42976 |

| | | | | | | | | | | | | | | |
|---|---|---|---|---|---|---|---|---|---|---|---|---|---|---|
|45541|28081|55436|48134|58450|53847|15997|44245|29421|59461|55824|46618|54593|28430|31051|51683|
|30012|40832|45962|51092|53713|27550|15835|29903|42953|45532|31880|59434|30291|40495|50811|53614|
|43865|52327|57933|61464|24393|44218|29635|39615|16324|36844|30101|40361|43878|47395|50621|57655|
|50155|38398|45908|32256|52776|55341|58018|46247|24182|47328|52318|57588|53937|16059|24048|26543|
|27891|23526|51662|44388|40737|45867|50997|27455|29178|52050|40279|42872|45437|28268|31785|52865|
|29822|40642|45800|50902|54419|27388|30905|22520|55444|57995|46238|28106|23503|16229|44365|40728|
|44571|29554|47374|52560|57690|38751|15349|30369|45970|54796|31366|51886|29911|40171|47681|50431|
|43485|58505|53916|46614|24013|28482|31047|51567|57941|61696|24401|44450|29531|39847|50163|30360|
|42949|46480|31876|52396|59430|40547|50807|54562|52784|55349|57914|46143|28011|23422|43709|51670|
|31496|52128|30041|40357|42922|45487|50673|27131|42492|38841|45875|24237|31271|59407|30054|40538|
|47212|58424|53821|16055|23932|26595|44191|29174|45808|51022|54539|27620|31137|52105|40348|44803|
|39882|50142|53659|42868|46385|31781|43923|52749|47382|54472|61506|44736|30265|47301|58513|54148|
|55384|57991|46290|28102|24451|29609|59649|40724|16270|24021|26586|29151|51575|42845|31772|47274|
|45854|54848|31306|51938|40167|45773|28313|31116|52404|57534|38651|20463|23994|31504|52024|40253|
|22493|44334|29527|39787|50047|30356|40616|47650|42930|45495|54377|28326|30947|51915|40158|44641|
|50876|53497|57910|46195|28007|24370|43761|52506|47220|58656|54053|16175|26491|44423|39890|53958|
|57776|38837|15295|24289|29419|52425|59459|40534|16108|29885|47627|52757|55616|57887|46410|27998|
|45692|54535|28456|31021|52101|40400|42895|45530|24347|43976|29617|57753|24280|31314|51834|40063|
|54468|30926|44620|30261|48137|58397|54088|16322|45781|28545|31124|51644|44342|39795|58466|53863|
|26582|36842|30099|39407|50619|58129|31824|47270|44261|30476|40624|45754|51108|53729|27566|15851|26111|
|52344|57586|38647|23990|29596|52020|40305|42814|43881|56322|61480|24185|44682|29427|47247|52433|
|45435|54373|28266|30831|51911|55442|42733|46264|57563|38862|45924|23967|28464|31029|51997|42903|
|28076|23529|16227|26487|44363|39774|54794|31303|54364|28355|30934|51454|44628|48145|58629|54096|
|59528|29937|40589|47623|50905|53708|57939|46406|16218|30286|36850|39415|50918|54435|31369|30152|
|24343|43972|29501|47489|57749|24276|29406|51830|44587|47166|52576|57706|38767|43501|39864|53932|
|55347|46617|28429|31064|43707|51696|42490|37887|46630|23805|28274|30839|51807|55562|42741|46496|
|27886|24235|59433|30528|40508|45750|51048|53613|28084|23537|14331|51673|44371|58439|54802|31288|
|27618|15847|36815|40346|43877|47408|54414|61476|59536|30057|40597|45727|51137|53716|27595|15838|
|24181|44678|29311|47299|52317|57559|54146|16296|43868|47385|58888|61453|24396|44207|29638|39674|
|24019|26556|29177|52049|42843|28239|31770|52402|50158|53675|46849|28437|43939|55400|46306|27894|
|58008|46237|28105|23516|16214|36734|40251|45969|24243|52379|59441|40740|45870|51056|53621|27514|
|54319|31365|51885|30148|40184|44583|47218|50668|15743|36823|41981|54422|28329|30908|22509|44574|
|57702|54051|44449|39860|53984|16106|26366|29883|29543|47195|52549|57679|54042|16304|30372|44440|
|52755|55558|57913|46380|28024|23421|43918|14327|39837|58508|53961|46659|28247|32002|52522|58240|
|51669|42463|24222|31284|59420|30053|40537|45779|46469|28113|40550|54327|31261|51893|30044|40416|
|51021|54552|27591|31122|51642|44816|47381|58884|42687|45546|50676|27134|23483|44345|58413|53880|
|61505|44259|30474|39670|51106|53671|16269|26585|16114|26598|44250|30115|39647|51083|53662|58145|
|43823|55396|46190|24127|43756|47273|52375|57533|46388|31840|43926|52808|55373|58050|46279|24454|
|38888|45922|20476|23993|27510|31027|51995|42929|29612|59652|40769|45899|51029|27487|55458|46728|
|54362|28325|30960|51928|40157|44626|47191|58627|28316|30937|44155|30482|39790|51002|53567|16277|
|54038|16188|30312|44436|39889|58560|53957|16079|30401|36797|43831|50921|53500|57955|46198|24359|
|30094|47640|52518|58124|46409|27997|43499|53930|43764|47281|52495|57765|38896|15354|24292|29422|
|23803|31313|51833|40300|42739|45542|28082|23479|52428|59462|55811|46633|54594|28221|31080|52160|
|51615|44341|58465|53876|15998|44246|29999|40595|40389|42954|45519|28059|30320|48140|58456|53853|
|45753|51079|53714|27565|15864|29932|43866|52804|16087|36607|30102|40362|47872|50622|58132|46417|
|56321|57934|61451|24394|44681|29664|47260|57800|31813|43507|52333|57575|53938|24035|29641|52065|
|38861|45895|28435|55342|46724|28368|30933|51453|40308|42859|45438|31786|52866|55431|58024|46253|
|44151|40738|50998|53619|16217|30285|36849|41979|27897|23532|16230|44366|30007|40715|45985|50975|
|50917|54448|27375|30906|22507|44600|47165|52547|27573|29940|40648|47682|50908|54425|57942|61459|
|57705|38780|15350|30370|43486|39835|58506|53903|24402|44689|29560|47492|57808|38869|15327|30347|
|46629|24014|28273|31076|52044|55561|42950|46467|52771|55350|46620|28488|31053|43710|51685|42479|
|28055|48192|58452|54801|31259|51891|30042|40358|38842|24238|59436|30293|40553|45795|50813|54568|
|45964|50674|27608|15837|43391|58411|53822|23919|27383|31138|52106|22515|40335|44832|47397|50651|
|44220|29637|39673|50157|53688|42855|46386|31782|57713|30266|47302|58514|53911|16061|24022|26601|
|43952|52750|55371|58020|46305|27893|24480|29610|29180|52052|55569|42846|46363|31759|43929|52391|
|52616|59650|40711|45869|51027|27513|40644|45774|57997|46296|28108|24457|31491|52011|40254|45972|
|54421|28314|30879|22494|44573|29556|47432|57692|54378|31424|51944|40173|44642|47207|58419|54054|
|54041|16275|30343|36795|50863|53498|46672|28484|23927|44452|29533|39905|50165|12287|29886|47656|
|32001|43762|52521|57763|38838|24290|52426|59488|52758|55379|57916|46201|28013|24376|43739|29618|
|40549|45679|54564|28219|31022|52102|22399|40387|52624|57754|38815|45877|24267|31329|59465|40540|
|42924|45545|50647|27133|30262|48138|58398|53851|45782|54541|28546|31111|51631|44805|47440|61508|44262|
|16113|26597|44249|30128|39884|51096|53661|58130|30239|40611|50871|53730|16328|26588|30105|43882|
|46359|31811|43925|52331|58049|46292|24453|29583|52529|57659|24186|47276|52434|57592|38653|45687|
|52007|40306|45912|54374|31308|51940|55457|42734|23996|28451|31030|51998|40283|42932|45553|54351|
|46251|27839|23530|44392|30481|39789|51001|27571|28384|30949|51917|55448|44615|48146|58630|54083|
|29938|40590|47652|50906|53471|57968|46197|24372|16233|26493|44481|39892|54912|31370|29915|47629|
|43735|29502|47490|52508|57750|38867|15353|24263|52339|57945|46412|24349|43502|29591|39851|50111|

23806 31316 51836 55353 42742 46259 28071 23538
51674 44400 39797 58468 54817 31275 59523 30058
40598 45756 51138 53703 27624 15853 43855 47386
56324 61454 24159 44684 29429 47305 57565 54152
46850 24025 28438 31059 51579 42961 28357 31888
52408 59442 40503 51043 53622 16220 36852 40369
41982 45499 54437 28330 30895 22510 44589 47224
52550 57708 54057 16291 26551 44427 39838 53962
46688 28276 31793 52761 55564 58003 46470 28114
23511 14333 44373 54804 31262 51894 30031 40179
45785 50663 27597 31128 44346 39743 58414 53867
44265 30592 39676 51112 53677 58146 46375 28019
43941 55374 46308 24245 29375 52381 59415 40770
45928 51030 54547 27516 31033 52113 42907 54480
28303 30938 44632 30497 47197 58633 54044 16278
30402 36798 39419 50922 53487 46661 32004 43751
47282 52524 57766 38883 20471 55840 46634 54385
28222 30843 51923 40390 42745 45548 28088 23485
16183 30307 44319 58443 53854 16116 44252 30117
40601 47635 51085 53720 58119 46418 31814 43984
52334 58052 61569 24512 29642 52066 40295 45901
28441 55460 46254 27898 23295 44157 30484 40744
45986 51004 53625 27574 15859 29927 36827 43889
50895 54426 57957 61488 24417 44690 29547 47255
52553 57795 38870 15356 30376 60416 55813 46607
54596 28251 31054 51686 42956 46473 28061 30294
40554 50814 54331 31377 51897 30160 40364 44595
47398 50680 57714 38775 43509 58529 53940 16062
24037 26602 29167 52039 55570 42861 46392 31788
43930 52868 55489 57998 46283 27871 24458 31520
59656 30065 40717 45959 51033 27603 40174 47684
58896 61461 24404 44215 29534 39906 50166 53683
16281 30349 43835 52773 55408 57903 46202 28014
24363 43768 52611 57769 38844 45878 24296 31330
59466 40527 45797 54542 28337 31140 52108 22517
40393 44806 47427 50653 57687 30268 48256 58516
53969 16091 26575 30106 52530 58136 46365 31817
43455 52449 57579 38654 23983 31493 52013 40312
42919 45554 54380 30950 51918 55435 44644 48161
58421 54112 16234 26494 44482 30011 39879 51091
27577 29944 47630 52816 55381 57946 46175 24350
43741 29620 47496 57756 38873 45907 24269 31303
51823 55354 46736 28548 31169 51689 44387 39798
54818 59552 30297 40613 45743 50929 53732 27387
15854 22463 43884 47401 52503 57661 24188 29430
47306 52436 57566 53915 46641 24026 28453 31088
52056 40285 42962 45527 28358 31875 52395 59905
48148 58688 54085 16207 36839 40370 45976 54438
31372 29917 44590 47211 52341 57471 54058 23931
44456 29649 39853 50169 42867 28263 31794 52762
55327 58032 46261 28129 23540 14334 51676 44374
40723 45881 54791 31277 59525 30060 40656 45786
51140 54657 27598 31115 44809 47388 61512 44266 30355
39663 50875 53678 46852 28496 31061 43942 51581
42487 24246 52382 59444 40561 45691 51045 54576
27503 31034 52114 40343 42936 45501 54467 28332
30953 44619 30498 47198 58634 54031 16293 26609
44429 39896 53964 46662 31767 47745 52287 58005
46528 28116 24465 29595 52019 54386 31320 51952
40181 42746 45311 28075 23486 44348 39801 58472
53869 16103 44239 30118 40602 47664 51086 53707
58148 46433 28021 43971 56328 61570 24275 29433
59473 40772 45902 54549 28442 31007 51639 42909
28361 30940 44158 30471 40507 50991 53626 16336
30404 36856 39421 43890 50924 54441 57958 61475
24418 44705 47284 52554 57824 38885 15343 26555
55814 46636 54359 28280 30845 51925 55680 42719

46474 28062 23515 16241 30309 44377 58445 54808
31378 51898 30147 40127 47637 50667 58177 46420
43510 39859 58530 53927 24038 29644 52068 55585
42862 46379 27967 43945 55490 46312 27900 24249
31283 59419 30066 40718 45988 51034 53599 27632
15861 36829 43863 54428 58883 61462 24391 44692
29549 47313 57797 54160 16282 30350 52774 55395
46665 28253 32008 43755 52640 57770 38831 20475
40556 45798 54333 28338 30903 51871 22518 40394
44597 47456 50654 57716 54065 16187 30255 44435
58503 53970 16120 26604 30121 52993 55572 58123
46366 31818 43932 52450 58056 46285 24460 31494
52014 30039 40299 46017 50559 27605 55464 48162
58422 53875 44273 30488 39908 51120 53685 27578
15807 29931 43837 52803 55382 57961 46204 24365
43742 29607 47259 52613 57743 38874 45936 24270
31332 59468 55817 46723 54600 28311 31170 51690
44864 47429 58641 30298 40614 50930 53495 16093
30108 43647 47402 52532 57662 38779 24175 43513
52423 57581 53944 46642 24041 28454 31075 52043
40286 42977 45556 31904 52872 55437 59906 48135
58451 54086 16234 44484 30013 40833 45963 51093
27551 29918 47688 52342 57948 61465 24408 44219
29650 39854 50170 38399 45909 32257 52777 55356
58019 46262 28130 23527 51663 44389 40752 45882
54820 31278 59526 29823 40643 45801 50903 54658
27389 31144 22521 44810 29555 47375 52561 57691
30384 47308 58520 53917 46615 24028 28483 31062
51582 42964 46481 31877 52397 59431 40562 51046
54563 31497 52129 40372 42923 45502 54496 30954
44648 47213 58425 54060 16294 23933 26610 44430
29175 39883 50143 42869 31796 47746 52764 55385
58006 46291 28103 24466 29624 59664 40725 45855
54849 31307 51939 40182 45788 28552 31117 44335
39802 53870 44268 30357 40617 47651 50877 53736
57911 46434 28022 24371 44000 52507 57777 24304
29434 52440 59474 40535 45693 54550 28457 31036
52116 40401 42910 45531 54469 28362 30927 44621
30500 48152 58636 54089 16323 26583 36843 39422
54442 61952 31825 44706 47271 52345 57587 38886
23991 29597 52021 42815 54388 28267 30846 51926
55443 42748 46265 28077 23544 16242 30310 44378
39775 58446 54795 31393 59529 30176 40604 47638
51144 53709 58178 46407 43973 47504 61572 24277
29407 51831 55586 46856 28444 31065 43946 51697
42491 27887 24250 59448 30529 40509 45751 51049
53628 27619 15862 36830 40347 43892 47409 54415
58912 61477 24420 44679 29550 47314 52556 57798
54147 16297 26557 55872 46666 28254 31771 52403
58009 46476 28120 23517 16215 36735 54334 31380
51900 30149 40185 44598 47219 50669 57703 54066
44464 39861 58532 53985 16107 26367 30122 52994
55559 58152 46381 28025 43919 55492 46286 24223
31285 59421 30068 40776 46018 51036 54553 27606
31123 51643 44817 58885 61520 44274 30475 39671
51107 53686 16284 30408 43838 52832 55397 57962
46191 24366 43757 47288 52614 57772 38889 45923
20477 27511 55818 46752 54363 28340 30961 51929
40396 44627 47430 58642 54039 16189 30313 44437
58561 53972 16094 30095 47641 52519 58125 46424
31820 43514 52452 57582 53931 24042 31552 52072
40301 42978 45543 28083 55438 48164 58480 53877
15999 44247 30014 40834 45992 51094 53715 27580
15865 29933 43867 52805 56336 57935 61466 24395
44696 29665 47261 57801 38876 45910 32258 52778
55343 46725 28369 31172 51692 44390 40739 50999
30300 40672 45802 50932 54449 27390 30907 22522

| | | | | | | | | | | | | | | |
|---|---|---|---|---|---|---|---|---|---|---|---|---|---|---|
| 44601 | 47404 | 52562 | 57720 | 38781 | 15351 | 30371 | 43487 | 42494 | 38843 | 24239 | 59437 | 30532 | 40568 | 45810 | 51052 |
| 58507 | 53918 | 46644 | 24015 | 28512 | 31077 | 52045 | 55576 | 54569 | 27622 | 31139 | 52107 | 40350 | 44833 | 47412 | 54474 |
| 42951 | 46482 | 31878 | 52398 | 59908 | 48193 | 58453 | 55040 | 61536 | 44738 | 30267 | 47303 | 58515 | 54150 | 16300 | 24023 |
| 31498 | 52130 | 30043 | 40359 | 45965 | 50675 | 27609 | 47214 | 26616 | 29181 | 52053 | 42847 | 31774 | 47752 | 52306 | 58012 |
| 58426 | 53823 | 23934 | 44221 | 29652 | 39912 | 50172 | 53689 | 46297 | 28109 | 24472 | 31506 | 32026 | 40255 | 45973 | 54379 |
| 42870 | 46387 | 31783 | 43953 | 52751 | 55386 | 58021 | 46320 | 31425 | 51945 | 40188 | 44643 | 47222 | 58658 | 54055 | 44453 |
| 28132 | 24481 | 29611 | 52617 | 59651 | 40726 | 45884 | 54850 | 39920 | 53988 | 16110 | 29887 | 47657 | 52759 | 55618 | 57917 |
| 31336 | 59584 | 40645 | 45775 | 54660 | 28315 | 31118 | 22495 | 46440 | 28028 | 24377 | 43978 | 29619 | 52625 | 57755 | 24282 |
| 44812 | 29557 | 47433 | 57693 | 30358 | 40618 | 50878 | 53499 | 31344 | 59480 | 40541 | 45783 | 54556 | 28547 | 31126 | 51646 |
| 46673 | 28485 | 32016 | 43763 | 52536 | 57778 | 38839 | 24291 | 44820 | 47441 | 58944 | 61509 | 44263 | 30478 | 40626 | 51110 |
| 52427 | 59489 | 40564 | 45694 | 54565 | 28458 | 31023 | 52103 | 53731 | 16329 | 26589 | 43883 | 56352 | 61482 | 24187 | 44712 |
| 40402 | 42925 | 45560 | 54470 | 30956 | 44622 | 30263 | 48139 | 47277 | 52435 | 57593 | 38892 | 45926 | 23997 | 28466 | 31031 |
| 58399 | 54090 | 16352 | 26612 | 44488 | 30129 | 39885 | 51097 | 51999 | 42933 | 54366 | 28385 | 30964 | 51932 | 55449 | 44630 |
| 58131 | 31826 | 47748 | 52346 | 58064 | 46293 | 24468 | 29598 | 48147 | 58631 | 54098 | 16248 | 30316 | 44496 | 39893 | 58564 |
| 52022 | 40307 | 45913 | 54375 | 31309 | 51941 | 55472 | 42735 | 54913 | 31371 | 30154 | 47644 | 52578 | 58184 | 46413 | 43503 |
| 46266 | 28078 | 23531 | 44393 | 39804 | 54824 | 31394 | 59530 | 39866 | 53934 | 23807 | 31317 | 51837 | 55592 | 42743 | 46498 |
| 29939 | 40591 | 47653 | 50907 | 53710 | 57969 | 46436 | 24373 | 28086 | 23539 | 51675 | 44401 | 58469 | 54832 | 31290 | 59538 |
| 43974 | 29503 | 47491 | 52509 | 57751 | 24278 | 29436 | 59476 | 30059 | 40599 | 45757 | 51139 | 53718 | 27625 | 15868 | 43870 |
| 55825 | 46619 | 54608 | 28431 | 31066 | 51698 | 42968 | 45533 | 47387 | 56325 | 58890 | 61455 | 24398 | 44685 | 29668 | 47320 |
| 28364 | 31881 | 59435 | 30530 | 40510 | 51050 | 53615 | 16325 | 57804 | 54153 | 46851 | 28439 | 55402 | 46784 | 28372 | 31889 |
| 36845 | 40376 | 43879 | 47410 | 54444 | 61478 | 24183 | 44708 | 52409 | 59443 | 40742 | 51058 | 53623 | 16221 | 36853 | 41983 |
| 47329 | 52319 | 57589 | 54176 | 16298 | 24049 | 26558 | 29179 | 54452 | 28331 | 30910 | 22511 | 44604 | 47225 | 52551 | 57709 |
| 52051 | 42873 | 28269 | 31800 | 52880 | 55445 | 58010 | 46239 | 54072 | 16306 | 30374 | 44442 | 39839 | 58510 | 53963 | 46689 |
| 28107 | 23518 | 16244 | 44380 | 40729 | 45971 | 54797 | 31367 | 28277 | 32032 | 53000 | 55565 | 58242 | 46471 | 28115 | 48196 |
| 51887 | 30150 | 40186 | 47696 | 50670 | 58180 | 61697 | 44451 | 54805 | 31263 | 51895 | 30046 | 40418 | 46024 | 50678 | 27612 |
| 39862 | 53986 | 30361 | 52785 | 55588 | 57915 | 46382 | 28026 | 31129 | 44347 | 58415 | 53882 | 44280 | 30593 | 39677 | 51113 | 53692 |
| 23423 | 43948 | 51671 | 42493 | 24252 | 31286 | 59422 | 30055 | 58147 | 46390 | 31842 | 43956 | 52810 | 55375 | 58080 | 46309 |
| 40539 | 45809 | 51023 | 54554 | 27621 | 31152 | 52120 | 40349 | 24484 | 29614 | 52620 | 59654 | 40771 | 45929 | 51031 | 27517 |
| 44818 | 47383 | 54473 | 58886 | 61507 | 44737 | 30504 | 47316 | 55936 | 46730 | 54481 | 28318 | 30939 | 44633 | 30512 | 47436 |
| 58752 | 54149 | 16271 | 26587 | 55398 | 46668 | 31773 | 43758 | 58648 | 54045 | 16279 | 30403 | 36799 | 50923 | 53502 | 46676 |
| 47275 | 52405 | 57535 | 38890 | 20478 | 23995 | 31505 | 52025 | 32005 | 43766 | 47283 | 52525 | 57767 | 38898 | 24294 | 52430 |
| 42931 | 54392 | 28327 | 30962 | 51930 | 40159 | 44656 | 47221 | 59492 | 55841 | 46635 | 54624 | 28223 | 31082 | 52162 | 40391 |
| 58657 | 54068 | 16190 | 30314 | 44438 | 39891 | 58562 | 53959 | 42984 | 45549 | 28089 | 30322 | 48142 | 58458 | 53855 | 16117 |
| 16109 | 30124 | 47642 | 52996 | 55617 | 58126 | 46411 | 27999 | 44253 | 30132 | 40840 | 47874 | 51100 | 53721 | 58134 | 46419 |
| 43977 | 61576 | 24281 | 31315 | 51835 | 40302 | 46020 | 28560 | 31815 | 43985 | 52335 | 58053 | 61584 | 24513 | 29643 | 52067 |
| 31125 | 51645 | 44343 | 58467 | 53878 | 44276 | 30477 | 40625 | 40310 | 45916 | 32264 | 52896 | 55461 | 58026 | 46255 | 27899 |
| 45755 | 51109 | 53744 | 27567 | 15866 | 29934 | 43896 | 52806 | 23534 | 44396 | 30485 | 40745 | 45987 | 51005 | 27575 | 29942 |
| 56323 | 57964 | 61481 | 24424 | 44683 | 29666 | 47262 | 52672 | 40650 | 47712 | 50910 | 54427 | 57972 | 61489 | 24432 | 44691 |
| 57802 | 38863 | 45925 | 28465 | 55820 | 46726 | 54365 | 28370 | 29562 | 47494 | 52568 | 57810 | 38871 | 15357 | 30377 | 60417 |
| 30935 | 51455 | 44629 | 48384 | 58644 | 54097 | 16219 | 30287 | 55828 | 46622 | 54597 | 28490 | 31055 | 51687 | 42957 | 46488 |
| 36851 | 50919 | 54450 | 31384 | 30153 | 44602 | 47167 | 52577 | 31884 | 59438 | 30295 | 40555 | 50815 | 54570 | 31616 | 52136 |
| 57707 | 38782 | 43516 | 39865 | 58536 | 53933 | 46631 | 24044 | 30161 | 40365 | 44834 | 47399 | 50681 | 57715 | 47332 | 58544 |
| 28275 | 31078 | 52046 | 55563 | 42980 | 46497 | 28085 | 55496 | 53941 | 16063 | 24052 | 26603 | 29182 | 52054 | 55571 | 42876 |
| 48194 | 58454 | 54803 | 31289 | 59537 | 30072 | 40836 | 45966 | 46393 | 31789 | 43931 | 52869 | 55504 | 57999 | 46298 | 28110 |
| 51152 | 53717 | 27610 | 15839 | 43869 | 58889 | 61468 | 24397 | 24459 | 31521 | 59657 | 40732 | 45974 | 54856 | 31426 | 51946 |
| 44222 | 29639 | 39675 | 50159 | 53690 | 46864 | 32260 | 43954 | 40175 | 47685 | 58897 | 61700 | 24405 | 44454 | 29535 | 39907 |
| 52780 | 55401 | 58022 | 46307 | 27895 | 24482 | 52618 | 59680 | 50167 | 30364 | 47658 | 52788 | 55409 | 57918 | 46203 | 28015 |
| 40741 | 45871 | 51057 | 27515 | 40646 | 45804 | 54423 | 28344 | 24378 | 43769 | 52626 | 57784 | 38845 | 45879 | 24297 | 31331 |
| 30909 | 22524 | 44575 | 29558 | 47434 | 52564 | 57694 | 54043 | 59467 | 40542 | 45812 | 54543 | 28576 | 31141 | 52109 | 40408 |
| 16305 | 30373 | 44441 | 58509 | 53976 | 46674 | 28486 | 32003 | 44807 | 47442 | 54476 | 61510 | 44740 | 30269 | 48257 | 58517 |
| 52523 | 58241 | 46484 | 31936 | 52456 | 59490 | 40551 | 54566 | 54208 | 16330 | 26590 | 30107 | 52531 | 58137 | 31832 | 47278 |
| 31500 | 52132 | 30045 | 40417 | 42926 | 45547 | 50677 | 27135 | 52464 | 57594 | 38655 | 23998 | 31508 | 52028 | 40313 | 42934 |
| 48168 | 58428 | 53881 | 16115 | 26599 | 44251 | 30130 | 39886 | 45555 | 54381 | 28386 | 30951 | 51919 | 55450 | 44645 | 48176 |
| 51098 | 53663 | 58160 | 46389 | 31841 | 43927 | 52809 | 55388 | 58660 | 54113 | 16235 | 26495 | 44483 | 39894 | 54914 | 31400 |
| 58051 | 46294 | 24455 | 29613 | 59653 | 40784 | 45914 | 54852 | 29945 | 47631 | 52817 | 55620 | 57947 | 46414 | 24351 | 43980 |
| 31310 | 51942 | 55459 | 46729 | 28317 | 31176 | 44394 | 30483 | 29621 | 47497 | 57757 | 24284 | 31318 | 51838 | 55355 | 46737 |
| 39791 | 51003 | 30416 | 40620 | 47654 | 50936 | 53501 | 57970 | 28549 | 31184 | 51704 | 44402 | 39799 | 58470 | 54819 | 59553 |
| 46199 | 24374 | 43765 | 47520 | 52510 | 57780 | 38897 | 15355 | 30536 | 40628 | 45758 | 51168 | 53733 | 27626 | 15855 | 43885 |
| 24293 | 29423 | 52429 | 59463 | 55826 | 46648 | 54595 | 28460 | 47416 | 56326 | 61484 | 24189 | 44686 | 29431 | 47307 | 52437 |
| 31081 | 52161 | 40404 | 42955 | 45534 | 31882 | 59912 | 30321 | 57567 | 54154 | 46880 | 24027 | 28468 | 31089 | 52057 | 42963 |
| 48141 | 58457 | 54092 | 16326 | 36846 | 30103 | 40363 | 47873 | 28359 | 31890 | 52410 | 59920 | 48149 | 58689 | 54100 | 16222 |
| 50623 | 58133 | 31828 | 47330 | 52348 | 57590 | 53939 | 24050 | 36854 | 40371 | 45977 | 54439 | 31373 | 30156 | 44591 | 47226 |
| 29656 | 52080 | 40309 | 42874 | 45439 | 28270 | 31787 | 52867 | 52580 | 57710 | 54059 | 44457 | 39868 | 53992 | 46690 | 28278 |
| 55446 | 58025 | 46268 | 28136 | 23533 | 16231 | 44367 | 40730 | 31795 | 52763 | 55566 | 58033 | 46500 | 28144 | 23541 | 14335 |
| 46000 | 54798 | 31396 | 59532 | 29941 | 40649 | 47683 | 50909 | 51677 | 44375 | 54806 | 31292 | 59540 | 30061 | 40657 | 45787 |
| 54664 | 57943 | 61698 | 24403 | 44928 | 29561 | 47493 | 57809 | 51141 | 54672 | 27599 | 31130 | 44824 | 47389 | 58892 | 61513 |
| 30362 | 52786 | 55351 | 46621 | 28489 | 31068 | 43711 | 51700 | 44267 | 30594 | 39678 | 51114 | 53679 | 46853 | 28497 | 43943 |

| | | | | | | | | | | | | | |
|---|---|---|---|---|---|---|---|---|---|---|---|---|---|
| 55404 | 46310 | 24247 | 52383 | 59445 | 40800 | 45930 | 51060 | 24300 | 31334 | 59470 | 55819 | 46753 | 54602 | 28341 | 31200 |
| 54577 | 27518 | 31035 | 52115 | 42937 | 54482 | 28333 | 30968 | 52168 | 40397 | 44866 | 47431 | 58643 | 30328 | 48260 | 58576 |
| 44634 | 30499 | 47199 | 58635 | 54046 | 16308 | 30432 | 44444 | 53973 | 16095 | 30110 | 47880 | 52534 | 58140 | 46425 | 31821 |
| 39897 | 58568 | 53965 | 46663 | 32006 | 47760 | 52526 | 58244 | 43515 | 52453 | 57583 | 53946 | 24043 | 31553 | 52073 | 40316 |
| 46529 | 28117 | 55842 | 54387 | 31321 | 51953 | 40420 | 42747 | 42979 | 45558 | 31906 | 52874 | 55439 | 59936 | 48165 | 58481 |
| 45550 | 28090 | 23487 | 44349 | 58473 | 53884 | 16118 | 44254 | 54116 | 16238 | 44486 | 30015 | 40835 | 45993 | 51095 | 27581 |
| 30119 | 40603 | 47665 | 51087 | 53722 | 58149 | 46448 | 31844 | 29948 | 47690 | 52820 | 56337 | 57950 | 61467 | 24410 | 44697 |
| 43986 | 52812 | 56329 | 58054 | 61571 | 24514 | 29672 | 59712 | 29680 | 47500 | 57816 | 38877 | 45911 | 32259 | 52779 | 55358 |
| 40773 | 45903 | 28443 | 55462 | 46732 | 28376 | 30941 | 44159 | 46740 | 28608 | 31173 | 51693 | 44391 | 40754 | 54822 | 59556 |
| 30486 | 40746 | 51006 | 53627 | 16337 | 30405 | 36857 | 43891 | 30301 | 40673 | 45803 | 50933 | 54688 | 27391 | 31146 | 22523 |
| 50925 | 54456 | 57959 | 61490 | 24419 | 44720 | 47285 | 52555 | 44840 | 47405 | 52563 | 57721 | 30386 | 47310 | 58522 | 53919 |
| 57825 | 38900 | 15358 | 30378 | 60418 | 55815 | 46637 | 54598 | 46645 | 24030 | 28513 | 31092 | 52060 | 55577 | 42966 | 46483 |
| 28281 | 31084 | 52164 | 55681 | 42958 | 46475 | 28063 | 30324 | 31879 | 52399 | 59909 | 48208 | 58692 | 55041 | 31499 | 52131 |
| 48200 | 58460 | 54809 | 31379 | 51899 | 30162 | 40366 | 47876 | 40374 | 45980 | 54498 | 31432 | 44650 | 47215 | 58427 | 54062 |
| 50682 | 58192 | 46421 | 43511 | 58531 | 53942 | 24039 | 29645 | 23935 | 44460 | 29653 | 39913 | 50173 | 42871 | 31798 | 47776 |
| 52069 | 55600 | 42863 | 46394 | 31790 | 43960 | 52870 | 55491 | 52766 | 55387 | 58036 | 46321 | 28133 | 24496 | 29626 | 52632 |
| 58028 | 46313 | 27901 | 24488 | 31522 | 59658 | 30067 | 40719 | 59666 | 40727 | 45885 | 54851 | 31337 | 59585 | 40660 | 45790 |
| 45989 | 51035 | 27633 | 40652 | 47686 | 54429 | 58898 | 61463 | 54661 | 28554 | 31119 | 44813 | 47448 | 61516 | 44270 | 30359 |
| 24406 | 44693 | 29564 | 47552 | 57812 | 54161 | 16283 | 30351 | 40619 | 50879 | 53738 | 46912 | 28500 | 32017 | 44002 | 52537 |
| 52775 | 55410 | 46680 | 28492 | 32009 | 43770 | 52641 | 57771 | 57779 | 24306 | 52442 | 59504 | 40565 | 45695 | 54580 | 28459 |
| 38846 | 24298 | 59496 | 40557 | 45799 | 54572 | 28339 | 31142 | 31038 | 52118 | 40403 | 42940 | 45561 | 54471 | 28392 | 30957 |
| 52110 | 22519 | 40395 | 44836 | 47457 | 50655 | 57717 | 30270 | 44623 | 30502 | 48154 | 58638 | 54091 | 16353 | 26613 | 44489 |
| 48258 | 58518 | 53971 | 16121 | 26605 | 30136 | 53008 | 55573 | 39900 | 54920 | 61954 | 31827 | 47749 | 52347 | 58065 | 46532 |
| 58138 | 46367 | 31819 | 43933 | 52451 | 58057 | 46300 | 24461 | 24469 | 29599 | 52023 | 54390 | 31324 | 51956 | 55473 | 42750 |
| 31495 | 52015 | 40314 | 46032 | 54382 | 31428 | 51948 | 55465 | 46267 | 28079 | 23546 | 44408 | 39805 | 58476 | 54825 | 31395 |
| 44646 | 48163 | 58423 | 54114 | 44512 | 30489 | 39909 | 51121 | 59531 | 30178 | 40606 | 47668 | 51146 | 53711 | 58208 | 46437 |
| 27579 | 29946 | 47660 | 52818 | 55383 | 57976 | 46205 | 24380 | 43975 | 47506 | 56332 | 61574 | 24279 | 29437 | 59477 | 56064 |
| 43743 | 29622 | 47498 | 52628 | 57758 | 38875 | 45937 | 24271 | 46858 | 54609 | 28446 | 31067 | 51699 | 42969 | 28365 | 31896 |
| 31333 | 59469 | 55832 | 46738 | 54601 | 28550 | 31171 | 51691 | 59450 | 30531 | 40511 | 51051 | 53630 | 16340 | 36860 | 40377 |
| 44865 | 47444 | 62464 | 59554 | 30299 | 40615 | 50931 | 53734 | 43894 | 47411 | 54445 | 58914 | 61479 | 24422 | 44709 | 47344 |
| 16332 | 30109 | 43886 | 47403 | 52533 | 57663 | 24190 | 47336 | 52558 | 57828 | 54177 | 16299 | 26559 | 55874 | 46696 | 28284 |
| 52438 | 57596 | 53945 | 46643 | 24056 | 28455 | 31090 | 52058 | 31801 | 52881 | 55684 | 58011 | 46478 | 28122 | 23519 | 16245 |
| 40287 | 42992 | 45557 | 28388 | 31905 | 52873 | 55452 | 59907 | 44381 | 54812 | 31382 | 51902 | 30151 | 40187 | 47697 | 50671 |
| 48150 | 58690 | 54087 | 16237 | 44485 | 40848 | 45978 | 54916 | 58181 | 61712 | 44466 | 39863 | 58534 | 53987 | 30600 | 53024 |
| 31374 | 29919 | 47689 | 52343 | 57949 | 61704 | 24409 | 44458 | 55589 | 58154 | 46383 | 28027 | 43949 | 55494 | 46316 | 24253 |
| 29651 | 39855 | 50171 | 32272 | 52792 | 55357 | 58034 | 46263 | 31287 | 59423 | 30070 | 40778 | 46048 | 51038 | 54555 | 27636 |
| 28131 | 23542 | 51678 | 44404 | 40753 | 45883 | 54821 | 31279 | 31153 | 52121 | 44819 | 54488 | 58887 | 61522 | 44752 | 30505 |
| 59527 | 30062 | 40658 | 45816 | 51142 | 54659 | 27628 | 31145 | 44811 | 47317 | 58753 | 54164 | 16286 | 30410 | 52834 | 55399 | 46669 |
| 47390 | 56384 | 61514 | 44744 | 30385 | 47309 | 58521 | 54156 | 32012 | 43759 | 47290 | 52644 | 57774 | 38891 | 20479 | 55848 |
| 46854 | 24029 | 28498 | 31063 | 51583 | 42965 | 31892 | 52412 | 46754 | 54393 | 28342 | 30963 | 51931 | 40398 | 44657 | 47460 |
| 59446 | 40563 | 51047 | 54578 | 31512 | 52144 | 40373 | 42938 | 58672 | 54069 | 16191 | 30315 | 44439 | 58563 | 53974 | 16124 |
| 45503 | 54497 | 28334 | 30955 | 44649 | 47228 | 58664 | 54061 | 30125 | 47643 | 52997 | 55632 | 58127 | 46426 | 31822 | 43992 |
| 16295 | 26611 | 44431 | 39898 | 53966 | 46692 | 31797 | 47747 | 52454 | 58060 | 61577 | 24520 | 31554 | 52074 | 40303 | 46021 |
| 52765 | 55624 | 58007 | 46530 | 28118 | 24467 | 29625 | 59665 | 28561 | 55468 | 48166 | 58482 | 53879 | 44277 | 30492 | 40864 |
| 54864 | 31322 | 51954 | 40183 | 45789 | 28553 | 31132 | 44350 | 45994 | 51124 | 53745 | 27582 | 15867 | 29935 | 43897 | 52807 |
| 39803 | 58474 | 53871 | 44269 | 30596 | 40632 | 47666 | 51116 | 56338 | 57965 | 61496 | 24425 | 44698 | 29667 | 47263 | 52673 |
| 53737 | 58150 | 46435 | 28023 | 44001 | 56330 | 61600 | 24305 | 57803 | 38878 | 45940 | 32288 | 60424 | 55821 | 46727 | 54604 |
| 29435 | 52441 | 59475 | 40774 | 45932 | 54551 | 28472 | 31037 | 28371 | 31174 | 51694 | 44868 | 48385 | 58645 | 30302 | 40674 |
| 52117 | 42911 | 54484 | 28363 | 30942 | 44636 | 30501 | 48153 | 50934 | 54451 | 31385 | 30168 | 44603 | 47406 | 52592 | 57722 |
| 58637 | 54104 | 16338 | 30406 | 36858 | 39423 | 50926 | 54443 | 38783 | 43517 | 58537 | 53948 | 46646 | 24045 | 28514 | 31079 |
| 61953 | 32064 | 44707 | 47286 | 52584 | 57826 | 38887 | 55844 | 52047 | 55578 | 42981 | 46512 | 31908 | 52876 | 55497 | 59910 |
| 46638 | 54389 | 28282 | 30847 | 51927 | 55682 | 42749 | 46504 | 48195 | 58455 | 55042 | 31528 | 59776 | 30073 | 40837 | 45967 |
| 28092 | 23545 | 16243 | 30311 | 44379 | 58447 | 54810 | 31408 | 51153 | 27611 | 47692 | 58904 | 61469 | 24412 | 44223 | 29654 |
| 59544 | 30177 | 40605 | 47639 | 51145 | 53724 | 58179 | 46422 | 39914 | 50174 | 53691 | 46865 | 32261 | 43955 | 52781 | 55416 |
| 43988 | 47505 | 59008 | 61573 | 24516 | 29646 | 52070 | 55587 | 58023 | 46322 | 28134 | 24483 | 52619 | 59681 | 40756 | 45886 |
| 46857 | 28445 | 43947 | 55520 | 46314 | 27902 | 24251 | 59449 | 54880 | 31338 | 59586 | 40647 | 45805 | 54662 | 28345 | 31148 |
| 30544 | 40748 | 45990 | 51064 | 53629 | 27634 | 15863 | 36831 | 22525 | 44814 | 29559 | 47435 | 52565 | 57695 | 30388 | 48264 |
| 43893 | 54430 | 58913 | 61492 | 24421 | 44694 | 29551 | 47315 | 58524 | 53977 | 46675 | 28487 | 32018 | 52538 | 58256 | 46485 |
| 52557 | 57799 | 54162 | 16312 | 30380 | 60420 | 55873 | 46667 | 31937 | 52457 | 59491 | 40566 | 54567 | 31501 | 52133 | 40432 |
| 28255 | 32010 | 52642 | 58248 | 46477 | 28121 | 40558 | 54335 | 42927 | 45562 | 54500 | 30958 | 44652 | 48169 | 58429 | 54120 |
| 31381 | 51901 | 30164 | 40424 | 44599 | 47458 | 50684 | 57718 | 16354 | 26614 | 44490 | 30131 | 39887 | 51099 | 58161 | 31856 |
| 54067 | 44465 | 58533 | 54000 | 16122 | 26606 | 30123 | 52995 | 47750 | 52824 | 55389 | 58066 | 46295 | 24470 | 29628 | 59668 |
| 55574 | 54853 | 16396 | 31848 | 43934 | 52928 | 55493 | 58058 | 40785 | 45915 | 54853 | 31311 | 51943 | 55474 | 46744 | 28556 |
| 46287 | 24462 | 31524 | 59660 | 30069 | 40777 | 46019 | 51037 | 31177 | 44395 | 39806 | 54826 | 59560 | 30417 | 40621 | 47655 |
| 27607 | 55466 | 48640 | 58900 | 61521 | 44275 | 30490 | 39910 | 50937 | 53740 | 57971 | 46438 | 24375 | 44004 | 47521 | 52511 |
| 51122 | 53687 | 16285 | 30409 | 43839 | 52833 | 55412 | 57963 | 57781 | 24308 | 29438 | 52444 | 59478 | 55827 | 46649 | 54610 |
| 46206 | 24367 | 43772 | 47289 | 52615 | 57773 | 38904 | 45938 | 28461 | 31096 | 52176 | 40405 | 42970 | 45535 | 28366 | 31883 |

| | | | | | | | | | | | | | | |
|---|---|---|---|---|---|---|---|---|---|---|---|---|---|---|
| 59913 | 30560 | 48156 | 58696 | 54093 | 16327 | 36847 | 40378 | 55567 | 58272 | 46501 | 28145 | 55500 | 48198 | 54807 | 31293 |
| 47888 | 54446 | 61956 | 31829 | 44710 | 47331 | 52349 | 57591 | 59541 | 30076 | 40896 | 46026 | 51156 | 54673 | 27614 | 31131 |
| 54178 | 24051 | 29657 | 52081 | 42875 | 28271 | 31802 | 52882 | 44825 | 58893 | 61528 | 44282 | 30595 | 39679 | 51115 | 53694 |
| 55447 | 58040 | 46269 | 28137 | 23548 | 16246 | 44382 | 40731 | 46868 | 32320 | 43958 | 52840 | 55405 | 58082 | 46311 | 24486 |
| 46001 | 54799 | 31397 | 59533 | 30180 | 40664 | 47698 | 51148 | 52622 | 59684 | 40801 | 45931 | 51061 | 27519 | 55938 | 46760 |
| 54665 | 58182 | 61699 | 44929 | 47508 | 61632 | 30363 | 52787 | 54483 | 28348 | 30969 | 44635 | 30514 | 47438 | 58650 | 54047 |
| 55590 | 46860 | 28504 | 31069 | 43950 | 51701 | 42495 | 24254 | 16309 | 30433 | 44445 | 58569 | 53980 | 46678 | 32007 | 47761 |
| 59452 | 30533 | 40569 | 45811 | 51053 | 54584 | 27623 | 31154 | 52527 | 58245 | 46544 | 31940 | 52460 | 59494 | 55843 | 54626 |
| 52122 | 40351 | 44848 | 47413 | 54475 | 58916 | 61537 | 44739 | 31560 | 52192 | 40421 | 42986 | 45551 | 28091 | 48172 | 58488 |
| 30506 | 47318 | 58754 | 54151 | 16301 | 26617 | 55876 | 46670 | 53885 | 16119 | 44255 | 30134 | 40842 | 47904 | 51102 | 53723 |
| 31775 | 47753 | 52407 | 58013 | 46536 | 28124 | 24473 | 31507 | 58164 | 46449 | 31845 | 43987 | 52813 | 56344 | 58055 | 61586 |
| 52027 | 54394 | 31440 | 51960 | 40189 | 44658 | 47223 | 58659 | 24515 | 29673 | 59713 | 40788 | 45918 | 32266 | 52898 | 55463 |
| 54070 | 44468 | 39921 | 58592 | 53989 | 16111 | 30126 | 47672 | 46733 | 28377 | 31180 | 44398 | 30487 | 40747 | 51007 | 30420 |
| 52998 | 55619 | 58156 | 46441 | 28029 | 43979 | 56448 | 61578 | 40680 | 47714 | 50940 | 54457 | 57974 | 61491 | 24434 | 44721 |
| 24283 | 31345 | 59481 | 40780 | 46022 | 54557 | 28562 | 31127 | 47524 | 52570 | 57840 | 38901 | 15359 | 30379 | 60419 | 55830 |
| 51647 | 44821 | 58945 | 61524 | 44278 | 30479 | 40627 | 51111 | 53746 | 46652 | 54599 | 28520 | 31085 | 52165 | 55696 | 42959 | 46490 |
| 16344 | 30412 | 43898 | 52836 | 56353 | 57966 | 61483 | 24426 | 31886 | 59916 | 30325 | 48201 | 58461 | 55048 | 31618 | 52138 |
| 44713 | 47292 | 52674 | 57832 | 38893 | 45927 | 28467 | 55822 | 30163 | 40367 | 47877 | 50683 | 58193 | 47334 | 58546 | 53943 |
| 46756 | 54367 | 28400 | 30965 | 51933 | 55688 | 44631 | 48386 | 24054 | 29660 | 52084 | 55601 | 42878 | 46395 | 31791 | 43961 |
| 58646 | 54099 | 16249 | 30317 | 44497 | 58565 | 54928 | 31386 | 52871 | 55506 | 58029 | 46328 | 28140 | 24489 | 31523 | 59659 |
| 30155 | 47645 | 52579 | 58185 | 46428 | 43518 | 39867 | 58538 | 40734 | 46004 | 54858 | 31456 | 59592 | 40653 | 47687 | 54668 |
| 53935 | 24046 | 31556 | 52076 | 55593 | 42982 | 46499 | 28087 | 58899 | 61702 | 24407 | 44932 | 29565 | 47553 | 57813 | 30366 |
| 55498 | 48224 | 58484 | 54833 | 31291 | 59539 | 30074 | 40828 | 52790 | 55411 | 46681 | 28493 | 32024 | 43771 | 52656 | 57786 |
| 45996 | 51154 | 53719 | 27640 | 15869 | 43871 | 56340 | 58891 | 38847 | 24299 | 59497 | 40572 | 45814 | 54573 | 28578 | 31143 | 52111 |
| 61470 | 24399 | 44700 | 29669 | 47321 | 57805 | 54168 | 46866 | 40410 | 44837 | 47472 | 54478 | 61540 | 44742 | 30271 | 48259 |
| 32262 | 52782 | 55403 | 46785 | 28373 | 32128 | 52648 | 59682 | 58519 | 54210 | 16360 | 26620 | 30137 | 53009 | 58139 | 31834 |
| 40743 | 51059 | 40676 | 45806 | 54453 | 28346 | 30911 | 22526 | 47756 | 52466 | 58072 | 46301 | 24476 | 31510 | 52030 | 40315 |
| 44605 | 47464 | 52566 | 57724 | 54073 | 16307 | 30375 | 44443 | 46033 | 54383 | 31429 | 51949 | 55480 | 44647 | 48178 | 58662 |
| 58511 | 53978 | 46704 | 28516 | 32033 | 53001 | 55580 | 58243 | 54115 | 44513 | 39924 | 54944 | 31402 | 29947 | 47661 | 52819 |
| 46486 | 31938 | 52458 | 59968 | 48197 | 55044 | 31502 | 52134 | 55622 | 57977 | 46444 | 24381 | 43982 | 29623 | 47499 | 52629 |
| 30047 | 40419 | 46025 | 50679 | 27613 | 48170 | 58430 | 53883 | 57759 | 24286 | 31348 | 59484 | 55833 | 46739 | 54616 | 28551 |
| 44281 | 30608 | 39916 | 51128 | 53693 | 58162 | 46391 | 31843 | 31186 | 51706 | 44880 | 47445 | 58948 | 62465 | 59555 | 30538 |
| 43957 | 52811 | 55390 | 58081 | 46324 | 24485 | 29615 | 52621 | 40630 | 51170 | 53735 | 16333 | 43887 | 47418 | 56356 | 61486 |
| 59655 | 40786 | 45944 | 54854 | 31340 | 59588 | 55937 | 46731 | 24191 | 44716 | 47337 | 52439 | 57597 | 54184 | 46882 | 24057 |
| 54720 | 28319 | 31178 | 44872 | 30513 | 47437 | 58649 | 30418 | 28470 | 31091 | 52059 | 42993 | 28389 | 31920 | 52888 | 55453 |
| 40622 | 50938 | 53503 | 46677 | 32020 | 43767 | 47522 | 52540 | 59922 | 48151 | 58691 | 54102 | 16252 | 44500 | 40849 | 45979 |
| 57782 | 38899 | 24295 | 52431 | 59493 | 55856 | 46650 | 54625 | 54917 | 31375 | 30158 | 47704 | 52582 | 58188 | 61705 | 44459 |
| 28462 | 31083 | 52163 | 40406 | 42985 | 45564 | 31912 | 59914 | 39870 | 53994 | 32273 | 52793 | 55596 | 58035 | 46502 | 28146 |
| 30323 | 48143 | 58459 | 54094 | 16356 | 44492 | 30133 | 40841 | 23543 | 51679 | 44405 | 54836 | 31294 | 59542 | 30063 | 40659 |
| 47875 | 51101 | 58135 | 31830 | 47808 | 52350 | 58068 | 61585 | 45817 | 51143 | 54674 | 27629 | 31160 | 44826 | 47391 | 56385 |
| 24528 | 29658 | 52082 | 40311 | 45917 | 32265 | 52897 | 55476 | 58894 | 61515 | 44745 | 30624 | 47324 | 58760 | 54157 | 46855 |
| 58027 | 46270 | 28138 | 23535 | 44397 | 40760 | 46002 | 54828 | 28499 | 55406 | 46788 | 31893 | 52413 | 59447 | 40802 | 51062 |
| 31398 | 59534 | 29943 | 40651 | 47713 | 50911 | 54666 | 57973 | 54579 | 31513 | 52145 | 42939 | 54512 | 28335 | 30970 | 44664 |
| 61728 | 24433 | 44930 | 29563 | 47495 | 52569 | 57811 | 30392 | 47229 | 58665 | 54076 | 16310 | 30434 | 44446 | 39899 | 58570 |
| 60432 | 55829 | 46623 | 54612 | 28491 | 31070 | 51702 | 42972 | 53967 | 46693 | 32036 | 47762 | 53004 | 55625 | 58246 | 46531 |
| 46489 | 31885 | 59439 | 30534 | 40570 | 51054 | 54571 | 31617 | 28119 | 63488 | 54865 | 31323 | 51955 | 40422 | 46028 | 28568 |
| 52137 | 40380 | 44835 | 47414 | 54504 | 61538 | 44768 | 47333 | 31133 | 44351 | 58475 | 53886 | 44284 | 30597 | 40633 | 47667 | 51117 |
| 58545 | 54180 | 16302 | 24053 | 26618 | 29183 | 52055 | 42877 | 53752 | 58151 | 46450 | 31846 | 44016 | 52814 | 56331 | 58084 |
| 31804 | 47754 | 52884 | 55505 | 58014 | 46299 | 28111 | 24474 | 61601 | 24544 | 29674 | 52680 | 59714 | 40775 | 45933 | 28473 |
| 31536 | 59672 | 40733 | 45975 | 54857 | 31427 | 51947 | 40190 | 55940 | 46734 | 54485 | 28378 | 30943 | 44637 | 30516 | 48392 |
| 47700 | 59136 | 61701 | 44455 | 39922 | 53990 | 30365 | 47659 | 58652 | 54105 | 16339 | 30407 | 36859 | 50927 | 54458 | 61968 |
| 52789 | 55648 | 57919 | 46442 | 28030 | 24379 | 44008 | 52627 | 32065 | 44722 | 47287 | 52585 | 57827 | 38902 | 60448 | 55845 |
| 57785 | 24312 | 31346 | 59482 | 40543 | 45813 | 54558 | 28577 | 46639 | 54628 | 28283 | 31086 | 52166 | 55683 | 42988 | 46505 |
| 31156 | 52124 | 40409 | 44822 | 47443 | 54477 | 58946 | 61511 | 28093 | 30326 | 48202 | 58462 | 54811 | 31409 | 59545 | 30192 |
| 44741 | 30508 | 48272 | 58756 | 54209 | 16331 | 26591 | 56354 | 40844 | 47878 | 51160 | 53725 | 58194 | 46423 | 43989 | 59009 |
| 61960 | 31833 | 44714 | 47279 | 52465 | 57595 | 38894 | 23999 | 61588 | 24517 | 29647 | 52071 | 55602 | 46872 | 32268 | 43962 |
| 31509 | 52029 | 42935 | 54396 | 28387 | 30966 | 51934 | 55451 | 52900 | 55521 | 58030 | 46315 | 27903 | 24490 | 59688 | 30545 |
| 44660 | 48177 | 58661 | 54128 | 16250 | 30318 | 44498 | 39895 | 40749 | 45991 | 51065 | 27635 | 40654 | 47716 | 54431 | 58928 |
| 58566 | 54915 | 31401 | 30184 | 47646 | 53056 | 55621 | 58186 | 61493 | 24436 | 44695 | 29566 | 47554 | 52572 | 57814 | 54163 |
| 46415 | 43981 | 47512 | 61580 | 24285 | 31319 | 51839 | 55594 | 16313 | 30381 | 60421 | 55888 | 46682 | 28494 | 32011 | 52643 |
| 46976 | 28564 | 31185 | 51705 | 44403 | 58471 | 54834 | 59568 | 58249 | 46492 | 31944 | 59498 | 40559 | 54574 | 31620 | 52140 |
| 30537 | 40629 | 45759 | 51169 | 53748 | 27627 | 15870 | 43900 | 30165 | 40425 | 44838 | 47459 | 50685 | 57719 | 48288 | 58548 |
| 47417 | 56327 | 58920 | 61485 | 24428 | 44687 | 29670 | 47263 | 54001 | 16123 | 26607 | 30138 | 53010 | 55575 | 58168 | 46397 |
| 52676 | 57806 | 54155 | 46881 | 28469 | 55880 | 46786 | 28374 | 31849 | 43935 | 52929 | 55508 | 58059 | 46302 | 24463 | 31525 |
| 31891 | 52411 | 59921 | 48388 | 58704 | 54101 | 16223 | 36855 | 59661 | 40792 | 46034 | 54860 | 31430 | 51950 | 55467 | 48641 |
| 54454 | 31388 | 30157 | 44606 | 47227 | 52581 | 57711 | 54074 | 58901 | 61760 | 44514 | 30491 | 39911 | 51123 | 30424 | 47662 |
| 44472 | 39869 | 58540 | 53993 | 46691 | 28279 | 32034 | 53002 | 52848 | 55413 | 57978 | 46207 | 24382 | 43773 | 47528 | 52630 |

| | | | | | | | | | | | | | |
|---|---|---|---|---|---|---|---|---|---|---|---|---|---|
|57788|38905|45939|24301|31335|59471|55834|46768|46508|28152|23549|16247|44383|54814|31412|59548|
|54603|28580|31201|52169|40412|44867|47446|62466|30181|40665|47699|51149|54680|58183|61714|44944|
|60032|30329|48261|58577|54212|16334|30111|47881|47509|59012|61633|30602|53026|55591|46861|28505|
|52535|58141|31836|47338|52468|57598|53947|24058|43951|55524|46318|24255|59453|30548|40808|46050|
|31568|52088|40317|42994|45559|28390|31907|52875|51068|54585|27638|31155|52123|44849|54490|58917|
|55454|59937|48180|58720|54117|16239|44487|40850|61552|44754|30507|47319|58755|54166|16316|30440|
|46008|54918|31404|29949|47691|52821|56576|57951|60480|55877|46671|32014|47768|52646|58252|46537|
|61706|24411|44936|29681|47501|57817|32274|52794|28125|55850|54395|31441|51961|40428|44659|47462|
|55359|46741|28609|31188|51708|44406|40755|54823|58674|54071|44469|58593|54004|16126|30127|47673|
|59557|30540|40688|45818|51172|54689|27630|31147|52999|55634|58157|46456|31852|43994|52932|56449|
|44841|47420|56386|61544|44746|30387|47311|58523|58062|61579|24522|31584|59720|40781|46023|28563|
|54158|46884|24031|28528|31093|52061|42967|31894|55470|48644|58960|61525|44279|30494|40866|51126|
|52414|59924|48209|58693|55056|31514|52146|40375|53747|16345|30413|43899|52837|56368|57967|61498|
|45981|54499|31433|44651|47230|58666|54063|44461|24427|44728|47293|52675|57833|38908|45942|32290|
|39928|53996|46694|31799|47777|52767|55626|58037|60426|55823|46757|54606|28401|31204|52172|55689|
|46560|28148|24497|29627|52633|59667|54866|31352|44870|48387|58647|30332|48320|58580|54929|31387|
|59600|40661|45791|54676|28555|31134|44828|47449|30170|47884|52594|58200|46429|43519|58539|53950|
|58952|61517|44271|30598|40634|51118|53739|46913|24047|31557|52077|55608|42983|46514|31910|52878|
|28501|44003|56360|61602|24307|52443|59505|40804|55499|59940|48225|58485|55072|31530|59778|30075|
|45934|54581|28474|31039|52119|42941|54486|28393|40839|45997|51155|27641|47694|56341|58906|61471|
|30972|44638|30503|48155|58639|54106|16368|30436|24414|44701|29684|47560|57820|54169|46867|32263|
|44504|39901|58572|54921|61955|32066|47764|52586|52783|55418|46800|28612|32129|52649|59683|40758|
|58304|46533|55846|54391|31325|51957|55712|42751|54882|59616|46077|45807|54692|28347|31150|22527|
|46506|28094|23547|44409|58477|54840|31410|59546|44844|47465|52567|57725|50390|44266|58526|53979|
|30179|40607|47669|51147|53726|58209|46452|43990|46705|28517|32048|53016|55581|58258|46487|31939|
|47507|56333|59010|61575|24518|29676|59716|56065|52459|59969|48212|55045|31503|52135|40434|46040|
|46859|28447|55522|46792|28380|31897|59451|30546|54502|31436|44654|48171|58431|54122|44520|30609|
|40750|51066|53631|16341|36861|43895|54460|58915|39917|51129|58163|31858|47780|52826|55391|58096|
|61494|24423|44724|47345|52559|57829|54192|16314|46325|24500|29630|52636|59670|40787|45945|54855|
|30382|60422|55875|46697|28285|32040|53120|55685|31341|59589|55952|46746|54721|28558|31179|44873|
|58250|46479|28123|48204|54813|31383|51903|30166|47452|62472|59562|30419|40623|50939|53742|46916|
|40426|47936|50686|58196|61713|44467|58535|54002|32021|44006|47523|52541|57783|24310|52446|59508|
|30601|53025|55604|58155|46398|31850|43964|52930|55857|46651|54640|28463|31098|52178|40407|43000|
|55495|58088|46317|24492|31526|59662|30071|40779|45565|28396|31913|59915|30562|48158|58698|54095|
|46049|51039|27637|55944|48642|54489|58902|61523|16357|44493|40856|47890|54924|61958|31831|47809|
|44753|30520|47556|58768|54165|16287|30411|52835|52351|58069|61824|24529|29659|52083|32280|52912|
|55414|46684|32013|43774|47291|52645|57775|38906|55477|58042|46271|28139|23550|44412|40761|46003|
|24302|59500|55849|46755|54632|28343|31202|52170|54829|31399|59535|30182|40666|47728|51150|54667|
|40399|44896|47461|58673|30330|48262|58578|53975|58212|61729|44931|47510|56392|61634|30393|60433|
|16125|30140|47882|53012|55633|58142|46427|31823|56068|46862|54613|28506|31071|51703|42973|31900|
|43993|52455|58061|61592|24521|31555|52075|40318|59454|30535|40571|51055|54586|31632|52152|40381|
|46036|32384|52904|55469|59938|48167|58483|54118|44850|47415|54505|58918|61539|44769|47348|58784|
|44516|30493|40865|45995|51125|27583|29950|47720|54181|16303|26619|55878|46700|31805|47755|52885|
|52822|56339|57980|61497|24440|44699|29682|47502|55744|58015|46538|28126|24475|31537|59673|54872|
|52688|57818|38879|45941|32289|60425|55836|46742|31442|51962|40191|47701|59137|61716|44470|39923|
|54605|28610|31175|51695|44869|48400|62468|59558|58594|53991|30604|47674|53028|55649|58158|46443|
|30303|40675|50935|54690|31624|30169|44842|47407|28031|44009|56450|61608|24313|31347|59483|40782|
|52593|57723|47340|58552|53949|46647|24060|28515|46052|54559|28592|31157|52125|44823|54492|58947|
|31094|52062|55579|42996|46513|31909|52877|55512|61526|44756|30509|48273|58757|54224|16346|30414|
|59911|48210|58694|55043|31529|59777|40852|45982|52838|56355|61961|32072|44715|47294|52704|57834|
|54976|31434|47693|58905|61708|24413|44462|29655|38895|55852|46758|54397|28402|30967|51935|55690|
|39915|50175|32276|47778|52796|55417|58038|46323|44661|48416|58676|54129|16251|30319|44499|58567|
|28135|24498|52634|59696|40757|45887|54881|31339|54930|31416|30185|47647|53057|55636|58187|46430|
|59587|40662|45820|54663|28584|31149|44815|47450|43996|47513|59016|61581|24524|31558|52078|55595|
|56388|61518|44748|30389|48265|58525|54216|46914|46977|28565|55528|48226|58486|54835|59569|30552|
|28502|32019|52539|58257|31952|52472|59506|40567|40868|45998|51184|53749|27642|15871|43901|56342|
|54582|31516|52148|40433|42942|45563|54501|28394|58921|61500|24429|44702|29671|47323|52677|57807|
|30959|44653|48184|58668|54121|16355|26615|44491|54170|46896|32292|60428|55881|46787|28375|32130|
|39902|54922|61984|31857|47751|52825|55628|58067|52650|60160|48389|58705|40678|54455|31389|30172|
|46534|24471|29629|59669|54868|31326|51958|55475|44607|47466|52596|57726|54075|44473|58541|54008|
|46745|28557|31192|44410|39807|58478|54827|59561|46706|28518|32035|53003|55582|58273|46516|31968|
|30656|40636|47670|51176|53741|58210|46439|44005|52936|55501|59970|48199|55046|31532|59780|30077|
|47536|56334|61604|24309|29439|52445|59479|56066|40897|46027|51157|27615|48648|58908|61529|44283|
|46888|54611|28476|31097|52177|42971|28367|31898|30610|39918|51130|53695|46869|32321|43959|52841|
|59928|30561|48157|58697|54108|16342|36862|40379|55420|58083|46326|24487|52623|59685|40816|45946|
|47889|54447|61957|32068|44711|47346|52588|57830|54884|31342|59590|55939|46761|54722|28349|31208|
|54179|55904|46698|28286|31803|52883|55686|58041|44874|30515|47439|58651|30448|48268|58584|53981|

| | | | | | | | | | | | | | | |
|---|---|---|---|---|---|---|---|---|---|---|---|---|---|---|
| 46679 | 32022 | 48000 | 52542 | 58260 | 46545 | 31941 | 52461 | 47421 | 56387 | 58924 | 61545 | 44747 | 30626 | 47326 | 58762 |
| 59495 | 55858 | 54627 | 31561 | 52193 | 40436 | 42987 | 45566 | 54159 | 46885 | 28529 | 55884 | 46790 | 31895 | 52415 | 59925 |
| 31914 | 59944 | 48173 | 58489 | 54124 | 16358 | 44494 | 30135 | 48448 | 58708 | 55057 | 31515 | 52147 | 54514 | 31448 | 44666 |
| 40843 | 47905 | 51103 | 58165 | 31860 | 47810 | 52828 | 56345 | 47231 | 58667 | 54078 | 44476 | 39929 | 58600 | 53997 | 46695 |
| 58070 | 61587 | 24530 | 29688 | 59728 | 40789 | 45919 | 32267 | 32038 | 47792 | 53006 | 55627 | 58276 | 46561 | 28149 | 56456 |
| 52899 | 55478 | 46748 | 28616 | 31181 | 44399 | 40762 | 54830 | 63490 | 54867 | 31353 | 59601 | 40900 | 46030 | 54677 | 28570 |
| 59564 | 30421 | 40681 | 47715 | 50941 | 54696 | 57975 | 61730 | 31135 | 44829 | 58953 | 61532 | 44286 | 30599 | 40635 | 51119 | 53754 |
| 24435 | 44960 | 47525 | 52571 | 57841 | 30394 | 60434 | 55831 | 46928 | 32324 | 44018 | 52844 | 56361 | 58086 | 61603 | 24546 |
| 46653 | 54614 | 28521 | 31100 | 52180 | 55697 | 42974 | 46491 | 52682 | 59744 | 40805 | 45935 | 28475 | 55942 | 46764 | 54487 |
| 31887 | 59917 | 30564 | 48216 | 58700 | 55049 | 31619 | 52139 | 28408 | 30973 | 44639 | 30518 | 48394 | 58654 | 54107 | 16369 |
| 40382 | 47892 | 54506 | 62016 | 44770 | 47335 | 58547 | 54182 | 30437 | 44505 | 58573 | 54936 | 61970 | 32067 | 47765 | 52587 |
| 24055 | 29661 | 52085 | 42879 | 31806 | 47784 | 52886 | 55507 | 58305 | 46548 | 60450 | 55847 | 54630 | 31564 | 52196 | 55713 |
| 58044 | 46329 | 28141 | 24504 | 31538 | 59674 | 40735 | 46005 | 42990 | 46507 | 28095 | 48232 | 58492 | 54841 | 31411 | 59547 |
| 54859 | 31457 | 59593 | 40668 | 47702 | 54669 | 59138 | 61703 | 30194 | 40846 | 47908 | 51162 | 53727 | 58224 | 46453 | 43991 |
| 44933 | 47568 | 61636 | 30367 | 52791 | 55650 | 46920 | 28508 | 56348 | 59011 | 61590 | 24519 | 29677 | 59717 | 56080 | 46874 |
| 32025 | 44010 | 52657 | 57787 | 24314 | 59512 | 40573 | 45815 | 32270 | 52902 | 55523 | 46793 | 28381 | 32136 | 59690 | 30547 |
| 54588 | 28579 | 31158 | 52126 | 40411 | 44852 | 47473 | 54479 | 40751 | 51067 | 40684 | 47718 | 54461 | 58930 | 61495 | 24438 |
| 58976 | 61541 | 44743 | 30510 | 48274 | 58758 | 54211 | 16361 | 44725 | 47584 | 52574 | 57844 | 54193 | 16315 | 30383 | 60423 |
| 26621 | 56832 | 61962 | 31835 | 47757 | 52467 | 58073 | 46540 | 55890 | 46712 | 28524 | 32041 | 53121 | 55700 | 58251 | 46494 |
| 24477 | 31511 | 52031 | 54398 | 31444 | 51964 | 55481 | 44662 | 31946 | 59976 | 48205 | 55052 | 31622 | 52142 | 30167 | 40427 |
| 48179 | 58663 | 54130 | 44528 | 39925 | 58596 | 54945 | 31403 | 47937 | 50687 | 58197 | 48290 | 58550 | 54003 | 30616 | 53040 |
| 30186 | 47676 | 53058 | 55623 | 58216 | 46445 | 43983 | 47514 | 55605 | 58170 | 46399 | 31851 | 43965 | 52931 | 55510 | 58089 |
| 56452 | 61582 | 24287 | 31349 | 59485 | 56072 | 46978 | 54617 | 46332 | 24493 | 31527 | 59663 | 40794 | 46064 | 54862 | 31460 |
| 28566 | 31187 | 51707 | 44881 | 58949 | 62480 | 59570 | 30539 | 59596 | 55945 | 48643 | 54728 | 58903 | 61762 | 44992 | 30521 |
| 40631 | 51171 | 53750 | 16348 | 43902 | 47419 | 56357 | 58922 | 47557 | 58769 | 30426 | 52850 | 55415 | 46685 | 32028 | 43775 |
| 61487 | 24430 | 44717 | 47352 | 52678 | 57836 | 54185 | 46883 | 47530 | 52660 | 57790 | 38907 | 24303 | 59501 | 55864 | 46770 |
| 28471 | 55882 | 46816 | 28404 | 31921 | 52889 | 55692 | 59923 | 54633 | 28582 | 31203 | 52171 | 40414 | 44897 | 47476 | 62496 |
| 48390 | 58706 | 54103 | 16253 | 44501 | 54932 | 31390 | 30159 | 60034 | 30331 | 48263 | 58579 | 54214 | 16364 | 30141 | 47883 |
| 47705 | 52583 | 58189 | 61720 | 44474 | 39871 | 58542 | 53995 | 53013 | 58143 | 31838 | 47816 | 52470 | 58076 | 61593 | 24536 |
| 32512 | 53032 | 55597 | 58274 | 46503 | 28147 | 55502 | 48228 | 31570 | 52090 | 40319 | 46037 | 32385 | 52905 | 55484 | 59939 |
| 54837 | 31295 | 59543 | 30078 | 40898 | 46056 | 51158 | 54675 | 48182 | 58722 | 54119 | 44517 | 40880 | 46010 | 54948 | 31406 |
| 27644 | 31161 | 44827 | 56400 | 58895 | 61530 | 44760 | 30625 | 29951 | 47721 | 52823 | 56578 | 57981 | 61736 | 24441 | 44938 |
| 47325 | 58761 | 54172 | 46870 | 32322 | 52842 | 55407 | 46789 | 29683 | 47503 | 52689 | 57819 | 32304 | 60440 | 55837 | 46743 |
| 32132 | 52652 | 59686 | 40803 | 51063 | 55968 | 46762 | 54513 | 54620 | 28611 | 31190 | 51710 | 44884 | 48401 | 62469 | 59559 |
| 28350 | 30971 | 44665 | 47468 | 58680 | 54077 | 16311 | 30435 | 30542 | 40690 | 51174 | 54691 | 31625 | 44843 | 47422 | 56416 |
| 44447 | 58571 | 53982 | 46708 | 32037 | 47763 | 53005 | 55640 | 61546 | 44776 | 47341 | 58553 | 54188 | 46886 | 24061 | 28530 |
| 58247 | 46546 | 31942 | 52462 | 59972 | 63489 | 55104 | 31562 | 31095 | 52063 | 42997 | 31924 | 52892 | 55513 | 59926 | 48211 |
| 52194 | 40423 | 46029 | 28569 | 48174 | 58490 | 53887 | 44285 | 58695 | 55058 | 31544 | 59792 | 40853 | 45983 | 54977 | 31435 |
| 30612 | 40872 | 47906 | 51132 | 53753 | 58166 | 46451 | 31847 | 47708 | 59144 | 61709 | 44463 | 39930 | 53998 | 32277 | 47779 |
| 44017 | 52815 | 56346 | 58085 | 61616 | 24545 | 29675 | 52681 | 52797 | 55656 | 58039 | 46562 | 28150 | 24499 | 52635 | 59697 |
| 59715 | 40790 | 45948 | 32296 | 60544 | 55941 | 46735 | 54724 | 54896 | 31354 | 59602 | 40663 | 45821 | 54678 | 28585 | 31164 |
| 28379 | 31182 | 44876 | 30517 | 48393 | 58653 | 30422 | 40682 | 44830 | 47451 | 56389 | 58954 | 61519 | 44749 | 30628 | 48280 |
| 50942 | 54459 | 61969 | 32080 | 44723 | 47526 | 52600 | 57842 | 58764 | 54217 | 46915 | 28503 | 56362 | 62080 | 31953 | 52473 |
| 38903 | 60449 | 55860 | 46654 | 54629 | 28522 | 31087 | 52167 | 59507 | 40806 | 54583 | 31517 | 52149 | 42943 | 54516 | 28395 |
| 55698 | 42989 | 46520 | 31916 | 59918 | 30327 | 48203 | 58463 | 30974 | 44668 | 48185 | 58669 | 54136 | 16370 | 30438 | 44506 |
| 55050 | 31648 | 59784 | 30193 | 40845 | 47879 | 51161 | 58195 | 39903 | 58574 | 54923 | 61985 | 32096 | 47766 | 53064 | 55629 |
| 47812 | 59024 | 61589 | 24532 | 29662 | 52086 | 55603 | 46873 | 58306 | 46535 | 63492 | 54869 | 31327 | 51959 | 55714 | 46984 |
| 32269 | 43963 | 52901 | 55536 | 58031 | 46330 | 28142 | 24491 | 28572 | 31193 | 44411 | 58479 | 54842 | 59576 | 30657 | 40637 |
| 59689 | 40764 | 46006 | 54888 | 31458 | 59594 | 40655 | 47717 | 47671 | 51177 | 53756 | 58211 | 46454 | 44020 | 47537 | 56335 |
| 54670 | 58929 | 61732 | 24437 | 44934 | 29567 | 47555 | 52573 | 59040 | 61605 | 24548 | 29678 | 52684 | 59718 | 56067 | 46889 |
| 57815 | 30396 | 60436 | 55889 | 46683 | 28495 | 32026 | 52658 | 28477 | 56000 | 46794 | 28382 | 31899 | 59929 | 30576 | 48396 |
| 58264 | 46493 | 31945 | 59499 | 40574 | 54575 | 31621 | 52141 | 58712 | 54109 | 16343 | 36863 | 54462 | 61972 | 32069 | 44726 |
| 40440 | 44839 | 47474 | 54508 | 61542 | 44772 | 48289 | 58549 | 47347 | 52589 | 57831 | 54194 | 60452 | 55905 | 46699 | 28287 |
| 54240 | 16362 | 26622 | 30139 | 53011 | 58169 | 31864 | 47758 | 32042 | 53122 | 55687 | 58280 | 46509 | 28153 | 48206 | 54815 |
| 52944 | 55509 | 58074 | 46303 | 24478 | 31540 | 59676 | 40793 | 31413 | 59549 | 30196 | 40904 | 47938 | 51164 | 54681 | 58198 |
| 46035 | 54861 | 31431 | 51951 | 55482 | 48656 | 59140 | 61761 | 61715 | 44945 | 59013 | 61648 | 30603 | 53027 | 55606 | 46876 |
| 44515 | 39926 | 54946 | 30425 | 47663 | 52849 | 55652 | 57979 | 32328 | 43966 | 52960 | 55525 | 58090 | 46319 | 24494 | 59692 |
| 46446 | 24383 | 44012 | 47529 | 52631 | 57789 | 24316 | 31350 | 30549 | 40809 | 46051 | 51069 | 27639 | 55946 | 48672 | 54491 |
| 59486 | 55835 | 46769 | 54618 | 28581 | 31216 | 52184 | 40413 | 58932 | 61553 | 44755 | 30522 | 47558 | 58770 | 54167 | 16317 |
| 44882 | 47447 | 58950 | 62467 | 60033 | 30568 | 48276 | 58816 | 30441 | 60481 | 55892 | 46686 | 32015 | 47769 | 52647 | 58253 |
| 54213 | 16335 | 47896 | 56358 | 61964 | 31837 | 44718 | 47339 | 46552 | 31948 | 59502 | 55851 | 54634 | 31680 | 52200 | 40429 |
| 52469 | 57599 | 54186 | 24059 | 31569 | 52089 | 42995 | 28391 | 44898 | 47463 | 58675 | 48292 | 58608 | 54005 | 16127 | 30142 |
| 31922 | 52890 | 59255 | 55455 | 59952 | 48181 | 58721 | 54132 | 16254 | 47912 | 53014 | 55635 | 58172 | 46457 | 31853 | 43995 | 52933 |
| 44502 | 40851 | 46009 | 54919 | 31491 | 30188 | 47706 | 53060 | 56464 | 58063 | 61594 | 24523 | 31585 | 59721 | 40796 | 46038 |
| 56577 | 58190 | 61707 | 44937 | 47516 | 61640 | 32275 | 52795 | 32386 | 52906 | 55471 | 48645 | 58961 | 61764 | 44518 | 30495 |
| 55598 | 46980 | 28624 | 31189 | 51709 | 44407 | 54838 | 59572 | 40867 | 51127 | 30428 | 47722 | 52852 | 56369 | 57982 | 61499 |
| 30541 | 40689 | 45819 | 51173 | 54704 | 27631 | 31162 | 44856 | 24442 | 44729 | 47532 | 52690 | 57848 | 38909 | 45943 | 32291 |

| | | | | | | | | | | | | | | |
|---|---|---|---|---|---|---|---|---|---|---|---|---|---|---|
| 60427 | 55838 | 46772 | 54607 | 28640 | 31205 | 52173 | 55704 | 32074 | 47772 | 52706 | 58312 | 46541 | 55854 | 54399 | 31445 |
| 44871 | 48402 | 62470 | 60036 | 30333 | 48321 | 58581 | 55168 | 51965 | 55720 | 44663 | 48418 | 58678 | 54131 | 44529 | 58597 |
| 31626 | 30171 | 47885 | 52595 | 58201 | 47342 | 58554 | 53951 | 54960 | 31418 | 30187 | 47677 | 53059 | 55638 | 58217 | 46460 |
| 24062 | 31572 | 52092 | 55609 | 42998 | 46515 | 31911 | 52879 | 43998 | 47515 | 56453 | 59018 | 61583 | 24526 | 31588 | 59724 |
| 55514 | 59941 | 48240 | 58724 | 55073 | 31531 | 59779 | 40854 | 56073 | 46979 | 28567 | 55530 | 48704 | 58964 | 62481 | 59571 |
| 46012 | 54978 | 31464 | 47695 | 56580 | 58907 | 61710 | 24415 | 30554 | 40870 | 51186 | 53751 | 16349 | 43903 | 56372 | 58923 |
| 44940 | 29685 | 47561 | 57821 | 32278 | 52798 | 55419 | 46801 | 61502 | 24431 | 44732 | 47353 | 52679 | 57837 | 54200 | 46898 |
| 28613 | 32144 | 52664 | 59698 | 40759 | 54883 | 59617 | 40692 | 32294 | 60430 | 55883 | 46817 | 28405 | 32160 | 53128 | 55693 |
| 45822 | 54693 | 28586 | 31151 | 44845 | 47480 | 56390 | 61548 | 60162 | 48391 | 58707 | 48324 | 54933 | 31391 | 30174 | 47944 |
| 44750 | 30391 | 48267 | 58527 | 54218 | 46944 | 28532 | 32049 | 52598 | 58204 | 61721 | 44475 | 58543 | 54010 | 32513 | 53033 |
| 53017 | 58259 | 31954 | 52474 | 59984 | 48213 | 55060 | 31518 | 55612 | 58275 | 46518 | 31970 | 52938 | 55503 | 60000 | 48229 |
| 52150 | 40435 | 46041 | 54503 | 31437 | 44655 | 48186 | 58670 | 55076 | 31534 | 59782 | 30079 | 40899 | 46057 | 51159 | 27645 |
| 54123 | 44521 | 39932 | 54952 | 61986 | 31859 | 47781 | 52827 | 48650 | 56401 | 58910 | 61531 | 44761 | 30640 | 47564 | 58776 |
| 55630 | 58097 | 46564 | 24501 | 29631 | 52637 | 59671 | 54870 | 54173 | 46871 | 32323 | 52843 | 55422 | 46804 | 32133 | 52653 |
| 31356 | 59604 | 55953 | 46747 | 54736 | 28559 | 31194 | 44888 | 59687 | 40818 | 54886 | 59620 | 55969 | 46763 | 54752 | 28351 |
| 47453 | 58956 | 62473 | 59563 | 30658 | 40638 | 51178 | 53743 | 31210 | 44904 | 47469 | 58681 | 30450 | 48270 | 58586 | 53983 |
| 46917 | 44007 | 47538 | 56364 | 61606 | 24311 | 52447 | 59509 | 46709 | 32052 | 48002 | 53020 | 55641 | 58262 | 46547 | 31943 |
| 56096 | 46890 | 54641 | 28478 | 31099 | 52179 | 43001 | 28397 | 52463 | 59973 | 63504 | 55105 | 31563 | 52195 | 40438 | 46044 |
| 31928 | 59930 | 30563 | 48159 | 58699 | 54110 | 16372 | 44508 | 32392 | 59946 | 48175 | 58491 | 54126 | 44524 | 30613 | 40873 |
| 40857 | 47891 | 54925 | 61959 | 32070 | 47824 | 52590 | 58308 | 47907 | 51133 | 58167 | 31862 | 47840 | 52830 | 56347 | 58100 |
| 61825 | 55906 | 32281 | 52913 | 55716 | 58043 | 46510 | 28154 | 61617 | 24560 | 29690 | 52696 | 59730 | 40791 | 45949 | 32297 |
| 23551 | 44413 | 54844 | 31414 | 59550 | 30183 | 40667 | 47729 | 60545 | 55956 | 46750 | 54725 | 28618 | 31183 | 44877 | 48408 |
| 51151 | 54682 | 58213 | 61744 | 44946 | 47511 | 56393 | 59014 | 62476 | 59566 | 30423 | 40683 | 50943 | 54698 | 62208 | 32081 |
| 61635 | 30632 | 60672 | 56069 | 46863 | 28507 | 55526 | 46796 | 44962 | 47527 | 52601 | 57843 | 60464 | 55861 | 46655 | 54644 |
| 31901 | 59455 | 30550 | 40810 | 51070 | 54587 | 31633 | 52153 | 28523 | 31102 | 52182 | 55699 | 43004 | 46521 | 31917 | 59919 |
| 44851 | 54520 | 58919 | 61554 | 44784 | 47349 | 58785 | 54196 | 30566 | 48218 | 58702 | 55051 | 31649 | 59785 | 40860 | 47894 |
| 16318 | 30442 | 60482 | 55879 | 46701 | 32044 | 47770 | 53124 | 54984 | 62018 | 47813 | 59025 | 61828 | 24533 | 29663 | 52087 |
| 55745 | 58254 | 46539 | 28127 | 63496 | 54873 | 31443 | 51963 | 32284 | 47786 | 52916 | 55537 | 58046 | 46331 | 28143 | 24506 |
| 40430 | 47940 | 59152 | 61717 | 44471 | 58595 | 54006 | 30605 | 59704 | 40765 | 46007 | 54889 | 31459 | 59595 | 40670 | 47732 |
| 47675 | 53029 | 55664 | 58159 | 46458 | 31854 | 44024 | 52934 | 54671 | 59168 | 61733 | 44935 | 47570 | 56396 | 61638 | 30397 |
| 56451 | 58092 | 61609 | 24552 | 31586 | 59722 | 40783 | 46053 | 60437 | 56128 | 46922 | 28510 | 32027 | 52659 | 58265 | 31960 |
| 28593 | 55948 | 48646 | 54493 | 58962 | 61527 | 44757 | 30524 | 59514 | 40575 | 54590 | 31636 | 52156 | 40441 | 44854 | 47475 |
| 48512 | 58772 | 54225 | 16347 | 30415 | 52839 | 56370 | 61976 | 54509 | 58978 | 61543 | 44773 | 48304 | 58788 | 54241 | 16363 |
| 32073 | 44730 | 47295 | 52705 | 57835 | 38910 | 60456 | 55853 | 26623 | 56834 | 61992 | 31865 | 47759 | 52945 | 55748 | 58075 |
| 46759 | 54636 | 28403 | 31206 | 52174 | 55691 | 44900 | 48417 | 46542 | 24479 | 31541 | 59677 | 54876 | 31446 | 51966 | 55483 |
| 58677 | 30334 | 48322 | 58582 | 54931 | 31417 | 30200 | 47886 | 48657 | 59141 | 61776 | 44530 | 39927 | 58598 | 54947 | 30664 |
| 53072 | 55637 | 58202 | 46431 | 43997 | 59017 | 61596 | 24525 | 47678 | 53088 | 55653 | 58218 | 46447 | 44013 | 47544 | 56454 |
| 31559 | 52079 | 55610 | 46992 | 32388 | 52908 | 55529 | 59942 | 61612 | 24317 | 31351 | 59487 | 56074 | 47008 | 54619 | 28596 |
| 48227 | 58487 | 55074 | 59808 | 30553 | 40869 | 45999 | 51185 | 31217 | 52185 | 44883 | 58951 | 62482 | 60048 | 30569 | 48277 |
| 27643 | 47724 | 56343 | 58936 | 61501 | 24444 | 44703 | 29686 | 58817 | 54228 | 16350 | 47897 | 56359 | 61965 | 32076 | 44719 |
| 47562 | 52692 | 57822 | 54171 | 46897 | 32293 | 60429 | 55896 | 47354 | 52708 | 57838 | 54187 | 55912 | 46818 | 28406 | 31923 |
| 46802 | 28614 | 32131 | 52651 | 60161 | 48404 | 62528 | 59618 | 52891 | 55694 | 59953 | 48420 | 58736 | 54133 | 16255 | 44503 |
| 40679 | 54694 | 31628 | 30173 | 44846 | 47467 | 52597 | 57727 | 54934 | 31420 | 30189 | 47707 | 53061 | 56592 | 58191 | 61722 |
| 48296 | 58556 | 54009 | 46707 | 28519 | 32050 | 53018 | 55583 | 44952 | 47517 | 59020 | 61641 | 32514 | 53034 | 55599 | 46981 |
| 58288 | 46517 | 31969 | 52937 | 55516 | 59971 | 48214 | 55047 | 28625 | 55532 | 48230 | 54839 | 59573 | 30556 | 40928 | 46058 |
| 31533 | 59781 | 40912 | 46042 | 54980 | 31438 | 48649 | 58909 | 51188 | 54705 | 27646 | 31163 | 44857 | 56402 | 58925 | 61560 |
| 61768 | 44522 | 30611 | 39919 | 51131 | 32336 | 47782 | 52856 | 44762 | 30627 | 47327 | 58763 | 54174 | 46900 | 32352 | 60488 |
| 55421 | 58098 | 46327 | 24502 | 52638 | 59700 | 40817 | 45947 | 55885 | 46791 | 32134 | 52654 | 60164 | 48449 | 58709 | 55970 |
| 54885 | 31343 | 59591 | 55954 | 46776 | 54723 | 28588 | 31209 | 54515 | 31449 | 44667 | 47470 | 58682 | 54079 | 44477 | 58601 |
| 44875 | 47454 | 62474 | 60040 | 30449 | 48269 | 58585 | 54220 | 54012 | 46710 | 32039 | 47793 | 53007 | 55642 | 58277 | 46576 |
| 46918 | 32023 | 48001 | 52543 | 58261 | 31956 | 52476 | 59510 | 31972 | 52940 | 56457 | 59974 | 63491 | 55106 | 31592 | 59840 |
| 55859 | 54642 | 31576 | 52208 | 40437 | 43002 | 45567 | 28398 | 40901 | 46031 | 28571 | 48652 | 58968 | 61533 | 44287 | 30614 |
| 31915 | 59945 | 48188 | 58728 | 54125 | 16359 | 44495 | 40858 | 40874 | 51134 | 53755 | 46929 | 32325 | 44019 | 52845 | 56376 |
| 47920 | 54926 | 61988 | 31861 | 47811 | 52829 | 56584 | 58071 | 58087 | 61618 | 24547 | 52683 | 59745 | 40820 | 45950 | 32298 |
| 61826 | 24531 | 29689 | 59729 | 32282 | 52914 | 55479 | 46749 | 60546 | 55943 | 46765 | 54726 | 28409 | 31212 | 44878 | 30519 |
| 28617 | 31196 | 44414 | 40763 | 54831 | 59565 | 30660 | 40696 | 48395 | 58655 | 30452 | 48328 | 58588 | 54937 | 61971 | 32082 |
| 47730 | 51180 | 54697 | 58214 | 61731 | 44961 | 47540 | 56394 | 48004 | 52602 | 58320 | 46549 | 60451 | 55862 | 54631 | 31565 |
| 61664 | 30395 | 60435 | 56070 | 46892 | 54615 | 28536 | 31101 | 52197 | 55728 | 42991 | 46522 | 31918 | 59948 | 48233 | 58493 |
| 52181 | 42975 | 31902 | 59932 | 30565 | 48217 | 58701 | 55064 | 55080 | 31650 | 59786 | 30195 | 40847 | 47909 | 51163 | 58225 |
| 31634 | 52154 | 40383 | 47893 | 54507 | 62017 | 44771 | 47350 | 47814 | 56349 | 59026 | 61591 | 24534 | 29692 | 59732 | 56081 |
| 58786 | 54183 | 55908 | 46702 | 31807 | 47785 | 52887 | 55746 | 46875 | 32271 | 52903 | 55538 | 46808 | 28620 | 32137 | 59691 |
| 58045 | 46568 | 28156 | 24505 | 31539 | 59675 | 54874 | 31472 | 40766 | 54890 | 59624 | 40685 | 47719 | 54700 | 58931 | 61734 |
| 59608 | 40669 | 47703 | 54684 | 59139 | 61718 | 44948 | 47569 | 24439 | 44964 | 47585 | 52575 | 57845 | 50398 | 60438 | 55891 |
| 59072 | 61637 | 30606 | 53030 | 55651 | 46921 | 28509 | 44011 | 46713 | 28525 | 32056 | 53136 | 55701 | 58266 | 46495 | 31947 |
| 56480 | 61610 | 24315 | 59513 | 40812 | 46054 | 54589 | 28594 | 59977 | 48220 | 55053 | 31623 | 52143 | 40442 | 47952 | 54510 |
| 31159 | 52127 | 44853 | 54494 | 58977 | 61556 | 44758 | 30511 | 62020 | 44774 | 48291 | 58551 | 54242 | 30617 | 53041 | 58171 |
| 48275 | 58759 | 54226 | 16376 | 30444 | 60484 | 56833 | 61963 | 31866 | 47788 | 52946 | 55511 | 58104 | 46333 | 24508 | 31542 |

| | | | | | | | | | | | | | | |
|---|---|---|---|---|---|---|---|---|---|---|---|---|---|---|
| 59678 | 40795 | 46065 | 54863 | 31461 | 59597 | 55960 | 48658 | 55760 | 58255 | 46554 | 31950 | 59980 | 63497 | 55112 | 31682 |
| 54729 | 59142 | 61763 | 44993 | 47572 | 62592 | 30427 | 52851 | 52202 | 40431 | 47941 | 59153 | 48294 | 58610 | 54007 | 30620 |
| 55654 | 46924 | 32029 | 44014 | 47531 | 52661 | 57791 | 24318 | 47914 | 53044 | 55665 | 58174 | 46459 | 31855 | 44025 | 52935 |
| 59516 | 55865 | 46771 | 54648 | 28583 | 31218 | 52186 | 40415 | 56466 | 58093 | 61624 | 24553 | 31587 | 59723 | 40798 | 46068 |
| 44912 | 47477 | 58980 | 62497 | 60035 | 30570 | 48278 | 58818 | 32416 | 60552 | 55949 | 48647 | 54732 | 58963 | 61766 | 44996 |
| 54215 | 16365 | 47898 | 56836 | 61966 | 31839 | 47817 | 52471 | 30525 | 48513 | 58773 | 30430 | 52854 | 56371 | 61977 | 32088 |
| 58077 | 61832 | 24537 | 31571 | 52091 | 32400 | 52920 | 55485 | 44731 | 47534 | 52720 | 57850 | 38911 | 60457 | 55868 | 46774 |
| 59954 | 48183 | 58723 | 54134 | 44532 | 40881 | 46011 | 54949 | 54637 | 28642 | 31207 | 52175 | 55706 | 44901 | 48432 | 62500 |
| 31407 | 30190 | 47736 | 53062 | 56579 | 58220 | 61737 | 44939 | 60038 | 30335 | 48323 | 58583 | 55170 | 31656 | 30201 | 47887 |
| 47518 | 56512 | 61642 | 32305 | 60441 | 56076 | 46982 | 54621 | 53073 | 58203 | 47820 | 59032 | 61597 | 24540 | 31574 | 52094 |
| 28626 | 31191 | 51711 | 44885 | 62484 | 59574 | 30543 | 40691 | 51175 | 55611 | 46993 | 32389 | 52909 | 55544 | 59943 | 48242 | 58726 |
| 54706 | 31640 | 44858 | 47423 | 56417 | 58926 | 61547 | 44777 | 55075 | 59809 | 40884 | 46014 | 55008 | 31466 | 47725 | 56582 |
| 47356 | 58792 | 54189 | 46887 | 28531 | 55886 | 46820 | 31925 | 58937 | 61740 | 24445 | 44942 | 29687 | 47563 | 52693 | 57823 |
| 52893 | 55752 | 59927 | 48450 | 58710 | 55059 | 31545 | 59793 | 32308 | 60444 | 55897 | 46803 | 28615 | 32146 | 52666 | 60176 |
| 54992 | 31450 | 47709 | 59145 | 61724 | 44478 | 39931 | 58602 | 48405 | 62529 | 59619 | 40694 | 54695 | 31629 | 44847 | 47482 |
| 53999 | 32516 | 47794 | 53036 | 55657 | 58278 | 46563 | 28151 | 56420 | 61550 | 44780 | 48297 | 58557 | 54248 | 46946 | 28534 |
| 56458 | 63520 | 54897 | 31355 | 59603 | 40902 | 46060 | 54679 | 32051 | 53019 | 58289 | 31984 | 52952 | 55517 | 59986 | 48215 |
| 28600 | 31165 | 44831 | 56404 | 58955 | 61534 | 44764 | 30629 | 55062 | 31548 | 59796 | 40913 | 46043 | 54981 | 31439 | 48664 |
| 48281 | 58765 | 54232 | 46930 | 32326 | 52846 | 56363 | 62081 | 59148 | 61769 | 44523 | 39934 | 54954 | 32337 | 47783 | 52857 |
| 32192 | 52712 | 59746 | 40807 | 55972 | 46766 | 54517 | 28410 | 55660 | 58099 | 46566 | 24503 | 52639 | 59701 | 54900 | 31358 |
| 30975 | 44669 | 48424 | 58684 | 54137 | 16371 | 30439 | 44507 | 59606 | 55955 | 46777 | 54738 | 28589 | 31224 | 44890 | 47455 |
| 58575 | 54938 | 62000 | 32097 | 47767 | 53065 | 55644 | 58307 | 58958 | 62475 | 60041 | 30688 | 48284 | 58824 | 54221 | 46919 |
| 46550 | 60928 | 63493 | 55108 | 31566 | 52198 | 55715 | 46985 | 48016 | 56366 | 62084 | 31957 | 52477 | 59511 | 56098 | 54643 |
| 28573 | 48234 | 58494 | 54843 | 59577 | 30672 | 40876 | 47910 | 31577 | 52209 | 43003 | 28399 | 31930 | 59960 | 48189 | 58729 |
| 51192 | 53757 | 58226 | 46455 | 44021 | 56350 | 59041 | 61620 | 54140 | 16374 | 44510 | 40859 | 47921 | 54927 | 61989 | 32100 |
| 24549 | 29679 | 52685 | 59719 | 56082 | 46904 | 32300 | 60548 | 47826 | 53068 | 56585 | 58310 | 61827 | 63552 | 32283 | 52915 |
| 56001 | 46795 | 28383 | 32138 | 60168 | 30577 | 48397 | 58713 | 55718 | 46988 | 28632 | 31197 | 44415 | 54846 | 59580 | 30661 |
| 40686 | 54463 | 61973 | 32084 | 44727 | 47586 | 52604 | 57846 | 40697 | 47731 | 51181 | 54712 | 58215 | 61746 | 44976 | 47541 |
| 54195 | 60453 | 55920 | 46714 | 28526 | 32043 | 53123 | 55702 | 56395 | 59044 | 61665 | 30634 | 60674 | 56071 | 46893 | 28537 |
| 58281 | 46524 | 31976 | 59978 | 48207 | 55054 | 31652 | 59788 | 56004 | 46798 | 31903 | 59933 | 30580 | 48456 | 58716 | 55065 |
| 30197 | 40905 | 47939 | 51165 | 58199 | 48768 | 59028 | 61649 | 31635 | 52155 | 54522 | 62032 | 44786 | 47351 | 58787 | 54198 |
| 30618 | 53042 | 55607 | 46877 | 32329 | 43967 | 52961 | 55540 | 60512 | 55909 | 46703 | 32046 | 47800 | 53126 | 55747 | 58284 |
| 58091 | 46334 | 24495 | 59693 | 40824 | 46066 | 54892 | 31462 | 46569 | 28157 | 63498 | 54875 | 31473 | 59609 | 40908 | 47942 |
| 59598 | 55947 | 48673 | 54730 | 58933 | 61792 | 44994 | 30523 | 54685 | 59154 | 61719 | 44949 | 59073 | 61652 | 30607 | 53031 |
| 47559 | 58771 | 30456 | 60496 | 55893 | 46687 | 32030 | 48008 | 55666 | 46936 | 32332 | 44026 | 52964 | 56481 | 58094 | 61611 |
| 52662 | 58268 | 46553 | 31949 | 59503 | 55866 | 54635 | 31681 | 24554 | 59752 | 40813 | 46055 | 28595 | 55950 | 48676 | 54495 |
| 52201 | 40444 | 44899 | 47478 | 62498 | 60064 | 48293 | 58609 | 58992 | 61557 | 44759 | 30526 | 48514 | 58774 | 54227 | 16377 |
| 54244 | 16366 | 30143 | 47913 | 53015 | 58173 | 31868 | 47818 | 30445 | 60485 | 56848 | 61978 | 32075 | 47773 | 52707 | 58313 |
| 52948 | 56465 | 58078 | 61595 | 24538 | 31600 | 59736 | 40797 | 46556 | 60458 | 55855 | 54638 | 31684 | 52204 | 55721 | 44902 |
| 46039 | 32387 | 52907 | 55486 | 48660 | 59200 | 61765 | 44519 | 48419 | 58679 | 48352 | 58612 | 54961 | 31419 | 30202 | 47916 |
| 40882 | 54950 | 30429 | 47723 | 52853 | 56608 | 57983 | 61738 | 53074 | 55639 | 58232 | 46461 | 43999 | 56468 | 59019 | 61598 |
| 24443 | 44968 | 47533 | 52691 | 57849 | 32306 | 60442 | 55839 | 24527 | 31589 | 59725 | 56088 | 46994 | 32390 | 52910 | 55531 |
| 46773 | 54622 | 28641 | 31220 | 52188 | 55705 | 44886 | 48405 | 48705 | 58965 | 62720 | 59810 | 30555 | 40871 | 51187 | 47726 |
| 62471 | 60037 | 30572 | 48336 | 58820 | 55169 | 31627 | 47900 | 56373 | 58938 | 61503 | 24446 | 44733 | 47592 | 52694 | 57852 |
| 56418 | 62024 | 44778 | 47343 | 58555 | 54190 | 24063 | 31573 | 54201 | 46899 | 32295 | 60431 | 55898 | 46832 | 28644 | 32161 |
| 52093 | 42999 | 31926 | 52894 | 55515 | 59956 | 48241 | 58725 | 53129 | 55708 | 60163 | 48406 | 62530 | 60096 | 48325 | 55172 |
| 55088 | 31546 | 59794 | 40855 | 46013 | 54979 | 31465 | 47710 | 31630 | 30175 | 47945 | 52599 | 58205 | 48298 | 58558 | 54011 |
| 56581 | 59146 | 61711 | 44941 | 47576 | 61644 | 32279 | 52799 | 32528 | 53048 | 55613 | 58290 | 46519 | 31971 | 52939 | 55518 |
| 55658 | 47040 | 28628 | 32145 | 52665 | 59699 | 54898 | 59632 | 60001 | 48244 | 55077 | 31535 | 59783 | 40914 | 46072 | 54982 |
| 40693 | 45823 | 54708 | 28587 | 31166 | 44860 | 47481 | 56391 | 31468 | 48651 | 56640 | 58911 | 61770 | 45000 | 30641 | 47565 |
| 58984 | 61549 | 44751 | 30630 | 48282 | 58766 | 54219 | 46945 | 58777 | 32338 | 52858 | 55423 | 46805 | 32148 | 52668 | 59702 |
| 28533 | 56840 | 62082 | 31955 | 52475 | 59985 | 48452 | 55061 | 40819 | 54887 | 59621 | 55984 | 46778 | 54753 | 28590 | 31211 |
| 31519 | 52151 | 54518 | 31452 | 44670 | 48187 | 58671 | 54138 | 44905 | 47484 | 62504 | 60042 | 30451 | 48271 | 58587 | 54222 |
| 44536 | 39933 | 58604 | 54953 | 61987 | 32098 | 47796 | 53066 | 46948 | 32053 | 48003 | 53021 | 58263 | 31958 | 52478 | 59988 |
| 55631 | 58336 | 46565 | 56460 | 63494 | 54871 | 31357 | 59605 | 63505 | 55120 | 31578 | 52210 | 40439 | 46045 | 32393 | 59947 |
| 56192 | 46986 | 54737 | 28574 | 31195 | 44889 | 58957 | 62488 | 48190 | 58730 | 54127 | 44525 | 40888 | 47922 | 54956 | 61990 |
| 59578 | 30659 | 40639 | 51179 | 53758 | 46932 | 44022 | 47539 | 31863 | 47841 | 52831 | 56586 | 58101 | 61856 | 24561 | 29691 |
| 56365 | 59042 | 61607 | 24550 | 52686 | 59748 | 56097 | 46891 | 52697 | 59731 | 32312 | 60560 | 55957 | 46751 | 54740 | 28619 |
| 28479 | 56002 | 46824 | 28412 | 31929 | 59931 | 30578 | 48398 | 31198 | 44892 | 48409 | 62477 | 59567 | 30662 | 40698 | 51182 |
| 58714 | 54111 | 16373 | 44509 | 54940 | 61974 | 32071 | 47825 | 54699 | 62209 | 44963 | 47542 | 56424 | 61666 | 60465 | 56100 |
| 52591 | 58309 | 61840 | 60454 | 55907 | 32520 | 53152 | 55717 | 46894 | 54645 | 28538 | 31103 | 52183 | 43005 | 31932 | 59934 |
| 58282 | 46511 | 28155 | 48236 | 54845 | 58228 | 61745 | 44947 | 56408 | 30567 | 48219 | 58703 | 55066 | 31664 | 59800 | 40861 | 47895 |
| 40906 | 47968 | 51166 | 54683 | 58228 | 61745 | 44947 | 56408 | 54985 | 62019 | 47828 | 59264 | 61829 | 55910 | 32285 | 47787 |
| 59015 | 61650 | 30633 | 60673 | 56084 | 46878 | 42330 | 52962 | 52917 | 55776 | 58047 | 46570 | 28158 | 24507 | 59705 | 54904 |
| 55527 | 46797 | 32140 | 59694 | 30551 | 40811 | 51071 | 55976 | 31474 | 59610 | 40671 | 47733 | 54686 | 59169 | 61748 | 44950 |
| 48674 | 54521 | 58934 | 61555 | 44785 | 47588 | 58800 | 54197 | 47571 | 56397 | 59074 | 61639 | 30636 | 60676 | 56129 | 46923 |
| 16319 | 30443 | 60483 | 55894 | 46716 | 32045 | 47771 | 53125 | 28511 | 56482 | 62088 | 31961 | 59515 | 40814 | 54591 | 31637 |

| | | | | | | | | | | | | | | |
|---|---|---|---|---|---|---|---|---|---|---|---|---|---|---|
| 52157 | 44855 | 54524 | 58979 | 61558 | 44788 | 48305 | 58789 | 40445 | 44914 | 47479 | 58982 | 62499 | 60065 | 48308 | 58848 |
| 54256 | 16378 | 30446 | 60486 | 56835 | 61993 | 32104 | 47774 | 54245 | 16367 | 47928 | 56838 | 61996 | 31869 | 47819 | 52949 |
| 53184 | 55749 | 58314 | 46543 | 63500 | 54877 | 31447 | 51967 | 56704 | 58079 | 61834 | 24539 | 31601 | 59737 | 32402 | 52922 |
| 55722 | 48896 | 59156 | 61777 | 44531 | 58599 | 54962 | 30665 | 55487 | 48661 | 59201 | 61780 | 44534 | 40883 | 54951 | 30668 |
| 47679 | 53089 | 55668 | 58219 | 46462 | 44028 | 47545 | 56455 | 47738 | 53092 | 56609 | 58222 | 61739 | 44969 | 47548 | 56514 |
| 59048 | 61613 | 24556 | 31590 | 59726 | 56075 | 47009 | 28597 | 61672 | 32307 | 60443 | 56078 | 47012 | 54623 | 28656 | 31221 |
| 56008 | 48706 | 58966 | 62483 | 60049 | 30584 | 48516 | 58832 | 52189 | 44887 | 62486 | 60052 | 30573 | 48337 | 58821 | 55184 |
| 54229 | 16351 | 56374 | 61980 | 32077 | 44734 | 47355 | 52709 | 31642 | 47901 | 56419 | 62025 | 44779 | 47358 | 58794 | 54191 |
| 57839 | 54202 | 60460 | 55913 | 46819 | 28407 | 32162 | 53130 | 55916 | 46822 | 31927 | 52895 | 55754 | 59957 | 48480 | 58740 |
| 55695 | 60192 | 48421 | 58737 | 48326 | 54935 | 31421 | 30204 | 55089 | 31547 | 59795 | 54994 | 31480 | 47711 | 56596 | 59147 |
| 47946 | 53076 | 56593 | 58206 | 61723 | 44953 | 59021 | 61656 | 61726 | 44956 | 47577 | 59080 | 61645 | 32518 | 53038 | 55659 |
| 32515 | 53035 | 55614 | 46996 | 32448 | 52968 | 55533 | 60002 | 47041 | 28629 | 56488 | 63522 | 54899 | 59633 | 40932 | 46062 |
| 48231 | 55078 | 59812 | 30557 | 40929 | 46059 | 51189 | 27647 | 54709 | 28602 | 31167 | 44861 | 56406 | 58985 | 61564 | 44766 |
| 48680 | 56403 | 58940 | 61561 | 44763 | 30642 | 47566 | 58778 | 30631 | 48283 | 58767 | 54234 | 46960 | 32356 | 60492 | 56841 |
| 54175 | 46901 | 32353 | 60489 | 55900 | 46806 | 32135 | 52655 | 62083 | 32194 | 52714 | 60224 | 48453 | 55974 | 54519 | 31453 |
| 60165 | 48464 | 62532 | 59622 | 55971 | 54754 | 31688 | 44906 | 44671 | 48426 | 58686 | 54139 | 44537 | 58605 | 54968 | 62002 |
| 47471 | 58683 | 48300 | 58616 | 54013 | 46711 | 32054 | 48032 | 32099 | 47797 | 53067 | 55646 | 58337 | 46580 | 56461 | 60930 |
| 53022 | 55643 | 58292 | 46577 | 31973 | 52941 | 56472 | 59975 | 63495 | 55110 | 31596 | 59844 | 56193 | 46987 | 28575 | 48712 |
| 63506 | 55107 | 31593 | 59841 | 40916 | 46046 | 32394 | 48653 | 58972 | 62489 | 59579 | 30674 | 40878 | 51194 | 53759 | 46933 |
| 58969 | 61772 | 44526 | 30615 | 40875 | 51135 | 32340 | 47842 | 44023 | 56380 | 59043 | 61622 | 24551 | 52687 | 59749 | 56112 |
| 52860 | 56377 | 58102 | 61619 | 24562 | 52698 | 59760 | 40821 | 46906 | 32302 | 60550 | 56003 | 46825 | 28413 | 32168 | 60170 |
| 45951 | 32299 | 60547 | 55958 | 46780 | 54727 | 28648 | 31213 | 30579 | 48399 | 58715 | 48332 | 54941 | 61975 | 32086 | 48064 |
| 44879 | 48410 | 62478 | 60044 | 30453 | 48329 | 58589 | 55176 | 52606 | 58324 | 61481 | 60455 | 55922 | 32521 | 53153 | 55732 |
| 62210 | 32083 | 48005 | 52603 | 58321 | 60466 | 55863 | 54646 | 58283 | 44626 | 31978 | 60008 | 48237 | 55084 | 31654 | 59790 |
| 31580 | 52212 | 55729 | 43006 | 46523 | 31919 | 59949 | 48248 | 30199 | 40907 | 47969 | 51167 | 58229 | 48770 | 56409 | 59030 |
| 58732 | 55081 | 31651 | 59787 | 40862 | 47924 | 54986 | 62048 | 61651 | 30648 | 60688 | 56085 | 46879 | 32331 | 52963 | 55542 |
| 47815 | 56588 | 59027 | 61830 | 24535 | 29693 | 59733 | 32286 | 46812 | 32141 | 59695 | 40826 | 54894 | 59628 | 55977 | 48675 |
| 52918 | 55539 | 46809 | 28621 | 32152 | 59706 | 40767 | 54891 | 54760 | 58935 | 61794 | 45024 | 47589 | 58801 | 30458 | 60498 |
| 59625 | 40700 | 47734 | 54701 | 59170 | 61735 | 44965 | 47600 | 55895 | 46717 | 32060 | 48010 | 53140 | 55761 | 58270 | 46555 |
| 56398 | 61668 | 30399 | 60439 | 56130 | 46952 | 28540 | 32057 | 31951 | 59981 | 63512 | 55113 | 31683 | 52203 | 40446 | 47956 |
| 53137 | 58267 | 31962 | 59992 | 48221 | 55068 | 31638 | 52158 | 62976 | 60066 | 48295 | 58611 | 54246 | 30621 | 47915 | 53045 |
| 40443 | 47953 | 54511 | 62021 | 44775 | 48306 | 58790 | 54243 | 58175 | 31870 | 47848 | 52950 | 56467 | 58108 | 61625 | 24568 |
| 56864 | 61994 | 31867 | 47789 | 52947 | 55750 | 58105 | 46572 | 31602 | 59738 | 40799 | 46069 | 32417 | 60553 | 55964 | 48662 |
| 24509 | 31543 | 59679 | 54878 | 31476 | 59612 | 55961 | 48659 | 54733 | 59202 | 61767 | 44997 | 48528 | 62596 | 30431 | 52855 |
| 54744 | 59143 | 61778 | 45008 | 47573 | 59076 | 62593 | 30666 | 56610 | 62216 | 32089 | 44970 | 47535 | 52721 | 57851 | 60472 |
| 53090 | 55655 | 46925 | 44015 | 47546 | 56484 | 61614 | 24319 | 55869 | 46775 | 54652 | 28643 | 31222 | 52190 | 55707 | 44916 |
| 59517 | 56104 | 47010 | 54649 | 28598 | 31219 | 52187 | 44913 | 48433 | 62501 | 60039 | 30574 | 48338 | 58822 | 55171 | 31657 |
| 58981 | 62512 | 60050 | 30571 | 48279 | 58819 | 54230 | 16380 | 47902 | 56896 | 62026 | 47821 | 59033 | 61836 | 24541 | 31575 |
| 47899 | 56837 | 61967 | 32078 | 47832 | 52710 | 58316 | 61833 | 52095 | 32404 | 52924 | 55545 | 59958 | 48243 | 58727 | 55090 |
| 55914 | 32401 | 52921 | 55724 | 59955 | 48422 | 58738 | 54135 | 59824 | 40885 | 46015 | 55009 | 31467 | 47740 | 56583 | 59176 |
| 44533 | 54964 | 31422 | 30191 | 47737 | 53063 | 56594 | 58221 | 61741 | 44943 | 47578 | 56516 | 61646 | 32309 | 60445 | 56136 |
| 61752 | 44954 | 47519 | 56513 | 59022 | 61643 | 32544 | 60680 | 47042 | 28630 | 32147 | 52667 | 60177 | 62544 | 59634 | 40695 |
| 56077 | 46983 | 28627 | 55534 | 48708 | 62485 | 59575 | 30558 | 54710 | 31644 | 44862 | 47483 | 56421 | 58986 | 61551 | 44781 |
| 40930 | 51190 | 54707 | 31641 | 44859 | 56432 | 58927 | 61562 | 48312 | 58796 | 54249 | 46947 | 28535 | 56842 | 62112 | 31985 |
| 44792 | 47357 | 58793 | 54204 | 46902 | 32354 | 60490 | 55887 | 52953 | 55756 | 59987 | 48454 | 55063 | 31549 | 59797 | 54996 |
| 46821 | 32164 | 53132 | 55753 | 60166 | 48451 | 58711 | 63616 | 31454 | 48665 | 59149 | 61784 | 44538 | 39935 | 58606 | 54955 |
| 54993 | 31451 | 47948 | 59160 | 61725 | 44479 | 58603 | 54014 | 32576 | 47798 | 53096 | 55661 | 58338 | 46567 | 56462 | 63524 |
| 32517 | 47795 | 53037 | 55672 | 58279 | 46578 | 31974 | 52942 | 54901 | 31359 | 59607 | 56194 | 47016 | 54739 | 28604 | 31225 |
| 56459 | 60004 | 63521 | 55136 | 31594 | 59842 | 40903 | 46061 | 44891 | 58959 | 62490 | 60056 | 30689 | 48285 | 58825 | 54236 |
| 28601 | 48654 | 56405 | 58970 | 61535 | 44765 | 30644 | 48520 | 46934 | 48017 | 56367 | 62085 | 32196 | 52716 | 59750 | 56099 |
| 58780 | 54233 | 46931 | 32327 | 52847 | 56378 | 62096 | 32193 | 56032 | 46826 | 28414 | 31931 | 59961 | 48428 | 58744 | 54141 |
| 52713 | 59747 | 40822 | 60576 | 55973 | 46767 | 54756 | 28411 | 16375 | 44511 | 54942 | 62004 | 32101 | 47827 | 53069 | 56600 |
| 31214 | 44908 | 48425 | 58685 | 30454 | 48330 | 58590 | 54939 | 58311 | 61842 | 60932 | 63553 | 32522 | 53154 | 55719 | 46989 |
| 62001 | 32112 | 48006 | 53080 | 55645 | 58322 | 46551 | 60929 | 28633 | 48238 | 54847 | 59581 | 30676 | 40936 | 47970 | 51196 |
| 63508 | 55109 | 31567 | 52199 | 55730 | 47000 | 32396 | 59950 | 54713 | 58230 | 61747 | 44977 | 56410 | 59045 | 61680 | 30635 |
| 48235 | 58495 | 55082 | 59816 | 30673 | 40877 | 47911 | 51193 | 60675 | 56086 | 46908 | 32360 | 60608 | 56005 | 46799 | 32142 |
| 58227 | 47844 | 56351 | 59056 | 61621 | 24564 | 29694 | 52700 | 60172 | 30581 | 48457 | 58717 | 55978 | 54523 | 62033 | 44787 |
| 59734 | 56083 | 46905 | 32301 | 60549 | 56016 | 46810 | 28622 | 47590 | 58802 | 54199 | 60513 | 55924 | 46718 | 32047 | 47801 |
| 32139 | 60169 | 48412 | 62536 | 59626 | 40687 | 54702 | 62212 | 53127 | 55762 | 58285 | 46584 | 31980 | 59982 | 63499 | 55114 |
| 32085 | 44966 | 47587 | 52605 | 57847 | 60468 | 55921 | 46715 | 31712 | 59848 | 40909 | 47943 | 59155 | 48772 | 59088 | 61653 |
| 28527 | 32058 | 53138 | 55703 | 58296 | 46525 | 31977 | 59979 | 30622 | 53046 | 55667 | 46937 | 32333 | 44027 | 52965 | 56496 |
| 48222 | 55055 | 31653 | 59789 | 40920 | 47954 | 54988 | 62022 | 58095 | 61626 | 24555 | 59753 | 40828 | 46070 | 32418 | 60554 |
| 48769 | 59029 | 61888 | 30619 | 53043 | 32344 | 47790 | 52976 | 55951 | 48677 | 54734 | 58993 | 61796 | 44998 | 30527 | 48515 |
| 55541 | 58106 | 46335 | 24510 | 59708 | 40825 | 46067 | 54893 | 58775 | 30460 | 60500 | 56849 | 61979 | 32090 | 48012 | 52722 |
| 31463 | 59599 | 55962 | 48688 | 54731 | 59172 | 61793 | 44995 | 58328 | 46557 | 60459 | 55870 | 54639 | 31685 | 52205 | 55736 |
| 47574 | 62594 | 30457 | 60497 | 56132 | 46926 | 32031 | 48009 | 44903 | 48434 | 62502 | 60068 | 48353 | 58613 | 55200 | 31658 |
| 52663 | 58269 | 31964 | 59518 | 55867 | 54650 | 31696 | 52216 | 30203 | 47917 | 53075 | 58233 | 47822 | 56469 | 59034 | 61599 |

| | | | | | | | | | | | | | | |
|---|---|---|---|---|---|---|---|---|---|---|---|---|---|---|
| 24542 | 31604 | 59740 | 56089 | 46995 | 32391 | 52911 | 55546 | 55232 | 31690 | 47949 | 59161 | 48302 | 58618 | 54015 | 32532 |
| 48720 | 59204 | 62721 | 59811 | 40886 | 55010 | 47727 | 56612 | 48034 | 53052 | 55673 | 58294 | 46579 | 31975 | 52943 | 56474 |
| 58939 | 61742 | 24447 | 44972 | 47593 | 52695 | 57853 | 32310 | 60005 | 63536 | 55137 | 31595 | 59843 | 40918 | 46076 | 32424 |
| 60446 | 55899 | 46833 | 28645 | 32176 | 53144 | 55709 | 60178 | 48655 | 56644 | 58971 | 61774 | 45004 | 30645 | 48521 | 58781 |
| 48407 | 62531 | 60097 | 48340 | 55173 | 31631 | 47960 | 56422 | 32342 | 52862 | 56379 | 62097 | 32208 | 52728 | 59762 | 40823 |
| 62028 | 44782 | 48299 | 58559 | 54250 | 32529 | 53049 | 58291 | 60577 | 55988 | 46782 | 54757 | 28650 | 31215 | 44909 | 48440 |
| 31986 | 52954 | 55519 | 60016 | 48245 | 55092 | 31550 | 59798 | 62508 | 60046 | 30455 | 48331 | 58591 | 55178 | 62240 | 32113 |
| 40915 | 46073 | 54983 | 31469 | 48666 | 56641 | 59150 | 61771 | 48007 | 53081 | 58323 | 60944 | 63509 | 55124 | 31582 | 52214 |
| 45001 | 47580 | 62600 | 32339 | 52859 | 55662 | 47044 | 32149 | 55731 | 47001 | 32397 | 59951 | 48250 | 58734 | 55083 | 59817 |
| 52669 | 59703 | 54902 | 59636 | 55985 | 46779 | 54768 | 28591 | 40892 | 47926 | 55016 | 62050 | 47845 | 56590 | 59057 | 61860 |
| 31226 | 44920 | 47485 | 58988 | 62505 | 60043 | 30690 | 48286 | 24565 | 29695 | 52701 | 59735 | 32316 | 60564 | 56017 | 46811 |
| 58826 | 54223 | 46949 | 48018 | 56844 | 62086 | 31959 | 52479 | 28623 | 32154 | 60184 | 48413 | 62537 | 59627 | 40702 | 54703 |
| 59989 | 63744 | 55121 | 31579 | 52211 | 32408 | 59962 | 48191 | 62213 | 44967 | 47602 | 56428 | 61670 | 60469 | 56160 | 46954 |
| 58731 | 54142 | 44540 | 40889 | 47923 | 54957 | 61991 | 32102 | 28542 | 32059 | 53139 | 58297 | 31992 | 59994 | 48223 | 55070 |
| 47856 | 53070 | 56587 | 58340 | 61857 | 56520 | 63554 | 32313 | 31668 | 59804 | 40921 | 47955 | 54989 | 62023 | 48784 | 59268 |
| 60561 | 56196 | 46990 | 54741 | 28634 | 31199 | 44893 | 62492 | 61889 | 56866 | 32345 | 47791 | 52977 | 55780 | 58107 | 46574 |
| 59582 | 30663 | 40699 | 51183 | 54714 | 62224 | 44978 | 47543 | 24511 | 59709 | 54908 | 31478 | 59614 | 55963 | 48689 | 54746 |
| 56425 | 59046 | 61667 | 60704 | 56101 | 46895 | 28539 | 56006 | 59173 | 61808 | 45010 | 47575 | 59078 | 62595 | 30696 | 60736 |
| 46828 | 31933 | 59935 | 30582 | 48458 | 58718 | 55067 | 31665 | 56133 | 46927 | 48024 | 56486 | 62092 | 31965 | 59519 | 56106 |
| 59801 | 55000 | 62034 | 47829 | 59265 | 61844 | 60514 | 55911 | 54651 | 31697 | 52217 | 44915 | 58983 | 62514 | 60080 | 48309 |
| 32524 | 47802 | 53156 | 55777 | 58286 | 46571 | 28159 | 63528 | 58849 | 54260 | 16382 | 47929 | 56839 | 61997 | 32108 | 47834 |
| 54905 | 31475 | 59611 | 40910 | 47972 | 54687 | 59184 | 61749 | 53188 | 56705 | 58318 | 61835 | 63560 | 32403 | 52923 | 55726 |
| 44951 | 56412 | 59075 | 61654 | 30637 | 60677 | 56144 | 46938 | 48900 | 59216 | 61781 | 44535 | 54966 | 30669 | 47739 | 53093 |
| 32334 | 52966 | 56483 | 62089 | 32200 | 59754 | 40815 | 55980 | 56624 | 58223 | 61754 | 44984 | 47549 | 56515 | 59052 | 61673 |
| 48678 | 54525 | 58994 | 61559 | 44789 | 48544 | 58804 | 54257 | 32546 | 60682 | 56079 | 47013 | 28657 | 56012 | 48710 | 62487 |
| 16379 | 30447 | 60487 | 56850 | 62008 | 32105 | 47775 | 53185 | 60053 | 30588 | 48576 | 58836 | 55185 | 31643 | 56434 | 62040 |
| 55764 | 58315 | 46558 | 60936 | 63501 | 55116 | 31686 | 52206 | 44794 | 47359 | 58795 | 54206 | 60520 | 55917 | 46823 | 32166 |
| 55723 | 48897 | 59157 | 48354 | 58614 | 54963 | 30680 | 47918 | 53134 | 55755 | 60196 | 48481 | 58741 | 63618 | 54995 | 31481 |
| 53104 | 55669 | 58234 | 46463 | 44029 | 56470 | 59049 | 61628 | 47950 | 56597 | 59162 | 61727 | 44957 | 59081 | 61660 | 32519 |
| 24557 | 31591 | 59727 | 56090 | 47024 | 32420 | 60556 | 56009 | 53039 | 55674 | 47056 | 32452 | 52972 | 56489 | 60006 | 63523 |
| 48707 | 58967 | 62722 | 60288 | 30585 | 48517 | 58833 | 56375 | 55138 | 59872 | 40933 | 46063 | 28603 | 48684 | 56407 | 59000 |
| 61981 | 32092 | 44735 | 47594 | 52724 | 57854 | 54203 | 60461 | 61565 | 44767 | 30646 | 48522 | 58782 | 54235 | 46961 | 32357 |
| 55928 | 46834 | 28646 | 32163 | 53131 | 55710 | 60193 | 48436 | 60493 | 56856 | 62098 | 32195 | 52715 | 60225 | 48468 | 60578 |
| 62560 | 60098 | 48327 | 55174 | 31660 | 30205 | 47947 | 53077 | 55975 | 54758 | 31692 | 44910 | 48427 | 58687 | 48360 | 58620 |
| 58207 | 48776 | 59036 | 61657 | 32530 | 53050 | 55615 | 46997 | 54969 | 62003 | 32114 | 48036 | 53082 | 55647 | 58352 | 46581 |
| 32449 | 52969 | 55548 | 60003 | 48246 | 55079 | 59813 | 40944 | 56476 | 60931 | 63510 | 55111 | 31597 | 59845 | 56208 | 47002 |
| 46074 | 55012 | 31470 | 48681 | 56642 | 58941 | 61800 | 45002 | 32398 | 48713 | 58973 | 62728 | 59818 | 30675 | 40879 | 51195 |
| 30643 | 47567 | 58779 | 32368 | 60504 | 55901 | 46807 | 32150 | 47846 | 56381 | 59058 | 61623 | 24566 | 52702 | 59764 | 56113 |
| 52670 | 60180 | 48465 | 62533 | 59623 | 55986 | 54755 | 31689 | 46907 | 32303 | 60551 | 56018 | 46840 | 28652 | 32169 | 60171 |
| 44907 | 47486 | 62506 | 60072 | 48301 | 58617 | 54252 | 46950 | 48414 | 62538 | 60104 | 48333 | 55180 | 62214 | 32087 | 48065 |
| 32055 | 48033 | 53023 | 58293 | 31988 | 52956 | 56473 | 59990 | 52607 | 58325 | 60470 | 55923 | 32536 | 53168 | 55733 | 58298 |
| 63507 | 55122 | 31608 | 59856 | 40917 | 46047 | 32395 | 48668 | 46527 | 31979 | 60009 | 48252 | 55085 | 31655 | 59791 | 40922 |
| 59208 | 61773 | 44527 | 40890 | 54958 | 32341 | 47843 | 52861 | 47984 | 54990 | 62052 | 48771 | 56648 | 59031 | 61890 | 30649 |
| 56616 | 58103 | 61858 | 24563 | 52699 | 59761 | 32314 | 60562 | 60689 | 32346 | 52978 | 55543 | 46813 | 32156 | 59710 | 40827 |
| 55959 | 46781 | 54742 | 28649 | 31228 | 44894 | 48411 | 62479 | 54895 | 59629 | 55992 | 48690 | 54761 | 59174 | 61795 | 45025 |
| 60045 | 30692 | 48344 | 58828 | 55177 | 62211 | 48020 | 56426 | 47604 | 62624 | 30459 | 60499 | 56134 | 46956 | 32061 | 48011 |
| 62144 | 60467 | 56102 | 54647 | 31581 | 52213 | 43007 | 31934 | 53141 | 58271 | 31966 | 59996 | 63513 | 55128 | 31698 | 52218 |
| 59964 | 48249 | 58733 | 55096 | 31666 | 59802 | 40863 | 47925 | 40447 | 47957 | 62977 | 60067 | 48310 | 58850 | 54247 | 47930 |
| 54987 | 62049 | 47830 | 56589 | 59266 | 61831 | 63556 | 32287 | 56868 | 61998 | 31871 | 47849 | 52951 | 56706 | 58109 | 61864 |
| 52919 | 55778 | 47048 | 28636 | 32153 | 59707 | 54906 | 59640 | 24569 | 31603 | 59739 | 32432 | 60568 | 55965 | 48663 | 54748 |
| 40701 | 47735 | 54716 | 59171 | 61750 | 44980 | 47601 | 56399 | 59203 | 61782 | 45012 | 48529 | 62597 | 30670 | 53094 | 56611 |
| 59104 | 61669 | 30638 | 60678 | 56131 | 46953 | 28541 | 56960 | 62217 | 44971 | 47550 | 56544 | 61674 | 60473 | 56108 | 47014 |
| 62090 | 31963 | 59993 | 48460 | 55069 | 31639 | 52159 | 54526 | 54653 | 28658 | 31223 | 52191 | 44917 | 62516 | 60054 | 30575 |
| 62036 | 44790 | 48307 | 58791 | 54258 | 60516 | 56865 | 61995 | 48339 | 58823 | 55186 | 31672 | 47903 | 56897 | 62027 | 47836 |
| 32106 | 47804 | 53186 | 55751 | 58344 | 46573 | 63502 | 54879 | 59272 | 61837 | 55918 | 32405 | 52925 | 55784 | 59959 | 48482 |
| 31477 | 59613 | 56200 | 48898 | 54745 | 59158 | 61779 | 45009 | 58742 | 55091 | 59825 | 55024 | 31482 | 47741 | 56598 | 59177 |
| 59077 | 62608 | 30667 | 53091 | 55670 | 46940 | 44030 | 47547 | 61756 | 44958 | 47579 | 56517 | 59082 | 61647 | 32548 | 60684 |
| 56485 | 59050 | 61615 | 24558 | 59756 | 56105 | 47011 | 28599 | 56137 | 47043 | 28631 | 56490 | 64000 | 62545 | 59635 | 40934 |
| 56010 | 48736 | 58996 | 62513 | 60051 | 30586 | 48518 | 58834 | 54711 | 31645 | 44863 | 56436 | 58987 | 61566 | 44796 | 48313 |
| 54231 | 16381 | 56852 | 61982 | 32079 | 47833 | 52711 | 58317 | 58797 | 54264 | 46962 | 32358 | 60494 | 56843 | 62113 | 32224 |
| 61848 | 60462 | 55915 | 32640 | 53160 | 55725 | 60194 | 48423 | 53192 | 55757 | 60226 | 48455 | 63620 | 54997 | 31455 | 48904 |
| 58739 | 48356 | 54965 | 31423 | 30206 | 47976 | 53078 | 56595 | 59164 | 61785 | 44539 | 58607 | 54970 | 32577 | 47799 | 53097 |
| 58236 | 61753 | 44955 | 56528 | 59023 | 61658 | 32545 | 60681 | 55676 | 58339 | 46582 | 56463 | 60960 | 63525 | 55140 | 31598 |
| 56092 | 46998 | 32450 | 52970 | 55535 | 48709 | 62724 | 59814 | 59846 | 56195 | 47017 | 28605 | 48714 | 58974 | 62491 | 60057 |
| 30559 | 40931 | 51191 | 48682 | 56433 | 58942 | 61563 | 44793 | 30704 | 48524 | 58840 | 54237 | 46935 | 56382 | 62100 | 32197 |
| 47596 | 58808 | 54205 | 46903 | 32355 | 60491 | 55902 | 46836 | 52717 | 59751 | 56114 | 60580 | 56033 | 46827 | 28415 | 32170 |
| 32165 | 53133 | 55768 | 60167 | 48466 | 62534 | 60100 | 63617 | 60200 | 48429 | 58745 | 48334 | 54943 | 62005 | 32116 | 48066 |

| | | | | | | | | | | | | | | |
|---|---|---|---|---|---|---|---|---|---|---|---|---|---|---|
| 53084 | 56601 | 58326 | 61843 | 60933 | 63568 | 32523 | 53155 | 24559 | 59757 | 56120 | 47026 | 32422 | 60558 | 56011 | 48737 |
| 55734 | 47004 | 32456 | 60010 | 48239 | 55086 | 59820 | 30677 | 58997 | 62752 | 60290 | 30587 | 48519 | 58835 | 56853 | 61983 |
| 40937 | 47971 | 51197 | 58231 | 48800 | 56411 | 59060 | 61681 | 32094 | 48072 | 52726 | 58332 | 61849 | 60463 | 55930 | 32641 |
| 30650 | 60690 | 56087 | 46909 | 32361 | 60609 | 56020 | 46814 | 53161 | 55740 | 60195 | 48438 | 62562 | 60128 | 48357 | 55204 |
| 32143 | 60173 | 48472 | 62540 | 59630 | 55979 | 54762 | 62272 | 31662 | 30207 | 47977 | 53079 | 58237 | 48778 | 56529 | 59038 |
| 45026 | 47591 | 58803 | 60528 | 55925 | 46719 | 32062 | 48040 | 61659 | 32560 | 60696 | 56093 | 46999 | 32451 | 52971 | 55550 |
| 53142 | 55763 | 58300 | 46585 | 31981 | 59983 | 63514 | 55115 | 48724 | 62725 | 59815 | 40946 | 55014 | 48683 | 56672 | 58943 |
| 31713 | 59849 | 40924 | 47958 | 62978 | 48773 | 59089 | 61892 | 61802 | 45032 | 47597 | 58809 | 32370 | 60506 | 55903 | 46837 |
| 30623 | 53047 | 32348 | 47850 | 52980 | 56497 | 58110 | 61627 | 32180 | 53148 | 55769 | 60182 | 48467 | 62535 | 60101 | 63632 |
| 24570 | 59768 | 40829 | 46071 | 32419 | 60555 | 55966 | 48692 | 55233 | 31691 | 47964 | 62984 | 60074 | 48303 | 58619 | 54254 |
| 54735 | 59232 | 61797 | 44999 | 48530 | 62598 | 30461 | 60501 | 32533 | 48035 | 53053 | 58295 | 31990 | 52958 | 56475 | 60020 |
| 57088 | 62218 | 32091 | 48013 | 52723 | 58329 | 60474 | 55871 | 63537 | 55152 | 31610 | 59858 | 40919 | 46077 | 32425 | 48670 |
| 54654 | 31700 | 52220 | 55737 | 44918 | 48435 | 62503 | 60069 | 56645 | 59210 | 61775 | 45005 | 48536 | 62604 | 32343 | 52863 |
| 48368 | 58852 | 55201 | 31659 | 47932 | 56898 | 62056 | 47823 | 56618 | 62336 | 32209 | 52729 | 59763 | 60592 | 55989 | 46783 |
| 56708 | 59035 | 61838 | 24543 | 31605 | 59741 | 32406 | 52926 | 54772 | 28651 | 31230 | 44924 | 48441 | 62509 | 60047 | 30694 |
| 55547 | 48721 | 59205 | 62736 | 59826 | 40887 | 55011 | 47742 | 48346 | 58830 | 55179 | 62241 | 48022 | 56904 | 62146 | 60945 |
| 56613 | 59178 | 61743 | 44973 | 47608 | 56518 | 61676 | 32311 | 63748 | 55125 | 31583 | 52215 | 32412 | 59966 | 48251 | 58735 |
| 60447 | 56138 | 47072 | 28660 | 32177 | 53145 | 60179 | 62546 | 55098 | 59832 | 40893 | 47927 | 55017 | 62051 | 47860 | 56591 |
| 60112 | 48341 | 55188 | 31646 | 47961 | 56423 | 62029 | 44783 | 59296 | 61861 | 56524 | 63558 | 32317 | 60565 | 56256 | 47050 |
| 48314 | 58798 | 54251 | 56872 | 62114 | 31987 | 52955 | 55758 | 28638 | 32155 | 60185 | 62552 | 59642 | 40703 | 54718 | 62228 |
| 60017 | 48484 | 55093 | 31551 | 59799 | 54998 | 31484 | 48667 | 44982 | 47603 | 56429 | 59106 | 61671 | 60708 | 56161 | 46955 |
| 56656 | 59151 | 61786 | 45016 | 47581 | 59084 | 62601 | 32578 | 28543 | 56962 | 62120 | 31993 | 59995 | 48462 | 55071 | 31669 |
| 53098 | 55663 | 47045 | 56492 | 63526 | 54903 | 59637 | 56224 | 59805 | 55004 | 62038 | 48785 | 59269 | 61904 | 60518 | 56867 |
| 47018 | 54769 | 28606 | 31227 | 44921 | 58989 | 62520 | 60058 | 32584 | 47806 | 53216 | 55781 | 58346 | 46575 | 63532 | 54909 |
| 30691 | 48287 | 58827 | 54238 | 46964 | 48019 | 56845 | 62087 | 31479 | 59615 | 56202 | 48928 | 54747 | 59188 | 61809 | 45011 |
| 32198 | 52718 | 60228 | 63745 | 56034 | 32409 | 59963 | 48430 | 59079 | 62610 | 30697 | 60737 | 56148 | 46942 | 48025 | 56487 |
| 58746 | 54143 | 44541 | 54972 | 62006 | 32103 | 47857 | 53071 | 62093 | 32204 | 59758 | 56107 | 56040 | 48738 | 58998 | 62515 |
| 56602 | 58341 | 61872 | 56521 | 60934 | 63555 | 32552 | 60800 | 60081 | 48548 | 58864 | 54261 | 16383 | 56854 | 62012 | 32109 |
| 56197 | 46991 | 28635 | 48716 | 62493 | 59583 | 30678 | 40938 | 47835 | 53189 | 56720 | 58319 | 61850 | 60940 | 63561 | 32642 |
| 51198 | 54715 | 62225 | 44979 | 56440 | 59047 | 61682 | 60705 | 53162 | 55727 | 48901 | 59217 | 48358 | 54967 | 30684 | 47978 |
| 56116 | 46910 | 32362 | 60610 | 56007 | 46829 | 32172 | 60174 | 53108 | 56625 | 58238 | 61755 | 44985 | 56530 | 59053 | 61688 |
| 30583 | 48459 | 58719 | 63624 | 55001 | 62035 | 48068 | 59280 | 32547 | 60683 | 56094 | 47028 | 32480 | 60616 | 56013 | 48711 |
| 61845 | 60515 | 55926 | 32525 | 47803 | 53157 | 55792 | 58287 | 62726 | 60292 | 30589 | 48577 | 58837 | 56435 | 62041 | 44795 |
| 46586 | 31982 | 60012 | 63529 | 55144 | 31714 | 59850 | 40911 | 47598 | 58810 | 54207 | 60521 | 55932 | 46838 | 32167 | 53135 |
| 47973 | 59185 | 48774 | 56413 | 59090 | 61655 | 30652 | 60692 | 55770 | 60197 | 48496 | 62564 | 60102 | 63619 | 55234 | 31720 |
| 56145 | 46939 | 32335 | 52967 | 56498 | 62104 | 32201 | 59755 | 47951 | 59163 | 48780 | 59096 | 61661 | 32534 | 53054 | 55675 |
| 40830 | 60584 | 55981 | 48679 | 54764 | 58995 | 61798 | 45028 | 47057 | 32453 | 52973 | 56504 | 60007 | 63538 | 55139 | 59873 |
| 48545 | 58805 | 30462 | 60502 | 56851 | 62009 | 32120 | 48014 | 40948 | 46078 | 32426 | 48685 | 56646 | 59001 | 61804 | 45006 |
| 53200 | 55765 | 58330 | 46559 | 60937 | 63516 | 55117 | 31687 | 30647 | 48523 | 58783 | 32372 | 60508 | 56857 | 62099 | 32210 |
| 52207 | 55738 | 48912 | 62980 | 60070 | 48355 | 58615 | 55202 | 52730 | 60240 | 48469 | 60579 | 55990 | 54759 | 31693 | 44911 |
| 30681 | 47919 | 53105 | 58235 | 47852 | 56471 | 59064 | 61629 | 48442 | 62510 | 60076 | 48361 | 58621 | 55208 | 62242 | 32115 |
| 24572 | 31606 | 59742 | 56091 | 47025 | 32421 | 60557 | 56024 | 48037 | 53083 | 58353 | 56477 | 60946 | 63511 | 55126 | 31612 |
| 48722 | 59206 | 62723 | 60289 | 48532 | 62656 | 61614 | 62220 | 59860 | 56209 | 47003 | 32399 | 48728 | 59212 | 62729 | 59819 |
| 32093 | 44974 | 47595 | 52725 | 57855 | 60476 | 55929 | 46835 | 40894 | 55018 | 47847 | 56620 | 59059 | 61862 | 24567 | 52703 |
| 28647 | 32178 | 53146 | 55711 | 60208 | 48437 | 62561 | 60099 | 59765 | 32318 | 60566 | 56019 | 46841 | 28653 | 32184 | 60186 |
| 48342 | 55175 | 31661 | 47962 | 56900 | 62030 | 48777 | 59037 | 48415 | 62539 | 60105 | 48348 | 55181 | 62215 | 48080 | 56430 |
| 61896 | 32531 | 53051 | 32464 | 52984 | 55549 | 60018 | 48247 | 62148 | 60471 | 56162 | 32537 | 53169 | 58299 | 31994 | 60024 |
| 55094 | 59828 | 40945 | 46075 | 55013 | 31471 | 48696 | 56643 | 48253 | 55100 | 31670 | 59806 | 40923 | 47985 | 54991 | 62053 |
| 59180 | 61801 | 45003 | 47582 | 62602 | 32369 | 60505 | 56140 | 48786 | 56649 | 59270 | 61891 | 64512 | 32347 | 52979 | 55782 |
| 47046 | 32151 | 52671 | 60181 | 62548 | 59638 | 55987 | 54770 | 47052 | 32157 | 59711 | 54910 | 59644 | 55993 | 48691 | 54776 |
| 31704 | 44922 | 47487 | 58990 | 62507 | 60073 | 48316 | 58856 | 59175 | 61810 | 45040 | 47605 | 59108 | 62625 | 30698 | 60738 |
| 54253 | 46951 | 48048 | 56846 | 62116 | 31989 | 52957 | 56712 | 56135 | 46957 | 48026 | 56964 | 62094 | 31967 | 59997 | 63752 |
| 59991 | 63746 | 55123 | 31609 | 59857 | 32410 | 48669 | 59209 | 55129 | 31699 | 52219 | 62992 | 60082 | 48311 | 58851 | 54262 |
| 61788 | 44542 | 40891 | 54959 | 32580 | 47858 | 53100 | 56617 | 47931 | 56869 | 61999 | 32110 | 47864 | 53190 | 56707 | 58348 |
| 58342 | 61859 | 56522 | 63584 | 32315 | 60563 | 56198 | 47020 | 61865 | 63562 | 32433 | 60569 | 56204 | 48902 | 54749 | 59218 |
| 54743 | 28664 | 31229 | 44895 | 62494 | 60060 | 30693 | 48345 | 61783 | 45013 | 62612 | 30671 | 53095 | 56626 | 62232 | 44986 |
| 58829 | 55192 | 62226 | 48021 | 56427 | 62145 | 60706 | 56103 | 47551 | 56545 | 59054 | 61675 | 60712 | 56109 | 47015 | 28659 |
| 56036 | 46830 | 31935 | 59965 | 48488 | 58748 | 55097 | 31667 | 56014 | 48740 | 62517 | 60055 | 30590 | 48578 | 58838 | 55187 |
| 59803 | 55002 | 62064 | 47831 | 56604 | 59267 | 61846 | 60992 | 31673 | 56912 | 62042 | 47837 | 59273 | 61852 | 60522 | 55919 |
| 63557 | 32526 | 53158 | 55779 | 47049 | 28637 | 63530 | 54907 | 32644 | 53164 | 55785 | 60198 | 48483 | 58743 | 63648 | 55025 |
| 59641 | 40940 | 47974 | 54717 | 59186 | 61751 | 44981 | 56414 | 31483 | 47980 | 56599 | 59192 | 61757 | 44959 | 56532 | 59083 |
| 59105 | 61684 | 30639 | 60679 | 56146 | 46968 | 32364 | 60612 | 61662 | 32549 | 60685 | 56152 | 47058 | 32454 | 52974 | 56491 |
| 56961 | 62091 | 32202 | 60232 | 48461 | 55982 | 54527 | 62037 | 64001 | 62784 | 59874 | 40935 | 48686 | 56437 | 59002 | 61567 |
| 44791 | 48546 | 58806 | 54259 | 60517 | 56880 | 62010 | 32107 | 44797 | 48552 | 58812 | 54265 | 46963 | 32359 | 60495 | 56858 |
| 47805 | 53187 | 55766 | 58345 | 46588 | 60938 | 63503 | 55118 | 62128 | 32225 | 53193 | 55772 | 60227 | 48470 | 61056 | 63621 |
| 31716 | 59852 | 56201 | 48899 | 59159 | 48832 | 59092 | 62609 | 55236 | 31694 | 48905 | 59165 | 48362 | 58622 | 54971 | 32592 |
| 30682 | 53106 | 55671 | 46941 | 44031 | 56500 | 59051 | 61630 | 48038 | 53112 | 55677 | 58354 | 46583 | 56478 | 60961 | 63540 |

| | | | | | | | | | | | | | | |
|---|---|---|---|---|---|---|---|---|---|---|---|---|---|---|
| 55141 | 31599 | 59847 | 56210 | 47032 | 32428 | 48715 | 58975 | 32095 | 48073 | 52727 | 58333 | 60478 | 55931 | 32656 | 53176 |
| 62730 | 60296 | 30705 | 48525 | 58841 | 56383 | 62101 | 32212 | 55741 | 60210 | 48439 | 62563 | 60129 | 48372 | 55205 | 31663 |
| 52732 | 59766 | 56115 | 60581 | 56048 | 46842 | 28654 | 32171 | 47992 | 56902 | 62060 | 48779 | 56768 | 59039 | 61898 | 32561 |
| 60201 | 48444 | 62568 | 60106 | 48335 | 55182 | 62244 | 32117 | 60697 | 32466 | 52986 | 55551 | 48725 | 62740 | 59830 | 40947 |
| 48067 | 53085 | 58327 | 60948 | 63569 | 32538 | 53170 | 55735 | 55015 | 48698 | 56673 | 59182 | 61803 | 45033 | 47612 | 62632 |
| 47005 | 32457 | 60011 | 48254 | 55087 | 59821 | 40952 | 47986 | 32371 | 60507 | 56142 | 47076 | 32181 | 53149 | 60183 | 62550 |
| 55020 | 62054 | 48801 | 56650 | 59061 | 61920 | 30651 | 60691 | 60116 | 63633 | 55248 | 31706 | 47965 | 62985 | 60075 | 48318 |
| 32376 | 60624 | 56021 | 46815 | 32158 | 60188 | 48473 | 62541 | 58858 | 54255 | 48050 | 56876 | 62118 | 31991 | 52959 | 56714 |
| 59631 | 55994 | 54763 | 62273 | 45027 | 47606 | 62626 | 60529 | 60021 | 63776 | 55153 | 31611 | 59859 | 32440 | 48671 | 56660 |
| 56164 | 46958 | 32063 | 48041 | 53143 | 58301 | 31996 | 59998 | 59211 | 61790 | 45020 | 48537 | 62605 | 32582 | 53102 | 56619 |
| 63515 | 55130 | 31728 | 59864 | 40925 | 47959 | 62979 | 48788 | 62337 | 56552 | 63586 | 60593 | 56228 | 47022 | 54773 | 28666 |
| 59328 | 61893 | 56870 | 32349 | 47851 | 52981 | 56736 | 58111 | 31231 | 44925 | 62524 | 60062 | 30695 | 48347 | 58831 | 55194 |
| 61866 | 24571 | 59769 | 32434 | 60570 | 55967 | 48693 | 54750 | 62256 | 48023 | 56905 | 62147 | 61184 | 63749 | 56038 | 32413 |
| 59233 | 61812 | 45014 | 48531 | 62599 | 30700 | 60740 | 57089 | 59967 | 48490 | 58750 | 55099 | 59833 | 55032 | 62066 | 47861 |
| 62219 | 48028 | 56546 | 62152 | 60475 | 56110 | 54655 | 31701 | 56606 | 59297 | 61876 | 56525 | 60994 | 63559 | 32556 | 60804 |
| 52221 | 44919 | 62518 | 60084 | 48369 | 58853 | 55216 | 31674 | 56257 | 47051 | 28639 | 64008 | 62553 | 59643 | 40942 | 54719 |
| 47933 | 56899 | 62057 | 47838 | 56709 | 59274 | 61839 | 63564 | 62229 | 44983 | 56444 | 59107 | 61686 | 60709 | 56176 | 46970 |
| 32407 | 52927 | 55786 | 48960 | 59220 | 62737 | 59827 | 55026 | 32366 | 60614 | 56963 | 62121 | 32232 | 60234 | 48463 | 63628 |
| 47743 | 56628 | 59179 | 61758 | 44988 | 47609 | 56519 | 59112 | 55005 | 62039 | 49024 | 59284 | 61905 | 60519 | 56882 | 32585 |
| 61677 | 32550 | 60686 | 56139 | 47073 | 28661 | 56968 | 64002 | 47807 | 53217 | 55796 | 58347 | 46590 | 60968 | 63533 | 55148 |
| 62547 | 60113 | 48580 | 55189 | 31647 | 56438 | 62044 | 44798 | 31718 | 59854 | 56203 | 48929 | 59189 | 48834 | 59094 | 62611 |
| 48315 | 58799 | 54266 | 60524 | 56873 | 62115 | 32226 | 53194 | 30712 | 60752 | 56149 | 46943 | 56502 | 62108 | 32205 | 59759 |
| 55759 | 60256 | 48485 | 63622 | 54999 | 31485 | 48906 | 56657 | 56122 | 60588 | 56041 | 48739 | 58999 | 62754 | 60320 | 48549 |
| 59166 | 61787 | 45017 | 59085 | 62616 | 32579 | 53099 | 55678 | 58865 | 56855 | 62013 | 32124 | 48074 | 53204 | 56721 | 58334 |
| 47060 | 56493 | 60962 | 63527 | 55142 | 59876 | 56225 | 47019 | 61851 | 60941 | 63576 | 32643 | 53163 | 55742 | 48916 | 63040 |
| 28607 | 48744 | 59004 | 62521 | 60059 | 30706 | 48526 | 58842 | 60130 | 48359 | 55206 | 30685 | 47979 | 53109 | 58239 | 48808 |
| 54239 | 46965 | 56860 | 62102 | 32199 | 52719 | 60229 | 63760 | 56531 | 59068 | 61689 | 32562 | 60698 | 56095 | 47029 | 32481 |
| 60582 | 56035 | 32648 | 60202 | 48431 | 58747 | 48364 | 54973 | 60617 | 56028 | 48726 | 62727 | 60293 | 48592 | 62660 | 56674 |
| 62007 | 32118 | 48096 | 53086 | 56603 | 58356 | 61873 | 56536 | 62280 | 45034 | 47599 | 58811 | 60536 | 55933 | 46839 | 32182 |
| 60935 | 63570 | 32553 | 60801 | 56212 | 47006 | 32458 | 48717 | 53150 | 55771 | 60212 | 48497 | 62565 | 60103 | 63634 | 55235 |
| 62732 | 59822 | 30679 | 40939 | 51199 | 48802 | 56441 | 59062 | 31721 | 47966 | 62986 | 48781 | 59097 | 61900 | 32535 | 53055 |
| 61683 | 60720 | 56117 | 46911 | 32363 | 60611 | 56022 | 46844 | 32173 | 32468 | 52988 | 56505 | 60022 | 63539 | 55154 | 59888 | 40949 |
| 60175 | 48474 | 62542 | 60108 | 63625 | 55240 | 62274 | 48069 | 46079 | 32427 | 48700 | 56647 | 59240 | 61805 | 45007 | 48538 |
| 59281 | 60530 | 55927 | 32540 | 48042 | 53172 | 55793 | 58302 | 62606 | 32373 | 60509 | 57096 | 62338 | 32211 | 52731 | 60241 |
| 46587 | 31983 | 60013 | 63544 | 55145 | 31715 | 59851 | 40926 | 60594 | 55991 | 54774 | 31708 | 44926 | 48443 | 62511 | 60077 |
| 47988 | 63008 | 48775 | 56652 | 59091 | 61894 | 30653 | 60693 | 48376 | 58860 | 55209 | 62243 | 48052 | 56906 | 62176 | 56716 |
| 32350 | 52982 | 56499 | 62105 | 32216 | 59770 | 40831 | 60585 | 60947 | 63750 | 55127 | 31613 | 59861 | 32414 | 48729 | 59213 |
| 55996 | 48694 | 54765 | 59234 | 61799 | 45029 | 48560 | 62628 | 62744 | 59834 | 40895 | 55019 | 47862 | 56621 | 59298 | 61863 |
| 30463 | 60503 | 57090 | 62248 | 32121 | 48015 | 53201 | 58331 | 56526 | 63588 | 32319 | 60567 | 56258 | 47080 | 28668 | 32185 |
| 60952 | 63517 | 55132 | 31702 | 52222 | 55739 | 48913 | 62981 | 60187 | 62554 | 60120 | 48349 | 55196 | 62230 | 48081 | 56431 |
| 60071 | 48370 | 58854 | 55203 | 47934 | 56928 | 62058 | 47853 | 62149 | 60710 | 56163 | 56992 | 62122 | 31995 | 60025 | 48492 |
| 56710 | 59065 | 61868 | 24573 | 31607 | 59743 | 32436 | 60572 | 55101 | 31671 | 59807 | 55006 | 62068 | 48787 | 56664 | 59271 |
| 56025 | 48723 | 59207 | 62738 | 60304 | 48533 | 62657 | 56615 | 61906 | 60996 | 64513 | 32586 | 53218 | 55783 | 47053 | 63534 |
| 62221 | 44975 | 47610 | 56548 | 61678 | 60477 | 56168 | 47074 | 54911 | 59645 | 56232 | 48930 | 54777 | 59190 | 61811 | 45041 |
| 28662 | 32179 | 53147 | 60209 | 62576 | 60114 | 48343 | 55190 | 59109 | 62640 | 30699 | 60739 | 56150 | 46972 | 48027 | 56965 |
| 31676 | 47963 | 56901 | 62031 | 48792 | 59276 | 61897 | 56874 | 62095 | 32206 | 60236 | 63753 | 56042 | 62993 | 60083 | 48550 |
| 32465 | 52985 | 55788 | 60019 | 48486 | 55095 | 59829 | 55028 | 58866 | 54263 | 56884 | 62014 | 32111 | 47865 | 53191 | 56722 |
| 31486 | 48697 | 56658 | 59181 | 61816 | 45018 | 47583 | 59086 | 58349 | 61880 | 60942 | 63563 | 32672 | 60808 | 56205 | 48903 |
| 62603 | 32608 | 60744 | 56141 | 47047 | 56494 | 64004 | 62549 | 59219 | 48836 | 62613 | 30686 | 53110 | 56627 | 62233 | 44987 |
| 59639 | 56226 | 54771 | 31705 | 44923 | 58991 | 62522 | 60088 | 56560 | 59055 | 61690 | 60713 | 56124 | 47030 | 32482 | 60618 |
| 48317 | 58857 | 54268 | 46966 | 48049 | 56847 | 62117 | 32228 | 56015 | 48741 | 62756 | 60294 | 30591 | 48579 | 58839 | 56913 |
| 53196 | 56713 | 60230 | 63747 | 63680 | 32411 | 48908 | 59224 | 62043 | 48076 | 59288 | 61853 | 60523 | 55934 | 32645 | 53165 |
| 61789 | 44543 | 54974 | 32581 | 47859 | 53101 | 56632 | 58343 | 55800 | 60199 | 48498 | 62566 | 60132 | 63649 | 55264 | 31722 |
| 61874 | 56523 | 60964 | 63585 | 32554 | 60802 | 56199 | 47021 | 47981 | 59193 | 48782 | 56533 | 59098 | 61663 | 32564 | 60700 |
| 28665 | 48718 | 62495 | 60061 | 30708 | 48584 | 58844 | 55193 | 56153 | 47059 | 32455 | 52975 | 56506 | 64016 | 62785 | 59875 |
| 62227 | 56442 | 62160 | 60707 | 56118 | 60640 | 56037 | 46831 | 40950 | 48687 | 56676 | 59003 | 61806 | 45036 | 48553 | 58813 |
| 32174 | 60204 | 48489 | 58749 | 63626 | 55003 | 62065 | 48070 | 32374 | 60510 | 56859 | 62129 | 32240 | 53208 | 55773 | 60242 |
| 56605 | 59282 | 61847 | 60993 | 63572 | 32527 | 53159 | 55794 | 48471 | 61057 | 63636 | 55237 | 31695 | 48920 | 62988 | 60078 |
| 47064 | 32460 | 60014 | 63531 | 55146 | 59880 | 40941 | 47975 | 48363 | 58623 | 55210 | 32593 | 48039 | 53113 | 58355 | 56479 |
| 59187 | 48804 | 56415 | 59120 | 61685 | 30654 | 60694 | 56147 | 60976 | 63541 | 55156 | 31614 | 59862 | 56211 | 47033 | 32429 |
| 46969 | 32365 | 60613 | 56976 | 62106 | 32203 | 60233 | 48476 | 48730 | 59214 | 62731 | 60297 | 48540 | 62664 | 56622 | 62340 |
| 60586 | 55983 | 54766 | 62276 | 45030 | 48547 | 58807 | 60532 | 32213 | 52733 | 59767 | 60596 | 56049 | 46843 | 28655 | 32186 |
| 56881 | 62011 | 32122 | 48044 | 53202 | 55767 | 58360 | 46589 | 60216 | 48445 | 62569 | 60107 | 48350 | 55183 | 62245 | 48082 |
| 60939 | 63518 | 55119 | 31717 | 59853 | 56216 | 48914 | 62982 | 56908 | 62150 | 60949 | 63808 | 32539 | 53171 | 32472 | 60026 |
| 48833 | 59093 | 62848 | 30683 | 53107 | 47854 | 56501 | 59066 | 48255 | 55102 | 59836 | 40953 | 47987 | 55021 | 62055 | 48816 |
| 61631 | 24574 | 59772 | 56121 | 47027 | 32423 | 60559 | 56026 | 56651 | 59300 | 61921 | 64514 | 32377 | 60625 | 56260 | 47054 |
| 48752 | 59236 | 62753 | 60291 | 48534 | 62658 | 57092 | 62222 | 32159 | 60189 | 62556 | 59646 | 55995 | 54778 | 62288 | 45042 |

| | | | | | | | | | | | | | |
|---|---|---|---|---|---|---|---|---|---|---|---|---|---|
|47607|59110|62627|60768|56165|46959|48056|56966|56272|47066|32462|64009|62792|59882|40943|48806|
|62124|31997|59999|63754|55131|31729|59865|62994|56445|59122|61687|60724|56177|46971|32367|60615|
|48789|59329|61908|56871|32588|47866|53220|56737|56978|62136|32233|60235|48478|61064|63629|55244|
|58350|61867|63592|32435|60571|56206|48932|54751|62278|49025|59285|60534|56883|32600|48046|53232|
|59248|61813|45015|62614|30701|60741|57104|62234|55797|58362|46591|60969|63548|55149|31719|59855|
|48029|56547|62153|60714|56111|56044|48742|62519|56218|48944|63012|48835|59095|62850|30713|60753|
|60085|48608|58868|55217|31675|56914|62072|47839|56503|62109|32220|59774|56123|60589|56056|48754|
|56724|59275|61854|61000|63565|32646|53166|55787|59238|62755|60321|48564|62688|57094|62252|32125|
|48961|59221|63650|55027|47982|56629|59194|61759|48075|53205|58335|60956|63577|32658|53178|55743|
|44989|56534|59113|61692|32551|60687|56154|47088|48917|63041|60131|48374|55207|47994|56932|62062|
|32484|60620|56969|64003|62786|60352|48581|56439|48809|56770|59069|61928|32563|60699|32496|60632|
|62045|44799|48554|58814|54267|60525|56888|62130|56029|48727|62742|60308|48593|62661|56675|62281|
|32227|53195|55774|60257|48500|61058|63623|55238|45035|47614|62634|60537|56172|47078|32183|53151|
|31724|48907|59167|48840|59100|62617|32594|53114|60213|62580|60118|63635|55250|31736|47967|62987|
|55679|47061|56508|60963|63542|55143|59877|56240|48796|59336|61901|56878|32469|52989|56744|60023|
|47034|32430|48745|59005|62760|60298|30707|48527|63778|55155|59889|32442|48701|56662|59241|61820|
|58843|56861|62103|32214|52734|60244|63761|60583|45022|48539|62607|32612|60748|57097|62339|56554|
|56050|32649|60203|48446|62570|60136|48365|55212|64064|60595|56230|54775|31709|44927|62526|60092|
|62246|32119|48097|53087|58357|56537|60950|63571|48377|58861|55224|62258|48053|56907|62177|56717|
|32568|60816|56213|47007|32459|48732|62733|59823|61186|63751|63684|32415|48968|59228|62745|59835|
|40954|55022|48803|56680|59063|61922|60721|32378|55034|47863|56636|59299|61878|56527|61024|63589|
|60626|56023|46845|32188|60190|48475|62543|60109|32558|60806|56259|47081|28669|64010|62555|60121|
|63640|55241|62275|48084|63104|60531|56166|32549|48588|55197|62231|56446|62164|60711|56178|60644|
|48043|53173|58303|31998|60028|63545|55160|31730|56993|62123|32234|60264|48493|63630|55007|62069|
|59866|40927|47989|63009|48790|56653|59330|61895|49026|56665|59286|61907|60997|64528|32587|53219|
|64516|32351|52983|56738|62344|32217|59771|60600|55798|47068|60970|63535|55150|59884|56233|48931|
|55997|48695|54780|59235|61814|45044|48561|62629|59191|48864|59124|62641|30714|60754|56151|46973|
|30702|60742|57091|62249|48030|57024|62154|60953|56980|62110|32207|60237|63768|60590|56043|63232|
|63756|55133|31703|52223|62996|60086|48371|58855|60322|48551|58867|56885|62015|32126|48104|53206|
|55218|47935|56929|62059|47868|56711|59304|61869|56723|58364|61881|60943|63578|32673|60809|56220|
|63566|32437|60573|56264|48962|59222|62739|60305|48918|63042|48837|62852|30687|53111|48810|56561|
|62672|56630|62236|44990|47611|56549|59114|61679|59070|61691|60728|56125|47031|32483|60619|56030|
|60716|56169|47075|28663|56970|64032|62577|60115|48756|62757|60295|48594|62662|57152|62282|48077|
|48582|55191|31677|56916|62046|48793|59277|61912|59289|60538|55935|32660|53180|55801|60214|48499|
|60526|56875|32704|53224|55789|60258|48487|63652|62567|60133|63664|55265|31723|47996|63016|48783|
|55029|31487|48936|56659|59196|61817|45019|59087|56772|59099|61902|32565|60701|32470|52990|56507|
|62618|32609|60745|56156|47062|56495|64005|62788|64017|62800|59890|40951|48702|56677|59242|61807|
|59878|56227|48746|59006|62523|60089|48556|58872|45037|48568|62636|32375|60511|57098|62368|32241|
|54269|46967|56862|62132|32229|53197|56728|60231|53209|60243|61072|63637|55252|31710|48921|62989|
|63762|61060|63681|32650|48909|59225|48366|54975|60079|48378|58862|55211|48054|56936|62178|56718|
|32596|48098|53116|56633|58358|61875|56538|60965|60977|63780|55157|31615|59863|32444|48731|59215|
|63600|32555|60803|56214|32488|48719|62734|60312|62746|60312|48541|62665|56623|62341|56556|63590|
|60300|30709|48585|58845|56443|62161|60722|56119|60597|56288|47082|28670|32187|60217|62584|60122|
|60641|56052|46846|32175|60205|48504|62572|60110|48351|55198|62260|48083|56909|62151|61188|63809|
|63627|55242|62304|48071|59283|61008|63573|32542|56994|32473|60027|48494|55103|59837|55036|62070|
|53174|55795|47065|32461|60015|63546|55147|59881|48817|56666|59301|61936|60998|64515|32616|60864|
|40956|47990|63010|48805|56654|59121|61924|30655|56261|47055|64012|62557|59647|56234|54779|62289|
|60695|32380|60628|56977|62107|32218|60248|48477|45043|59111|62642|60769|56180|46974|48057|56967|
|60587|55998|54767|62277|45031|48562|62630|60533|62125|32236|60238|63755|63688|62995|49028|59344|
|57120|62250|32123|48045|53203|58361|60954|63519|61909|56886|32589|47867|53221|56752|58351|61882|
|55134|31732|59868|56217|48915|62983|48848|59332|60972|63593|32674|60810|56207|48933|59249|48838|
|62849|56930|47855|56740|59067|61870|24575|59773|62615|30716|60756|57105|62235|56562|62168|60715|
|32438|60574|56027|48753|59237|62768|60306|48535|56126|60648|56045|48743|62758|60324|48609|58869|
|62659|57093|62223|48088|56550|62156|60479|56170|56915|62073|48078|56725|59290|61855|61001|63580|
|32657|53177|60211|62578|60144|48373|55220|31678|32647|53167|55802|48976|63044|60134|63651|55266|
|47993|56903|62061|48794|56769|59278|61899|64520|47983|59195|48812|56535|59128|61693|32566|60702|
|32467|52987|55790|48964|62741|59831|55030|48699|56155|47089|32485|60621|56984|64018|62787|60353|
|56688|59183|61818|45048|47613|59116|62633|32610|48596|56678|62284|45038|48555|58815|60540|56889|
|60746|56143|47077|56972|64006|62551|60117|63872|62131|32242|53210|55775|60272|48501|61059|63638|
|55249|31707|63000|60090|48319|58859|54270|48051|55239|31725|48922|62990|48841|59101|62856|32595|
|56877|62119|32230|53198|56715|60260|63777|63682|53115|56509|60978|63543|55158|59892|56241|47035|
|32441|48910|56661|59226|61791|45021|62620|32583|32431|48760|59244|62761|60299|48542|62666|57100|
|53103|56634|62352|56553|60966|63587|60832|56229|62342|32215|52735|60245|60598|56051|32664|60218|
|47023|28667|48748|62525|60063|30710|48586|58846|48447|62571|60137|48380|55213|62247|48112|56910|
|55195|62257|56920|62162|61185|63764|60642|56039|62180|56776|60951|63810|32569|60817|32474|48733|
|32652|60206|48491|58751|63656|55033|62067|48100|62748|59838|40955|55023|48818|56681|59302|61923|
|56607|59312|61877|56540|60995|63574|32557|60805|64544|32379|60627|56262|47084|32189|60191|62558|

| | | | | | | | | | | | | | |
|---|---|---|---|---|---|---|---|---|---|---|---|---|---|
| 60124 | 63641 | 55256 | 62290 | 48085 | 63105 | 60770 | 56167 | 58365 | 60958 | 63579 | 32688 | 60824 | 56221 | 48919 | 63043 |
| 48058 | 56996 | 62126 | 31999 | 60029 | 63784 | 55161 | 31731 | 48852 | 62853 | 56934 | 48811 | 56800 | 59071 | 61930 | 60729 |
| 59867 | 63024 | 48791 | 56668 | 59331 | 61910 | 64517 | 32590 | 32498 | 60634 | 56031 | 48757 | 62772 | 60310 | 48595 | 62663 |
| 53222 | 56739 | 62345 | 63594 | 60601 | 56236 | 48934 | 54781 | 57153 | 62283 | 48092 | 63112 | 60539 | 56174 | 32661 | 53181 |
| 59250 | 61815 | 45045 | 62644 | 30703 | 60743 | 57106 | 62264 | 60215 | 62582 | 60148 | 63665 | 55280 | 31738 | 47997 | 63017 |
| 48031 | 57025 | 62155 | 61192 | 63757 | 56046 | 62997 | 60087 | 48798 | 56773 | 59338 | 61903 | 64524 | 32471 | 52991 | 56746 |
| 48610 | 58870 | 55219 | 56944 | 62074 | 47869 | 56726 | 59305 | 64256 | 62801 | 59891 | 48703 | 56692 | 59243 | 61822 | 45052 |
| 61884 | 61002 | 63567 | 32676 | 60812 | 56265 | 48963 | 59223 | 48569 | 62637 | 32614 | 60750 | 57099 | 62369 | 57032 | 64066 |
| 64128 | 62673 | 56631 | 62237 | 44991 | 56564 | 59115 | 61694 | 61073 | 63876 | 55253 | 31711 | 63004 | 60094 | 48379 | 58863 |
| 60717 | 56184 | 47090 | 32486 | 60622 | 56971 | 64033 | 62816 | 55226 | 48055 | 56937 | 62179 | 56719 | 61216 | 63781 | 63686 |
| 60354 | 48583 | 56917 | 62047 | 49032 | 59292 | 61913 | 60527 | 32445 | 48970 | 59230 | 62747 | 60313 | 62680 | 56638 | 62356 |
| 56890 | 32705 | 53225 | 55804 | 60259 | 48502 | 61088 | 63653 | 56557 | 61026 | 63591 | 60836 | 56289 | 47083 | 28671 | 64040 |
| 55268 | 31726 | 48937 | 59197 | 48842 | 59102 | 62619 | 32624 | 62585 | 60123 | 48590 | 55199 | 62261 | 56924 | 62166 | 61189 |
| 60760 | 56157 | 47063 | 56510 | 64020 | 62789 | 59879 | 56242 | 63824 | 60646 | 56995 | 32712 | 60266 | 48495 | 63660 | 55037 |
| 48747 | 59007 | 62762 | 60328 | 48557 | 58873 | 56863 | 62133 | 62071 | 49056 | 56667 | 59316 | 61937 | 60999 | 64530 | 32617 |
| 32244 | 53212 | 56729 | 60246 | 63763 | 61061 | 63696 | 32651 | 60865 | 56276 | 47070 | 64013 | 62796 | 59886 | 56235 | 48866 |
| 48924 | 63048 | 60138 | 48367 | 55214 | 32597 | 48099 | 53117 | 59126 | 62643 | 60784 | 56181 | 46975 | 56982 | 62140 | 32237 |
| 58359 | 56539 | 60980 | 63601 | 32570 | 60818 | 56215 | 47037 | 60239 | 63770 | 61068 | 63689 | 63234 | 49029 | 59345 | 56887 |
| 32489 | 48734 | 62735 | 60301 | 48600 | 62668 | 56682 | 62400 | 32604 | 48106 | 53236 | 56753 | 58366 | 61883 | 60973 | 63608 |
| 60723 | 60656 | 56053 | 46847 | 32190 | 60220 | 48505 | 62573 | 32675 | 60811 | 56222 | 48948 | 63072 | 48839 | 62854 | 30717 |
| 60111 | 63642 | 55243 | 62305 | 48086 | 63106 | 61009 | 63812 | 60757 | 56563 | 62169 | 60730 | 56127 | 60649 | 56060 | 48758 |
| 32543 | 53175 | 32476 | 60030 | 63547 | 55162 | 59896 | 40957 | 62759 | 60325 | 48624 | 62692 | 57154 | 62312 | 48079 | 59291 |
| 47991 | 63011 | 48820 | 56655 | 59360 | 61925 | 64518 | 32381 | 61016 | 63581 | 32662 | 53182 | 55803 | 48977 | 63045 | 60135 |
| 60629 | 57216 | 62346 | 32219 | 60249 | 60602 | 55999 | 54782 | 63666 | 55267 | 47998 | 63018 | 48813 | 56774 | 59129 | 61932 |
| 62292 | 45046 | 48563 | 62631 | 60772 | 57121 | 62251 | 48060 | 32567 | 60703 | 32500 | 60636 | 56985 | 64019 | 62802 | 60368 |
| 57026 | 62184 | 60955 | 63758 | 55135 | 31733 | 59869 | 62998 | 48597 | 56679 | 62285 | 45039 | 48570 | 62638 | 60541 | 57128 |
| 48849 | 59333 | 62864 | 56931 | 47870 | 56741 | 59306 | 61871 | 62370 | 32243 | 53211 | 60273 | 61074 | 63639 | 55254 | 31740 |
| 63596 | 32439 | 60575 | 56266 | 48992 | 59252 | 62769 | 60307 | 48923 | 62991 | 48856 | 59340 | 62857 | 56938 | 56748 | 60979 |
| 62674 | 57108 | 62238 | 48089 | 56551 | 62157 | 60718 | 56171 | 63782 | 55159 | 59893 | 32446 | 48761 | 59245 | 62776 | 60314 |
| 57000 | 64034 | 62579 | 60145 | 48612 | 55221 | 31679 | 56918 | 48543 | 62667 | 57101 | 62343 | 56558 | 64068 | 60599 | 56290 |
| 62076 | 48795 | 56784 | 59279 | 61914 | 61004 | 64521 | 32706 | 32665 | 60219 | 62586 | 60152 | 48381 | 55228 | 62262 | 48113 |
| 53226 | 55791 | 48965 | 63654 | 55031 | 48938 | 56689 | 59198 | 56911 | 62181 | 56777 | 61190 | 63811 | 64640 | 32475 | 48972 | 62749 |
| 61819 | 45049 | 59117 | 62648 | 32611 | 60747 | 56158 | 47092 | 59839 | 55038 | 48819 | 56696 | 59303 | 61938 | 61028 | 64545 |
| 56973 | 64007 | 62790 | 60356 | 63873 | 63001 | 60091 | 48558 | 32618 | 60866 | 56263 | 47085 | 64014 | 62559 | 60125 | 63880 |
| 58874 | 54271 | 56892 | 62134 | 32231 | 53199 | 56730 | 60261 | 55257 | 62291 | 63120 | 60771 | 56182 | 48059 | 56997 | 62127 |
| 63792 | 61062 | 63683 | 32680 | 48911 | 59227 | 48844 | 62621 | 32238 | 60268 | 63785 | 63690 | 63025 | 49030 | 56669 | 59346 |
| 32598 | 53118 | 56635 | 62353 | 56568 | 60967 | 63602 | 60833 | 61911 | 64532 | 32591 | 53223 | 56754 | 62360 | 60974 | 63595 |
| 56244 | 47038 | 62490 | 48749 | 62764 | 60302 | 30711 | 48587 | 60840 | 56237 | 48935 | 59251 | 48868 | 62645 | 30718 | 60758 |
| 58847 | 56921 | 62163 | 61200 | 63765 | 60643 | 56054 | 32653 | 57107 | 62265 | 57040 | 62170 | 61193 | 63772 | 60650 | 56047 |
| 60207 | 48506 | 62574 | 60140 | 63657 | 55272 | 62306 | 48101 | 63236 | 60326 | 48611 | 58871 | 56945 | 62075 | 48108 | 56727 |
| 59313 | 56541 | 61010 | 63575 | 32572 | 60820 | 56273 | 47067 | 59320 | 61885 | 61003 | 63582 | 32677 | 60813 | 56280 | 48978 |
| 32463 | 64024 | 62793 | 59883 | 40958 | 48807 | 56684 | 59123 | 63046 | 64129 | 62912 | 48814 | 56565 | 59130 | 61695 | 60732 |
| 61926 | 60725 | 32382 | 60630 | 56979 | 62137 | 32248 | 60250 | 56185 | 47091 | 32487 | 60623 | 56986 | 64048 | 62817 | 60355 |
| 48479 | 61065 | 63644 | 55245 | 62279 | 49040 | 63108 | 60535 | 48598 | 57156 | 62286 | 49033 | 59293 | 60542 | 56891 | 32720 |
| 57122 | 32601 | 48047 | 53233 | 58363 | 60984 | 63549 | 55164 | 53240 | 55805 | 60274 | 48503 | 61089 | 63668 | 55269 | 31727 |
| 31734 | 59870 | 56219 | 48945 | 63013 | 48850 | 59334 | 62851 | 48952 | 63020 | 48843 | 59103 | 62858 | 32625 | 60761 | 56511 |
| 64576 | 56742 | 62348 | 32221 | 59775 | 60604 | 56057 | 48755 | 64021 | 62804 | 59894 | 56243 | 48762 | 59246 | 62763 | 60329 |
| 59239 | 62770 | 60336 | 48565 | 62689 | 57095 | 62253 | 48090 | 48572 | 62696 | 57102 | 62372 | 32245 | 53213 | 60247 | 61076 |
| 57028 | 62158 | 60957 | 63816 | 32659 | 53179 | 63056 | 60146 | 63697 | 32666 | 48925 | 63049 | 60139 | 48382 | 55215 | 48114 |
| 48375 | 55222 | 47995 | 56933 | 62063 | 48824 | 56771 | 59308 | 56940 | 62182 | 56778 | 60981 | 63840 | 32571 | 60819 | 32504 |
| 61929 | 64522 | 32497 | 60633 | 56268 | 48966 | 62743 | 60309 | 48735 | 62750 | 60316 | 48601 | 62669 | 56683 | 62401 | 64546 |
| 62676 | 56690 | 62296 | 45050 | 47615 | 59118 | 62635 | 60776 | 60657 | 56292 | 47086 | 32191 | 60221 | 62588 | 60126 | 63643 |
| 56173 | 47079 | 56974 | 64036 | 62581 | 60119 | 63874 | 55251 | 55258 | 62320 | 48087 | 63107 | 61248 | 63813 | 56998 | 32477 |
| 31737 | 63002 | 48797 | 59337 | 61916 | 56879 | 32708 | 53228 | 60031 | 63786 | 55163 | 59897 | 63026 | 48821 | 56670 | 59361 |
| 56745 | 60262 | 63779 | 63712 | 32443 | 48940 | 56663 | 59256 | 61940 | 64519 | 32620 | 60868 | 57217 | 62347 | 64072 | 60603 |
| 61821 | 45023 | 62622 | 32613 | 60749 | 57112 | 62354 | 56555 | 56238 | 54783 | 62293 | 45047 | 62646 | 60773 | 57136 | 62266 |
| 64065 | 60834 | 56231 | 48750 | 62527 | 60093 | 48616 | 58876 | 48061 | 57027 | 62185 | 61194 | 63759 | 63692 | 62999 | 49088 |
| 55225 | 62259 | 56922 | 62192 | 56732 | 61187 | 63766 | 61120 | 59348 | 62865 | 56946 | 47871 | 56756 | 59307 | 61886 | 61032 |
| 63685 | 32654 | 48969 | 59229 | 63658 | 55035 | 48102 | 56637 | 63597 | 32678 | 60814 | 56267 | 48993 | 59253 | 64130 | 62675 |
| 59314 | 61879 | 56542 | 61025 | 63604 | 32559 | 60807 | 56274 | 57109 | 62239 | 56566 | 62172 | 60719 | 56186 | 60652 | 57001 |
| 47096 | 32492 | 64011 | 62794 | 60360 | 48589 | 56447 | 62165 | 64035 | 62818 | 60384 | 48613 | 56919 | 62077 | 49034 | 56785 |
| 60726 | 56179 | 60645 | 57008 | 62138 | 32235 | 60265 | 48508 | 59294 | 61915 | 61005 | 64536 | 32707 | 53227 | 55806 | 48980 |
| 61066 | 63631 | 55246 | 62308 | 49027 | 59287 | 61012 | 64529 | 61090 | 63655 | 55270 | 48939 | 59199 | 48872 | 59132 | 62649 |
| 32602 | 53234 | 55799 | 47069 | 60971 | 63550 | 55151 | 59885 | 32626 | 60762 | 56159 | 47093 | 58998 | 64022 | 62791 | 60357 |
| 56248 | 48946 | 63014 | 48865 | 59125 | 62880 | 30715 | 60755 | 63888 | 63240 | 60330 | 48559 | 58875 | 56893 | 62135 | 32246 |
| 56981 | 62111 | 32222 | 60252 | 63769 | 60591 | 56058 | 63233 | 53214 | 56731 | 60276 | 63793 | 61063 | 63698 | 32681 | 48926 |
| 60323 | 48566 | 62690 | 57124 | 62254 | 32127 | 48105 | 53207 | 63050 | 48845 | 62860 | 32599 | 53119 | 56569 | 60982 | 63603 |

| | | | | | | | | | | | | | | |
|---|---|---|---|---|---|---|---|---|---|---|---|---|---|---|
| 60848 | 56245 | 47039 | 32491 | 48764 | 62765 | 60303 | 48602 | 48953 | 63021 | 48858 | 59342 | 62859 | 64584 | 56750 | 64260 |
| 62670 | 57160 | 62402 | 61201 | 60658 | 56055 | 32668 | 60222 | 62805 | 59895 | 48763 | 59247 | 62778 | 60344 | 48573 | 62697 |
| 48507 | 62575 | 60141 | 63672 | 55273 | 62307 | 48116 | 63136 | 57103 | 62373 | 57036 | 64070 | 61077 | 63936 | 32667 | 63064 |
| 56780 | 61011 | 63814 | 32573 | 60821 | 32478 | 64025 | 62808 | 60154 | 48383 | 55230 | 48115 | 56941 | 62183 | 56779 | 61220 |
| 59898 | 40959 | 48822 | 56685 | 59362 | 61927 | 64548 | 32383 | 63841 | 64642 | 32505 | 48974 | 52751 | 60317 | 62684 | 56698 |
| 60631 | 57218 | 62376 | 32249 | 60251 | 61080 | 63645 | 55260 | 62416 | 61030 | 64547 | 60896 | 56293 | 47087 | 64044 | 62589 |
| 62294 | 49041 | 63109 | 60774 | 57123 | 48062 | 57056 | 62186 | 60127 | 63882 | 55259 | 62321 | 63122 | 61249 | 63828 | 56999 |
| 60985 | 63788 | 55165 | 31735 | 59871 | 63028 | 48851 | 59335 | 32716 | 60270 | 63787 | 63720 | 63027 | 49060 | 56671 | 59376 |
| 62866 | 64577 | 56743 | 62349 | 63598 | 60605 | 56296 | 48994 | 61941 | 64534 | 32621 | 60869 | 57232 | 62362 | 64073 | 60842 |
| 59254 | 62771 | 60337 | 62704 | 57110 | 62268 | 48091 | 57029 | 56239 | 48870 | 62647 | 60788 | 57137 | 62267 | 57042 | 62200 |
| 62159 | 61196 | 63817 | 57002 | 63057 | 60147 | 48614 | 55223 | 61195 | 63774 | 61128 | 63693 | 63238 | 49089 | 59349 | 56947 48110 |
| 56948 | 62078 | 48825 | 56786 | 59309 | 61944 | 61006 | 64523 | 56757 | 59322 | 61887 | 61033 | 63612 | 32679 | 60815 | 56282 |
| 32736 | 60872 | 56269 | 48967 | 64132 | 62677 | 56691 | 62297 | 49008 | 63076 | 64131 | 62914 | 56567 | 62173 | 60734 | 56187 |
| 45051 | 59119 | 62650 | 60777 | 56188 | 47094 | 56975 | 64037 | 60653 | 57016 | 64050 | 62819 | 60385 | 48628 | 57158 | 62316 |
| 62820 | 60358 | 63875 | 63003 | 49036 | 59352 | 61917 | 56894 | 49035 | 59295 | 61020 | 64537 | 32722 | 53242 | 55807 | 48981 |
| 32709 | 53229 | 56760 | 60263 | 63794 | 61092 | 63713 | 32682 | 61091 | 63670 | 55271 | 48954 | 63022 | 48873 | 59133 | 62888 |
| 48941 | 59257 | 48846 | 62623 | 32628 | 60764 | 57113 | 62355 | 32627 | 60763 | 56989 | 64023 | 62806 | 60372 | 63889 | 63241 |
| 56570 | 64080 | 60835 | 56246 | 48751 | 62766 | 60332 | 48617 | 60331 | 48574 | 62698 | 57132 | 62374 | 32247 | 53215 | 60277 |
| 58877 | 56923 | 62193 | 56733 | 61202 | 63767 | 61121 | 63700 | 61078 | 63699 | 32696 | 48927 | 63051 | 48860 | 62861 | 56942 |
| 32655 | 48984 | 63052 | 60142 | 63659 | 55274 | 48103 | 59315 | 56808 | 60983 | 63842 | 60849 | 32506 | 48765 | 62780 | 60318 |
| 56543 | 61040 | 63605 | 32574 | 60822 | 56275 | 47097 | 32493 | 48603 | 62671 | 57161 | 62403 | 65024 | 60659 | 56294 | 32669 |
| 64026 | 62795 | 60361 | 48604 | 56686 | 62404 | 60727 | 60660 | 60223 | 62590 | 60156 | 63673 | 55288 | 62322 | 48117 | 63137 |
| 57009 | 62139 | 32250 | 60280 | 48509 | 61067 | 63646 | 55247 | 56781 | 61250 | 63815 | 64644 | 32479 | 64264 | 62809 | 59899 |
| 62309 | 49042 | 63110 | 61013 | 64768 | 32603 | 53235 | 60986 | 48823 | 56700 | 59363 | 61942 | 64549 | 32622 | 60870 | 57219 |
| 63551 | 55166 | 59900 | 56249 | 48947 | 63015 | 48880 | 59364 | 62377 | 64074 | 61081 | 63884 | 55261 | 62295 | 63124 | 60775 |
| 62881 | 64578 | 57220 | 62350 | 32223 | 60253 | 60606 | 56059 | 57138 | 48063 | 57057 | 62187 | 61224 | 63789 | 63694 | 63029 |
| 63248 | 60338 | 48567 | 62691 | 57125 | 62255 | 48120 | 57030 | 49090 | 59350 | 62867 | 64592 | 56758 | 62364 | 61034 | 63599 |
| 62188 | 60959 | 63818 | 32689 | 60825 | 63058 | 48853 | 62868 | 60844 | 56297 | 48995 | 59255 | 64160 | 62705 | 57111 | 62269 |
| 56935 | 48826 | 56801 | 59310 | 61931 | 64552 | 32499 | 60635 | 57044 | 62174 | 61197 | 63832 | 60654 | 57003 | 63296 | 60386 |
| 56270 | 48996 | 62773 | 60311 | 62678 | 57168 | 62298 | 48093 | 48615 | 56949 | 62079 | 49064 | 56787 | 59324 | 61945 | 61007 |
| 63113 | 60778 | 56175 | 57004 | 64038 | 62583 | 60149 | 63904 | 64538 | 32737 | 60873 | 56284 | 48982 | 64133 | 62916 | 48874 |
| 55281 | 31739 | 63032 | 48799 | 56788 | 59339 | 61918 | 64525 | 59134 | 62651 | 60792 | 56189 | 47095 | 56990 | 64052 | 62821 |
| 32710 | 53230 | 56747 | 64257 | 63714 | 48942 | 56693 | 59258 | 60359 | 63890 | 63242 | 49037 | 59353 | 56895 | 32724 | 53244 |
| 61823 | 45053 | 62652 | 32615 | 60751 | 57114 | 62384 | 57033 | 56761 | 60278 | 63795 | 61093 | 63728 | 32683 | 48956 | 63080 |
| 64067 | 61312 | 63877 | 63005 | 60095 | 48618 | 58878 | 55227 | 48847 | 62862 | 32629 | 60765 | 56571 | 64081 | 60850 | 56247 |
| 56952 | 62194 | 56734 | 61217 | 63796 | 61122 | 63687 | 32684 | 48766 | 62767 | 60333 | 48632 | 62700 | 57162 | 62432 | 61203 |
| 48971 | 59231 | 64136 | 62681 | 56639 | 62357 | 56572 | 61027 | 61136 | 63701 | 32670 | 48985 | 63053 | 60143 | 63674 | 55275 |
| 63606 | 60837 | 56304 | 47098 | 32494 | 64041 | 62824 | 60362 | 48118 | 63138 | 56782 | 61041 | 63844 | 32575 | 60823 | 32508 |
| 48591 | 56925 | 56167 | 61204 | 63825 | 60647 | 57010 | 32713 | 64027 | 62810 | 60376 | 48605 | 56687 | 62405 | 64550 | 60661 |
| 60267 | 48510 | 61096 | 63661 | 55276 | 62310 | 49057 | 59317 | 57248 | 62378 | 32251 | 60281 | 61082 | 63647 | 55262 | 62324 |
| 61014 | 64531 | 32632 | 60880 | 56277 | 47071 | 64028 | 62797 | 49043 | 63111 | 61252 | 64769 | 57058 | 60987 | 63790 | 55167 |
| 59887 | 56250 | 48867 | 59127 | 62882 | 60785 | 56983 | 62141 | 59901 | 63030 | 48881 | 59365 | 62896 | 64579 | 57221 | 62351 |
| 32252 | 60254 | 63771 | 61069 | 63704 | 63235 | 49044 | 63168 | 64076 | 60607 | 56298 | 63249 | 60339 | 62770 | 57140 | 62270 |
| 57126 | 32605 | 48107 | 53237 | 58367 | 60988 | 63609 | 32690 | 48121 | 57031 | 62189 | 61198 | 63819 | 64648 | 63059 | 49092 |
| 60826 | 56223 | 48949 | 63073 | 48854 | 62855 | 64580 | 56802 | 62869 | 56950 | 48827 | 56816 | 59311 | 61946 | 61036 | 64553 |
| 62408 | 60731 | 60664 | 56061 | 48759 | 62774 | 60340 | 48625 | 32738 | 60874 | 56271 | 48997 | 64134 | 62679 | 57169 | 62299 |
| 62693 | 57155 | 62313 | 48094 | 63114 | 61017 | 63820 | 32663 | 63128 | 60779 | 56190 | 57005 | 64039 | 62822 | 60388 | 63905 |
| 53183 | 63060 | 60150 | 63667 | 55282 | 47999 | 63019 | 48828 | 63033 | 49038 | 56789 | 59354 | 61919 | 64540 | 32711 | 53231 |
| 56775 | 59368 | 61933 | 64526 | 32501 | 60637 | 57224 | 64258 | 56762 | 64272 | 61094 | 63715 | 48943 | 59259 | 48876 | 62653 |
| 62803 | 60369 | 56694 | 62300 | 45054 | 48571 | 62639 | 60780 | 32630 | 60766 | 57115 | 62385 | 57048 | 64082 | 61313 | 63892 |
| 57129 | 62371 | 57034 | 64096 | 61075 | 63878 | 55255 | 31741 | 63244 | 60334 | 48619 | 58879 | 56953 | 62195 | 56735 | 61232 |
| 63006 | 48857 | 59341 | 62872 | 56939 | 56749 | 61218 | 63783 | 63797 | 61123 | 63702 | 32685 | 48986 | 63054 | 64137 | 62920 |
| 63716 | 32447 | 49000 | 59260 | 62777 | 60315 | 62682 | 57116 | 56573 | 61042 | 63607 | 60852 | 56305 | 47099 | 32495 | 64056 |
| 62358 | 56559 | 64069 | 60838 | 56291 | 64042 | 62587 | 60153 | 62825 | 60363 | 48606 | 57164 | 62406 | 61205 | 60662 | 57011 |
| 48620 | 55229 | 62263 | 56926 | 62196 | 56792 | 61191 | 63826 | 32728 | 60282 | 48511 | 61097 | 63676 | 55277 | 62311 | 49072 |
| 61124 | 64641 | 32714 | 48973 | 63662 | 55039 | 49058 | 56697 | 63140 | 61015 | 64770 | 32633 | 60881 | 64029 | 62812 | 59902 |
| 59318 | 61939 | 61029 | 64560 | 32619 | 60867 | 56278 | 47100 | 56251 | 48882 | 59366 | 62883 | 64608 | 57222 | 62380 | 32253 |
| 64015 | 62798 | 60364 | 63881 | 63121 | 60786 | 56183 | 57012 | 60255 | 61084 | 63705 | 63250 | 49045 | 63169 | 57127 | 48122 |
| 62142 | 32239 | 60269 | 63800 | 61070 | 63691 | 63264 | 49031 | 57060 | 62190 | 60989 | 63848 | 32691 | 60827 | 63088 | 48855 |
| 59347 | 64533 | 32606 | 53238 | 56755 | 62361 | 60975 | 63610 | 62870 | 64581 | 56803 | 62409 | 64554 | 60665 | 56300 | 48998 |
| 60841 | 56252 | 48950 | 63074 | 48869 | 62884 | 30719 | 60759 | 62775 | 60341 | 62708 | 57170 | 62328 | 48095 | 63115 | 61256 |
| 57041 | 62171 | 61208 | 63773 | 60651 | 56062 | 63237 | 60327 | 63821 | 57006 | 63061 | 60151 | 63906 | 55283 | 63034 | 48829 |
| 48626 | 62694 | 57184 | 62314 | 48109 | 59321 | 61018 | 63583 | 56790 | 59369 | 61948 | 64527 | 32740 | 60876 | 57225 | 64259 |
| 32692 | 60828 | 56281 | 48979 | 63047 | 64144 | 62913 | 48815 | 64192 | 56695 | 62301 | 45055 | 62654 | 60781 | 57144 | 62386 |
| 56804 | 59131 | 61934 | 60733 | 32502 | 60638 | 56987 | 64049 | 57035 | 64097 | 61314 | 63879 | 63007 | 49096 | 59356 | 62873 |
| 62832 | 60370 | 48599 | 57157 | 62287 | 49048 | 63116 | 60543 | 56954 | 56764 | 61219 | 63798 | 61152 | 63717 | 32686 | 49001 |
| 57130 | 32721 | 53241 | 60275 | 61104 | 63669 | 55284 | 31742 | 59261 | 64138 | 62683 | 57117 | 62359 | 56574 | 64084 | 60839 |

| | | | | | | | | | | | | | | |
|---|---|---|---|---|---|---|---|---|---|---|---|---|---|---|
| 56306 | 64043 | 62826 | 60392 | 48621 | 56927 | 62197 | 56793 | 57240 | 64274 | 64193 | 48878 | 62655 | 60796 | 57145 | 62387 |
| 61206 | 63827 | 61125 | 64656 | 32715 | 48988 | 61098 | 63663 | 57050 | 64112 | 61315 | 63894 | 63246 | 49097 | 59357 | 56955 |
| 55278 | 49059 | 59319 | 61044 | 64561 | 32634 | 60882 | 56279 | 56765 | 61234 | 63799 | 61153 | 63732 | 32687 | 49016 | 63084 |
| 47101 | 64030 | 62799 | 60365 | 63896 | 63360 | 60787 | 57013 | 64139 | 62922 | 56575 | 64085 | 60854 | 56307 | 64058 | 62827 |
| 62143 | 32254 | 60284 | 63801 | 61071 | 63706 | 63265 | 49046 | 60393 | 48636 | 57166 | 62436 | 61207 | 61140 | 64657 | 32730 |
| 63170 | 64772 | 32607 | 53239 | 60990 | 63611 | 60856 | 56253 | 48989 | 61099 | 63678 | 55279 | 49074 | 63142 | 61045 | 64800 |
| 48951 | 63075 | 48884 | 62885 | 64582 | 57280 | 62410 | 61209 | 32635 | 60883 | 64031 | 62814 | 60380 | 63897 | 63361 | 64610 |
| 60666 | 56063 | 63252 | 60342 | 48627 | 62695 | 57185 | 62315 | 57252 | 62382 | 32255 | 60285 | 61086 | 63707 | 63280 | 49047 |
| 48124 | 63144 | 61019 | 63822 | 32693 | 60829 | 63062 | 64145 | 63171 | 64773 | 57062 | 60991 | 63850 | 60857 | 63090 | 48885 |
| 62928 | 48830 | 56805 | 59370 | 61935 | 64556 | 32503 | 60639 | 62900 | 64583 | 57281 | 62411 | 65032 | 60667 | 56302 | 63253 |
| 57226 | 64288 | 62833 | 60371 | 57172 | 62302 | 49049 | 63117 | 60343 | 62710 | 57200 | 62330 | 48125 | 63145 | 61258 | 63823 |
| 60782 | 57131 | 57064 | 64098 | 61105 | 63908 | 55285 | 31743 | 64652 | 63063 | 64384 | 62929 | 48831 | 56820 | 59371 | 61950 |
| 63036 | 48859 | 59343 | 62874 | 64585 | 56751 | 64261 | 63718 | 64557 | 32742 | 60878 | 57227 | 64289 | 64194 | 57173 | 62303 |
| 49002 | 59262 | 62779 | 60345 | 62712 | 57118 | 62388 | 57037 | 63132 | 60783 | 57146 | 57065 | 64099 | 61344 | 63909 | 63037 |
| 64071 | 61316 | 63937 | 63065 | 60155 | 48622 | 55231 | 56956 | 49098 | 59358 | 62875 | 64600 | 56766 | 64276 | 61154 | 63719 |
| 62198 | 56794 | 61221 | 63856 | 61126 | 64643 | 32744 | 48975 | 49003 | 59263 | 64168 | 62713 | 57119 | 62389 | 57052 | 64086 |
| 64140 | 62685 | 56699 | 62417 | 61031 | 64562 | 60897 | 56308 | 61317 | 63952 | 63304 | 60394 | 48623 | 56957 | 62199 | 56795 |
| 47102 | 64045 | 62828 | 60366 | 63883 | 63123 | 61264 | 63829 | 61236 | 63857 | 61127 | 64658 | 32745 | 48990 | 64141 | 62924 |
| 57014 | 32717 | 60271 | 63802 | 61100 | 63721 | 63266 | 49061 | 61046 | 64563 | 60912 | 56309 | 47103 | 64060 | 62829 | 60367 |
| 59377 | 64535 | 32636 | 60884 | 57233 | 62363 | 64088 | 60843 | 63898 | 63362 | 61265 | 57015 | 32732 | 60286 | 63803 | 61101 |
| 56254 | 48871 | 62886 | 60789 | 57043 | 62201 | 61210 | 63775 | 63736 | 63267 | 49076 | 63200 | 64774 | 32637 | 60885 | 64089 |
| 61129 | 63708 | 63239 | 49104 | 63172 | 57186 | 48111 | 59323 | 61048 | 60858 | 56255 | 48886 | 62887 | 64612 | 57282 | 62440 | 61211 |
| 63613 | 32694 | 60830 | 56283 | 49009 | 63077 | 64146 | 62915 | 61144 | 63709 | 63254 | 49105 | 63173 | 57187 | 48126 | 63146 |
| 56806 | 62412 | 60735 | 60668 | 57017 | 64051 | 62834 | 60400 | 61049 | 63852 | 32695 | 60831 | 63092 | 64147 | 62930 | 56807 |
| 48629 | 57159 | 62317 | 49050 | 63118 | 61021 | 64776 | 32723 | 62413 | 64558 | 60669 | 57256 | 64290 | 62835 | 60401 | 57174 |
| 53243 | 61106 | 63671 | 55286 | 48955 | 63023 | 48888 | 59372 | 62332 | 49051 | 63119 | 61260 | 64777 | 57066 | 61107 | 63910 |
| 62889 | 64586 | 57228 | 64262 | 62807 | 60373 | 63256 | 60346 | 55287 | 63038 | 48889 | 59373 | 62904 | 64587 | 57229 | 64263 |
| 48575 | 62699 | 57133 | 62375 | 57038 | 64100 | 61079 | 63938 | 64196 | 63257 | 60347 | 62714 | 57148 | 62390 | 57039 | 64101 |
| 32697 | 63066 | 48861 | 62876 | 56943 | 56809 | 61222 | 63843 | 61318 | 63939 | 63067 | 49100 | 62877 | 56958 | 56824 | 61223 |
| 64672 | 32507 | 49004 | 62781 | 60319 | 62686 | 57176 | 62418 | 63858 | 61156 | 64673 | 32746 | 49005 | 64142 | 62687 | 57177 |
| 65025 | 60898 | 56295 | 64046 | 62591 | 60157 | 63912 | 55289 | 62419 | 65040 | 60899 | 56310 | 64047 | 62830 | 60396 | 63913 |
| 62323 | 63152 | 56796 | 61251 | 63830 | 64645 | 32718 | 64265 | 63153 | 56797 | 61266 | 63831 | 64660 | 32719 | 64280 | 61102 |
| 63722 | 49062 | 56701 | 59378 | 61943 | 64564 | 32623 | 60871 | 63723 | 49063 | 59379 | 64565 | 32638 | 60886 | 57235 | 62393 |
| 57234 | 62392 | 64075 | 61320 | 63885 | 63125 | 60790 | 57139 | 64090 | 61321 | 63900 | 63364 | 60791 | 57073 | 62203 | 61240 |
| 57072 | 62202 | 61225 | 63804 | 61130 | 63695 | 63268 | 49091 | 63805 | 61131 | 63710 | 63269 | 49106 | 63174 | 64832 | 61050 |
| 59351 | 64593 | 56759 | 62365 | 61035 | 63614 | 60845 | 56312 | 63615 | 60860 | 56313 | 49011 | 63079 | 64176 | 62945 | 57284 |
| 49010 | 63078 | 64161 | 62944 | 57045 | 62175 | 61212 | 63833 | 62414 | 61213 | 60670 | 57019 | 63312 | 60402 | 48631 | 57189 |
| 60655 | 57018 | 63297 | 60387 | 48630 | 57188 | 62318 | 49065 | 62319 | 49080 | 63148 | 61023 | 64778 | 32753 | 60889 | 64149 |
| 59325 | 61022 | 64539 | 32752 | 60888 | 56285 | 48983 | 64148 | 62932 | 48890 | 59374 | 62891 | 64616 | 57230 | 64292 | 62837 |
| 62917 | 48875 | 59135 | 62890 | 60793 | 56991 | 64053 | 62836 | 60375 | 63258 | 49053 | 63177 | 57135 | 57068 | 64102 | 61109 |
| 60374 | 63891 | 63243 | 49052 | 63176 | 57134 | 32725 | 53245 | 63968 | 32699 | 63096 | 48863 | 62878 | 64589 | 56811 | 64321 |
| 60279 | 61108 | 63729 | 32698 | 48957 | 63081 | 48862 | 62863 | 64674 | 49006 | 62783 | 60349 | 62716 | 57178 | 62448 | 65027 |
| 64588 | 56810 | 64320 | 60851 | 48767 | 62782 | 60348 | 48633 | 61376 | 63941 | 63069 | 60159 | 63914 | 55291 | 63154 | 56798 |
| 62701 | 57163 | 62433 | 65026 | 61137 | 63940 | 32671 | 63068 | 61281 | 63860 | 64647 | 32748 | 64267 | 64200 | 56703 | 62421 |
| 60158 | 63675 | 55290 | 48119 | 63139 | 56783 | 61280 | 63845 | 64566 | 60901 | 57264 | 62394 | 64105 | 61322 | 63887 | 63127 |
| 64646 | 32509 | 64266 | 62811 | 60377 | 56702 | 62420 | 64551 | 61268 | 64785 | 57074 | 61227 | 63806 | 61160 | 63725 | 63270 |
| 60900 | 57249 | 62379 | 64104 | 61083 | 63886 | 55263 | 62325 | 49121 | 59381 | 64595 | 57237 | 62367 | 64092 | 60847 | 56314 |
| 63126 | 61253 | 64784 | 57059 | 61226 | 63791 | 63724 | 63031 | 64163 | 62946 | 57047 | 62205 | 61214 | 63835 | 61133 | 64664 |
| 49120 | 59380 | 62897 | 64594 | 57236 | 62366 | 64077 | 60846 | 63299 | 49108 | 57190 | 49067 | 59327 | 61052 | 64569 | 32754 |
| 56299 | 64162 | 62707 | 57141 | 62271 | 57046 | 62204 | 61199 | 60890 | 56287 | 49013 | 64150 | 62919 | 63368 | 60795 | 57021 |
| 63834 | 61132 | 64649 | 63298 | 49093 | 56951 | 49066 | 56817 | 64055 | 62838 | 60404 | 63921 | 63273 | 49054 | 63178 | 64780 |
| 59326 | 61947 | 61037 | 64568 | 32739 | 60875 | 56286 | 49012 | 32727 | 53247 | 61110 | 63731 | 48959 | 63083 | 48892 | 62893 |
| 64135 | 62918 | 63129 | 60794 | 56191 | 57020 | 64054 | 62823 | 64590 | 57288 | 64322 | 61329 | 63260 | 60350 | 48635 | 62703 |
| 60389 | 63920 | 63272 | 49039 | 59355 | 64541 | 32726 | 53246 | 57193 | 62435 | 65056 | 61139 | 63942 | 32701 | 63070 | 64153 |
| 56763 | 64273 | 61095 | 63730 | 48958 | 63082 | 48877 | 62892 | 62936 | 56813 | 61282 | 63847 | 64676 | 32511 | 64296 | 62841 |
| 32631 | 60767 | 57049 | 64083 | 61328 | 63893 | 63245 | 60335 | 60379 | 57180 | 62422 | 65029 | 60902 | 57251 | 64106 | 61113 |
| 48634 | 62702 | 57192 | 62434 | 61233 | 61138 | 63703 | 32700 | 63916 | 55293 | 62327 | 63156 | 61255 | 64786 | 64705 | 64269 |
| 48987 | 63055 | 64152 | 62921 | 56812 | 61043 | 63846 | 60853 | 63726 | 49122 | 59382 | 62899 | 64624 | 57238 | 62396 | 64079 |
| 32510 | 64057 | 62840 | 60378 | 48607 | 57165 | 62407 | 65028 | 61324 | 63945 | 63185 | 57143 | 57076 | 62206 | 61229 | 63864 |
| 60663 | 57250 | 32729 | 60283 | 61112 | 63677 | 55292 | 62326 | 61134 | 64651 | 63328 | 49095 | 64597 | 56819 | 62425 | 61039 |
| 49073 | 63141 | 61254 | 64771 | 64704 | 64268 | 62813 | 59903 | 64570 | 60905 | 56316 | 49014 | 64165 | 62948 | 63131 | 61272 |
| 48883 | 59367 | 62898 | 64609 | 57223 | 62381 | 64078 | 61085 | 63837 | 57022 | 63301 | 60391 | 63922 | 63274 | 49069 | 59385 |
| 63944 | 63251 | 63184 | 48123 | 57061 | 62191 | 61228 | | 64543 | 32756 | 60892 | 57241 | 64275 | 64208 | 48879 | 62894 |
| 63849 | 64650 | 63089 | 49094 | 62871 | 64596 | 56818 | 62424 | 60797 | 57051 | 64113 | 61330 | 63895 | 63247 | 49112 | 63180 |
| 61038 | 64555 | 60904 | 56301 | 48999 | 64164 | 62709 | 57171 | 57194 | 61235 | 61168 | 63733 | 32702 | 49017 | 63085 | 64154 |
| 62329 | 63130 | 61257 | 63836 | 57007 | 63300 | 60390 | 63907 | 62923 | 56814 | 64324 | 60855 | 64059 | 62842 | 60408 | 48637 |
| 63035 | 49068 | 56791 | 59384 | 61949 | 64542 | 32741 | 60877 | 57167 | 62437 | 65030 | 61141 | 64896 | 32731 | 61114 | 63679 | 55294 |

| | | | | | | | | | | | | | | |
|---|---|---|---|---|---|---|---|---|---|---|---|---|---|---|
| 49075 | 63143 | 61284 | 64801 | 64706 | 64270 | 62815 | 60381 | 64306 | 64225 | 63135 | 61276 | 64793 | 57082 | 61347 | 63926 |
| 63376 | 64611 | 57253 | 62383 | 64108 | 61087 | 63946 | 63281 | 63278 | 49129 | 59389 | 64603 | 57245 | 64279 | 64212 | 64171 |
| 63186 | 64788 | 57063 | 61230 | 63851 | 64680 | 63091 | 49124 | 62954 | 57055 | 64117 | 61334 | 63955 | 63307 | 49116 | 57198 |
| 62901 | 64598 | 57296 | 62426 | 65033 | 60906 | 56303 | 64166 | 61239 | 61172 | 64689 | 32762 | 49021 | 64158 | 62927 | 65280 |
| 62711 | 57201 | 62331 | 63160 | 61259 | 63838 | 64653 | 63302 | 60915 | 64063 | 62846 | 60412 | 63929 | 63393 | 65090 | 64900 |
| 64385 | 49070 | 56821 | 59386 | 61951 | 64572 | 32743 | 60879 | 32735 | 61118 | 63739 | 49079 | 63203 | 64805 | 64710 | 64330 |
| 57242 | 64304 | 64195 | 63133 | 60798 | 57147 | 57080 | 64114 | 61337 | 63380 | 64615 | 57313 | 62443 | 65064 | 61147 | 63950 |
| 61345 | 63924 | 63276 | 49099 | 59359 | 64601 | 56767 | 64277 | 63285 | 63190 | 64848 | 61290 | 63855 | 64684 | 63095 | 64416 |
| 61155 | 63734 | 49018 | 63086 | 64169 | 62952 | 57053 | 64087 | 62961 | 57300 | 62430 | 65037 | 60910 | 57259 | 64226 | 57205 |
| 61332 | 63953 | 63305 | 60395 | 48638 | 57196 | 62438 | 61237 | 62335 | 63164 | 61263 | 64794 | 64713 | 64389 | 49130 | 59390 |
| 61142 | 64659 | 32760 | 48991 | 64156 | 62925 | 61047 | 64802 | 62907 | 64632 | 57246 | 64308 | 64199 | 63193 | 57151 | 57084 |
| 60913 | 64061 | 62844 | 60382 | 63899 | 63363 | 65088 | 57254 | 64118 | 61349 | 63984 | 63336 | 49103 | 64605 | 56827 | 64337 |
| 32733 | 60287 | 61116 | 63737 | 63282 | 49077 | 63201 | 64775 | 61159 | 64690 | 49022 | 64173 | 62956 | 65043 | 61392 | 63957 |
| 64708 | 64328 | 60859 | 48887 | 62902 | 64613 | 57283 | 62441 | 63309 | 60399 | 63930 | 63394 | 61297 | 64663 | 32764 | 64283 |
| 65034 | 61145 | 63948 | 63255 | 63188 | 57202 | 48127 | 63147 | 64216 | 64806 | 60917 | 64121 | 61338 | 63903 | 63367 | 65092 |
| 61288 | 63853 | 64654 | 63093 | 64386 | 62931 | 56822 | 62428 | 57314 | 61243 | 61176 | 63741 | 63286 | 49137 | 63205 | 64835 |
| 64559 | 60908 | 57257 | 64291 | 64224 | 57175 | 62333 | 63134 | 64332 | 60863 | 64179 | 62962 | 57287 | 62445 | 65038 | 61149 |
| 61261 | 64792 | 57067 | 61346 | 63911 | 63039 | 49128 | 59388 | 64904 | 63315 | 57206 | 49083 | 63151 | 61292 | 64809 | 64714 |
| 62905 | 64602 | 57244 | 64278 | 64197 | 64170 | 62715 | 57149 | 64390 | 62935 | 63384 | 64619 | 57261 | 64295 | 64228 | 63289 |
| 62391 | 57054 | 64116 | 61319 | 63954 | 63306 | 49101 | 56959 | 63194 | 64796 | 57071 | 61350 | 63971 | 63099 | 49132 | 62909 |
| 56825 | 61238 | 63859 | 61157 | 64688 | 32747 | 49020 | 64143 | 64606 | 57304 | 64338 | 65153 | 64174 | 62719 | 57209 | 62451 |
| 62926 | 65041 | 60914 | 56311 | 64062 | 62831 | 60397 | 63928 | 65072 | 61379 | 63958 | 63310 | 64393 | 56829 | 61298 | 63863 |
| 63392 | 61267 | 64661 | 32734 | 64281 | 61103 | 63738 | 49078 | 64692 | 32751 | 64312 | 64203 | 65045 | 60918 | 57267 | 64122 |
| 63202 | 64804 | 32639 | 60887 | 64091 | 61336 | 63901 | 63365 | 61353 | 63932 | 63396 | 61271 | 64721 | 64285 | 61163 | 63742 |
| 64614 | 57312 | 62442 | 61241 | 61146 | 63711 | 63284 | 49107 | 49138 | 63206 | 64864 | 64095 | 61340 | 63961 | 63425 | 57316 |
| 63175 | 64833 | 61051 | 63854 | 60861 | 63094 | 64177 | 62960 | 62446 | 61245 | 61150 | 64667 | 63344 | 49111 | 64837 | 61055 | 64810 |
| 57285 | 62415 | 65036 | 60671 | 57258 | 63313 | 60403 | 57204 | 60921 | 64181 | 62964 | 63371 | 65096 | 57262 | 63317 | 60407 |
| 62334 | 49081 | 63149 | 61262 | 64779 | 64712 | 64388 | 62933 | 63290 | 49085 | 63209 | 64783 | 64716 | 64448 | 48895 | 62910 |
| 48891 | 59375 | 62906 | 64617 | 57231 | 64293 | 64198 | 63259 | 64621 | 57291 | 64353 | 65154 | 63263 | 63196 | 57210 | 65059 |
| 63192 | 57150 | 57069 | 64103 | 61348 | 63969 | 63097 | 49102 | 61408 | 63973 | 63101 | 64394 | 62939 | 56830 | 64340 | 64679 |
| 62879 | 64604 | 56826 | 64336 | 61158 | 64675 | 49007 | 64172 | 64299 | 64232 | 57183 | 62453 | 65046 | 61381 | 64912 | 61354 |
| 62717 | 57179 | 62449 | 65042 | 61377 | 63956 | 63308 | 60398 | 63919 | 63159 | 61300 | 64817 | 64722 | 64286 | 64205 | 64627 |
| 63915 | 63155 | 56799 | 61296 | 63861 | 64662 | 32749 | 64282 | 57269 | 62399 | 64124 | 61327 | 63962 | 63426 | 57079 | 61246 |
| 64201 | 64567 | 60916 | 57265 | 62395 | 64120 | 61323 | 63902 | 63867 | 61165 | 64696 | 63331 | 49140 | 64838 | 65049 | 60922 |
| 63366 | 61269 | 57075 | 61242 | 63807 | 61161 | 63740 | 63271 | 56319 | 64182 | 62951 | 63400 | 61275 | 64669 | 63318 | 64401 |
| 49136 | 63204 | 64834 | 64093 | 60862 | 56315 | 64178 | 62947 | 49086 | 63210 | 64812 | 32759 | 60895 | 64211 | 63373 | 64622 |
| 57286 | 62444 | 61215 | 61148 | 64665 | 63314 | 49109 | 57191 | 57320 | 64354 | 61361 | 63292 | 49115 | 63183 | 64841 | 61171 |
| 49082 | 63150 | 61053 | 64808 | 32755 | 60891 | 64151 | 62934 | 63974 | 63102 | 64185 | 62968 | 57293 | 64327 | 65156 | 63321 |
| 63369 | 64618 | 57260 | 64294 | 62839 | 60405 | 63288 | 49055 | 60411 | 57212 | 62454 | 65061 | 61382 | 64899 | 64396 | 62941 |
| 63179 | 64781 | 57070 | 61111 | 63970 | 63098 | 48893 | 62908 | 64591 | 61287 | 64818 | 64737 | 64301 | 64206 | 63379 | 65104 | 57270 |
| 57289 | 64323 | 65152 | 63261 | 60351 | 62718 | 57208 | 62450 | 64111 | 61356 | 63977 | 63217 | 64791 | 64724 | 64344 | 61166 | 64683 |
| 65057 | 61378 | 63943 | 63071 | 64392 | 62937 | 56828 | 61283 | 49127 | 64629 | 57299 | 62457 | 65050 | 61385 | 63964 | 63428 |
| 63862 | 64677 | 32750 | 64297 | 64202 | 57181 | 62423 | 65044 | 63163 | 61304 | 63869 | 64670 | 63333 | 64402 | 64575 | 60924 |
| 60903 | 57266 | 64107 | 61352 | 63917 | 63157 | 61270 | 64787 | 57273 | 64307 | 64240 | 63374 | 61277 | 57083 | 61362 | 63927 |
| 64720 | 64284 | 61162 | 63727 | 49123 | 59383 | 64625 | 57239 | 63279 | 49144 | 63212 | 64842 | 64213 | 64186 | 62955 | 57294 |
| 62397 | 64094 | 61325 | 63960 | 63424 | 57077 | 62207 | 61244 | 64356 | 61335 | 63322 | 49117 | 57199 | 65062 | 61173 | 64928 |
| 63865 | 61135 | 64666 | 63329 | 49110 | 64836 | 61054 | 64571 | 32763 | 64159 | 62942 | 65281 | 64738 | 64302 | 62847 | 60413 |
| 60920 | 56317 | 49015 | 64180 | 62949 | 63370 | 61273 | 57023 | 63408 | 65091 | 64901 | 61119 | 63978 | 63218 | 64820 | 64711 | 64331 |
| 63316 | 60406 | 63923 | 63275 | 49084 | 63208 | 64782 | 32757 | 65160 | 63381 | 64630 | 57328 | 62458 | 65065 | 61386 | 63951 |
| 60893 | 64209 | 48894 | 62895 | 64620 | 57290 | 64352 | 61331 | 63191 | 64849 | 61291 | 63870 | 64685 | 63334 | 64417 | 57301 |
| 63262 | 49113 | 63181 | 57195 | 65058 | 61169 | 63972 | 32703 | 62431 | 65052 | 60911 | 57274 | 64227 | 63165 | 61278 | 64795 |
| 63100 | 64155 | 62938 | 56815 | 64325 | 64678 | 64298 | 62843 | 64728 | 64404 | 49131 | 59391 | 64633 | 57247 | 64309 | 64214 |
| 60409 | 57182 | 62452 | 65031 | 61380 | 64897 | 61115 | 63918 | 63432 | 57085 | 64119 | 61364 | 63985 | 63337 | 49118 | 64844 | 61174 |
| 55295 | 63158 | 61285 | 64816 | 64707 | 64271 | 64204 | 63377 | 64691 | 49023 | 64188 | 62957 | 65282 | 61393 | 63324 | 60414 |
| 64626 | 57268 | 62398 | 64109 | 61326 | 63947 | 63187 | 64789 | 63931 | 63395 | 65120 | 64902 | 32765 | 64217 | 64807 | 64740 |
| 57078 | 61231 | 63866 | 61164 | 64681 | 63330 | 49125 | 64599 | 64360 | 61339 | 63382 | 65093 | 57315 | 65066 | 61177 | 63980 |
| 57297 | 62427 | 65048 | 60907 | 56318 | 64167 | 62950 | 63161 | 63287 | 63220 | 64850 | 64333 | 64686 | 64418 | 62963 | 57302 |
| 61274 | 63839 | 64668 | 63303 | 64400 | 49071 | 59387 | 64573 | 62460 | 65039 | 61388 | 64905 | 57207 | 63166 | 61293 | 64824 |
| 32758 | 60894 | 57243 | 64305 | 64210 | 63372 | 60799 | 57081 | 64715 | 64391 | 63385 | 64634 | 57276 | 64310 | 64229 | 63195 |
| 64115 | 61360 | 63925 | 63277 | 49114 | 63182 | 64840 | 61170 | 63735 | 64797 | 57086 | 61351 | 63986 | 63338 | 49133 | 64607 | 57305 |
| 49019 | 63087 | 64184 | 62953 | 57292 | 64326 | 61333 | 63320 | 64339 | 65168 | 64175 | 62958 | 65073 | 61394 | 63959 | 63311 |
| 60410 | 48639 | 57197 | 62439 | 65060 | 61143 | 64898 | 32761 | 64408 | 61299 | 64693 | 32766 | 64313 | 64218 | 65284 | 60919 |
| 64157 | 62940 | 61286 | 64803 | 64736 | 64300 | 62845 | 60383 | 64123 | 61368 | 63933 | 63397 | 65094 | 64960 | 61178 | 63743 |
| 63378 | 65089 | 57255 | 64110 | 61117 | 63976 | 63283 | 63216 | 64790 | 49139 | 63207 | 64685 | 64334 | 61341 | 63440 | 57317 |
| 64709 | 64329 | 64682 | 49126 | 62903 | 64628 | 57298 | 62456 | 65068 | 61151 | 64906 | 63345 | 64852 | 61294 | 64811 | 64744 |
| 65035 | 61384 | 63949 | 63189 | 57203 | 63162 | 61289 | 63868 | 64420 | 62965 | 63386 | 65097 | 57263 | 64230 | 63291 | 63224 |
| 64655 | 63332 | 64387 | 56823 | 62429 | 64574 | 60909 | 57272 | 64798 | 64717 | 64449 | 49134 | 62911 | 64636 | 57306 | 64368 |

| | | | | | | | | | | | | | | |
|---|---|---|---|---|---|---|---|---|---|---|---|---|---|---|
| 65155 | 63197 | 57211 | 65074 | 61409 | 63988 | 63340 | 64395 | 65224 | 63445 | 63418 | 65129 | 64911 | 64830 | 64749 | 64481 |
| 56831 | 64341 | 64694 | 64314 | 64233 | 65047 | 61396 | 64913 | 63391 | 65116 | 57338 | 65187 | 63229 | 64859 | 64468 | 64427 |
| 61355 | 63934 | 63398 | 61301 | 64723 | 64287 | 64220 | 64866 | 57311 | 64373 | 65174 | 65079 | 61428 | 64945 | 64414 | 64755 |
| 64125 | 61342 | 63963 | 63427 | 57318 | 61247 | 61180 | 64697 | 64319 | 64252 | 65346 | 61374 | 63995 | 63459 | 64966 | 65177 |
| 63346 | 49141 | 64839 | 65288 | 60923 | 64183 | 62966 | 63401 | 64871 | 65320 | 61403 | 63446 | 65130 | 64940 | 63351 | 65293 |
| 65098 | 64908 | 63319 | 49087 | 63211 | 64813 | 64718 | 64450 | 64750 | 64482 | 63420 | 65103 | 64969 | 63230 | 64888 | 64455 |
| 63388 | 64623 | 57321 | 64355 | 65184 | 63293 | 63198 | 64856 | 63449 | 57340 | 64374 | 65189 | 64861 | 61415 | 64946 | 64429 |
| 61410 | 63975 | 63103 | 64424 | 62969 | 57308 | 64342 | 65157 | 65299 | 65232 | 64239 | 65137 | 64919 | 64472 | 64757 | 64377 |
| 64234 | 57213 | 62455 | 65076 | 61383 | 64914 | 64397 | 61302 | 65178 | 65348 | 65083 | 61432 | 63997 | 63461 | 64703 | 64435 |
| 64819 | 64752 | 64316 | 64207 | 65105 | 57271 | 64126 | 61357 | 65294 | 61405 | 63407 | 65132 | 64970 | 64875 | 64484 | 63450 |
| 63992 | 63456 | 64725 | 64345 | 61167 | 64698 | 49142 | 64868 | 57327 | 65190 | 63355 | 64862 | 65409 | 64430 | 62975 | 65328 |
| 65051 | 61400 | 63965 | 63429 | 63402 | 61305 | 64671 | 63348 | 65219 | 65138 | 64948 | 64459 | 65301 | 64758 | 64378 | 65193 |
| 64403 | 64814 | 60925 | 64241 | 63375 | 65100 | 57322 | 61363 | 65111 | 64977 | 61419 | 63998 | 63462 | 64351 | 65180 | 65085 |
| 63294 | 49145 | 63213 | 64843 | 64452 | 64187 | 62970 | 57295 | 61406 | 64923 | 61311 | 64761 | 64437 | 65352 | 64247 | 63465 |
| 64357 | 65158 | 63323 | 57214 | 65063 | 61412 | 64929 | 64398 | 64972 | 49151 | 64877 | 65410 | 63452 | 65315 | 65248 | 63357 |
| 62943 | 65296 | 64739 | 64303 | 64236 | 63409 | 65106 | 64916 | 64935 | 64488 | 65302 | 65221 | 65194 | 63415 | 65140 | 64978 |
| 61358 | 63979 | 63219 | 64821 | 64726 | 64346 | 65161 | 64631 | 64461 | 64883 | 64380 | 65167 | 57335 | 65086 | 61421 | 64952 |
| 57329 | 62459 | 65080 | 61387 | 63966 | 63430 | 61306 | 63871 | 65305 | 64762 | 64438 | 65115 | 64925 | 63466 | 64735 | 64467 |
| 64700 | 63335 | 64432 | 65053 | 60926 | 57275 | 64242 | 63404 | 64878 | 65201 | 63439 | 61427 | 63358 | 64441 | 65412 | 64251 |
| 61279 | 64729 | 64405 | 49146 | 63214 | 64872 | 64215 | 63433 | 65317 | 65222 | 65127 | 64993 | 64462 | 65360 | 64367 | 65196 |
| 57324 | 64358 | 61365 | 63352 | 49119 | 64845 | 61175 | 64930 | 63473 | 64980 | 61422 | 64939 | 64885 | 65306 | 65225 | 63419 |
| 64189 | 62972 | 65283 | 65216 | 63325 | 60415 | 63410 | 65121 | 65144 | 64926 | 64831 | 64764 | 64496 | 65117 | 57339 | 65202 |
| 64903 | 64456 | 64822 | 64741 | 64361 | 65162 | 63383 | 65108 | 63468 | 64469 | 64442 | 65175 | 65318 | 61429 | 64415 | 64994 |
| 57330 | 65067 | 61416 | 63981 | 63221 | 64851 | 64348 | 64687 | 64253 | 65347 | 61375 | 63474 | 64967 | 65416 | 64886 | 65321 |
| 64419 | 57303 | 62461 | 65054 | 61389 | 64920 | 63167 | 61308 | 65226 | 63447 | 65131 | 64941 | 65308 | 64751 | 64483 | 63421 |
| 64825 | 64730 | 64406 | 64635 | 57277 | 64311 | 64244 | 63434 | 65118 | 64984 | 63231 | 64889 | 64470 | 57341 | 64375 | 65204 |
| 57087 | 61366 | 63987 | 63339 | 49148 | 64846 | 65169 | 64190 | 61430 | 64947 | 64444 | 65233 | 64254 | 65376 | 64473 | 64996 |
| 62959 | 65312 | 61395 | 63326 | 64409 | 65122 | 64932 | 32767 | 65179 | 65349 | 65322 | 61433 | 63476 | 64942 | 65295 | 65228 |
| 64219 | 65285 | 64742 | 64362 | 61369 | 63412 | 65095 | 64961 | 63422 | 65133 | 64971 | 64890 | 64485 | 63451 | 57342 | 65191 |
| 61179 | 63982 | 63222 | 64880 | 64335 | 65164 | 63441 | 57332 | 64863 | 65424 | 64431 | 65329 | 65234 | 65139 | 64949 | 64474 |
| 62462 | 65069 | 61390 | 64907 | 64853 | 61295 | 64826 | 64745 | 64759 | 64379 | 65208 | 65350 | 61434 | 63999 | 63463 | 65181 |
| 64421 | 63387 | 65112 | 57278 | 64231 | 63225 | 64799 | 64732 | 65324 | 61407 | 65134 | 65000 | 65353 | 64486 | 63480 | 64973 |
| 64464 | 49135 | 64637 | 57307 | 64369 | 65170 | 63436 | 65075 | 64892 | 65411 | 63453 | 65330 | 65249 | 64950 | 64489 | 65303 |
| 61424 | 63989 | 63341 | 64410 | 64695 | 64315 | 64248 | 65286 | 65236 | 65195 | 65141 | 64979 | 64476 | 64381 | 65182 | 65087 |
| 61397 | 61370 | 63935 | 63399 | 65124 | 64962 | 64221 | 64867 | 61436 | 64953 | 64763 | 64439 | 65354 | 63467 | 64974 | 64879 |
| 64364 | 61343 | 63442 | 57319 | 65070 | 61181 | 64936 | 63347 | 65440 | 63454 | 65250 | 63359 | 65413 | 64490 | 65332 | 65223 |
| 64854 | 65289 | 64746 | 64422 | 62967 | 63416 | 65099 | 64909 | 65142 | 65008 | 64463 | 65361 | 64382 | 65197 | 64981 | 61423 |
| 63226 | 64828 | 64719 | 64451 | 63389 | 64638 | 57336 | 64370 | 64954 | 65307 | 65240 | 65145 | 64927 | 64765 | 64497 | 65356 |
| 65185 | 63199 | 64857 | 61411 | 63990 | 63342 | 64425 | 57309 | 65203 | 63469 | 64443 | 65414 | 65319 | 65252 | 64995 | 64492 |
| 64343 | 65172 | 64235 | 65077 | 61398 | 64915 | 64412 | 61303 | 65362 | 65198 | 63475 | 64982 | 65417 | 64887 | 65336 | 65227 |
| 64753 | 64317 | 64222 | 65344 | 64127 | 61372 | 63993 | 63457 | 65146 | 64956 | 65309 | 64766 | 64498 | 65119 | 64985 | 63470 |
| 64964 | 61182 | 64699 | 49143 | 64869 | 65290 | 61401 | 63444 | 64471 | 65205 | 61431 | 64445 | 65472 | 64255 | 65377 | 64997 |
| 63403 | 65128 | 64910 | 64815 | 64748 | 64480 | 63390 | 65229 | 65418 | 65364 | 65253 | 65256 | 63477 | 64943 | 65310 | 65229 |
| 65101 | 57323 | 65186 | 63295 | 63228 | 64858 | 64453 | 64426 | 63423 | 65148 | 64986 | 64891 | 64500 | 57343 | 65206 | 65425 |
| 62971 | 57310 | 64372 | 65159 | 57215 | 65078 | 61413 | 64944 | 64446 | 65235 | 65378 | 64475 | 64998 | 65209 | 65351 | 61435 |
| 64399 | 65297 | 64754 | 64318 | 64237 | 65107 | 64917 | 61359 | 63478 | 65420 | 65325 | 65230 | 65135 | 65001 | 65368 | 64487 |
| 63994 | 63458 | 64727 | 64347 | 65176 | 64870 | 65081 | 61402 | 63481 | 64988 | 64893 | 65426 | 65331 | 65264 | 64951 | 64504 |
| 63967 | 63431 | 61307 | 64701 | 63350 | 64433 | 65292 | 60927 | 65237 | 65210 | 65380 | 64477 | 65183 | 65326 | 61437 | 65002 |
| 64243 | 63405 | 65102 | 64968 | 49147 | 63215 | 64873 | 64454 | 65355 | 63482 | 64975 | 64894 | 65441 | 63455 | 65251 | 65428 |
| 63448 | 57325 | 64359 | 65188 | 63353 | 64860 | 61414 | 64931 | 64491 | 65333 | 65238 | 65143 | 65009 | 64478 | 64383 | 65212 |
| 64428 | 62973 | 65298 | 65217 | 64238 | 63411 | 65136 | 64918 | 61438 | 64955 | 65241 | 65384 | 65004 | 65357 | 65442 | 63484 |
| 64457 | 64823 | 64756 | 64376 | 65163 | 65109 | 57331 | 65082 | 65415 | 65334 | 65253 | 65010 | 64493 | 65363 | 65199 | 64983 |
| 61417 | 63996 | 63460 | 64349 | 64702 | 64434 | 65055 | 61404 | 65432 | 65337 | 65242 | 65147 | 64957 | 64767 | 64499 | 65358 |
| 64921 | 63406 | 61309 | 64731 | 64407 | 64874 | 64245 | 63435 | 63471 | 65444 | 65254 | 65473 | 64494 | 65392 | 65012 | 65419 |
| 57326 | 61367 | 63354 | 49149 | 64847 | 65408 | 64191 | 62974 | 65365 | 65338 | 65257 | 64958 | 65311 | 65244 | 65149 | 64987 |
| 65313 | 65218 | 63327 | 65123 | 64933 | 64458 | 65300 | 64743 | 64501 | 65207 | 64447 | 65474 | 65379 | 64999 | 65448 | 65366 |
| 64363 | 65192 | 63413 | 65110 | 64976 | 61418 | 63983 | 63223 | 65258 | 63479 | 65421 | 65340 | 65231 | 65150 | 65016 | 65369 |
| 64881 | 64350 | 65165 | 57333 | 62463 | 65084 | 61391 | 64922 | 64502 | 64989 | 65427 | 65265 | 64505 | 65476 | 65211 | 65381 |
| 61310 | 64827 | 64760 | 64436 | 65113 | 57279 | 64246 | 63464 | 65422 | 65327 | 65260 | 65003 | 65370 | 63483 | 64990 | 64895 |
| 64733 | 64465 | 49150 | 64876 | 65171 | 63437 | 65314 | 61425 | 65456 | 65266 | 65429 | 64506 | 65239 | 65382 | 64479 | 65213 |
| 63356 | 64411 | 64934 | 64249 | 65287 | 65220 | 61371 | 63414 | 61439 | 65480 | 65385 | 65005 | 65372 | 65443 | 63485 | 65430 |
| 65125 | 64963 | 64460 | 64882 | 64365 | 65166 | 63443 | 57334 | 65335 | 65268 | 65011 | 64508 | 65214 | 65433 | 65243 | 65386 |
| 65071 | 61420 | 64937 | 64855 | 65304 | 64747 | 64423 | 63417 | 65006 | 65359 | 63486 | 64645 | 65255 | 65488 | 64495 | 65393 |
| 65114 | 64924 | 63227 | 64829 | 64734 | 64466 | 64639 | 57337 | 65013 | 65434 | 65339 | 65272 | 64959 | 65245 | 65388 | 65446 |
| 64371 | 65200 | 63438 | 61426 | 63991 | 63343 | 64440 | 65173 | 65475 | 65394 | 65014 | 65449 | 65367 | 65259 | 65436 | 65341 |
| 64250 | 65316 | 61399 | 64413 | 65126 | 64992 | 64223 | 65345 | 65246 | 65151 | 65017 | 64503 | 65504 | 65477 | 65450 | 65396 |
| 64366 | 61373 | 63472 | 64965 | 61183 | 64938 | 64884 | 65291 | 65423 | 65342 | 65261 | 65018 | 65371 | 64991 | 65457 | 65267 |

64507 65478 65383 65452 65262 65481 65400 65020
65373 65458 65431 65269 64509 65215 65482 65387
65007 65374 63487 65460 65270 65489 64510 65435
65273 65484 65389 65447 65490 65395 65015 65464
65274 65437 65247 65390 65505 65492 65451 65397
65438 65343 65276 65019 65506 65479 65398 65453
65263 65496 65401 65021 65459 65508 65454 65483
65402 65022 65375 65461 65271 64511 65512 65485
65404 65462 65491 65465 65275 65486 65391 65520
65493 65466 65439 65277 65507 65494 65399 65468
65278 65497 65509 65455 65498 65403 65023 65510
65513 65500 65405 65463 65514 65487 65406 65521
65467 65516 65522 65495 65469 65279 65524 65470
65499 65511 65528 65501 65515 65502 65407 65517
65523 65518 65525 65471 65526 65529 65530 65503
65532 65519 65527 65531 65533 65534 65535}

In this embodiment of this application, the system stores a maximum mother code sequence (assuming that a length is N), and a mother code sequence in any code length (assuming that the code length is M, where M≤N) can be directly read from the maximum mother code sequence.

For example, when N=65536, any mother code sequence in code length of 16, 32, 64, 128, . . . , or 32768 can be directly read from the foregoing sequence #A.

Optionally, in this embodiment of this application, the maximum mother code sequence supported by the system may be stored in a compressed storage mode, to further reduce the storage overheads of the system.

It can be learned from a polar code polarization process that, polarized channels $$\frac{N}{2}, \frac{N}{2}+1, \frac{N}{2}-2, \ldots, N-1 = 2^n - 1$$

are a result of further polarization on polarized channels $$\left\{0, 1, 2, \ldots, \frac{N}{2}-1 = 2^{n-1}-1\right\},$$

and the two groups of polarized channels have same inner ordering. During storage, an ordering sequence of $$\left\{0, 1, 2, \ldots, \frac{N}{2}-1 = 2^{n-1}-1\right\}$$

may be stored, and for $$\left\{\frac{N}{2}, \frac{N}{2}+1, \frac{N}{2}-2, \ldots, N-1 = 2^n-1\right\},$$

only a difference with corresponding locations in $$\left\{0, 1, 2, \ldots, \frac{N}{2}-1 = 2^{n-1}-1\right\}$$

needs to be stored. The process is further broken down, so that an ordering sequence of a shorter polar code may be stored. For example, a sequence $$\left\{0, 1, 2, \ldots, \frac{N}{2}-1 = 2^{n-1}-1\right\}$$

is used as a base sequence, and for other polarized channels, a difference with corresponding locations in the base sequence is stored. For example, a difference between $$\left\{\frac{N}{4}, \frac{N}{4}+1, \frac{N}{4}-2, \ldots, 2^{n-1}-1\right\}$$

and corresponding locations in the base sequence is $$\frac{N}{4},$$

and a difference between $$\left\{\frac{N}{2}, \frac{N}{2}+1, \frac{N}{2}-2, \ldots, N-1 = 2^n-1\right\}$$

and corresponding locations in the base sequence is $$\frac{N}{2}.$$

It can be learned that the differences are all integer multiples of a length of the base sequence.

Therefore, in this embodiment of this application, when the maximum mother code sequence supported by the system is stored, a base sequence may be first determined from the maximum mother code sequence, and for sequence numbers of rest polarized channels, an offset difference (in other words, an offset multiplier) of the sequence numbers with respect to those in the base sequence is stored.

The following describes a compressed storage process according to this embodiment of this application in detail.

First, a maximum mother code length that can be supported by a system is set to N (N=$2^n$, where n is a nonnegative integer). In this case, it can be learned from the foregoing polar coding method in this embodiment of this application that, the system needs to store only one maximum mother code sequence (which, for ease of differentiation, is denoted by a sequence $S_N$ in the following description). The sequence $S_N$ includes sequence numbers (indexes from 0 to N−1) of N polarized channels, and ordering of the sequence numbers of the N polarized channels is obtained based on ordering of reliabilities of the polarized channels.

201. Based on a length of the maximum mother code sequence and a preset rule, a quantity S of bits that need to be used to represent a sequence number in the maximum mother code sequence is calculated.

In this embodiment of this application, the preset rule may be understood as an equation N=$2^{2S-2}$ configured by the system.

Specifically, it can be learned from the foregoing equation that a value of S may be calculated based on a formula $$S = \left\lceil \frac{\log_2 N}{2} \right\rceil + 1.$$

The symbol ⌈ ⌉ represents rounding up.

It should be understood that determining the value of S based on this equation is only used as an example. In this embodiment of this application, a manner how the value of S is determined is not limited. Any manner shall fall with the protection scope of this embodiment of this application, provided that a compressed storage mode is used so that a quantity of bits used when the sequence numbers of the polarized channels are stored is less than a quantity of bits used during direct storage are.

202. A maximum sequence length that is represented by (S−1) bits is calculated.

In this embodiment of this application, when the sequence number in the maximum mother code sequence is represented by S bits, one bit in the S bits needs to be reserved as an indication bit used to indicate a type of a sequence number stored at a current location. Therefore, the rest (S−1) bits in the S bits are used to indicate a value of the sequence number.

It should be understood that, the type of the sequence number herein means that the sequence number stored at the current location belongs to a base sequence or an offset sequence.

It can be understood that, the maximum sequence length that is represented by the (S−1) bits is $Q=2^{S-1}$.

203. A sequence obtained by successively sorting sequence numbers that are less than Q and that are in the maximum mother code sequence, is determined as a base sequence.

It should be noted that, for ordering of the sequence numbers in the base sequence, reference may be made to step 105.

204. Sequence numbers that are greater than or equal to the sequence number Q and that are in the maximum mother code sequence are grouped into $$\left(\frac{N-Q}{Q}\right)$$

offset sequences.

It should be understood that a quantity of sequence numbers included in each offset sequence is the same as a quantity of the sequence numbers included in the base sequence, ordering of a plurality of sequence numbers in each offset sequence is the same as ordering of the plurality of sequence numbers in the maximum mother code sequence, and there is a common offset multiplier for a plurality of sequence numbers in each offset sequence with respect to sequence numbers at corresponding locations in the base sequence.

205. Each sequence number in the base sequence is stored by using S bits, where the S bits include a first bit and a plurality of second bits.

Specifically, the first bit is used to indicate that the sequence number stored at the current location belongs to the base sequence, and the plurality of second bits are used to indicate a value of the sequence number stored at the current location.

206. A sequence number in the offset sequence is stored by using S bits, where the S bits include a third bit and a plurality of fourth bits.

Specifically, the third bit is used to indicate that the sequence number stored at the current location belongs to an offset sequence, and the plurality of fourth bits are used to indicate an offset multiplier of the sequence number stored at the current location with respect to a sequence number at a corresponding location in the base sequence. An $i^{th}$ sequence number in each offset sequence corresponds to an $i^{th}$ sequence number in the base sequence.

For ease of understanding, the following uses N=16 (meaning that the maximum mother code length supported by the system is 16) as an example to describe the foregoing compressed storage process.

First, it is assumed that reliabilities of 16 polarized channels are calculated and sorted in ascending order into a sequence $S_1$.

$S_1$={0, 1, 2, 4, 8, 3, 5, 6, 9, 10, 12, 7, 11, 13, 14, 15}

(1) Calculate a quantity S of bits that need to be used to represent a sequence number in the maximum mother code sequence.

$$S = \left\lceil \frac{\log_2 16}{2} \right\rceil + 1 = 3.$$

(2) Calculate a maximum sequence length Q that is represented by (3−1) bits.

$Q=2^{3-1}=4$.

(3) Obtain a base sequence (which, for ease of description, is denoted by $S_2$ in the following description) by successively reading sequence numbers that are less than Q from the sequence $S_1$.

It is easy to obtain that $S_2$={0, 1, 2, 3}.

(4) Calculate a quantity of offset sequences.

$$\frac{N-Q}{Q} = \frac{16-4}{4} = 3.$$

Specifically, sequence numbers of the rest polarized channels, other than the sequence numbers in the base sequence, are grouped into 3 offset sequences. Each offset sequence includes 4 sequence numbers, and the 4 sequence numbers in each offset sequence are in one-to-one correspondence with 4 sequence numbers in the base sequence. In addition, at corresponding locations, differences between sequence numbers in the offset sequence and sequence numbers in the base sequence are the same.

For example, the foregoing base sequence is $S_2$={0 1 2 3}, the sequence numbers 4 to 15 are grouped in to 3 offset sequences, the sequence numbers 4 to 7 belong to an offset sequence 1, the sequence numbers 8 to 11 belong to an offset sequence 2, and sequence numbers 12 to 15 belong to an offset sequence 3.

It should be noted that, herein, that the sequence numbers 4 to 7 belong to the offset sequence 1 means that the sequence numbers 4, 5, 6, and 7 belong to a same offset sequence but does not represent ordering of the sequence numbers 4, 5, 6, and 7. The similar applies to the offset sequence 2 and the offset sequence 3, and details are not repeatedly described herein.

It should be understood that a same offset difference (or offset multiplier) exists for sequence numbers that belong to one offset sequence with respect to sequence numbers at corresponding locations in the base sequence.

For example, the sequence numbers in the offset sequence 1 are successively read from the sequence $S_1$, to obtain the offset sequence 1={4 5 6 7}. Similarly, the offset sequence 2={8 9 10 11}, and the offset sequence 3={12 13 14 15}. Therefore, it can be learned that differences between a plurality of sequence numbers that belong to a same offset sequence and sequence numbers at corresponding locations in the base sequence are the same. A difference between the offset sequence 1 and the base sequence is 4 (an offset multiplier is 1), a difference between the offset sequence 2 and the base sequence is 8 (an offset multiplier is 2), and a difference between the offset sequence 3 and the base sequence is 12 (an offset multiplier is 3).

(5) Store the maximum mother code sequence by using 3 bits. The sequence numbers in the base sequence are stored directly, and for sequence numbers in an offset sequence, an offset multiplier of the offset sequence with respect to the base sequence is stored.

In this embodiment of this application, bits that are used to store each sequence number include a first portion and a second portion. The first portion is used to indicate whether a sequence number stored at a current location belongs to the base sequence or an offset sequence. If the first portion indicates that the sequence number stored at the current location belongs to the base sequence, the second portion is used to indicate a value of the sequence number stored at the current location. If the first portion indicates that the sequence number stored at the current location belongs to an offset sequence, the second portion is used to indicate an offset multiplier of the sequence number stored at the current location with respect to that in the base sequence.

FIG. 3 is a storage form of a maximum mother code sequence in a compressed storage mode according to an embodiment of this application. As shown in FIG. 3, each sequence number is stored by using 3 bits. The most significant 1 bit of each sequence number is used to indicate whether a sequence number stored at a current location belongs to the base sequence or an offset sequence. As an example but not a limitation, in this embodiment of this application, "0" is used to indicate that the sequence number stored at the current location belongs to the base sequence, and "1" is used to indicate that the sequence number stored at the current location belongs to an offset sequence. Therefore, the first bits of sequence numbers 1, 2, and 3 are 0s, and the first bits of the rest sequence numbers are all 1s.

Further, when the first bit indicates that the sequence number stored at the current location belongs to the base sequence, the rest bits are used to indicate a value of the sequence number stored at the current location. The last 2 bits are directly read as a sequence number of a polarized channel.

For example, the last 2 bits of the sequence numbers 0, 1, 2, and 3 are 00, 01, 10, and 11, respectively. This means that the sequence numbers of polarized channels are 0, 1, 2, and 3, respectively.

When the first bit indicates that the sequence number stored at the current location belongs to an offset sequence, the rest bits are used to indicate an offset multiplier of the sequence number stored at the current location with respect to that in the base sequence. Therefore, for a $k^{th}$ sequence number whose most significant bit is 1 and whose offset multiplier is y, the value of the sequence number stored at the current location is the $k^{th}$ sequence number in the base sequence+(the offset multiplier y×a length of the base sequence).

For example, when a sequence number 5 is stored, the most significant bit is stored as 1 and is used to indicate that the sequence number 5 belongs to an offset sequence. The last 2 bits are necessarily stored as 00 and are used to indicate that an offset multiplier of the sequence number (that is, the sequence number 5) stored at the current location with respect to that in the base sequence is 1. For another example, when a sequence number 9 is stored, the most significant bit is stored as 1, and the last 2 bits are stored as 01 and are used to indicate that an offset multiplier is 2.

FIG. 4 is a schematic diagram of storing a maximum mother code sequence in a direct storage mode. As shown in FIG. 4, using N=16 as an example, if the direct storage mode is used, 4 bits are required to represent a sequence number of each polarized channel. Sequence numbers 0 to 15 are represented by "0000" to "1111", respectively.

FIG. 5 is another storage form of a maximum mother code sequence in a compressed storage mode according to an embodiment of this application. In FIG. 5, {0 1 2, . . . , 7} is selected as a base sequence, and an offset difference of sequence numbers of the rest polarized channels with respect to those in the base sequence is 8; therefore, an offset multiplier is 1. In this case, a length of a maximum sequence in the base sequence is 8, and therefore 3 bits need to be used for representation. The offset multiplier of the sequence numbers of the rest polarized channels with respect to those in the base sequence is 1, and therefore only one bit needs to be used for representation. To ensure consistency with the quantity of bits that are used in the base sequence to represent a value of a sequence number, 3 bits are also used when an offset multiplier of sequence numbers 8 to 15 is stored. With one indication bit added, in this case, a quantity of bits used when the maximum mother code sequence is stored is 4.

It should be understood that, the lengths of the base sequences selected in FIG. 5 and FIG. 3 are different. The quantity of bits used when the maximum mother code sequence is stored in FIG. 5 and that used in the direct storage mode are both 4, and the quantity of bits is not reduced. In this case, the length of the base sequence may further be shortened, so as to enlarge a range of the offset multiplier. Therefore, when the length of the base sequence is shortened to 4, the storage form of the maximum mother code sequence shown in FIG. 3 may be obtained.

Therefore, when the maximum code length sequence is stored in the compressed storage mode, referring to the foregoing steps 201 to 206, the quantity of bits that are used can be minimal. Compared with the prior art, this can further reduce storage overheads of a system on the basis that the storage overheads are reduced by storing only one sequence (that is, the maximum mother code sequence).

Table 6 shows a result of comparison between storage space occupied by direct storage and that occupied by compressed storage.

TABLE 6

| Maximum Mother Code Length (N) | Direct Storage | | Compressed Storage | |
|---|---|---|---|---|
| | Quantity of bits used | Quantity of bits used | Base sequence range | Space saved |
| 256 | 8 | 5 | 0~15 | 37.5% |
| 512 | 9 | 6 | 0~31 | 33.3% |
| 1024 | 10 | 6 | 0~31 | 40% |
| 2048 | 11 | 7 | 0~63 | 36.4% |
| 4096 | 12 | 7 | 0~63 | 41.7% |
| 8192 | 13 | 8 | 0~127 | 38.5% |
| 16384 | 14 | 8 | 0~127 | 42.9% |
| 32768 | 15 | 9 | 0~255 | 40% |
| 65536 | 16 | 9 | 0~255 | 43.75% |
| 131072 | 17 | 10 | 0~511 | 41.2% |
| 262144 | 18 | 10 | 0~511 | 44.4% |
| 524288 | 19 | 11 | 0~1023 | 42.1% |
| 1048576 | 20 | 11 | 0~1023 | 45% |

It can be learned from Table 6 that, when the maximum mother code sequence is stored, the compressed storage mode can save 40% storage space in comparison with the direct storage mode.

Figure 6:
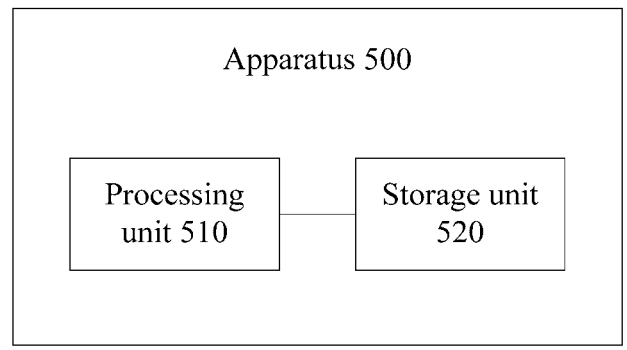
FIG. 6 is a schematic block diagram of a polar coding apparatus according to an embodiment of this application.
Figure 7:
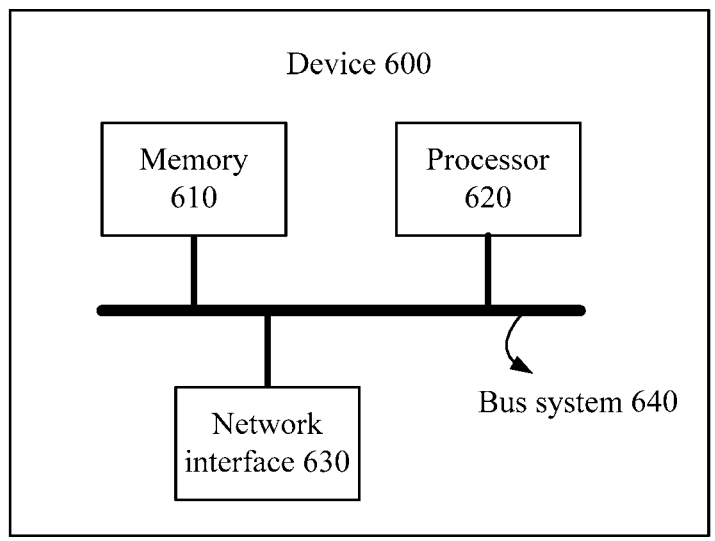
FIG. 7 is a schematic structural diagram of a polar coding device according to an embodiment of this application.

With reference to FIG. 1 to FIG. 5, the foregoing describes in detail the polar coding method according to the embodiments of this application. With reference to FIG. 6 and FIG. 7, the following describes a polar coding apparatus and a polar coding device according to the embodiments of this application.

FIG. 6 is a schematic block diagram of a polar coding apparatus 500 according to an embodiment of this application. As shown in FIG. 6, the apparatus 500 includes a processing unit 510 and a storage unit 520.

The processing unit 510 is configured to obtain reliability metrics of N polarized channels, where $N=2^n$, and n and N are positive integers.

The processing unit 510 is further configured to sort sequence numbers of the N polarized channels in ascending order or descending order of the metrics, to obtain a maximum mother code sequence. The maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z \leq n$, and z is a positive integer.

The storage unit 520 is configured to store the maximum mother code sequence.

The units in the apparatus 500 in this embodiment of this application and the foregoing operations or functions are intended to implement corresponding procedures in the method 100. For brevity, details are not repeatedly described herein.

Optionally, the apparatus 500 may be a chip or an integrated circuit.

In a possible design, when some or all functions of the apparatus 500 are implemented by using software, the apparatus 500 may be provided with a chip (or a chip system). The chip includes a memory and a processor. The memory is configured to store a computer program, and the processor is configured to execute the computer program stored in the memory. When the computer program is executed, the apparatus 500 can perform the polar coding method described in the foregoing embodiments.

The computer program may also be referred to as computer program code, program code, or the like.

In a possible design, when some or all functions of the apparatus 500 are implemented by using hardware, the apparatus 500 may be an integrated circuit. The integrated circuit may include:

an input interface circuit, configured to obtain to-be-coded bits;

a logic circuit, configured to read, from the maximum mother code sequence, a mother code sequence in a required length, to perform polar coding on the to-be-coded bits; and an output interface circuit, configured to output a sequence resulting from the polar coding.

In this embodiment of this application, only the maximum mother code sequence that can be supported by a system needs to be stored, and during polar code coding, the mother code sequence in the length required to perform polar coding is read from the maximum mother code sequence, so that storage overheads of the system can be reduced.

FIG. 7 is a schematic structural diagram of a polar coding device 600 according to an embodiment of this application.

As shown in FIG. 7, the device 600 includes a memory 610, a processor 620, and a network interface 630. The memory 610, the processor 620, and the network interface 630 may be connected to each other by using a bus system 640. The memory 610 is configured to store an instruction, and the processor 620 is configured to execute the instruction stored in the memory 620, to control the network interface 630 to send or receive a signal.

The processor 620 is configured to obtain reliability metrics of N polarized channels, where $N=2^n$, and n and N are positive integers.

The processor 620 is further configured to sort sequence numbers of the N polarized channels in ascending order or descending order of the metrics, to obtain a maximum mother code sequence. The maximum mother code sequence is characterized in that, if a first sequence whose code length is Z is read from the maximum mother code sequence, ordering, in the first sequence, of Z sequence numbers included in the first sequence is the same as ordering, in the maximum mother code sequence, of the Z sequence numbers, where $Z=2^z$, $z \leq n$, and z is a positive integer.

The memory 610 is configured to store the maximum mother code sequence.

The units in the polar coding device 600 in this embodiment of this application and the foregoing operations or functions are intended to implement corresponding procedures in the method 100. For brevity, details are not repeatedly described herein. In this embodiment of this application, only the maximum mother code sequence that can be supported by a system needs to be stored, and during polar code coding, a mother code sequence in a length required to perform polar coding is read from the maximum mother code sequence, so that storage overheads of the system can be reduced.

It should be understood that, in this embodiment of this application, the processor 620 may be a central processing unit (central processing unit, CPU), or may be another general purpose processor, a digital signal processor (Digital Signal Processor, DSP), an application-specific integrated circuit (Application-Specific Integrated Circuit, ASIC), a field programmable gate array (Field Programmable Gate Array, FPGA) or another programmable logic device, a discrete gate or transistor logic device, a discrete hardware component, or the like. The general purpose processor may be a microprocessor or the processor may be any normal processor, or the like.

The memory 610 may include a read-only memory and a random access memory, and provides an instruction and data to the processor 620. A part of the memory 610 may further include a non-volatile random access memory. For example, the memory 610 may further store device type information.

In addition to a data bus, the bus system 640 may include a power bus, a control bus, a status signal bus, and the like. However, for clear description, various buses are marked as the bus system 640 in the figure.

The network interface 630 may be a wired interface, such as a fiber distributed data interface (Fiber Distributed Data Interface, FDDI) or a gigabit Ethernet (Gigabit Ethernet, GE) interface. The network interface 630 may alternatively be a wireless interface.

During implementation, the steps of the foregoing methods may be implemented by using an integrated logic circuit of hardware in the processor 620, or by using a software instruction. The steps of the polar coding method disclosed with reference to the embodiments of this application may be directly performed by a hardware processor, or may be performed by using a combination of hardware in the processor and a software module. The software module may be in a random access memory, a flash memory, a read-only memory, a programmable read-only memory or an electrical erasable programmable memory, a register, or another mature storage medium in the art. The storage medium is located in the memory 610, and the processor 620 reads information from the memory 610 and implements, in combination with hardware of the processor 620, the steps of the foregoing methods. To avoid repetition, no detailed description is given herein again.

The units in the polar coding device 600 in this embodiment of this application and the foregoing operations or functions are intended to implement corresponding procedures in the method 100. For brevity, details are not repeatedly described herein.

In this embodiment of this application, only the maximum mother code sequence that can be supported by the system needs to be stored, and during polar code coding, the mother code sequence in the length required to perform polar coding is read from the maximum mother code sequence, so that storage overheads of the system are reduced.

It should be understood that values of sequence numbers of the foregoing processes do not mean execution sequences in the embodiments of this application. The execution sequences of the processes should be determined based on functions and internal logic of the processes, and should not be construed as any limitation on the implementation processes of the embodiments of this application.

A person of ordinary skill in the art may be aware that the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use a different method to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not repeatedly described herein.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be indirect couplings or communication connections through some interfaces, apparatuses, or units, and may be in electronic, mechanical, or other forms.

The units described as separate parts may or may not be physically separate. Parts displayed as units may or may not be physical units, and may be located in one location or distributed on a plurality of network units. Some or all of the units may be selected depending on actual requirements to achieve the objectives of the solutions of the embodiments.

In addition, functional units in the embodiments of this application may be integrated into one processing unit, or each of the units may exist alone physically, or two or more units are integrated into one unit.

When implemented in the form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A method, comprising:
   identifying, by a communications apparatus, a plurality of bits to be coded;
   determining, by the communications apparatus, a mother code sequence for coding the plurality of bits into a target polar code, the mother code sequence comprising at least a sub-sequence of a maximum mother code sequence, wherein the maximum mother code sequence comprising N sequence numbers corresponding to N polarized channels and the N sequence numbers are sorted according to arranging reliabilities of N polarized channels in an ascending order or a descending order, the mother code sequence comprising L sequence numbers that are sorted in a same order as they are in the maximum mother code sequence, wherein L≤N, and L and N are an integer power of 2; and
   performing, by the communications apparatus, polar coding on the plurality of bits based on the mother code sequence to generate a coded sequence.

2. The method according claim 1, wherein values of the mother code sequence are less than L.

3. The method according claim 1, wherein determining the mother code sequence comprises:
   determining sequence numbers in the maximum mother code sequence that are less than L.

4. The method according claim 1, wherein the maximum mother code sequence is pre-stored in a memory.

5. The method according to claim 1, wherein N equals 1024.

6. A device, comprising:
   a memory storing instructions;
   at least one processor coupled to the memory for executing the instructions to perform operations comprising:
      obtaining to-be-coded bits;
      obtaining a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2;

performing polar coding on the to-be-coded bits based on the second sequence;

outputting a sequence resulting from the polar coding.

7. The device according claim 6, wherein values of the L sequence numbers in the second sequence are less than L.

8. The device according claim 6, wherein the obtaining the second sequence comprises:

obtaining the second sequence by reading, from the maximum mother code sequence, sequence numbers that are less than L.

9. The device according claim 6, wherein the maximum mother code sequence is pre-stored.

10. The device according claim 6, wherein N equals 1024.

11. An apparatus comprising an integrated circuit, wherein the integrated circuit comprises:

an input interface circuit, configured to obtain to-be-coded bits;

a logic circuit, configured to:

obtain a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2; and perform polar coding on the to-be-coded bits based on the second sequence;

an output interface circuit, configured to output a sequence resulting from the polar coding.

12. The apparatus according claim 11, wherein values of the L sequence numbers in the second sequence are less than L.

13. The apparatus according claim 11, wherein the second sequence is obtained by reading, from the maximum mother code sequence, sequence numbers that are less than L, wherein L is a length of a mother code for the target polar code.

14. The apparatus according claim 11, wherein the maximum mother code sequence is pre-stored.

15. The apparatus according claim 11, wherein N equals 1024.

16. A non-transitory, computer-readable medium storing one or more instructions executable by at least one processor to perform operations comprising:

obtain to-be-coded bits;

obtain a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2;

perform polar coding on the to-be-coded bits based on the second sequence; and output a sequence resulting from the polar coding.

17. The computer readable medium according claim 16, wherein values of the L sequence numbers in the second sequence are less than L.

18. The computer readable medium according claim 16, wherein the second sequence is obtained by reading, from the maximum mother code sequence, sequence numbers that are less than L.

19. The computer readable medium according claim 16, wherein the maximum mother code sequence is pre-stored.

20. The computer readable medium according to claim 16, wherein N equals 1024.

\* \* \* \* \*

UNITED STATES PATENT AND TRADEMARK OFFICE
CERTIFICATE OF CORRECTION

PATENT NO. : 11,368,249 B2
APPLICATION NO. : 17/132566
DATED : June 21, 2022
INVENTOR(S) : Rong Li et al.

It is certified that error appears in the above-identified patent and that said Letters Patent is hereby corrected as shown below:

On the Title Page

Column 2, Item (56) References Cited, Other Publications / Line 1 - Delete "Hauwei," and insert -- Huawei, --.

In the Claims

Column 134 / Line 51 – In Claim 2, delete "according claim 1," and insert -- according to claim 1, --.

Column 134 / Line 53 – In Claim 3, delete "according claim 1," and insert -- according to claim 1, --.

Column 134 / Line 57 – In Claim 4, delete "according claim 1," and insert -- according to claim 1, --.

Column 134 / Lines 62-67 and Column 135 / Lines 1-16 – In Claim 6, delete "A device, comprising:
a memory storing instructions;
at least one processor coupled to the memory for executing the instructions to perform operations comprising:
    obtaining to-be-coded bits;
    obtaining a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2;
    performing polar coding on the to-be-coded bits based on the second sequence;
    outputting a sequence resulting from the polar coding." and insert -- A device, comprising:
    a memory storing instructions;

Signed and Sealed this
Eleventh Day of April, 2023

Katherine Kelly Vidal
*Director of the United States Patent and Trademark Office*

CERTIFICATE OF CORRECTION (continued)
U.S. Pat. No. 11,368,249 B2 at least one processor coupled to the memory for executing the instructions to perform operations comprising:
  identifying a plurality of bits to be coded;
  determining a mother code sequence for coding the plurality of bits into a target polar code, the mother code sequence comprising at least a sub-sequence of a maximum mother code sequence, wherein the maximum mother code sequence comprising N sequence numbers corresponding to N polarized channels and the N sequence numbers are sorted according to reliabilities of N polarized channels in an ascending order or a descending order, the mother code sequence comprising L sequence numbers that are sorted in a same order as they are in the maximum mother code sequence, wherein $L \leq N$, and L and N are an integer power of 2; and
  performing polar coding on the plurality of bits based on the mother code sequence to generate a coded sequence. --.

Column 135 / Lines 17-18 – In Claim 7, delete "The device according claim 6, wherein values of the L sequence numbers in the second sequence are less than L." and insert -- The device according to claim 6, wherein values of the mother code sequence are less than L. --.

Column 135 / Lines 19-23 – In Claim 8, delete "The device according claim 6, wherein the obtaining the second sequence comprises:
  obtaining the second sequence by reading, from the maximum mother code sequence, sequence numbers that are less than L." and insert -- The device according to claim 6, wherein determining the mother code sequence comprises:
  determining sequence numbers in the maximum mother code sequence that are less than L. --.

Column 135 / Lines 24-25 – In Claim 9, delete "The device according claim 6, wherein the maximum mother code sequence is pre-stored." and insert -- The device according to claim 6, wherein the maximum mother code sequence is pre-stored in a memory. --.

Column 135 / Line 26 – In Claim 10, delete "The device according claim 6, wherein N equals 1024." and insert -- The device according to claim 6, wherein N equals 1024. --.

Column 135 / Lines 27-48 and Column 136 / Lines 1-2 – In Claim 11, delete "An apparatus comprising an integrated circuit, wherein the integrated circuit comprises:
    an input interface circuit, configured to obtain to-be-coded bits;
    a logic circuit, configured to:
      obtain a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2; and
        perform polar coding on the to-be-coded bits based on the second sequence;
    an output interface circuit, configured to output a sequence resulting from the polar

CERTIFICATE OF CORRECTION (continued)
U.S. Pat. No. 11,368,249 B2 coding." and insert -- An apparatus comprising an integrated circuit, wherein the integrated circuit comprises:
    an input interface circuit, configured to identify a plurality of bits to be coded;
    a logic circuit, configured to:
    determine a mother code sequence for coding the plurality of bits into a target polar code, the mother code sequence comprising at least a sub-sequence of a maximum mother code sequence, wherein the maximum mother code sequence comprising N sequence numbers corresponding to N polarized channels and the N sequence numbers are sorted according to reliabilities of N polarized channels in an ascending order or a descending order, the mother code sequence comprising L sequence numbers that are sorted in a same order as they are in the maximum mother code sequence, wherein L < N, and L and N are an integer power of 2; and
    perform polar coding on the plurality of bits based on the mother code sequence to generate a coded sequence. --.

Column 136 / Lines 3-5 – In Claim 12, delete "The apparatus according claim 11, wherein values of the L sequence numbers in the second sequence are less than L." and insert -- The apparatus according to claim 11, therein values of the mother code sequence are less than L. --.

Column 136 / Lines 6-10 – In Claim 13, delete "The apparatus according claim 11, wherein the second sequence is obtained by reading, from the maximum mother code sequence, sequence numbers that are less than L, wherein L is a length of a mother code for the target polar code." and insert -- The apparatus according to claim 11, wherein the mother code sequence is determined based on determining sequence numbers in the maximum mother code sequence that are less than L. --.

Column 136 / Lines 11-12 – In Claim 14, delete "The apparatus according claim 11, wherein the maximum mother code sequence is pre-stored." and insert -- The apparatus according to claim 11, wherein the maximum mother code sequence is pre-stored in a memory. --.

Column 136 / Lines 13-14 – In Claim 15 delete "The apparatus according claim 11, wherein N equals 1024." and insert -- The apparatus according to claim 11, wherein N equals 1024. --.

Column 136 / Lines 15 (Approximately) – Lines 25 (Approximately) – In Claim 16, delete "A non-transitory, computer-readable medium storing one or more instructions executable by at least one processor to perform operations comprising:
    obtain to-be-coded bits;
    obtain a second sequence as a mother code sequence for coding the to-be-encoded bits into a target polar code, the second sequence comprising a sub-sequence of a maximum mother code sequence or comprising the maximum mother code sequence, the maximum mother code sequence comprising N sequence numbers of N polarized channels and the N sequence numbers are sorted in ascending order or descending order of reliability metrics of the N polarized channels, the second sequence comprising L sequence numbers, with an ordering of the L sequence numbers in the second sequence being the same as an ordering of the L sequence numbers in the maximum mother code sequence, wherein L and N are an integer power of 2;
    perform polar coding on the to-be-coded bits based on the second sequence; and

CERTIFICATE OF CORRECTION (continued)
U.S. Pat. No. 11,368,249 B2 output a sequence resulting from the polar coding." and insert -- A non-transitory, computer-readable medium storing one or more instructions executable by at least one processor to perform operations comprising:
    identifying a plurality of bits to be coded;
    determining a mother code sequence for coding the plurality of bits into a target polar code, the mother code sequence comprising at least a sub-sequence of a maximum mother code sequence, wherein the maximum mother code sequence comprising N sequence numbers corresponding to N polarized channels and the N sequence numbers are sorted according to reliabilities of N polarized channels in an ascending order or a descending order, the mother code sequence comprising L sequence numbers that are sorted in a same order as they are in the maximum mother code sequence, wherein $L \leq N$, and L and N are an integer power of 2; and
    performing polar coding on the plurality of bits based on the mother code sequence to generate a coded sequence. --.

Column 136 / Lines 36-38 – In Claim 17, delete "The computer readable medium according claim 16, wherein values of the L sequence numbers in the second sequence are less than L." and insert -- The non-transitory, computer readable medium according to claim 16, wherein values of the mother code sequence are less than L. --.

Column 136 / Lines 39-42 – In Claim 18, delete "The computer readable medium according claim 16, wherein the second sequence is obtained by reading, from the maximum mother code sequence, sequence numbers that are less than L." and insert -- The non-transitory, computer readable medium according to claim 16, wherein the mother code sequence is determined based on sequence numbers in the maximum mother code sequence that are less than L. --.

Column 136 / Lines 43-45 – In Claim 19, delete "The computer readable medium according claim 16, wherein the maximum mother code sequence is pre-stored." and insert -- The non-transitory, computer readable medium according to claim 16, wherein the maximum mother code sequence is pre-stored in a memory. --.

Column 136 / Lines 46-47 – In Claim 20, delete "The computer readable medium according to claim 16, wherein N equals 1024." and insert -- The non-transitory, computer readable medium according to claim 16, wherein N equals 1024. --.